United States Patent
Chen et al.

(10) Patent No.: US 12,497,611 B2
(45) Date of Patent: Dec. 16, 2025

(54) COMPOSITIONS AND METHODS FOR HIGH-THROUGHPUT ACTIVATION SCREENING TO BOOST T CELL EFFECTOR FUNCTION

(71) Applicant: YALE UNIVERSITY, New Haven, CT (US)

(72) Inventors: Sidi Chen, Milford, CT (US); Ryan D. Chow, San Jose, CA (US); Lupeng Ye, New Haven, CT (US); Matthew Dong, San Francisco, CA (US); Jonathan Park, Scott AFB, IL (US); Lei Peng, New Haven, CT (US)

(73) Assignee: Yale University, New Haven, CT (US)

( * ) Notice: Subject to any disclaimer, the term of this patent is extended or adjusted under 35 U.S.C. 154(b) by 1241 days.

(21) Appl. No.: 17/268,928

(22) PCT Filed: Aug. 15, 2019

(86) PCT No.: PCT/US2019/046691
§ 371 (c)(1),
(2) Date: Feb. 16, 2021

(87) PCT Pub. No.: WO2020/037142
PCT Pub. Date: Feb. 20, 2020

(65) Prior Publication Data
US 2021/0269794 A1 Sep. 2, 2021

Related U.S. Application Data

(60) Provisional application No. 62/824,514, filed on Mar. 27, 2019, provisional application No. 62/719,205, filed on Aug. 17, 2018.

(51) Int. Cl.
| | | |
|---|---|---|
| C12N 15/10 | (2006.01) | |
| A61K 40/11 | (2025.01) | |
| A61K 40/31 | (2025.01) | |
| A61K 40/32 | (2025.01) | |
| A61K 40/42 | (2025.01) | |
| C12N 15/86 | (2006.01) | |
| C12N 15/90 | (2006.01) | |

(52) U.S. Cl.
CPC .......... *C12N 15/1082* (2013.01); *A61K 40/11* (2025.01); *A61K 40/31* (2025.01); *A61K 40/32* (2025.01); *A61K 40/42* (2025.01); *A61K 40/4212* (2025.01); *C12N 15/86* (2013.01); *C12N 15/907* (2013.01); *A61K 2239/48* (2023.05); *C12N 2310/20* (2017.05); *C12N 2740/15043* (2013.01)

(58) Field of Classification Search
CPC .......... C12N 15/86; C12N 2740/15043; C12N 2740/16043; C12N 2750/14143; C12N 2310/20
See application file for complete search history.

(56) References Cited

U.S. PATENT DOCUMENTS

| | | |
|---|---|---|
| 5,350,674 A | 9/1994 | Boenisch |
| 5,399,346 A | 3/1995 | Anderson |
| 5,580,859 A | 12/1996 | Felgner |
| 5,585,362 A | 12/1996 | Wilson |
| 5,589,466 A | 12/1996 | Felgner |
| 5,993,434 A | 11/1999 | Dev |
| 6,181,964 B1 | 1/2001 | Hofmann |
| 6,233,482 B1 | 5/2001 | Hofmann |
| 6,241,701 B1 | 6/2001 | Hofmann |
| 6,326,193 B1 | 12/2001 | Liu |
| 6,516,223 B2 | 2/2003 | Hofmann |
| 6,657,694 B2 | 12/2003 | Ko |
| 6,678,556 B1 | 1/2004 | Nolan |
| 7,171,264 B1 | 1/2007 | Hofmann |
| 7,173,116 B2 | 2/2007 | Fewell |
| 2004/0014645 A1 | 1/2004 | Draghia-Akli |
| 2004/0059285 A1 | 3/2004 | Mathiesen |
| 2004/0092907 A1 | 5/2004 | Mathiesen |
| 2005/0052630 A1 | 3/2005 | Smith |
| 2005/0070841 A1 | 3/2005 | Mathiesen |
| 2007/0128708 A1 | 6/2007 | Gamelin |
| 2010/0273660 A1 | 10/2010 | Zender et al. |
| 2011/0059502 A1 | 3/2011 | Chalasani |
| 2013/0280220 A1 | 10/2013 | Ahmed et al. |
| 2014/0068797 A1 | 3/2014 | Doudna |

(Continued)

FOREIGN PATENT DOCUMENTS

| | | |
|---|---|---|
| WO | 0129058 | 4/2001 |
| WO | 0196584 | 12/2001 |

(Continued)

OTHER PUBLICATIONS

Haeryfar SM, Hoskin DW. Thy-1: more than a mouse pan-T cell marker. J Immunol. Sep. 15, 2004;173(6):3581-8. doi: 10.4049/jimmunol.173.6.3581. PMID: 15356100. (Year: 2004).*

Liao HK, Hatanaka F, Araoka T, Reddy P, Wu MZ, Sui Y, Yamauchi T, Sakurai M, O'Keefe DD, Núñez-Delicado E, Guillen P, Campistol JM, Wu CJ, Lu LF, Esteban CR, Izpisua Belmonte JC. In Vivo Target Gene Activation via CRISPR/Cas9-Mediated Transepigenetic Modulation. Cell. Dec. 14, 2017 (Year: 2017).*

Wang X, Xu Z, Tian Z, Zhang X, Xu D, Li Q, Zhang J, Wang T. The EF-1α promoter maintains high-level transgene expression from episomal vectors in transfected CHO-K1 cells. J Cell Mol Med. Nov. 2017;21(11):3044-3054. doi: 10.1111/jcmm.13216. Epub May 30, 2017. PMID: 28557288; PMCID: PMC5661254. (Year: 2017).*

(Continued)

*Primary Examiner* — Fereydoun G Sajjadi
*Assistant Examiner* — Qinhua Gu
(74) *Attorney, Agent, or Firm* — Pabst Patent Group LLP

(57) ABSTRACT

The present invention includes dead-guide RNA (dgRNA) libraries and methods of use in immunology and immunotherapy thereof. Also provided are engineered primary or chimeric antigen receptor (CAR) T cells that overexpress Prodh2, Ccnblip1, Sreklip1, or Wdr37 or a fragment thereof, and methods of use in immunology and immunotherapy thereof.

19 Claims, 66 Drawing Sheets
Specification includes a Sequence Listing.

(56) References Cited

U.S. PATENT DOCUMENTS

| | | |
|---|---|---|
| 2015/0252358 A1 | 9/2015 | Maeder |
| 2016/0208243 A1 | 7/2016 | Zhang et al. |
| 2016/0375149 A1 | 12/2016 | Irvine |
| 2017/0204407 A1* | 7/2017 | Gilbert ............... C12N 15/1082 |
| 2017/0321214 A1* | 11/2017 | Zhang ................. C12N 15/115 |
| 2020/0085929 A1 | 3/2020 | Cooper et al. |
| 2021/0139583 A1 | 5/2021 | Jensen et al. |
| 2021/0388389 A1 | 12/2021 | Chen et al. |
| 2023/0302134 A1 | 9/2023 | Chen et al. |

FOREIGN PATENT DOCUMENTS

| | | | |
|---|---|---|---|
| WO | 2017127807 | A1 | 7/2017 |
| WO | 2017156484 | A1 | 9/2017 |
| WO | 2018051347 | | 3/2018 |
| WO | 2018068022 | A1 | 4/2018 |
| WO | 2019178225 | A2 | 9/2019 |
| WO | 2020028533 | A1 | 2/2020 |
| WO | 2020092057 | A1 | 5/2020 |

OTHER PUBLICATIONS

Kao R, Gschweng E, Lerman A, Larson S, Tu A, Tyagi T, Senadheera S, Hollis R, De Oliveira S, Systematic Comparison of the EF-1 Alpha Short (EFS) and Viral Promoters for Gene Modification of Human Primary Cells for Clinical Applications, Blood, vol. 124, Issue 21, 2014, p. 3497, ISSN 0006-4971 (Year: 2014).*

Milone MC, O'Doherty U. Clinical use of lentiviral vectors. Leukemia. Jul. 2018;32(7):1529-1541. doi: 10.1038/s41375-018-0106-0. Epub Mar. 22, 2018. PMID: 29654266; PMCID: PMC6035154. (Year: 2018).*

Anderson, et al., "Human Gene Therapy", Science, 256(5058):808-813 (1992).

Bray, et al., "Near-optimal RNA-Seq quantification", Nat. Biotechnol., 34(5):525-527 (2016).

Chong, et al., "MetaboAnalystR 2.0: From Raw Spectra to Biological Insights", Nuc. Acids. Res., 46(W1): W486-W494 (2018).

Cougot, et al., "Cap-tabolism", Trends in Biochem. Sci., 29(8):436-444 (2001).

Dahlman, et al., "Orthogonal gene knock out and activation with a catalytically active Cas9 nuclease", Nat. Biotechnol., 33(11): 1159-1161 (2015).

Elango, et al., "Optimized transfection of mRNA transcribed from a d(A/T) 100 tail-containing vector", Biochim. Biophys. Res. Commun., 330(3):958-966 (2005).

Ghosh, et al., "Design of liposomes for circumventing the reticuloendothelial cells", Glycobiology, 1(5):505-10 (1991).

Huang, et al., "Systematic and Integrative Analysis of Large Gene Lists Using DAVID Bioinformatics Resources", Nature Protocols, 4:44-57 (2009).

International Search Report for PCT/US2019/046691 dated Jan. 13, 2020.

Jiang, et al., "Signatures of T cell dysfunction and exclusion predict cancer immunotherapy response", Nat. Med., 24(10):1550-1558 (2018).

Kanehisa, et al., "KEGG: Kyoto Encyclopedia of Genes and Genomes", Nuc. Acids. Res., 28(1):27-30 (2000).

Kiani, et al., "Cas9 gRNA engineering for genome editing, activation and repression", Nat. Methods, 12(11):1051-1054 (2015).

Langmead, et al., "Ultrafast and memory-efficient alignment of short DNA sequences to the human genome", Genome Biol., 10(3):R25 (2009).

Nacheva, et al., "Preventing nondesired RNA-primed RNA extension catalyzed by T7 RNA polymerase", Eur. J. Biochem., 270(7):1485-65 (2003).

Pimentel, et al., "Differential analysis of RNA-seq incorporating quantification uncertainty", Nat. Methods, 14(7):687-690 (2017).

Schenborn, et al., "A novel transcription property of SP6 and T7 RNA polymerases: dependence on template structure", Nuc. Acids. Res., 13(17):6223-36 (1985).

Stepinski, et al., "Synthesis and properties of mRNAs containing the novel "anti-reverse" cap analogs 7-methyl(3'-O-methyl)GpppG and 7-methyl (3'-deoxy)GpppG", RNA, 7(10):1468-95 (2001).

Xia, et al., "MetaboAnalyst 3.0—making metabolomics more meaningful", Nuc. Acids. Res., 43(W1):W251-W257 (2015).

Xia, et al., "MetaboAnalyst: a web server for metabolomic data analysis and interpretation", Nuc. Acids. Res., 37:W652-660 (2009).

Ye, et al., "Programmable DNA repair with CRISPRa/i enhanced homology-directed repair efficiency with a single Cas9", Cell Discovery, 4:46, 12 pages (2018).

Yu, et al., "Progress towards gene therapy for HIV infection", Gene Therapy, 1(1):13_26 (1994). Abstract Only.

International Search Report received for PCT Patent Application No. PCT/US2019/057379, mailed on Feb. 18, 2020, 6 pages.

International Search Report received for PCT Patent Application No. PCT/US2021/045882, mailed on Dec. 7, 2021, 6 pages.

International Search Report received for PCT Patent Application No. PCT/US2023/064244, mailed on Jul. 13, 2023, 8 pages.

International Search Report received for PCT Patent Application No. PCT/US2023/074788, mailed on Mar. 21, 2024, 8 pages.

Barrett, et al., "Chimeric Antigen Receptor Therapy for Cancer", Annual Review of Medicine, vol. 65, No. 1, Jan. 14, 2014, pp. 333-347.

Dai, et al., "One-step generation of modular CAR-T cells with AAV-Cpf1", Nature Methods, Nature Pub. Group, New York, vol. 16, No. 3, Feb. 25, 2019, pp. 247-254.

Hale, et al., "Homology-Directed Recombination for Enhanced Engineering of Chimeric Antigen Receptor T Cells", Molecular Therapy—Methods & Clinical Development, vol. 4, 2017, pp. 192-203.

Izsvak, et al., "Sleeping Beauty Transposition: Biology and Applications for Molecular Therapy", Molecular Therapy, Elsevier Inc, US, vol. 9, No. 2, Feb. 1, 2004, pp. 147-156.

Peng, et al., "Perturbomics of tumor-infiltrating NK cells", bioRxiv, 2023.03.14.532653, Mar. 15, 2023, 62 pages.

Ruella, et al., "Dual CD19 and CD123 targeting prevents antigen-loss relapses after CD19-directed immunotherapies", Journal of Clinical Investigation, vol. 126, No. 10, Oct. 3, 2016, pp. 3814-3826.

Scholz, et al., "Langerhans Cells Suppress CD49a+ NK Cell-Mediated Skin Inflammation", J Immunol., vol. 195, No. 5, 2015, pp. 2335-2342.

Tipanee, et al., "Transposons: Moving Forward from Preclinical Studies to Clinical Trials", Human Gene Therapy, vol. 28, No. 11, Nov. 1, 2017, pp. 1087-1104.

Zetsche, et al., "Multiplex gene editing by CRISPR-Cpf1 using a single crRNA array", Nature Biotechnology, vol. 35, No. 1, 2017, 6 pages.

* cited by examiner

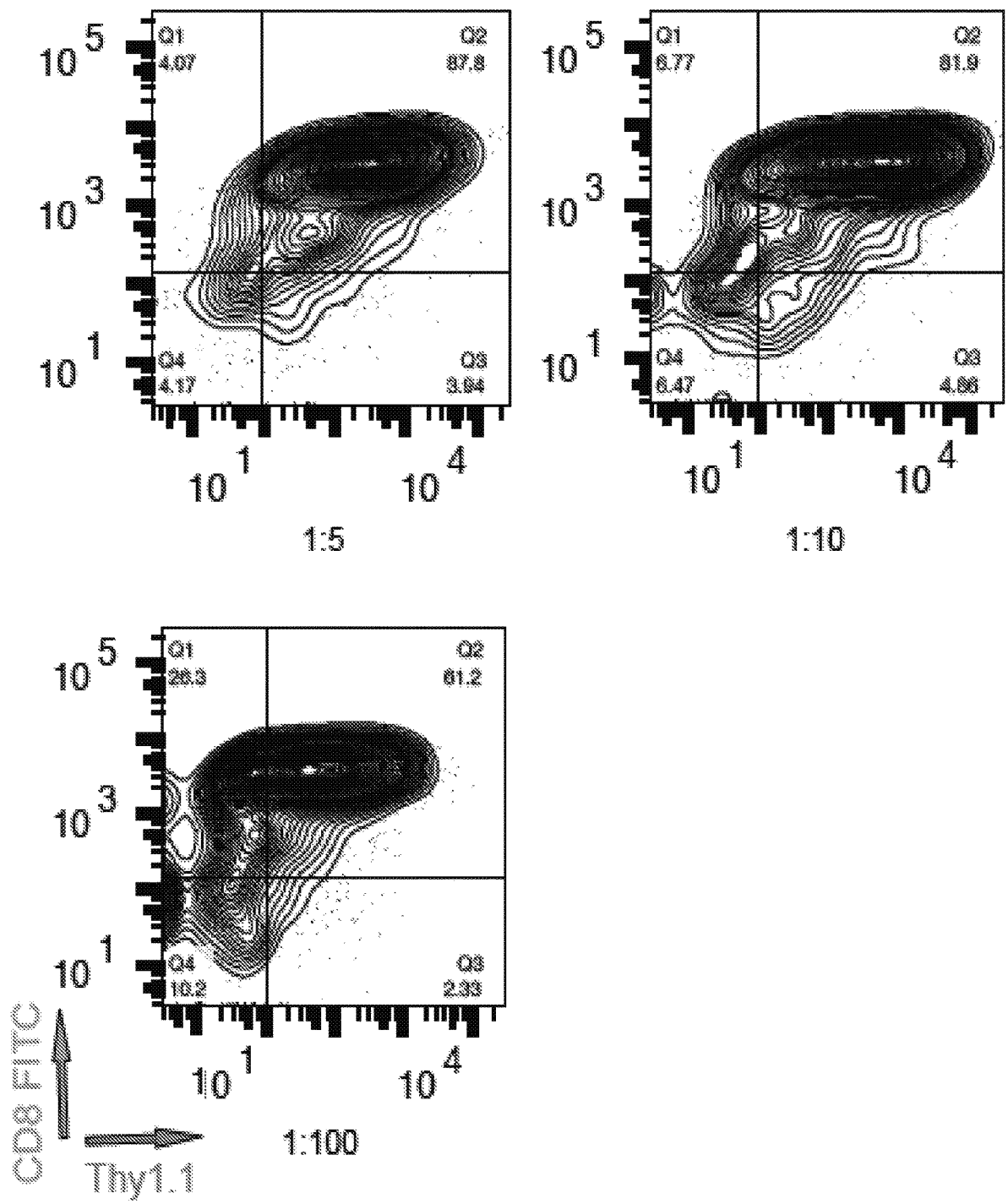
FIG. 4D, Continued

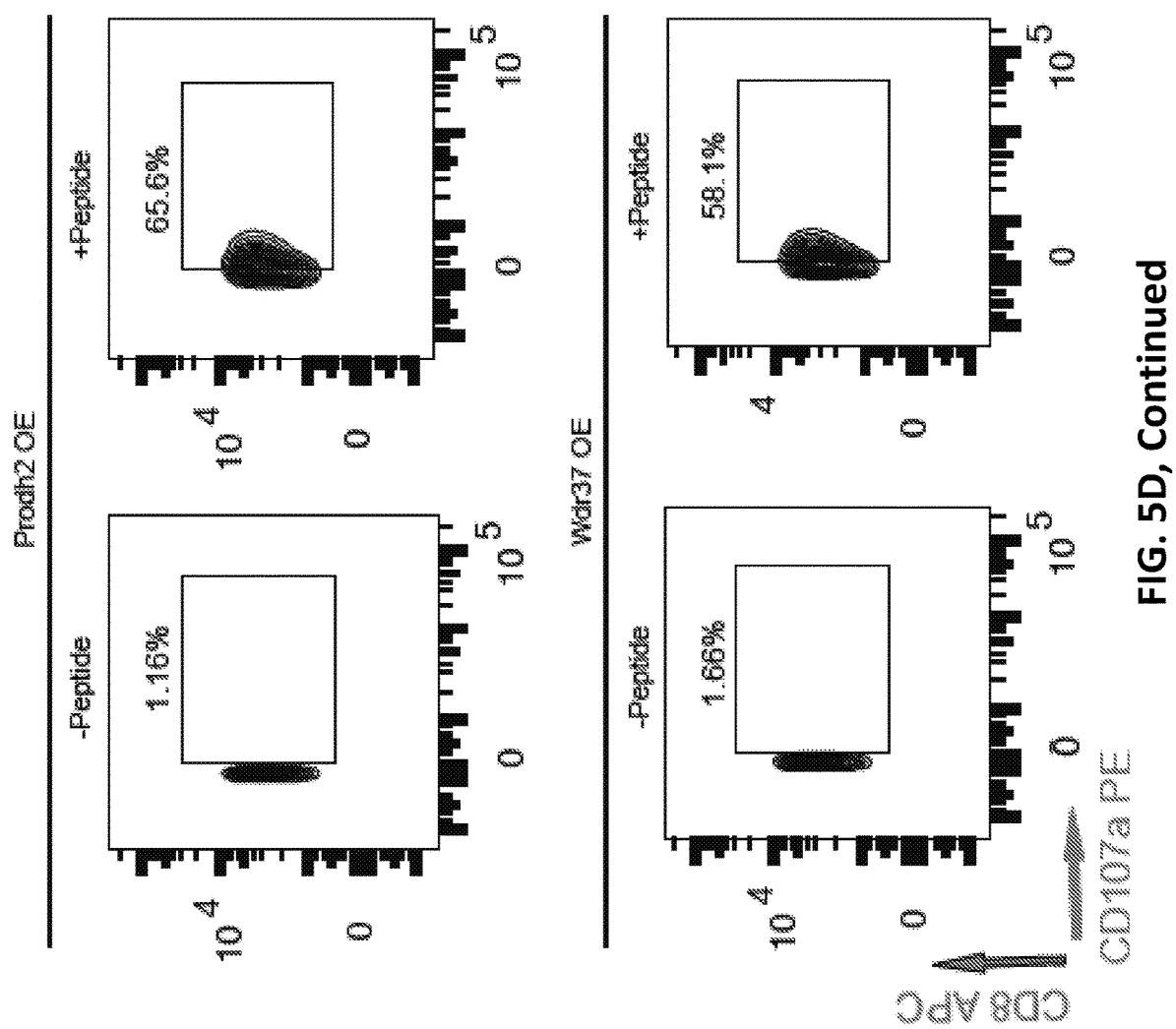
FIG. 5D, Continued

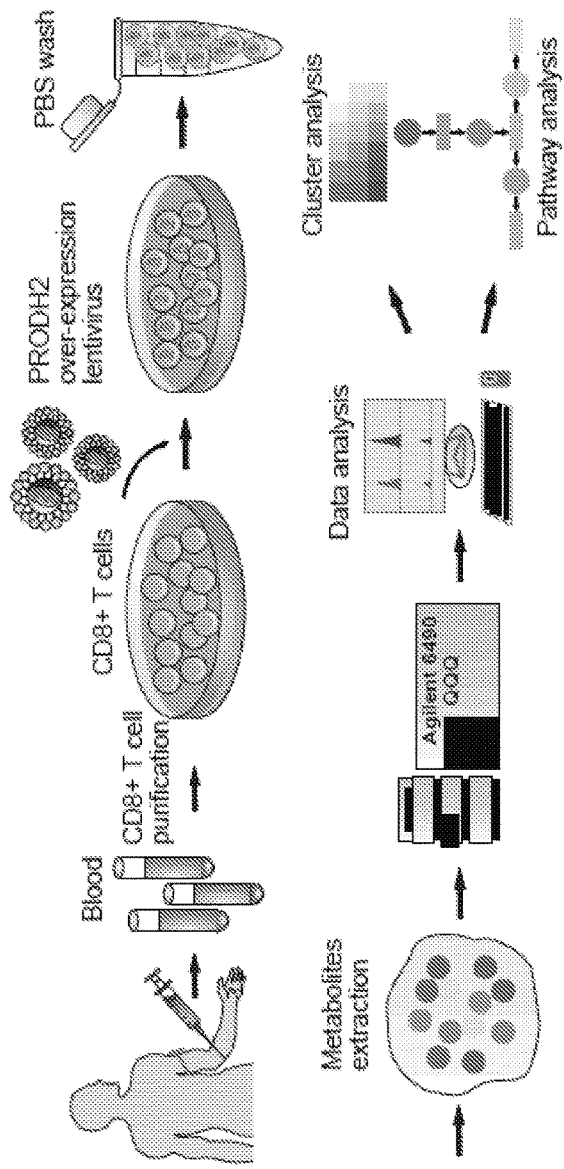
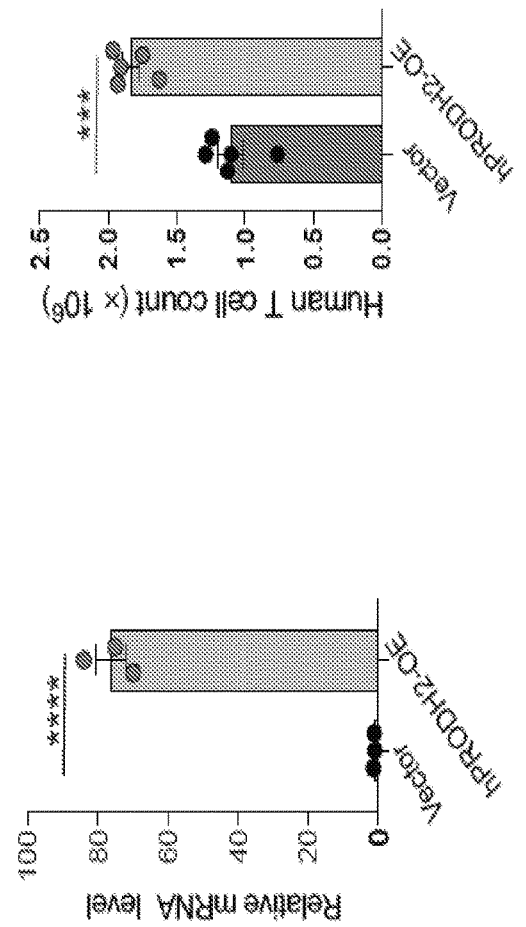
FIG. 8A
FIG. 8B
FIG. 8C

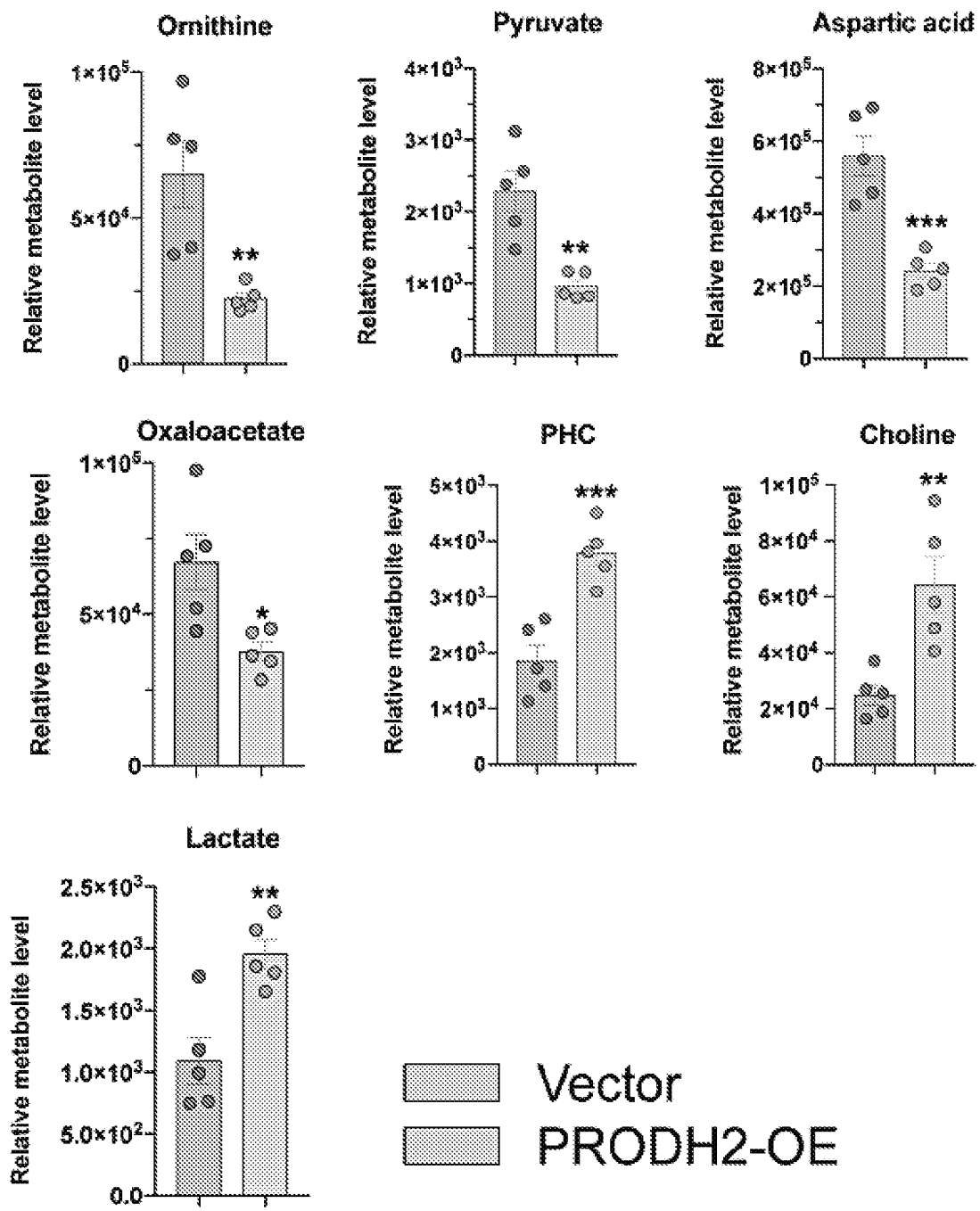
FIG. 8D, Continued

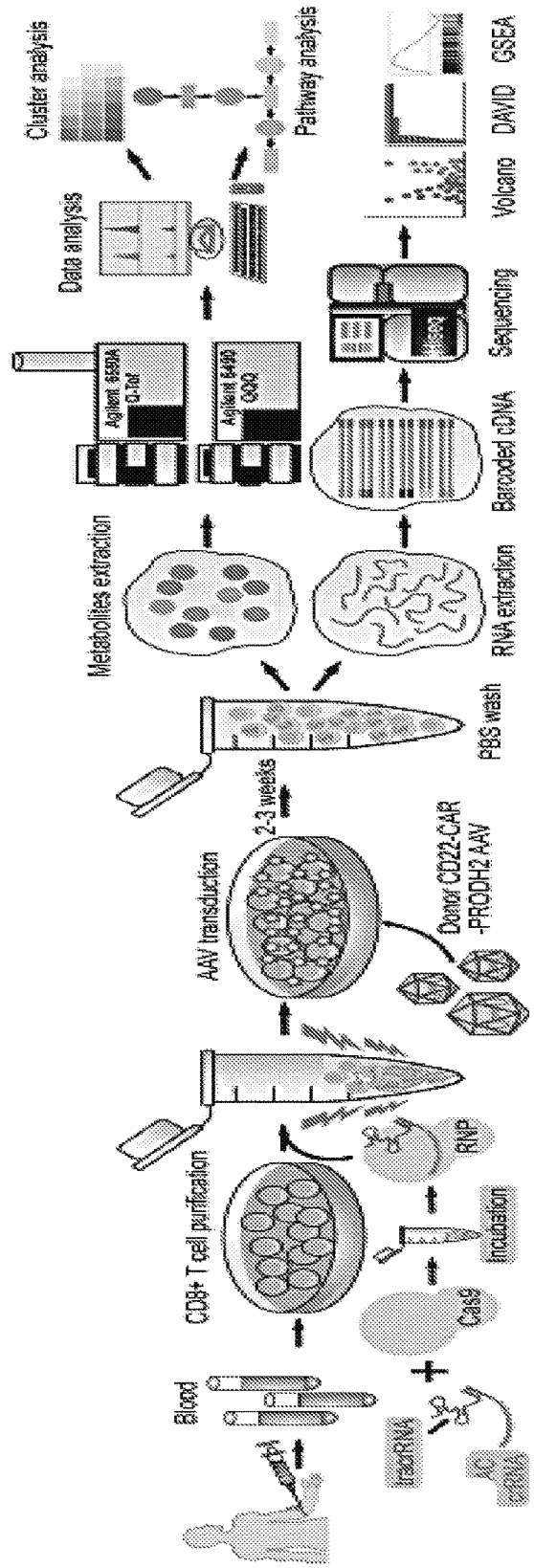
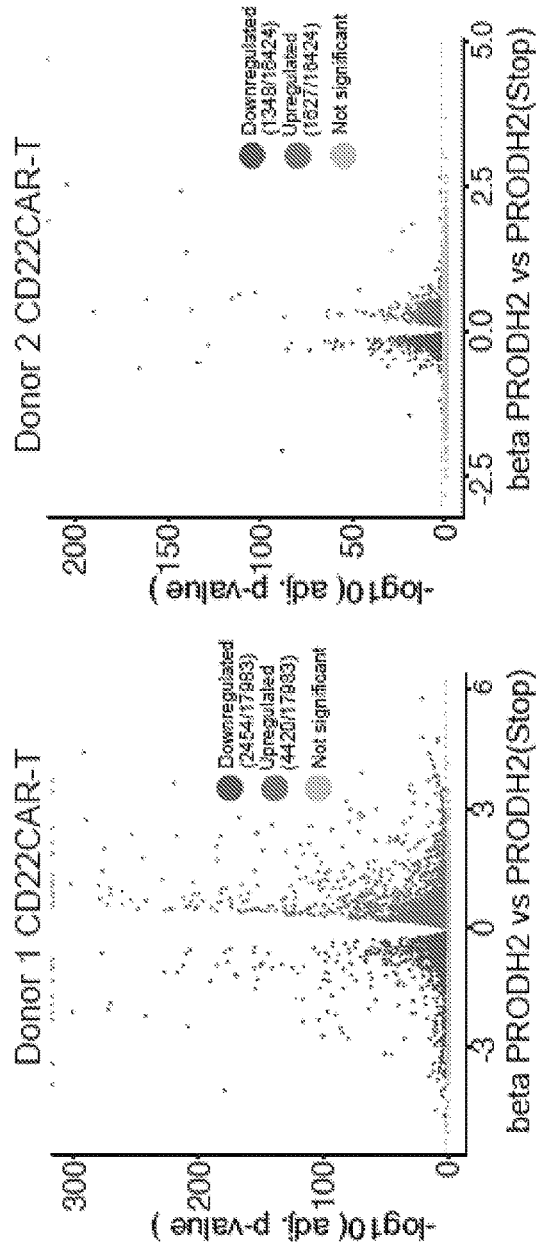
FIG. 10A
FIG. 10B

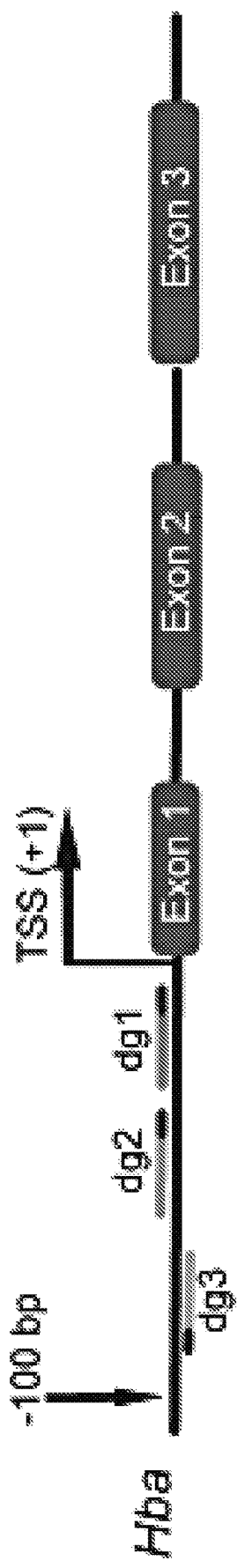
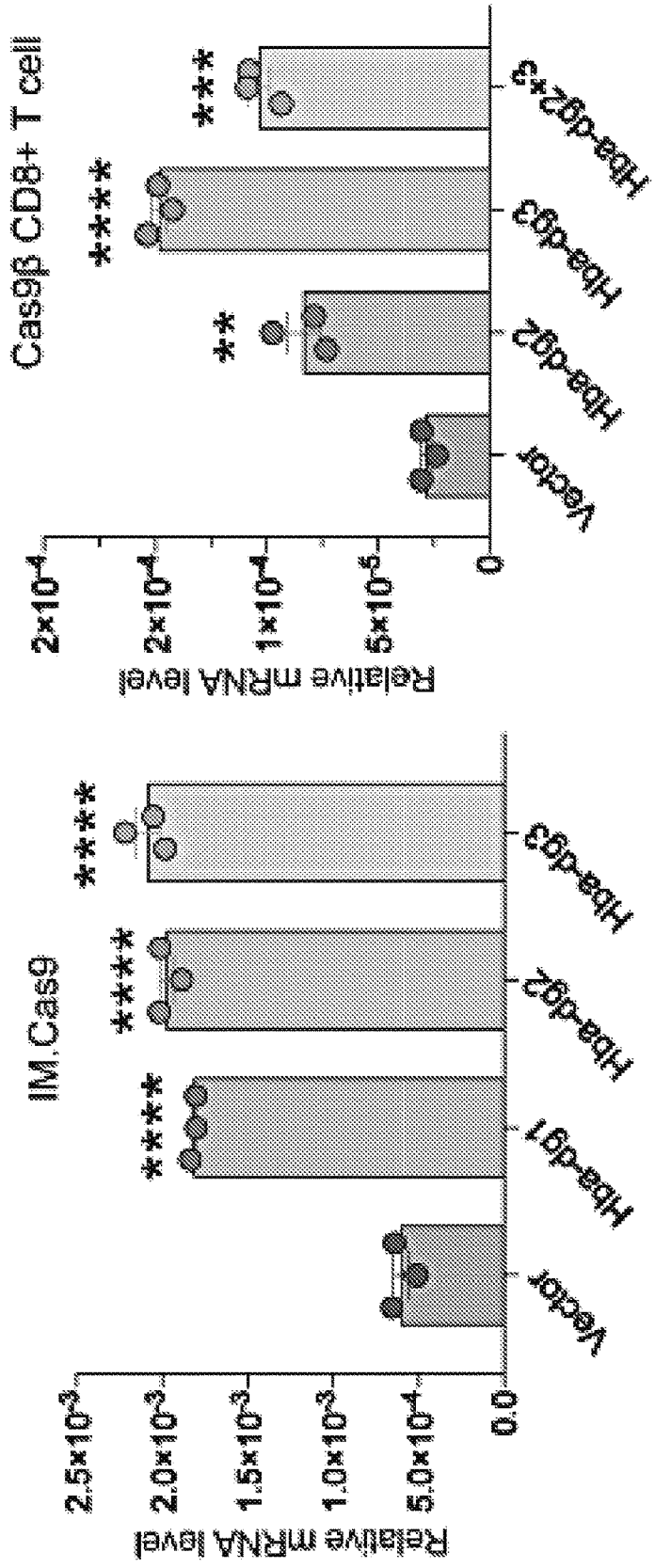
FIG. 12A
FIG. 12B
FIG. 12C

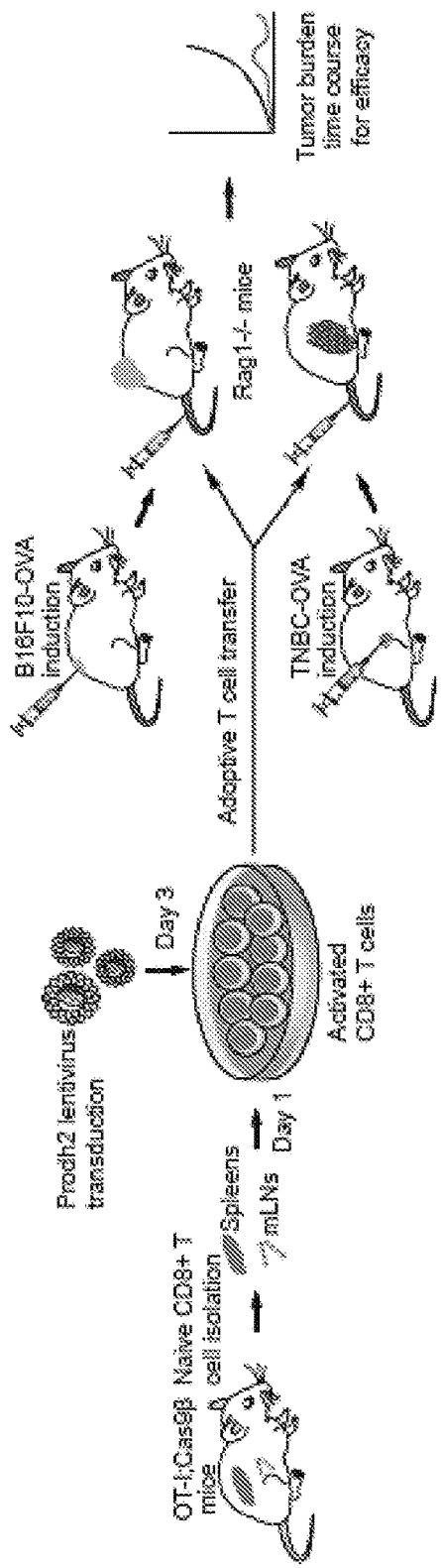
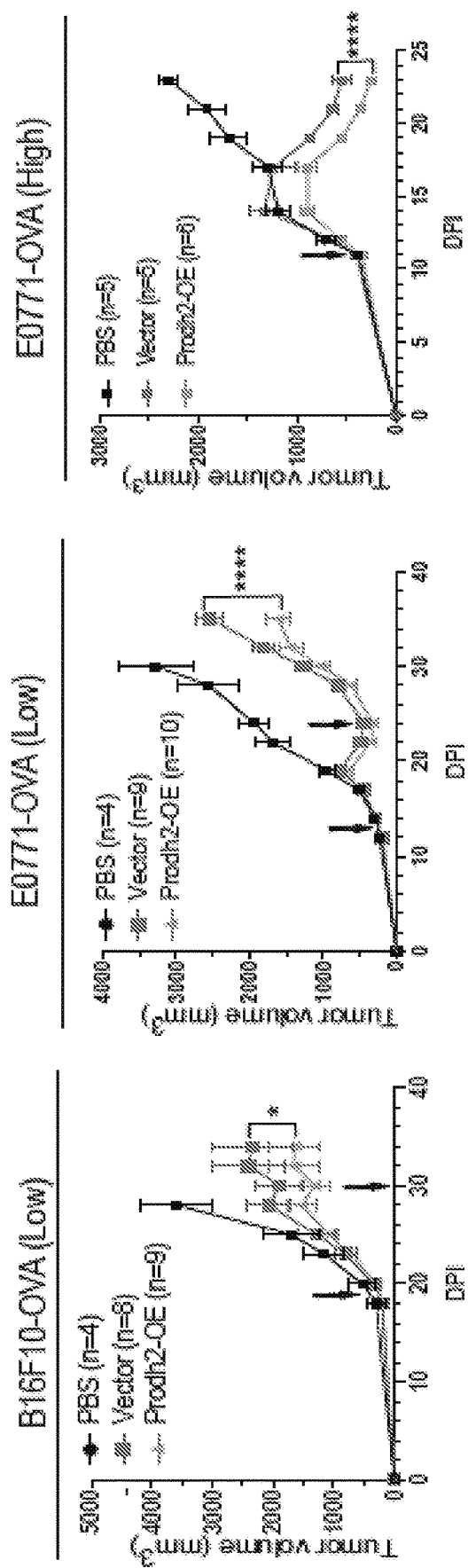
FIG. 15A
FIG. 15B
FIG. 15C
FIG. 15D

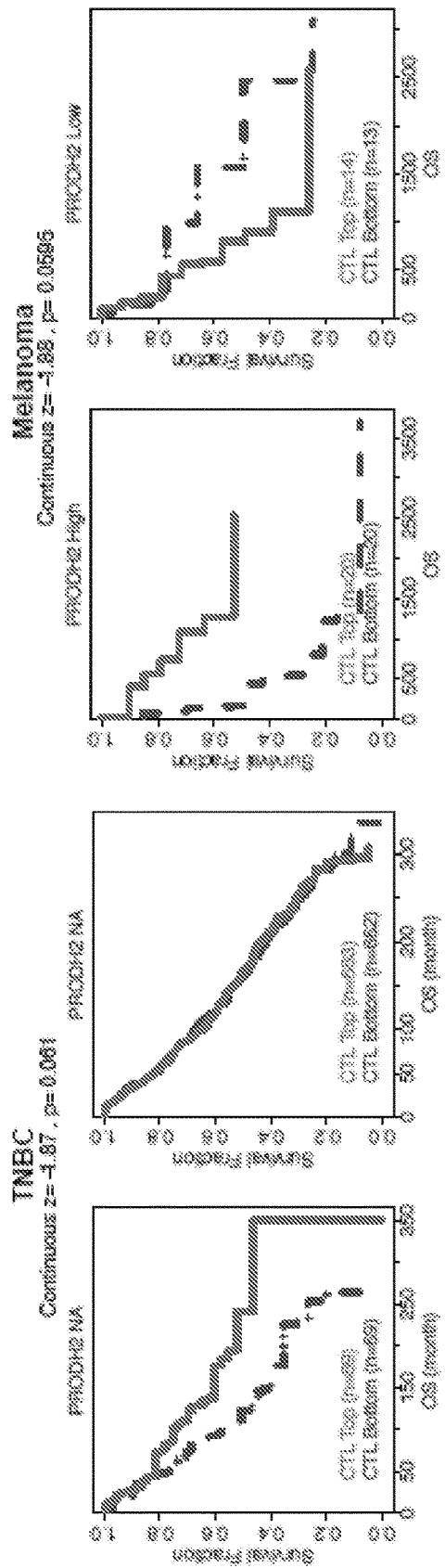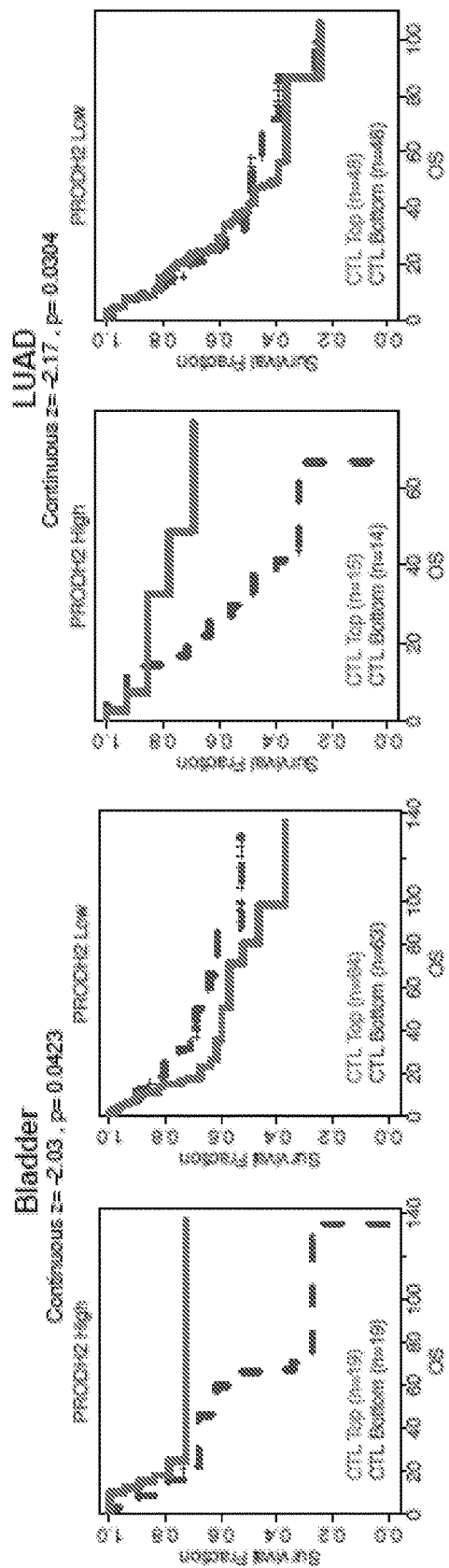
FIG. 16A
FIG. 16B
FIG. 16C
FIG. 16D

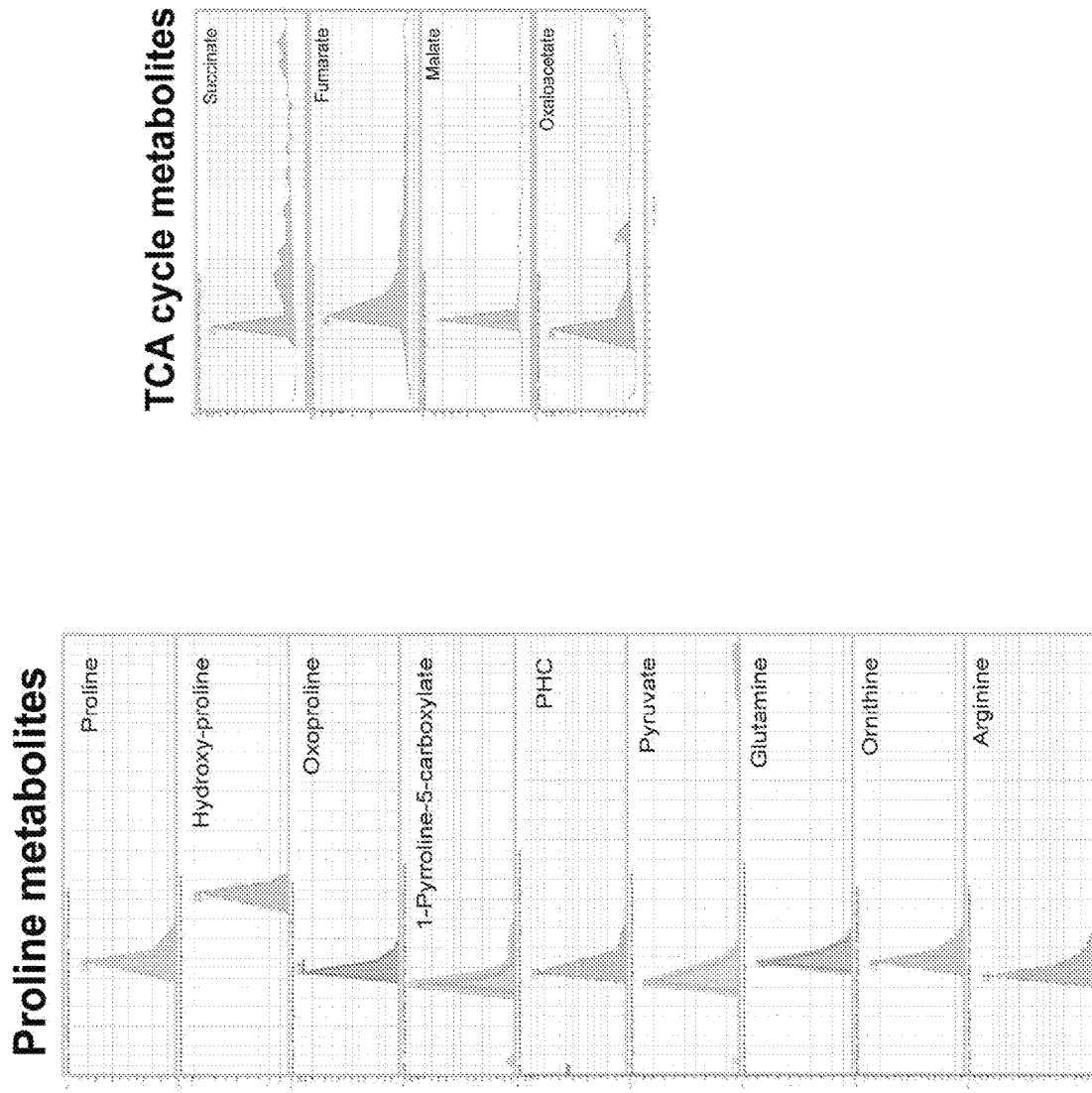
FIG. 17, Continued

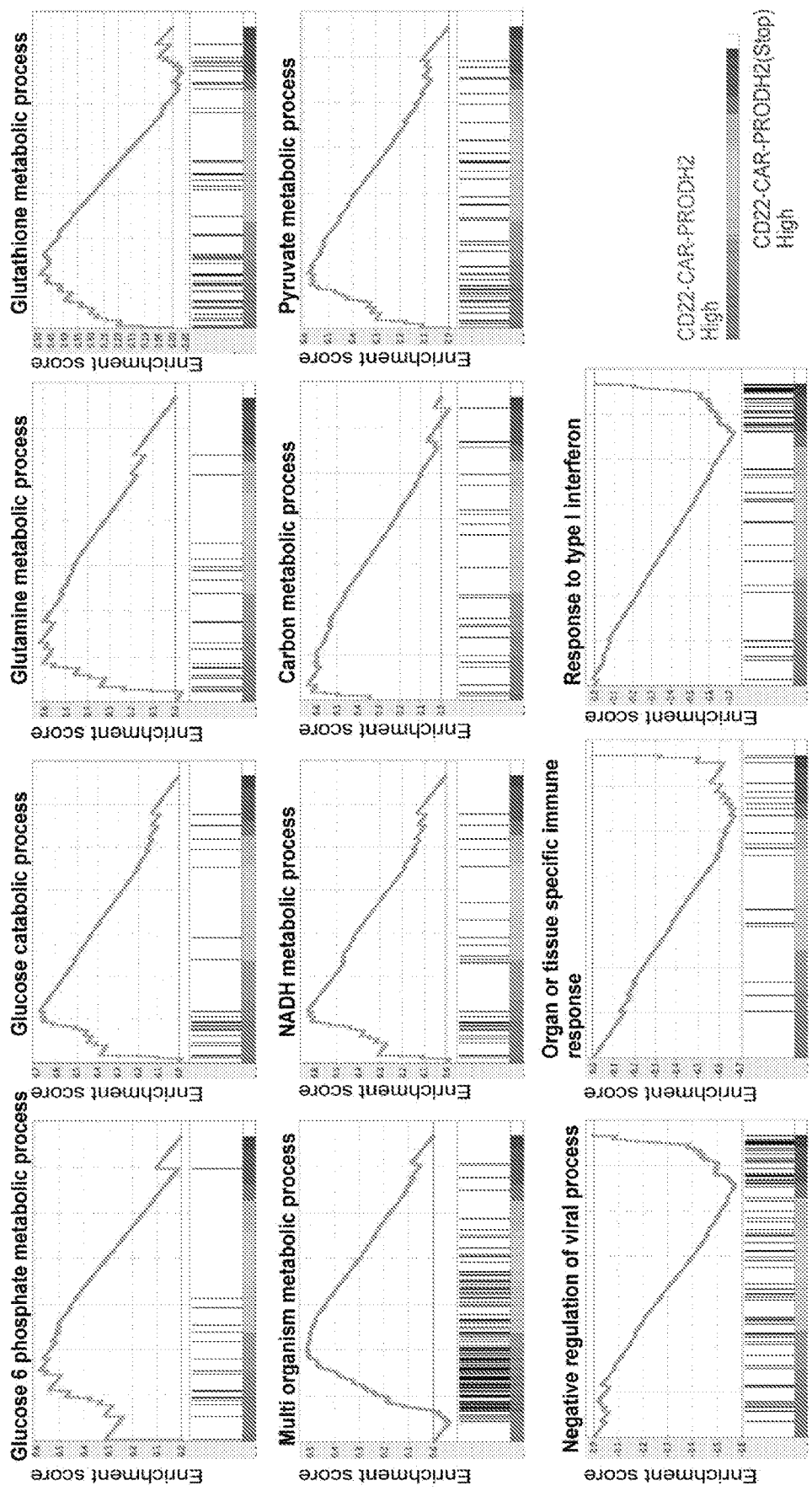
FIG. 19, Continued

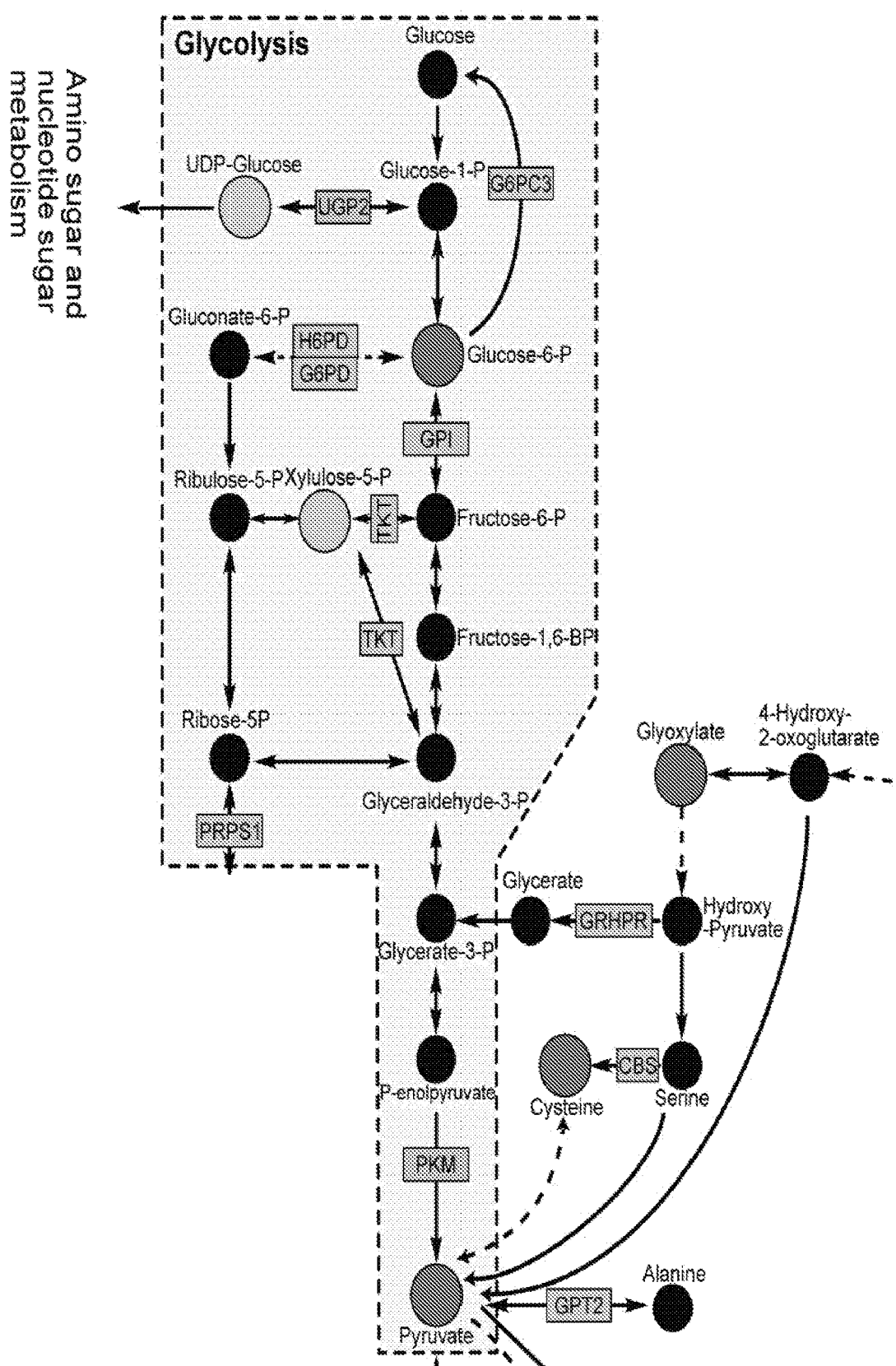
FIG. 21, Continued

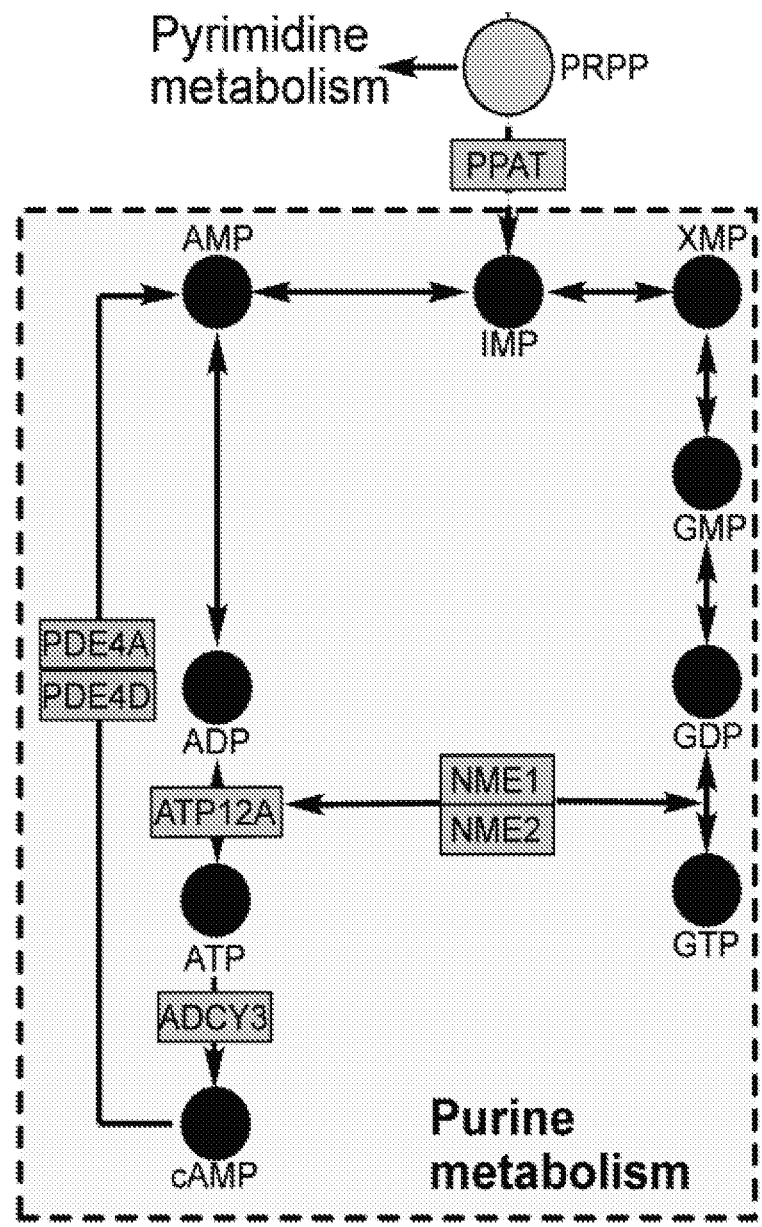
FIG. 21, Continued

COMPOSITIONS AND METHODS FOR HIGH-THROUGHPUT ACTIVATION SCREENING TO BOOST T CELL EFFECTOR FUNCTION

CROSS-REFERENCE TO RELATED APPLICATIONS

The present application is a 35 U.S.C. § 371 national phase application from, and claiming priority to, International Application No. PCT/US2019/046691, filed Aug. 15, 2019, which is entitled to priority under 35 U.S.C. § 119 (e) to U.S. Provisional Patent Application No. 62/719,205, filed Aug. 17, 2018, and U.S. Provisional Patent Application No. 62/824,514, filed Mar. 27, 2019, each of which are hereby incorporated by reference in their entireties herein.

STATEMENT REGARDING FEDERALLY SPONSORED RESEARCH OR DEVELOPMENT

This invention was made with government support under CA209992, CA231112 and CA238295 awarded by the National Institutes of Health. The government has certain rights in the invention.

BACKGROUND OF THE INVENTION $CD8^+$ T cells play a critical role in anti-tumor and anti-viral immunity because of their ability to secrete pro-inflammatory cytokines and their elaborate cytotoxic functions after detecting antigens bound to MHC class I proteins presented by antigen presenting cells (APCs). However, T cell-mediated cytotoxicity can be abolished by multiple cancer-immune mechanisms, such as reduced or lost antigen presentation, generation of an immune-suppressive tumor environment, heightened expression of immune checkpoint proteins, and T cell exhaustion. Therefore, it is important to identify genetic targets that can directly boost effector function in $CD8^+$ T cells.

To date, all genetic screens in cancer immunology are based on loss-of-function (LOF), particularly for the identification of key regulators of T cell differentiation and for modulators of cancer immunotherapy using RNA interference (RNAi) or CRISPR/Cas9 technologies. In contrast, gain-of-function (GOF) screens in cancer immunology have remained completely unexplored thus far. Thus, it is of significant clinical interest to identify specific genes that will augment the anti-tumor function of immune cells when overexpressed. However, such a screen has not been performed in T cells, perhaps due to technical challenges in genetic manipulation of primary T lymphocytes.

A need exists for compositions and methods for high-throughput activation screening to identify gain-of-function targets for enhancement of $CD8^+$ T cell activity against cancer. The present invention satisfies this need.

SUMMARY OF THE INVENTION

As described herein, the present invention relates to compositions and methods for high-throughput activation screening to boost T cell (e.g. $CD8^+$) effector function.

In one aspect, the invention includes a vector comprising a first promoter, a dgRNA expression cassette, a MS2-loop-containing chimeric backbone sequence, a second promoter, and a cassette expressing a fusion protein of Thy 1.1 and one or more transcription activators.

In some embodiments, one or more transcription activators are selected in the vector from the group consisting of MS2 bacteriophage coat protein (MCP), transcription factor p65 (P65), and heat shock factor 1 (HSF1). In further embodiments, the vector further comprises one or more additional components selected from the group consisting of an LTR seqeunce, aT2A sequence, a linker sequence, an NLS sequence, and a short PA sequence. In further embodiments the first promoter of the vector is a U6 promoter and/or the second promoter is an EFS promoter.

In some embodiments, the dgRNA expression cassette and the MS2-loop-containing chimeric backbone of the vector are driven by the U6 promoter (e.g., U6-dgRNA-MS2). In further embodiments, the cassette expressing a fusion protein of Thy 1.1 and at least one transcription activator is driven by an EFS promoter (e.g., EFS-Thy 1.1-MPH).

In some embodiments, the vector is a lentiviral vector. In further embodiments, the vector comprises SEQ ID NO: 84,602.

In one aspect, the invention includes a non-naturally occurring or engineered dgRNA library comprising a plurality of nucleic acids comprising one or more nucleotide sequences selected from the group consisting of SEQ ID NOs. 1-83,601.

In one aspect, the invention includes a non-naturally occurring or engineered dgRNA library comprising a plurality of nucleic acids comprising one or more nucleotide sequences consisting of the nucleotide sequences of SEQ ID NOs. 1-83,601.

In one aspect, the invention includes a lentiviral library comprising a plurality of vectors, wherein each vector comprises an expression cassette for a dgRNA comprising a nucleotide sequence selected from the group consisting of SEQ ID NOs. 1-83,601.

In some embodiments, one or more of the plurality of vectors of the lentiviral library comprises SEQ ID NO: 84,602.

In various embodiments of the aspects found elsewhere herein or any other aspect of the invention delineated herein, the engineered immune cell comprises the vector of any one of the preceding aspects.

In some embodiments, the cell is selected from the group consisting of a T cell, a primary cell, a $CD8^+$ cell, a $CD4^+$ cell, a T regulatory (Treg) cell, and a CAR-T cell. In further embodiments, the cell is selected from other types of T cells.

Another aspect of the invention includes a method of designing a non-naturally occurring or engineered dgRNA library comprising: identifying protein coding genes in a genome in silico, extracting 250 bp sequences upstream of the protein coding genes, identifying 18mer dgRNA spacer sequences (15mer-NGG), aligning the identified 18mers to the genome, discarding sequences with a mismatch at position 17 or 18 in in the 18mer, scoring each alignment based on the number of mismatches, disgarding sequences with a high mismatch score, and from the remaining sequences, and selecting dgRNA spacer sequences based on the shortest distance to the −200 position from the transcriptional start site.

Another aspect of the invention includes a method of generating a non-naturally occurring or engineered dgRNA library comprising: identifying protein coding genes in a genome in silico, extracting 250 bp sequences upstream of the protein coding genes, identifying 18mer dgRNA spacer sequences (15mer-NGG), aligning the identified 18mers to the genome, discarding sequences with a mismatch at position 17 or 18 in in the 18mer, scoring each alignment based on the number of mismatches, disgarding sequences with a high mismatch score, and from the remaining sequences, selecting dgRNA spacer sequences based on the shortest distance to the −200 position from the transcriptional start site, synthesizing oligonucleotides based on the selected dgRNA spacer sequences, cloning the oligonucleotides into a vector, and packaging the vector into a lentiviral library.

In some embodiments, the scoring comprises use of the formula: (# of 0 mismatch alignments*1000)+ (#of 1 mismatch alignments*50)+ (#of 2 mismatch alignments*1), wherein when the mismatch score>=2000, the sequence is discarded.

Another aspect of the invention includes a cell comprising a non-naturally occurring or engineered dgRNA library, wherein the dgRNA library is designed or generated by any one of the preceding methods.

Another aspect of the invention includes a method of identifying a genetic target that boosts T cell effector function, the method comprising: administering a composition comprising a Cas9 and a lentiviral dgRNA library to a naïve T cell, wherein the library comprises a plurality of vectors, wherein each vector comprises an expression cassette for a dgRNA, activating the T cell, incubating the activated T cell with a diseased cell or cancer cell, and measuring the T cell for degranulation, wherein when degranulation is increased relative to a control sample, the T cell is sequenced and a genetic target is identified.

In some embodiments, the T cell is selected from the group consisting of a primary cell, a CD8+ cell, a CD4+ cell, a T regulatory (Treg) cell, and a CAR-T cell.

In some embodiments, one or more dgRNAs of the library comprise a nucleotide sequence selected from the group consisting of SEQ ID NOs. 1-83,601.

In some embodiments, the dgRNA library comprises the nucleotide sequences consisting of SEQ ID NOs. 1-83,601.

Another aspect of the invention includes a method of treating a disease in a subject in need thereof, the method comprising: administering a composition comprising a Cas9 and a dgRNA lentiviral library to an immune cell from the subject, wherein the library comprises a plurality of vectors, wherein each vector comprises an expression cassette for a dgRNA, incubating the immune cell with a diseased cell from the patient, identifying one or more genes that increase degranulation in the immune cell when incubated with the diseased cell, treating the subject with an agonist to the one or more identified genes or gene products thereof.

In one aspect of the invention, the immune cell is selected from the group consisting of a T cell, a primary cell, a CD8+ cell, a CD4+ cell, a T regulatory (Treg) cell, and a CAR-T cell.

In some embodiments, the disease is cancer and the diseased cell is a cancer cell. In some embodiments, the identifying comprises sequencing the immune cell if degranulation is increased relative to a control sample.

In some embodiments, one or more dgRNAs of the library comprise a nucleotide sequence selected from the group consisting of SEQ ID NOs. 1-83,601.

In some embodiments the dgRNA library comprises the nucleotide sequences consisting of SEQ ID NOs. 1-83,601.

Another aspect of the invention includes a method of treating a disease in a subject in need thereof, the method comprising: administering a composition comprising Cas9 and a dgRNA lentiviral vector to an immune cell, wherein the vector comprises a dgRNA that targets one or more genes selected from the group consisting of Prodh2, Ccnblip1, Sreklip1, or Wdr37; and administering the immune cell to the subject.

In one aspect of the invention, the immune cell is selected from the group consisting of a T cell, a primary cell, a CD8+ cell, a CD4+ cell, a T regulatory (Treg) cell, and a CAR-T cell.

In some embodiments, the disease is cancer.

Another aspect of the invention includes a method of activating degranulation in an immune cell in a subject, the method comprising: administering a composition comprising Cas9 and a dgRNA lentiviral vector to the immune cell from the subject, wherein the vector comprises a dgRNA that targets one or more genes selected from the group consisting of Prodh2, Ccnblip1, Sreklip1, or Wdr37.

In one aspect of the invention, the immune cell is selected from the group consisting of a T cell, a primary cell, a CD8 cell, a CD4+ cell, a T regulatory (Treg) cell, and a CAR-T cell.

In some embodiments, the dgRNA comprises one or more nucleotide sequences selected from the group consisting of SEQ ID NOs. 55,168-55,171, SEQ ID NOs. 79,364-79,367, SEQ ID NOs. 55,044-55,047; SEQ ID NOs. 55,671-55,674, SEQ ID NOs. 25,546-25,549, and SEQ ID NOs. 34,631-34,634.

Another aspect of the invention includes a method of treating cancer in a subject in need thereof, the method comprising: administering to the subject a therapeutically effective amount of a pharmaceutical composition comprising an agonist of one or more genes or gene products thereof selected from the group consisting of Prodh2, Ccnblip1, Sreklip1, or Wdr37.

Another aspect of the invention includes a method of activating degranulation in a CD8+ T cell in a subject, the method comprising: administering to the subject a therapeutically effective amount of a pharmaceutical composition comprising an agonist of one or more genes or gene products thereof selected from the group consisting of Prodh2, Ccnblip1, Sreklip1, or Wdr37.

Another aspect of the invention includes an engineered immune cell, wherein one or more genes or gene products thereof selected from the group consisting of Prodh2, Ccnblip1, Sreklip1, or Wdr37 has been activated.

In one aspect, the the gene or gene product that has been activated is Prodh2.

In some embodiments, the cell is selected from the group consisting of a primary cell, a CD8+, a CD4+, a T regulatory (Treg) cell, and a CAR-T cell.

In some embodiments, the activation of the gene within the engineered immune cell occurs through use of a dgRNA library and a Cas9.

In some embodiments, one or more dgRNAs of the engineered immune cell comprise a nucleotide sequence selected from the group consisting of SEQ ID NOs. 1-83, 601.

In some embodiments, the dgRNA library comprises the nucleotide sequences consisting of SEQ ID NOs. 1-83,601.

Another aspect of the invention includes a kit comprising Cas9 and a dgRNA lentiviral library, wherein the library comprises a plurality of vectors, wherein each vector comprises an expression cassette for a dgRNA, and instructions for use thereof.

In some embodiments, one or more dgRNAs of the library comprise a nucleotide sequence selected from the group consisting of SEQ ID NOs. 1-83,601.

In some embodiments, the dgRNA library comprises the nucleotide sequences consisting of SEQ ID NOs. 1-83,601.

Another aspect of the invention includes an engineered immune cell comprising a vector encoding one or more genes or gene products thereof selected from the group consisting of Prodh2, Ccnblip1, Sreklip1, Wdr37 or a fragment thereof.

In one aspect, the gene or gene product thereof is Prodh2.

In some embodiments the vector is a lentiviral vector or an adenoviral vector.

In some embodiments, the vector further comprises a promoter.

In some embodiments, the engineered immune cell further comprises a chimeric antigen receptor (CAR).

In some embodiments, the CAR of the engineered immune cell further comprises an antigen binding domain, a transmembrane domain, and an intracellular domain.

In some embodiments, the antigen binding domain binds CD22.

In some embodiments, the immune cell further comprises a co-stimulatory domain.

Another aspect of the invention includes an engineered immune cell, wherein the cell is selected from the group consisting of a primary cell, a CD8$^+$, a CD4$^+$, a T regulatory (Treg) cell, and a CAR-T cell.

Another aspect of the invention includes a vector comprising a promoter, a CAR expression cassette and a nucleic acid sequence encoding Prodh2, Ccnblip1, Sreklip1, Wdr37 or a fragment thereof.

In some embodiments, the nucleic acid sequence of the vector encodes Prodh2.

In some embodiments, the vector further comprises a T2A sequence and/or a short PA sequence.

In some embodiments, the vector further comprises a TRAC locus homology-directed repair (HDR) 5' arm and a TRAC locus HDR 3' arm.

In another aspect, the engineered immune cell comprises the vector of any one of preceding aspects.

In another aspect, the invention includes a composition comprising the engineered immune cell of the preceding aspect.

In another aspect, the invention includes a method of treating a disease in a subject in need thereof, the method comprising: administering to the subject a therapeutically effective amount of the engineered cell the preceding aspects.

In another aspect, the invention includes a method of generating an engineered immune cell comprising introducing into the immune cell the vector of any one the preceding aspects.

In some embodiments, the method further comprises introducing into the immune cell a CRISPR system.

In some embodiments, the vector of the method is inserted in the TRAC locus by HDR repair mediated by the CRISPR system.

Another aspect of the invention includes a method of treating a disease in a subject in need thereof, the method comprising: administering to the subject a therapeutically effective amount of a composition comprising a recombinant PRODH2, CCNBlIP1, SREKlIP1, or WDR37 peptide or a fragment thereof.

In some embodiments, the disease is cancer or an immunological disorder or disease.

In some embodiments, the cancer is a leukemia.

In some embodiments, the leukemia is Acute Lymphocytic Leukemia (ALL).

Another aspect of the invention includes a method of altering primary T cell metabolism in a subject in need thereof, the method comprising: administering to the subject a therapeutically effective amount of a composition comprising a recombinant PRODH2 peptide or a fragment thereof.

Another aspect of the invention includes a method of altering a phenotype of a primary T cell in a subject in need thereof, the method comprising: administering to the subject a therapeutically effective amount of a composition comprising a recombinant PRODH2 peptide or a fragment thereof.

Another aspect of the invention includes a method of altering an anti-tumor function of a primary T cell in a subject in need thereof, the method comprising: administering to the subject a therapeutically effective amount of a composition comprising a recombinant PRODH2 peptide or a fragment thereof.

Another aspect of the invention includes a method of altering CAR-T cell metabolism in a subject, the method comprising: administering a therapeutically effective amount of a recombinant PRODH2 peptide or a fragment thereof to a subject having received CAR-T therapy.

Another aspect of the invention includes a method of altering a phenotype of a CAR-T cell in a subject, the method comprising: administering a therapeutically effective amount of a recombinant PRODH2 peptide or a fragment thereof to a subject having received CAR-T therapy.

Another aspect of the invention includes a method of altering CAR-T cell anti-tumor function in a subject, the method comprising: administering a therapeutically effective amount of a recombinant PRODH2 peptide or a fragment thereof to a subject having received CAR-T therapy.

BRIEF DESCRIPTION OF THE DRAWINGS

The following detailed description of specific embodiments of the invention will be better understood when read in conjunction with the appended drawings. For the purpose of illustrating the invention, there are shown in the drawings exemplary embodiments. It should be understood, however, that the invention is not limited to the precise arrangements and instrumentalities of the embodiments shown in the drawings.

FIG. 1A illustrates a dead-guide RNA (dgRNA) activation lentiviral vector (TdgA), which contains a human U6 promoter, a dgRNA scaffold, and Thy1.1-MPH (MCP-p65-HSF1) expression cassette driven by an EFS promoter. FIG. 1B illustrates a mouse genome-scale dead-guide RNA library (mm10dgLib), which was designed by identifying all 15-bp spacers in the protein coding gene promoters and ranking based on off-target scores. Top 4 dgRNAs were chosen for each transcript, except the ones without enough scoring dgRNAs that passed the same criteria. The library was pool-synthesized and cloned into TdgA vector for CD8$^+$ T cell activation screening. FIG. 1C shows mm10dgLib composition analysis. Most coding transcripts (19,440/26,205) have 4 dgRNAs. Small portions of coding transcripts only have ≤3 dgRNAs that passed the same criteria (3,814, 1,010, 992 and 949 transcripts have 0, 1, 2, 3 dgRNAs, respectively). FIG. 1D shows mm10dgLib plasmid library representation analysis. 82,197/83,601 (98.3%) of gene-targeting spacers (GTSs) and 988/1,000 (98.8%) of NTCs were successfully cloned. Both GTSs and NTCs in the mm10dgLib showed a log-normal distribution.

FIG. 2A is a schematic illustrating genome-scale dgRNA library based CD8+ T cell kill assay activation screen (dgTKS) to identify essential genes for the effector function of CD8+ T cells. The main procedure includes naïve CD8+ T cell isolation, mm10dgLib transduction, kill assay (CD8+ T cell degranulation), CD8+; CD107a+ T cell sorting, genomic DNA preparation, dgRNA library readout, and dgRNAs enrichment. FIG. 2B shows representative flow cytometry results of kill assays. FACS gating plot showing the fraction of CD107a+ cells among all CD8+ cells in vector and mm10dgLib transduced CD8+ T cells co-culture with E0771 cancer cells pulsed with ovalbumin 257-264 (SIIN-FEKL) peptide (SEQ ID NO. 84,614). (Vector vs mm10dgLib, p=0.000866). Two-tailed, unpaired t test was used to assess the significance. FIG. 2C is a scatterplot of relative dgRNA abundance in the entire mm10dgLib library, with CD107a+-high FACS sorted CD8+ T cells, as compared to unsorted T cells. Blue dots are NTCs; brown dots are scoring GTSs that passed FDR 0.1% cutoff, with gene name labeled; orange dots are scoring GTSs that passed FDR 0.2% cutoff but did not pass FDR 0.1%; grey dots are remaining GTSs. Black dashed regression line of 1,000 NTCs represents a neutral baseline. GTSs deviating from the baseline showed enrichment in the CD107a+-high FACS as compared to the behavior of NTCs. FIG. 2D is a dotted waterfall plot of mm 10dgLib library differentials between the CD107a+-high FACS sorted CD8+ T cells and the unsorted T cells (delta). Blue dots are NTCs; yellow dots are scoring GTSs that passed FDR 1% cutoff; grey dots are remaining GTSs. Note that only 9/1,000 NTCs have a positive delta value. Representative top scoring genes were shown, such as Prodh2, Ccnblip1, Srekplip1 and Wdr37. Significance note, * p<0.05,  p<0.01, * p<0.001.

FIG. 3A is a schematic of the validation strategy for top candidates for dgTKS. FIG. 3B shows representative results of RT-qPCR for overexpression of Prodh2 (Vector vs Prodh2 OE (48 h), p=0.0003; Vector vs Prodh2 OE (72 h), p=0.0010), Ccnblip1 (Vector vs Ccnblip1 OE (48 h), p=0.0026; Vector vs Ccnblip1 OE (72 h), p=0.0059) and Wdr37 (Vector vs Wdr37 OE (48 h), p=0.0004; Vector vs Wdr37 OE (72 h), p=0.0005) both at 48 h and 72 h. Paired t test was used to assess the significance. FIG. 3C shows representative flow cytometry results of kill assay for validation. The fraction of CD107a+ cells (CD107a+%) among all CD8+ T cells were significantly increased with overexpression of Prodh2, Ccnblip1, Srekplip1 or Wdr37. FIG. 3D shows quantitative analysis of flow cytometry results from FIG. 3C, Vector vs Prodh2 OE (+pep), p=0.0049; Vector vs Ccnblip1 OE (+pep), p=0.0004; Vector vs Sreklip1 OE (+pep), p=0.0101; Vector vs Wdr37 OE (+pep), p=0.0015. Statistical comparisons were made using the Holm-Sidak method. Significance note, * p<0.05,  p<0.01, * p<0.001.

FIG. 4A is a schematic representation of a single gene activation experiment using Hba dgRNAs. FIGS. 4B-4C show RT-qPCR results of CRISPR/dgRNA activations in IM. Cas9 (Vector vs Hba-dg1, p=0.0011; Vector vs Hba-dg2, p=0.0033; Vector vs Hba-dg3, p=0.0056) and Cas9β CD8+ T cells (Vector vs Hba-dg2, p=0.0299; Vector vs Hba-dg3, p=0.0020; Vector vs Hba-dg2+dg3, p=0.0071). Paired t test was used to assess the significance. FIG. 4D shows representative flow cytometry results of the mm10dgLib lentivirus titration by detecting Thy 1.1 expression at day 3 after lentivirus transduction. The results showed that the mm10dgLib lentivirus was successfully produced with high titer. FIG. 4E shows quantitative analysis of flow cytometry results from FIG. 4D. Each group had three independent replicates. Significance note, * p<0.05,  p<0.01, * p<0.001.

FIG. 5A shows RT-qPCR for mRNA levels of candidate genes. The results showed that all candidates' mRNA levels were lower than house-keeping gene Gapdh, and most of them had low expression or were not expressed at all in primary CD8+ T cells. FIG. 5B shows CRISPR/dgRNA activation of representative candidates in mouse CD8+ T cells. Vector vs dgSreklip1, p=0.0298; Vector vs dgWdr37, p=0.0186; Vector vs dgSdhaf2, p=0.0396. Paired t test was used to assess the significance. * p<0.05. FIG. 5C shows representative flow cytometry gating for kill assay. FIG. 5D shows representative flow cytometry results of kill assay for validation using 10 ng/μL SIINFEKL (SEQ ID NO. 84,614) peptide. The CD107a+ CD8+ T cells were significantly increased after overexpression of Prodh2, Ccnblip1, Srekplip1 or Wdr37. FIG. 5E shows quantitative analysis of flow cytometry results from FIG. 5D, Vector vs Prodh2 OE (+pep), p=0.0062; Vector vs Ccnblip1 OE (+pep), p=0.0618; Vector vs Sreklip1 OE (+pep), p=0.0028; Vector vs Wdr37 OE (+pep), p=0.0135. Multiple comparisons using the Holm-Sidak method. Significance note, * p<0.05,  p<0.01, * p<0.001.

FIG. 6A is a schematic representation of a T cell dead-guide RNA (dgRNA) activation lentiviral vector (TdgA), which contains a human U6 promoter, a dgRNA scaffold, and Thy1.1-MPH (MCP-p65-HSF1) expression cassette driven by an EFS promoter. FIG. 6B shows schematics of experiment: mouse genome-scale dead-guide RNA library (mm10dgLib) design, including 15nt proximal promoter spacer identification, on-target and off-target mapping, scoring, filtering, and prioritization of final spacers (details in Methods). FIG. 6C shows schematics of genome-scale dgRNA library based mouse primary CD8+ T cell kill assay activation screen (dgTKS) to identify genes that boost effector functions of CD8+ T cells. The main procedure includes naïve CD8+ T cell isolation, mm10dgLib transduction, kill assay (CD8+ T cell degranulation, as measured by CD107a level in CD8 T cells in a T cell: cancer cell co-culture), CD8+;CD107a+ T cell sorting, genomic DNA preparation, dgRNA library readout, and dgRNAs enrichment. FIG. 6D shows representative flow cytometry results of kill assay in the dgTKS experiment. FACS gating plot showing the fraction of CD107a+ cells among all CD8+ cells in vector and mm10dgLib transduced CD8+ T cells co-culture with E0771 cancer cells pulsed with SIINFEKL (SEQ ID NO. 84,614) peptide. (n=3 biological replicates). FIG. 6E shows quantification of CD107a in the mm10dgLib screen (n=3 biological replicates). FIG. 6F shows A dotted waterfall plot of mm 10dgLib library differentials between the CD107a+-high FACS sorted CD8+ T cells and the unsorted T cells (delta). Blue dots are NTCs; yellow dots are scoring GTSs that passed FDR 1% cutoff; grey dots are remaining GTSs. Representative top scoring genes were shown, such as Prodh2, Ccnblip1, Srekplip1 and Wdr37. Additional high-rank genes were shown in FIG. 13. FIG. 6G shows RT-qPCR for mRNA level of high-ranked hit genes from dgTKS primary screen (n=2-3 biological replicates, variable between genes, see figure for datapoints). Higher CT values indicate the candidates' mRNA levels as lower than house-keeping gene Gapdh in primary murine CD8+ T cells. FIG. 6H shows time-course qPCR detection of Prodh2 mRNA level in Prodh2-OE mouse CD8 T cells (n=3 biological replicates). FIG. 6I shows quantitative analysis of flow cytometry for kill assay for individual genes overexpressed by lentiviral vectors, where representative FACS plots were shown in FIG. 14D. FIG. 6J shows mouse T cell number quantification at day 4 after IL-2 withdrawal. FIG. 6K shows quantification of mouse T cell apoptosis in an IL-2 withdrawal assay. Cleaved caspase 3 was detected by flow cytometry at day 1 and day 4 after IL-2 withdrawal. In this figure, two-tailed, unpaired t test was used to assess statistical significance for all two-group comparisons, unless otherwise noted. Multiple comparisons were performed using the Holm-Sidak method where applicable. Significance notes for all panels in this figure:  $p<0.01$,  $p<0.001$, **** $p<0.0001$.

FIG. 7A shows a volcano plot of all differentially expressed genes between Vector control and Prodh2-OE mouse primary CD8 T cells (n=3 biological replicates). FIG. 7B shows a color-coded volcano plot of representative top enriched pathways between Vector control and Prodh2-OE CD8 T cells, highlighting upregulated pathways such as cell cycle, DNA replication, and glycolytic process; and downregulated pathways such as negative regulation of cell death, apoptotic process, and immune system process. Upregulated and downregulated pathways were annotated from Database of Annotation, Visualization and Integrated Discovery (DAVID) analysis of the biological processes of upregulated and downregulated genes, respectively. FIG. 7C shows a barplot of DAVID analysis of most significantly enriched biological processes in upregulated genes. FIG. 7D shows a barplot of DAVID analysis of most significantly enriched biological processes in downregulated genes. FIG. 7E shows Gene Set Enrichement Analysis (GSEA) plots of individual pathways from the representative upregulated and downregulated gene sets between Vector control and Prodh2-OE groups. FIG. 7F shows qPCR validation of the representative highly significantly differentially expressed (DE) individual genes. (n=3 biological replicates). Two-tailed, unpaired t test was used to assess statistical significance for all two-group comparisons. Significance note, * $p<0.05$, ** $p<0.01$.

FIGS. 8A-8D illustrate that mass-spec analysis revealed metabolites altered by PRODH2-OE in human primary CD8 T cells. FIG. 8A shows schematics of human CD8 T cell lentivirus transduction, metabolites extraction, LC/MS analysis, and data analysis. FIG. 8B shows the transcriptional level of human PRODH2 in primary CD8 T cells after PRODH2-OE lentivirus transduction (n=3 biological replicates). FIG. 8C shows human T cell number quantification after PRODH2-OE lentivirus transduction (n=5 biological replicates). FIG. 8D shows quantification of significantly changed metabolites after PRODH2-OE (n=5 biological replicates). In this figure, two-tailed, unpaired t test was used to assess statistical significance for all two-group comparisons, unless otherwise noted. Significance notes for all panels in this figure: * $p<0.05$,  $p<0.01$, * $p<0.001$.

FIG. 9A shows schematics of human CD22-CAR-PRODH2 and CD22-CAR-PRODH2 (Stop) CD8 T cell generation. In the CD22-CAR-PRODH2 (Stop) construct, three artificial pre-mature stop codons were inserted between 318-319 bp position of the PRODH2 CDS to generate a truncated mutant version. Knockin (KI) constructs consist of TRAC locus homology-directed repair (HDR) 5' and 3' arms, an EFS promoter, a CD22-CAR expression cassette, a T2A sequence, a PRODH2 CDS or a PRODH2 (Stop) CDS, and a short polyA. AAV6-packaged KI constructs were introduced into T cells by viral transduction after TRAC first-exon targeting Cas9: crRNA RNP electroporation. FIG. 9B shows a PRODH2 immunoblot of untransduced, CD22-CAR-PRODH2 KI, and CD22-CAR-PRODH2 (Stop) KI T cells. FIG. 9C shows a representative flow cytometry plots of CD22-CAR-PRODH2 and CD22-CAR-PRODH2 (Stop) KI human primary CD8 T cells from two independent donors. FIG. 9D shows a kill assay of CD22-CAR-PRODH2 and CD22-CAR-PRODH2 (Stop) KI T cells with NAML6-GL (NAML6 with GFP and Luciferase reporters) cancer cells, with a titration series of Effector: Target (E:T) ratios, and at two timepoints (24 h and 48$h$). Individual replicate datapoints were shown (Donor 1:n=4 biological replicates; Donor 2: n=6 biological replicates) ($p<0.0001$ for all two group comparisons). 2-way ANOVA. Significance note, **** $p<0.0001$.

FIGS. 10A-10F illustrate whole transcriptome profiling of PRODH2 knockin CD22 CAR-T cells. FIG. 10A shows schematics of CAR-T multi-omics experiments: T cell electroporation, PRODH2/PRODH2 (Stop) CD22 CAR-T KI construct AAV transduction, metabolites preparation, metabolomics data collection, mRNA-seq library preparations, mRNA-seq, and data analyses. FIG. 10B shows volcano plots of mRNA-seq differential expression between PRODH2 vs. PRODH2 (Stop) CD22-CAR-T cells from 2 different human donors (n=3 biological replicates) (FDR adj. q<0.05). FIG. 10C shows a Venn diagram of PRODH2-vs-PRODH2 (Stop) upregulated genes among human donor 1/donor 2 CAR-T cells, and Prodh2-OE-vs-Vector upregulated genes in mouse CD8 T cells. P values for statistical significance of gene set overlap was calculated by hypergeometric test and indicated. FIG. 10D shows a bubble plot of GO pathways enriched in upregulated genes (upregulated pathways) in both donor 1 and donor 2. Color scale, average fold enrichment score; bubble size scale, average percentage of DE genes found in the pathway. Figure labels: A. Cellular component biogenesis. B. Macromolecular complex subunit organization. C. Protein complex assembly. D. Protein complex biogenesis. E. Ribonucleoprotein complex biogenesis. F. Mitochondrion Organization. G. Cellular component assembly. H. Biosynthetic process. I. Cellular macromolecule metabolic process. J. Nuclear mRNA splicing via spliceosome. K. RNA splicing via transesterification reactions. L. RNA splicing via transesterification reactions with bulged adenosine as nucleophile. M. Cellular macromolecular complex subunit organization. N. Interspecies interaction between organisms. O. Macromolecular complex assembly. FIG. 10E shows a Venn diagram of PRODH2-vs-PRODH2 (Stop) downregulated genes among human donor 1/donor 2 CAR-T cells, and Prodh2-OE-vs-Vector upregulated genes in mouse CD8 T cells. P values for statistical significance of gene set overlap was calculated by hypergeometric test and indicated. FIG. 10F shows a bubble plot of GO pathways enriched in downregulated genes (downregulated pathways) in both donor 1 and donor 2. Color scale, average fold enrichment score; bubble size scale, average percentage of DE genes found in the pathway.

FIG. 11A shows a heatmap of the relative abundance of top 40 QTOF/QQQ detected metabolites of PRODH2 vs. PRODH2 (Stop) CD22-CAR-T cells (n=5 biological replicates). FIG.

11B shows a volcano plot of differentially represented (DR) metabolites between PRODH2 vs. PRODH2 (Stop) CD22-CAR-T cells. Blue dots indicate decreased metabolites, pink dots indicate increased metabolites. FIG. 11C shows a summary illustration highlighting representative enzymes encoded by DE genes, as well as DR metabolites on a simplified metabolic map adapted from KEGG metabolic pathways. As in legend, blue circles indicate decreased metabolites; pink circles indicate increased metabolites; green squares indicate enzymes of downregulated genes; orange squares indicate enzymes of upregulated genes. Solid arrows indicate direct biochemical reactions; dashed arrows indicate indirect or multi-step biochemical reactions; bi-directional arrows indicate reversible reactions. All arrows were drawn according to the known reactions in KEGG. Only reactions related to DE genes or DR metabolites were shown. A more detailed version is shown in FIG. 21. FIG. 11D shows scatter plots of multi-omics analysis of RNA-seq upregulated genes vs. DR metabolomics metabolites (both increased and decreased) between PRODH2 vs. PRODH2 (Stop) CD22-CAR-T cells. Each dot represents a metabolic pathway, with those enriched in multi-omics analysis text-labeled. The upregulated genes and the DR metabolites associated with each significant pathway were labeled inside a box scaled to the number of metabolic hits. FIG. 11E shows scatter plots of multi-omics analysis of RNA-seq downregulated genes vs. DR metabolomics metabolites (both increased and decreased) between PRODH2 vs. PRODH2 (Stop) CD22-CAR-T cells. Each dot represents a metabolic pathway, with those enriched in multi-omics analysis text-labeled. The downregulated genes and the DR metabolites associated with each significant pathway were labeled inside a box scaled to the number of metabolic hits.

FIGS. 12A-12H illustrate setup experiments for TdgA vector and mm 10dgLib library screening. FIG. 12A shows a schematic representation of single gene activation experiment using Hba dgRNAs. FIG. 12B shows RT-qPCR results of dgRNA based CRISPR activation of Hba gene in IM.Cas9 cells. (n=3 biological replicates). FIG. 12C shows RT-qPCR results of dgRNA based CRISPR activation of Hba gene in Cas9β CD8$^+$ T cells. (n=3 biological replicates). FIG. 12D shows schematics of detailed mm 10dgLib design process, library cloning, and lentivirus production following FIG. 6B. FIG. 12E shows mm10dgLib designed composition. Most coding transcripts (19,440/26,205) have 4 dgRNAs. Small portions of coding transcripts only have ≤3 dgRNAs that pass the same criteria (3,814, 1,010, 992 and 949 transcripts have 0, 1, 2, 3 dgRNAs, respectively. FIG. 12F shows mm 10dgLib plasmid library representation analysis by Illumina sequencing of dgRNA spacers from plasmid. 82,197/83,601 (98.3%) of gene-targeting spacers (GTSs) and 988/1,000 (98.8%) of NTCs were successfully cloned. Both GTSs and NTCs in the mm10dgLib showed a log-normal distribution. FIG. 12G shows representative flow cytometry results of the mm10dgLib lentivirus titration by detecting Thy 1.1 expression at day 3 after lentivirus transduction. The results showed that the mm10dgLib lentivirus was successfully produced with high titer. FIG. 12H shows Quantitative analysis of flow cytometry results from FIG. 12G. Each group has three independent replicates. In this figure, two-tailed, unpaired t test was used to assess statistical significance for all two-group comparisons, unless otherwise noted. Significance notes for all panels in this figure:  p<0.01, * p<0.001, **** p<0.0001.

FIG. 14A shows representative results of RT-qPCR for overexpression of Prodh2 (n=3 biological replicates). FIG. 14B shows schematics of the validation strategy for of individual genes from top candidates in dgTKS. FIG. 14C shows representative flow cytometry gating for kill assay of individual genes. FIG. 14D shows representative flow cytometry results of kill assay for validation (n=3 biological replicates each group). The fraction of CD107a$^+$ cells (CD107a %) among all CD8$^+$ T cells were shown with or without SIINFEKL (SEQ ID NO. 84,614) peptide, in mouse CD8 T cells with overexpression of Prodh2, Ccnblip1, Sreklip1, or Wdr37. The quantification data was in a main figure panel. FIG. 14E shows representative flow cytometry of apoptosis analysis of mouse CD8$^+$ T cells after Prodh2-OE (n=3 biological replicates each group). Cleaved caspase 3 staining was performed at day 1 and day 4 after IL-2 depletion. The quantification data was in a main figure panel. In this figure, two-tailed, unpaired t test was used to assess statistical significance for all two-group comparisons. Significance notes for all panels in this figure: **** p<0.0001.

FIGS. 15A-15D illustrate Prodh2 in vivo validation using melanoma and TNBC cancer models. TIDE analyses of PRODH2 expression signatures linked to in cytotoxic T lymphocyte (CTL)—associated survival benefits in patients, where high-level of PRODH2 improves the overall survival benefit of CTL-high patients with TNBC (FIG. 15A), melanoma (FIG. 15B), bladder cancer (FIG. 15C) or LUAD (FIG. 15D).

FIG. 16A-16D illustrates TIDE analysis of human patient data of PRODH2 expression signatures linked to in cyto-toxic T lymphocyte (CTL)—associated survival benefits in patients, where high-level of PRODH2 improves the overall survival benefit of CTL-high patients with TNBC (FIG. 16A), melanoma (FIG. 16B), bladder cancer (FIG. 16C) or LUAD (FIG. 16D).

FIGS. 18A-18B show color-coded volcano plots of representative top enriched pathways between CD22-CAR-PRODH2 (Stop) and CD22-CAR-PRODH2 cells (FIG. 18A, donor 1; FIG. 18B, donor 2). Upregulated and downregulated pathways were annotated from DAVID analysis of the biological processes of upregulated and downregulated genes, respectively (n=5 biological replicates).

DETAILED DESCRIPTION

Definitions

Figure 1A:
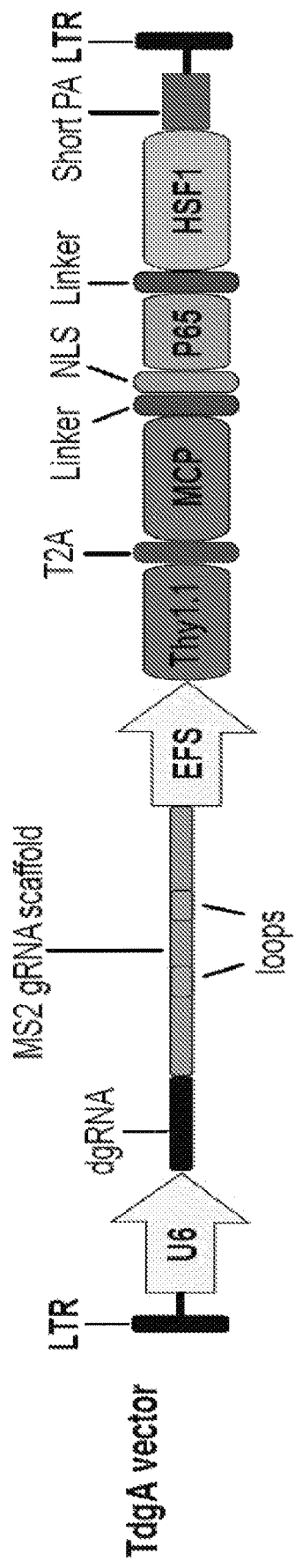
FIGS. 1A-1D illustrate the design and generation of a genome-scale dead-guide RNA activation screen system for primary T cells.

Unless defined otherwise, all technical and scientific terms used herein have the same meaning as commonly understood by one of ordinary skill in the art to which the invention pertains. Although any methods and materials similar or equivalent to those described herein can be used in the practice for testing of the present invention, the preferred materials and methods are described herein. In describing and claiming the present invention, the following terminology will be used.

It is also to be understood that the terminology used herein is for the purpose of describing particular embodiments only, and is not intended to be limiting.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20% or ±10%, more preferably ±5%, even more preferably ±1%, and still more preferably ±0.1% from the The term "agonist" refers to a substance that acts like another substance and therefore stimulates an action. For example, an agonist can be a molecule capable of binding a specific protein and initiating the same reaction or activity typically produced by the binding endogenous substance. An agonist can be any molecule that increases transcription, increases translation, or increases the activity of the cognate molecule. For example, a Prodh2 agonist can be a small molecule that binds the Prodh2 protein and causes increased activity of the protein. Other examples of immunooncology agonists include, but are not limited to OX40, 4-1BB, GITR, CD27, IL2R, CD134, CD137, ICOS, TNFR, VISTA, TNFRSF9, IL15R, IL7R.

"Allogeneic" refers to any material derived from a different animal of the same species.

As used herein, the term "autologous" is meant to refer to any material derived from the same individual to which it is later to be re-introduced into the individual.

As used herein, the term "bp" refers to base pair.

The term "complementary" refers to the degree of antiparallel alignment between two nucleic acid strands. Complete complementarity requires that each nucleotide be across from its opposite. No complementarity requires that each nucleotide is not across from its opposite. The degree of complementarity determines the stability of the sequences to be together or anneal/hybridize. Furthermore various DNA repair functions as well as regulatory functions are based on base pair complementarity.

The term "CRISPR/Cas" or "clustered regularly interspaced short palindromic repeats" or "CRISPR" refers to DNA loci containing short repetitions of base sequences followed by short segments of spacer DNA from previous exposures to a virus or plasmid. Bacteria and archaea have evolved adaptive immune defenses termed CRISPR/CRISPR—associated (Cas) systems that use short RNA to direct degradation of foreign nucleic acids. In bacteria, the CRISPR system provides acquired immunity against invading foreign DNA via RNA-guided DNA cleavage.

The "CRISPR/Cas9" system or "CRISPR/Cas9-mediated gene editing" refers to a type II CRISPR/Cas system that has been modified for genome editing/engineering. It is typically comprised of a "guide" RNA (gRNA) and a non-specific CRISPR-associated endonuclease (Cas9). "Guide RNA (gRNA)" is used interchangeably herein with "short guide RNA (sgRNA)" or "single guide RNA (sgRNA). The sgRNA is a short synthetic RNA composed of a "scaffold" sequence necessary for Cas9-binding and a user-defined ~20 nucleotide "spacer" or "targeting" sequence which defines the genomic target to be modified. The genomic target of Cas9 can be changed by changing the targeting sequence present in the sgRNA.

"CRISPRa" system refers to a modification of the CRISPR-Cas9 system that functions to activate or increase gene expression. In certain embodiments, the CRISPRa system is comprised of dCas9, at least one transcriptional activator, and at least one sgRNA that functions to increase expression of at least one gene of interest.

"dCas9" as used herein refers to a catalytically dead Cas9 protein that lacks endonuclease activity.

"dgRNA" or "dead guide RNA" refers to a guide RNA which is catalytically inactive yet maintains target-site binding capacity.

A "disease" is a state of health of an animal wherein the animal cannot maintain homeostasis, and wherein if the disease is not ameliorated then the animal's health continues to deteriorate. In contrast, a "disorder" in an animal is a state of health in which the animal is able to maintain homeostasis, but in which the animal's state of health is less favorable than it would be in the absence of the disorder. Left untreated, a disorder does not necessarily cause a further decrease in the animal's state of health.

The term "downregulation" as used herein refers to the decrease or elimination of gene expression of one or more genes.

"Effective amount" or "therapeutically effective amount" are used interchangeably herein, and refer to an amount of a compound, formulation, material, or composition, as described herein effective to achieve a particular biological result or provides a therapeutic or prophylactic benefit. Such results may include, but are not limited to, anti-tumor activity as determined by any means suitable in the art.

The term "therapeutic" as used herein means a treatment and/or prophylaxis. A therapeutic effect is obtained by suppression, remission, or eradication of a disease state.

"Encoding" refers to the inherent property of specific sequences of nucleotides in a polynucleotide, such as a gene, a cDNA, or an mRNA, to serve as templates for synthesis of other polymers and macromolecules in biological processes having either a defined sequence of nucleotides (i.e., rRNA, tRNA and mRNA) or a defined sequence of amino acids and the biological properties resulting therefrom. Thus, a gene encodes a protein if transcription and translation of mRNA corresponding to that gene produces the protein in a cell or other biological system. Both the coding strand, the nucleotide sequence of which is identical to the mRNA sequence and is usually provided in sequence listings, and the non-coding strand, used as the template for transcription of a gene or cDNA, can be referred to as encoding the protein or other product of that gene or cDNA.

As used herein "endogenous" refers to any material from or produced inside an organism, cell, tissue or system.

As used herein, the term "exogenous" refers to any material introduced from or produced outside an organism, cell, tissue or system.

The term "expression" as used herein is defined as the transcription and/or translation of a particular nucleotide sequence driven by its promoter.

"Expression vector" refers to a vector comprising a recombinant polynucleotide comprising expression control sequences operatively linked to a nucleotide sequence to be expressed. An expression vector comprises sufficient cis-acting elements for expression; other elements for expression can be supplied by the host cell or in an in vitro expression system. Expression vectors include all those known in the art, such as cosmids, plasmids (e.g., naked or contained in liposomes) and viruses (e.g., Sendai viruses, lentiviruses, retroviruses, adenoviruses, and adeno-associated viruses) that incorporate the recombinant polynucleotide.

"Homologous" as used herein, refers to the subunit sequence identity between two polymeric molecules, e.g., between two nucleic acid molecules, such as, two DNA molecules or two RNA molecules, or between two polypeptide molecules. When a subunit position in both of the two molecules is occupied by the same monomeric subunit; e.g., if a position in each of two DNA molecules is occupied by adenine, then they are homologous at that position. The homology between two sequences is a direct function of the number of matching or homologous positions; e.g., if half (e.g., five positions in a polymer ten subunits in length) of the positions in two sequences are homologous, the two sequences are 50% homologous; if 90% of the positions (e.g., 9 of 10), are matched or homologous, the two sequences are 90% homologous.

"Identity" as used herein refers to the subunit sequence identity between two polymeric molecules particularly between two amino acid molecules, such as, between two polypeptide molecules. When two amino acid sequences have the same residues at the same positions; e.g., if a position in each of two polypeptide molecules is occupied by an Arginine, then they are identical at that position. The identity or extent to which two amino acid sequences have the same residues at the same positions in an alignment is often expressed as a percentage. The identity between two amino acid sequences is a direct function of the number of matching or identical positions; e.g., if half (e.g., five positions in a polymer ten amino acids in length) of the positions in two sequences are identical, the two sequences are 50% identical; if 90% of the positions (e.g., 9 of 10), are matched or identical, the two amino acids sequences are 90% identical.

As used herein, an "instructional material" includes a publication, a recording, a diagram, or any other medium of expression which can be used to communicate the usefulness of the compositions and methods of the invention. The instructional material of the kit of the invention may, for example, be affixed to a container which contains the nucleic acid, peptide, and/or composition of the invention or be shipped together with a container which contains the nucleic acid, peptide, and/or composition. Alternatively, the instructional material may be shipped separately from the container with the intention that the instructional material and the compound be used cooperatively by the recipient.

"Isolated" means altered or removed from the natural state. For example, a nucleic acid or a peptide naturally present in a living animal is not "isolated," but the same nucleic acid or peptide partially or completely separated from the coexisting materials of its natural state is "isolated." An isolated nucleic acid or protein can exist in substantially purified form, or can exist in a non-native environment such as, for example, a host cell.

The term "knockdown" as used herein refers to a decrease in gene expression of one or more genes.

The term "knockout" as used herein refers to the ablation of gene expression of one or more genes.

A "lentivirus" as used herein refers to a genus of the Retroviridae family. Lentiviruses are unique among the retroviruses in being able to infect non-dividing cells; they can deliver a significant amount of genetic information into the DNA of the host cell, so they are one of the most efficient vectors for gene delivery. HIV, SIV, and FIV are all examples of lentiviruses. Vectors derived from lentiviruses offer the means to achieve significant levels of gene transfer in vivo.

By the term "modified" as used herein, is meant a changed state or structure of a molecule or cell of the invention. Molecules may be modified in many ways, including chemically, structurally, and functionally. Cells may be modified through the introduction of nucleic acids.

By the term "modulating," as used herein, is meant mediating a detectable increase or decrease in the level of a response in a subject compared with the level of a response in the subject in the absence of a treatment or compound, and/or compared with the level of a response in an otherwise identical but untreated subject. The term encompasses perturbing and/or affecting a native signal or response thereby mediating a beneficial therapeutic response in a subject, preferably, a human.

A "mutation" as used herein is a change in a DNA sequence resulting in an alteration from a given reference sequence (which may be, for example, an earlier collected DNA sample from the same subject). The mutation can comprise deletion and/or insertion and/or duplication and/or substitution of at least one deoxyribonucleic acid base such as a purine (adenine and/or thymine) and/or a pyrimidine (guanine and/or cytosine). Mutations may or may not produce discernible changes in the observable characteristics (phenotype) of an organism (subject).

By "nucleic acid" is meant any nucleic acid, whether composed of deoxyribonucleosides or ribonucleosides, and whether composed of phosphodiester linkages or modified linkages such as phosphotriester, phosphoramidate, siloxane, carbonate, carboxymethylester, acetamidate, carbamate, thioether, bridged phosphoramidate, bridged methylene phosphonate, phosphorothioate, methylphosphonate, phosphorodithioate, bridged phosphorothioate or sulfone linkages, and combinations of such linkages. The term nucleic acid also specifically includes nucleic acids composed of bases other than the five biologically occurring bases (adenine, guanine, thymine, cytosine and uracil). In the context of the present invention, the following abbreviations for the commonly occurring nucleic acid bases are used. "A" refers to adenosine, "C" refers to cytosine, "G" refers to guanosine, "T" refers to thymidine, and "U" refers to uridine.

Unless otherwise specified, a "nucleotide sequence encoding an amino acid sequence" includes all nucleotide sequences that are degenerate versions of each other and that encode the same amino acid sequence. The phrase nucleotide sequence that encodes a protein or an RNA may also include introns to the extent that the nucleotide sequence encoding the protein may in some version contain an intron(s).

The term "oligonucleotide" typically refers to short polynucleotides, generally no greater than about 60 nucleotides. It will be understood that when a nucleotide sequence is represented by a DNA sequence (i.e., A, T, G, C), this also includes an RNA sequence (i.e., A, U, G, C) in which "U" replaces "T".

As used herein, the terms "peptide," "polypeptide," and "protein" are used interchangeably, and refer to a compound comprised of amino acid residues covalently linked by peptide bonds. A protein or peptide must contain at least two amino acids, and no limitation is placed on the maximum number of amino acids that can comprise a protein's or peptide's sequence. Polypeptides include any peptide or protein comprising two or more amino acids joined to each other by peptide bonds. As used herein, the term refers to both short chains, which also commonly are referred to in the art as peptides, oligopeptides and oligomers, for example, and to longer chains, which generally are referred to in the art as proteins, of which there are many types. "Polypeptides" include, for example, biologically active fragments, substantially homologous polypeptides, oligopeptides, homodimers, heterodimers, variants of polypeptides, modified polypeptides, derivatives, analogs, fusion proteins, among others. The polypeptides include natural peptides, recombinant peptides, synthetic peptides, or a combination thereof.

"Parenteral" administration of an immunogenic composition includes, e.g., subcutaneous (s.c.), intravenous (i.v.), intramuscular (i.m.), or intrasternal injection, or infusion techniques.

As used herein, the terms "peptide," "polypeptide," and "protein" are used interchangeably, and refer to a compound comprised of amino acid residues covalently linked by peptide bonds. A protein or peptide must contain at least two amino acids, and no limitation is placed on the maximum number of amino acids that can comprise a protein's or peptide's sequence. Polypeptides include any peptide or protein comprising two or more amino acids joined to each other by peptide bonds. As used herein, the term refers to both short chains, which also commonly are referred to in the art as peptides, oligopeptides and oligomers, for example, and to longer chains, which generally are referred to in the art as proteins, of which there are many types. "Polypeptides" include, for example, biologically active fragments, substantially homologous polypeptides, oligopeptides, homodimers, heterodimers, variants of polypeptides, modified polypeptides, derivatives, analogs, fusion proteins, among others. The polypeptides include natural peptides, recombinant peptides, synthetic peptides, or a combination thereof.

The term "polynucleotide" as used herein is defined as a chain of nucleotides. Furthermore, nucleic acids are polymers of nucleotides. Thus, nucleic acids and polynucleotides as used herein are interchangeable. One skilled in the art has the general knowledge that nucleic acids are polynucleotides, which can be hydrolyzed into the monomeric "nucleotides." The monomeric nucleotides can be hydrolyzed into nucleosides. As used herein polynucleotides include, but are not limited to, all nucleic acid sequences which are obtained by any means available in the art, including, without limitation, recombinant means, i.e., the cloning of nucleic acid sequences from a recombinant library or a cell genome, using ordinary cloning technology and PCR™, and the like, and by synthetic means. Conventional notation is used herein to describe polynucleotide sequences: the left-hand end of a single-stranded polynucleotide sequence is the 5'-end; the left-hand direction of a double-stranded polynucleotide sequence is referred to as the 5'-direction.

As used herein, a DNA or RNA nucleotide sequence as recited refers to a polynucleotide molecule comprising the indicated bases in a 5' to 3' direction, from left to right.

A "sample" or "biological sample" as used herein means a biological material from a subject, including but is not limited to organ, tissue, exosome, blood, plasma, saliva, urine and other body fluid. A sample can be any source of material obtained from a subject.

As used herein, the terms "sequencing" or "nucleotide sequencing" refer to determining the order of nucleotides (base sequences) in a nucleic acid sample, e.g. DNA or RNA. Many techniques are available such as Sanger sequencing and high-throughput sequencing technologies (also known as next-generation sequencing technologies) such as Illumina's HiSeq and MiSeq platforms or the GS FLX platform offered by Roche Applied Science.

The term "subject" is intended to include living organisms in which an immune response can be elicited (e.g., mammals). A "subject" or "patient," as used therein, may be a human or non-human mammal. Non-human mammals include, for example, livestock and pets, such as ovine, bovine, porcine, canine, feline and murine mammals. Preferably, the subject is human.

As used herein, a "substantially purified" cell is a cell that is essentially free of other cell types. A substantially purified cell also refers to a cell which has been separated from other cell types with which it is normally associated in its naturally occurring state. In some instances, a population of substantially purified cells refers to a homogenous population of cells. In other instances, this term refers simply to cell that have been separated from the cells with which they are naturally associated in their natural state. In some embodiments, the cells are cultured in vitro. In other embodiments, the cells are not cultured in vitro.

A "target site" or "target sequence" refers to a genomic nucleic acid sequence that defines a portion of a nucleic acid to which a binding molecule may specifically bind under conditions sufficient for binding to occur.

The term "therapeutic" as used herein means a treatment and/or prophylaxis. A therapeutic effect is obtained by suppression, remission, or eradication of a disease state.

The term "transfected" or "transformed" or "transduced" as used herein refers to a process by which exogenous nucleic acid is transferred or introduced into the host cell. A "transfected" or "transformed" or "transduced" cell is one which has been transfected, transformed or transduced with exogenous nucleic acid. The cell includes the primary subject cell and its progeny.

To "treat" a disease as the term is used herein, means to reduce the frequency or severity of at least one sign or symptom of a disease or disorder experienced by a subject.

A "vector" is a composition of matter which comprises an isolated nucleic acid and which can be used to deliver the isolated nucleic acid to the interior of a cell. Numerous vectors are known in the art including, but not limited to, linear polynucleotides, polynucleotides associated with ionic or amphiphilic compounds, plasmids, and viruses. Thus, the term "vector" includes an autonomously replicating plasmid or a virus. The term should also be construed to include non-plasmid and non-viral compounds which facilitate transfer of nucleic acid into cells, such as, for example, polylysine compounds, liposomes, and the like. Examples of viral vectors include, but are not limited to, Sendai viral vectors, adenoviral vectors, adeno-associated virus vectors, retroviral vectors, lentiviral vectors, and the like.

As used herein, the term "T cell receptor" or "TCR" refers to a complex of membrane proteins that participate in the activation of T cells in response to the presentation of antigen. The TCR is responsible for recognizing antigens bound to major histocompatibility complex molecules. TCR is composed of a heterodimer of an alpha ($\alpha$) and beta ($\beta$) chain, although in some cells the TCR consists of gamma and delta ($\gamma/\delta$) chains. TCRs may exist in $\alpha/\beta$ and $\gamma/\delta$ forms, which are structurally similar but have distinct anatomical locations and functions. Each chain is composed of two extracellular domains, a variable and constant domain. In some embodiments, the TCR can be modified on any cell comprising a TCR, including, for example, a helper T cell, a cytotoxic T cell, a memory T cell, regulatory T cell, natural killer T cell, and/or gamma delta T cell.

The term "immune response" as used herein is defined as a cellular response to an antigen that occurs when lymphocytes identify antigenic molecules as foreign and induce the formation of antibodies and/or activate lymphocytes to remove the antigen.

"Chimeric antigen receptor" or "CAR" refers to an engineered receptor that is expressed on a T cell or any other effector cell type capable of cell-mediated cytotoxicity. The CAR comprises an extracellular domain having an antigen binding domain that is specific for a ligand or receptor. The CAR optionally also includes a transmembrane domain, and a costimulatory signaling domain. In some embodiments, the CAR comprises a hinge. In some embodiments, the antigen binding domain is specific for EGFRvIII. In some embodiments, the costimulatory signaling domain is a 4-1BB signaling domain. In some embodiments, the CAR further comprises a CD3 zeta signaling domain. A CAR-T cell is a T cell engineered to express a CAR.

"Costimulatory ligand," as the term is used herein, includes a molecule on an antigen presenting cell (e.g., an aAPC, dendritic cell, B cell, and the like) that specifically binds a cognate costimulatory molecule on a T cell, thereby providing a "second" signal which, in addition to the primary signal provided by, for instance, binding of a TCR/CD3 complex with an MHC molecule loaded with peptide, mediates a T cell response, including, but not limited to, proliferation, activation, differentiation, and the like.

A "costimulatory molecule" refers to the cognate binding partner on a T cell that specifically binds with a costimulatory ligand, thereby mediating a costimulatory response by the T cell, such as, but not limited to, proliferation. Costimulatory molecules include, but are not limited to CD28, CD27, and OX40.

Ranges: throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

DESCRIPTION

Catalytically-dead guide RNAs (dgRNAs) can be used to mediate robust gene activation with catalytically active Cas9. Herein, this system was leveraged for high-throughput GOF screens in conjunction with primary T cells isolated from Cas9 transgenic mice. A mouse genome-wide dgRNA library (mm 10dgLib) was designed, cloned, and produced. This can serve as a versatile tool for GOF screens in any catalytically active Cas9 expressing cell, which is particularly useful for applications in primary immune cells, as they are less amenable to viral transduction and genetic manipulation. This system was utilized to screen for genes that can directly boost the effector function of CD8$^+$ T cells when overexpressed. Several genes that have not been previously documented in CD8$^+$ T cell function were identified and subsequently validated, such as Prodh2, Ccnblip1, Sreklip1, and Wdr37. Overexpression of these genes in CD8$^+$ T cells significantly enhanced their activity to release cytotoxic granules. This study opens an entirely new avenue for cancer immunotherapy target discovery.

Mounting an effective T cell response against cancer is critical for cancer immunotherapy. This invention achieved (1) conception, design, and generation of a dead-guide RNA-based CRISPR activation screening system using catalytically active Cas9; (2) completion of a gain-of-function screen that identified target genes that promote CD8$^+$ T cell effector function; (3) demonstration that overexpression of novel candidates including Prodh2, Wdr37, Sreklip1 and Ccnblip1 significantly augmented the degranulation ability of CD8$^+$ T effector cells against cancer cells. The composition of genome-wide catalytically dead guide RNA library and methods for its use in conjunction with catalytically active Cas9-expressing CD8$^+$ effector cells represent a new avenue for the direct discovery of immune regulators in primary T cells to enhance immunotherapy. The newly identified targets can also be targeted by agonists for use as immunotherapy agents.

Also provided are engineered primary or chimeric antigen receptor (CAR) T cells that overexpress Proline Dehydrogenase 2 (PRODH2/Prodh2), Ccnblip1, Sreklip1, or Wdr37, or a fragment thereof. In some embodiments, the CAR T cells overexpress Prodh2 or a fragment thereof. Augmentation of Prodh2 expression enhanced anti-tumor activity and altered transcriptional programs in CD8$^+$ T cells, as well as the metabolism of the cells. Furthermore, PRODH2 genomic knockin boosts CAR-T cell effector function.

Compositions

In certain embodiments, the invention includes use of "dead guide RNAs" (dgRNAs). Recently, these 14-nt or 15-nt guide RNAs have been shown to be catalytically inactive yet maintain target-site binding capacity (Kiani et al. (2015) *Nat Methods* 12, 1051-1054; Dahlman et al. (2015) *Nat Biotechnol* 33 (11): 1159-1161). Thus, these catalytically dead guide RNAs (dgRNAs) can be utilized to modulate gene expression using a catalytically active Cas9. Therefore, an active Cas9 nuclease can be repurposed to simultaneously perform genome editing and regulate gene transcription using both types of gRNAs in the same cell.

In one aspect, the invention includes a dead guide RNA (dgRNA) library. In some embodiments, the dgRNA library comprises a plurality of nucleic acids comprising one or more nucleotide sequences selected from the group consisting of SEQ ID NOs. 1-83,601. In further embodiments, the library further comprises a nucleotide sequence selected from the group consisting of SEQ ID NOs. 83,602-84,601. In some embodiments, the dgRNA library comprises a plurality of nucleic acids consisting of the nucleotide sequences of SEQ ID NOs. 1-83,601. In further embodiments, the library comprises a plurality of nucleic acids consisting of the nucleotide sequences of SEQ ID NOs. 83,602-84,601. In certain embodiments, the library can be packaged into a vector. Any vector known to one of ordinary skill in the art can be used, including but not limited to lentiviral vectors, adenoviral vectors, and adeno-associated viral (AAV) vectors.

Another aspect of the invention includes an lentiviral library, e.g. a mouse genome-scale dgRNA library (mm10dgLib). In one embodiment, the lentiviral library comprises a plurality of vectors, wherein each vector comprises an expression cassette for an dgRNA comprising a nucleotide sequence selected from the group consisting of SEQ ID NOs. 1-83,601. In further embodiments, the lentiviral library comprises a plurality of vectors, wherein each vector comprises an expression cassette for an dgRNA comprising a nucleotide sequence selected from the group consisting of SEQ ID NOs. 83,602-84,601. In one embodiment, one or more of the vectors comprises SEQ ID NO: 84,602.

With regard to any of the dgRNA libraries or lentiviral libraries comprising the SEQ ID NOs. 1-83,601 or 83,602-84,601, it should be understood by one of ordinary skill in the art that the invention is construed to encompassing every individual SEQ ID NO. in the two ranges and all combinations from both ranges thereof.

In some embodiments, the dgRNA library comprises about 100 or more sequences. In some embodiments, the library comprises about 1,000 or more sequences. In some embodiments, the library comprises about 10,000 or more sequences. In further embodiments, the library comprises about 20,000 or more sequences. In yet further 20 embodiments, the library comprises about 30,000 or more sequences. In yet further embodiments, the library comprises about 40,000 or more sequences.

The invention also includes a kit comprising a lentiviral library, wherein the lentiviral library comprises a plurality of vectors, wherein each vector comprises an expression cassette for a dgRNA comprising a nucleotide sequence selected from the group consisting of SEQ ID NOs. 1-83, 601. In some embodiments, the lentiviral library in the kit comprises a plurality of vectors, wherein each vector comprises an expression cassette for a dgRNA comprising a nucleotide sequence selected from the group sonsisting of SEQ ID NOs. 1-84,601. In some embodiments, the AAV library in the kit comprises a plurality of vectors, wherein each vector comprises an expression cassette for a dgRNA comprising a nucleotide sequence selected from the group consisting of SEQ ID NOs: 1-83,601. In some embodiments, the AAV library in the kit comprises a plurality of vectors, wherein each vector comprises an expression cassette for a dgRNA comprising a nucleotide sequence selected from the group sonsisting of SEQ ID NOs. 1-84,601. The kit also includes instructional material for use thereof. Instructional material can include directions for using the kit as well as information on interpreting results generated from the kit. In one embodiment, one or more of the vectors comprises SEQ ID NO: 84,602.

Also included in the invention is a vector, e.g. a lentiviral T cell dgRNA activation (TdgA) vector. The vector comprises a first promoter, a dgRNA expression cassette, a MS2-loop-containing chimeric backbone sequence, a second promoter, and a cassette expressing a fusion protein of Thy 1.1 and one or more transcription activators. In certain embodiments, the one or more transcription activators are selected from the group consisting of MS2 bacteriophage coat protein (MCP), transcription factor p65 (P65) (aka RELA), and heat shock factor 1 (HSF1). The vector can include additional components, including but not limited ot an LTR seqeunce, aT2A sequence, a linker sequence, an NLS sequence, and a short PA sequence. In certain embodiments, the first promoter is a U6 promoter and/or the second promoter is an EFS promoter. In certain embodiments, the dgRNA expression cassette and the MS2-loop-containing chimeric backbone are driven by the U6 promoter (U6-dgRNA-MS2). In certain embodiments, the cassette expressing a fusion protein of Thy 1.1 and transcription activators (EFS-Thy1.1-MPH) is driven by an EFS promoter. In certain embodiments, the vector is a lentiviral vector. In certain embodiments, the vector comprises SEQ ID NO: 84,602.

Any promoter known to one of ordinary skill in the art can be incorporated into any of the vectors/plasmids of the present invention. Suitable promoter and enhancer elements are known to those of skill in the art. For expression in a bacterial cell, suitable promoters include, but are not limited to, lacI, lacZ, T3, T7, gpt, lambda P and trc. For expression in a eukaryotic cell, suitable promoters include, but are not limited to, light and/or heavy chain immunoglobulin gene promoter and enhancer elements; cytomegalovirus immediate early promoter; herpes simplex virus thymidine kinase promoter; early and late SV40 promoters; promoter present in long terminal repeats from a retrovirus; mouse metallothionein-I promoter; and various art-known tissue specific promoters. Suitable reversible promoters, including reversible inducible promoters are known in the art. Such reversible promoters may be isolated and derived from many organisms, e.g., eukaryotes and prokaryotes. Modification of reversible promoters derived from a first organism for use in a second organism, e.g., a first prokaryote and a second a eukaryote, a first eukaryote and a second a prokaryote, etc., is well known in the art. Such reversible promoters, and systems based on such reversible promoters but also comprising additional control proteins, include, but are not limited to, alcohol regulated promoters (e.g., alcohol dehydrogenase I (alcA) gene promoter, promoters responsive to alcohol transactivator proteins (AlcR), etc.), tetracycline regulated promoters, (e.g., promoter systems including TetActivators, TetON, TetOFF, etc.), steroid regulated promoters (e.g., rat glucocorticoid receptor promoter systems, human estrogen receptor promoter systems, retinoid promoter systems, thyroid promoter systems, ecdysone promoter systems, mifepristone promoter systems, etc.), metal regulated promoters (e.g., metallothionein promoter systems, etc.), pathogenesis-related regulated promoters (e.g., salicylic acid regulated promoters, ethylene regulated promoters, benzothiadiazole regulated promoters, etc.), temperature regulated promoters (e.g., heat shock inducible promoters (e.g., HSP-70, HSP-90, soybean heat shock promoter, etc.), light regulated promoters, synthetic inducible promoters, and the like.

Other examples of suitable promoters include the immediate early cytomegalovirus (CMV) promoter sequence. This promoter sequence is a strong constitutive promoter sequence capable of driving high levels of expression of any polynucleotide sequence operatively linked thereto. Other constitutive promoter sequences may also be used, including, but not limited to a simian virus 40 (SV40) early promoter, a mouse mammary tumor virus (MMTV) or human immunodeficiency virus (HIV) long terminal repeat (LTR) promoter, a MoMuLV promoter, an avian leukemia virus promoter, an Epstein-Barr virus immediate early promoter, a Rous sarcoma virus promoter, the EF-1 alpha promoter, as well as human gene promoters such as, but not limited to, an actin promoter, a myosin promoter, a hemoglobin promoter, and a creatine kinase promoter. Further, the invention should not be limited to the use of constitutive promoters. Inducible promoters are also contemplated as part of the invention. The use of an inducible promoter provides a molecular switch capable of turning on expression of the polynucleotide sequence which it is operatively linked when such expression is desired, or turning off the expression when expression is not desired. Examples of inducible promoters include, but are not limited to a metallothionine promoter, a glucocorticoid promoter, a progesterone promoter, and a tetracycline promoter.

In one embodiment, the vector comprises a U6 promoter and/or an EFS promoter. Certain embodiments of the invention include more than one promoter per plasmid/vector. It should be known to one of ordinary skill in the art that the when a plasmid/vector comprises more than one promoter, said promoters can include two or more of the same promoter or two or more different promoters. For example, the vector may comprise a first promoter comprising a U6 promoter and a second promoter comprising an EFS promoter.

In addition, any of the vectors/plasmids of the present invention can include additional components. For example, an antibiotic resistance gene/sequence. Any antibiotic resistance gene/sequence or selection marker known to one of ordinary skill in the art can be include in the vector. For example, the vector can comprise a Zeocin sequence. In one embodiment, the vector comprises a Hygromycin sequence.

The invention should be construed to encompass any type of vector known to one of ordinary skill in the art. For example, the vector can comprise a lentivirus, but can also comprise other viral vectors including but not limited to adenovirus, adeno-associated virus, retrovirus, hybrid viral vectors, or any combinations thereof. In one emobodiment, the vector comprises a lentiviral backbone.

In another aspect, the invention includes a cell or cell line comprising any of the vectors or libraries of the present invention. Any type of cell line known to one of ordinary skill in the art can be utilized. For example, the invention can include a CD8 T cell or cell line comprising a plasmid/vector of the present invention. In certain embodiments the cell is an engineered immune cell. The engineered immune cell can be for example, a T cell, a primary cell, a CD8$^+$ cell, a CD4$^+$ cell, a T regulatory (Treg) cell, or a CAR-T cell. In some embodiments, cell types include but are not limited to HeLa cells, T cells, autologous cells, and CAR T cells. In one embodiment, the cell is a CD8$^+$ T cell. The cell can include addition components, including but not limited to components useful for gene editing. For example, Cas9 can be included in the cell. Cas9 can be administered to the cell in any form, such as a plasmid, DNA, RNA, and protein.

In another aspect, the invention includes an immune cell or cell line comprising a vector encoding Prodh2, Ccnblip1, Sreklip1, Wdr37 or a fragment thereof. In some embodiments, the vector encodes Prodh2 or a fragment thereof.

Provided is a vector comprising a promoter, a chimeric antigen receptor (CAR) expression cassette and a nucleic acid encoding Prodh2, Ccnblip1, Sreklip1, Wdr37 or a fragment thereof. In some embodiments, the vector further comprises a T2A sequence and/or a short PA sequence. In further embodiments, the vector further comprises a TRAC locus homology-directed repair (HDR) 5' arm and a TRAC locus HDR 3' arm. In some preferred embodiments, the vector encodes Prodh2 or a fragment thereof.

In another aspect, the invention includes an engineered cell comprising any of the vectors of the invention.

In further aspects, the engineered cell further comprises a CRISPR system. In yet further aspects, the vector is inserted in the TRAC locus by HDR repair mediated by the CRISPR system.

In another aspect, the invention includes a chimeric antigen receptor (CAR), or a vector encoding a CAR. In some embodiments, the CAR comprises an antigen binding domain, a transmembrane domain and an intracellular domain. In some embodiments, the antigen binding domain binds CD22. In further embodiments, the intracellular or cytoplasmic domain comprises a costimulatory signaling region and a zeta chain portion, e.g., CD3 zeta. A costimulatory molecule is a cell surface molecule other than an antigen receptor or their ligands that is required for an efficient response of lymphocytes to an antigen. In some embodiments, the costimulatory signaling region of the CAR comprises an intracellular domain of a costimulatory molecule selected from the group consisting of CD27, CD28, 4-1BB (CD137), OX40, CD30, CD40, PD-1, ICOS, lymphocyte function-associated antigen-1 (LFA-1), CD2, CD7, LIGHT, NKG2C, B7-H3, and a ligand that specifically binds with CD83, and the like. The CAR may also comprises a spacer domain between the antigen binding domain and the transmembrane domain, or between the transmembrane domain and the intracellular domain. A spacer domain may comprise up to 10, 25, 50, 100 or 300 amino acids, and preferably 25-50 or 10-100 amino acids.

In some aspects of the invention, the antigen binding moiety of the CAR is fused with one or more intracellular domains selected from the group consisting of a 4-1BB (CD137) signaling domain, a CD28 signaling domain, a CD3 zeta signaling domain, and any combination thereof. In some aspects of the invention, the CAR comprises one or more domains selected from the group consisting of ICOS, ICOSL, OX40, OX40L, GITR, GITRL, Fc Receptor, G250, MP1, VZV, FMC36, Heregulin, IL-2, IL-7, IL-12, IL-15, IL-13, Ly49H, NKG2D, 7F5-b2, BBIR, and others.

Methods

Certain aspects of the invention include methods for designing and generating a dgRNA library, as well as methods for treating a disease and identifying a genetic target that boosts CD8$^+$ T cell effector function.

In one aspect, the invention includes a method of designing a dgRNA library. The method comprises identifying protein coding genes in a genome in silico, extracting 250 bp sequences upstream of the protein coding genes, and identifying 18mer dgRNA spacer sequences (15mer-NGG). The identified 18mers are aligned to the genome and sequences with a mismatch at position 17 or 18 in in the 18mer are discarded. Each alignment is scored based on the number of mismatches and sequences with a high mismatch score are discarded. From the remaining sequences, dgRNA spacer sequences are selected based on the shortest distance to the −200 position from the transcriptional start site.

Another aspect of the invention includes a method of generating a dgRNA library. The method comprises identifying protein coding genes in a genome in silico, extracting 250 bp sequences upstream of the protein coding genes, and identifying 18mer dgRNA spacer sequences (15mer-NGG). The identified 18mers are aligned to the genome and sequences with a mismatch at position 17 or 18 in in the 18mer are discarded. Each alignment is scored based on the number of mismatches and sequences with a high mismatch score are discarded. From the remaining sequences, dgRNA spacer sequences are selected based on the shortest distance to the −200 position from the transcriptional start site. Oligonucleotides are synthesized based on the selected dgRNA spacer sequences and cloned into a vector. The vector is then packaged into a lentiviral library.

In certain embodiments, the mismatch scoring comprises use of the formula: (#of 0 mismatch alignments*1000)+(#of 1 mismatch alignments*50)+(#of 2 mismatch alignments*1). When the mismatch score>=2000, the sequence is discarded.

Yet another aspect of the inveniton includes a method of identifying a genetic target that boosts CD8$^+$ T cell effector function. The method comprises administering a composition comprising a Cas9 and a lentiviral dgRNA library to a naïve CD8$^+$ T cell. The library comprises a plurality of vectors, wherein each vector comprises an expression cassette for a dgRNA. The CD8$^+$ T cell is activated then incubated with a diseased cell or a cancer cell. The CD8$^+$ T cell is measured for degranulation and when degranulation is increased relative to a control sample, the CD8$^+$ T cell is sequenced and a genetic target is identified.

Nucleotide sequencing or "sequencing", as it is commonly known in the art, can be performed by standard methods commonly known to one of ordinary skill in the art. In certain embodiments of the invention sequencing is performed via next-generation sequencing. Next-generation sequencing (NGS), also known as high-throughput sequencing, is used herein to describe a number of different modern sequencing technologies that allow sequencing of DNA and RNA much more quickly and cheaply than the previously used Sanger sequencing (Metzker, 2010, Nature Reviews Genetics 11.1:31-46). It is based on micro- and nanotechnologies to reduce the size of sample, the reagent costs, and to enable massively parallel sequencing reactions. It can be highly multiplexed which allows simultaneous sequencing and analysis of millions of samples. NGS includes first, second, third as well as subsequent Next Generations Sequencing technologies. Data generated from NGS can be analyzed via a broad range of computational tools. The wide variety of analysis can be appreciated and performed by those skilled in the art.

Still another aspect of the invention includes a method of treating a disease in a subject in need thereof. The method comprises administering a composition comprising a Cas9 and a dgRNA lentiviral library to an immune cellcell from the subject. In some embodiments, the immune cell can be for example, a T cell, a primary cell, a CD8$^+$ cell, a CD4$^+$ cell, a T regulatory (Treg) cell, or a CAR-T cell. The library comprises a plurality of vectors, wherein each vector comprises an expression cassette for a dgRNA. The immune cell is incubated with a diseased cell from the patient. One or more genes that increase degranulation in the immune cell when incubated with the diseased cell is identified. Then, the subject is treated with an agonist to the one or more identified genes or gene products thereof. In certain embodiments, identifying comprises sequencing the immune cell if degranulation is increased relative to a control sample. In certain embodiments, the disease is cancer and the diseased cell is a cancer cell.

In certain embodiments, the dgRNA library comprises one or more nucleotide sequences selected from the group consisting of SEQ ID NOs. 1-83,601. In certain embodiments, the dgRNA library comprises the nucleotide sequences consisting of SEQ ID NOs. 1-83,601.

Another aspect of the invention includes a method of treating a disease in a subject in need thereof comprising administering a composition comprising Cas9 and a dgRNA lentiviral vector to an immune cell and administering the immune cell to the subject. The vector comprises a dgRNA that targets one or more genes selected from the group consisting of Prodh2, Ccnblip1, Sreklip1, or Wdr37. The cell can be from the subject or from another source. In certain embodiments, the cell is an autologous T cell. In some embodiments, the immune cell can be for example, a T cell, a primary cell, a CD8$^+$ cell, a CD4$^+$ cell, a T regulatory (Treg) cell, or a CAR-T cell. In certain embodiments, the disease is cancer and the diseased cell is a cancer cell. In certain embodiments, the dgRNA comprises a nucleotide sequence selected from the group consisting of SEQ ID NOs. 55,168-55,171, SEQ ID NOs. 79,364-79,367, SEQ ID NOs. 55,044-55,047; SEQ ID NOs. 55,671-55,674, SEQ ID NOs. 25,546-25,549, and SEQ ID NOs. 34,631-34,634.

Yet another aspect of the invention includes a method of activating degranulation in an immune cell in a subject. The method comprises administering a composition comprising Cas9 and a dgRNA lentiviral vector to the immune cell from the subject, wherein the vector comprises a dgRNA that targets one or more genes selected from the group consisting of Prodh2, Ccnblip1, Sreklip1, or Wdr37. In certain embodiments, the dgRNA comprises a nucleotide sequence selected from the group consisting of SEQ ID NOs. 55,168-55,171, SEQ ID NOs. 79,364-79,367, SEQ ID NOs. 55,044-55,047; SEQ ID NOs. 55,671-55,674, SEQ ID NOs. 25,546-25,549, and SEQ ID NOs. 34,631-34,634.

Yet another aspect of the invention includes a method of treating a disease in a subject in need thereof comprising administering to the subject a therapeutically effective amount of a pharmaceutical composition comprising an agonists of one or more genes or gene products thereof selected from the group consisting of Prodh2, Ccnblip1, Sreklip1, or Wdr37. In certain embodiments, the disease is cancer and the diseased cell is a cancer cell.

The invention also includes a method of activating degranulation in a immune cell in a subject comprising administering to the subject a therapeutically effective amount of a pharmaceutical composition comprising an agonists of one or more genes or gene products thereof selected from the group consisting of Prodh2, Ccnblip1, Sreklip1, or Wdr37.

In various embodiments, the methods of the invention relate to immune cells. Any type of immune cell is meant to be included, for example various subtypes of CD8$^+$ T cells such as effector T cell, memory T cell, central memory T cell, effector memory T cell; and CD4$^+$ T helper cells including Th1, Th2, Th17, and Treg. In some embodiments, the immune cell is a CAR-T cell. This system can also be applied to other types of primary immune cells including, but not limited to, hematopoietic stem cell (HSC), macrophage, natural killer (NK) cell, and dendritic cell (DC).

Another aspect of the invention includes a method of treating a disease in a subject in need thereof comprising administering to the subject a therapeutically effective amount of an engineered cell of the invention. In some aspects the engineered cell comprises a vector comprising a promoter, a chimeric antigen receptor (CAR) expression cassette and a nucleic acid encoding Prodh2, Ccnblip1, Sreklip1, Wdr37 or a fragment thereof. In some embodiments, the nucleic acid encodes Prodh2 or a fragment thereof. In some embodiments, the vector further comprises a T2A sequence and/or a short PA sequence. In further embodiments, the vector further comprises a TRAC locus homology-directed repair (HDR) 5' arm and a TRAC locus HDR 3' arm. In some embodiments, the disease is cancer.

Another aspect of the invention comprises a method of generating an engineered immune cell comprising introducing into the immune cell one or more of the vectors described herein. In some aspects the method further comprise introducing into the immune cell a CRISPR system. In yet further aspects, the vector is inserted into the TRAC locus by HDR repair mediated by the CRISPR system.

Another aspect of the invention comprises a method of treating a disease in a subject in need thereof, the method comprising: administering to the subject a therapeutically effective amount of a composition comprising a Prodh2, Ccnblip1, Sreklip1, Wdr37 peptide or a fragment thereof. In some embodiments, the composition comprises Prodh2 or a fragment thereof. In some aspects, the Prodh2, Ccnblip1, Sreklip1, Wdr37 peptide or a fragment thereof is human. In some aspects, the disease is cancer.

Cancer and Other Diseases/Disorders

Certain embodiments of the invention include compositions and methods for treating a disease. Any disease that can be targeted by a $CD8^+$ T cell and/or wherein binding to the cognate antigen causes degranulation in the $CD8^+$ T cell can be treated with the compositions of the present invention. Diseases/disorder/conditions that can be treated include but are not limited to autoimmune diseases, inflammation, neuroimmune disorders, and other immune system disorders.

Immune system disorders include, but are not limited to: 22q11.2 deletion syndrome, Achondroplasia and severe combined immunodeficiency, Adenosine Deaminase 2 deficiency, Adenosine deaminase deficiency, Adult-onset immunodeficiency with anti-interferon-gamma autoantibodies, Agammaglobulinemia, non-Bruton type, Aicardi-Goutieres syndrome, Aicardi-Goutieres syndrome type 5, Allergic bronchopulmonary aspergillosis, Alopecia areata, Alopecia totalis, Alopecia universalis, Amyloidosis AA, Amyloidosis familial visceral, Ataxia telangiectasia, Autoimmune lymphoproliferative syndrome, Autoimmune lymphoproliferative syndrome due to CTLA4 haploinsuffiency, Autoimmune polyglandular syndrome type 1, Autosomal dominant hyper IgE syndrome, Autosomal recessive early-onset inflammatory bowel disease, Autosomal recessive hyper IgE syndrome, Bare lymphocyte syndrome 2, Barth syndrome, Blau syndrome, Bloom syndrome, Bronchiolitis obliterans, C1q deficiency, Candidiasis familial chronic mucocutaneous, autosomal recessive, Cartilage-hair hypoplasia, CHARGE syndrome, Chediak-Higashi syndrome, Cherubism, Chronic atypical neutrophilic dermatosis with lipodystrophy and elevated temperature, Chronic graft versus host disease, Chronic granulomatous disease, Chronic Infantile Neurological Cutaneous Articular syndrome, Chronic mucocutaneous candidiasis (CMC)—Not a rare disease, Cohen syndrome, Combined immunodeficiency with skin granulomas, Common variable immunodeficiency, Complement component 2 deficiency, Complement component 8 deficiency type 1, Complement component 8 deficiency type 2, Congenital pulmonary alveolar proteinosis, Cryoglobulinemia, Cutaneous mastocytoma, Cyclic neutropenia, Deficiency of interleukin-1 receptor antagonist, Dendritic cell, monocyte, B lymphocyte, and natural killer lymphocyte deficiency, Dyskeratosis congenital, Dyskeratosis congenita autosomal dominant, Dyskeratosis congenita autosomal recessive, Dyskeratosis congenita X-linked, Epidermodysplasia verruciformis, Familial amyloidosis, Finnish type, Familial cold autoinflammatory syndrome, Familial Mediterranean fever, Familial mixed cryoglobulinemia, Felty's syndrome, Glycogen storage disease type 1B, Griscelli syndrome type 2, Hashimoto encephalopathy, Hashimoto's syndrome-Not a rare disease, Hemophagocytic lymphohistiocytosis, Hennekam syndrome, Hepatic venoocclusive disease with immunodeficiency, Hereditary folate malabsorption, Hermansky Pudlak syndrome 2, Herpes simplex encephalitis, Hoyeraal Hreidarsson syndrome, Hyper IgE syndrome, Hyper-IgD syndrome, ICF syndrome, Idiopathic acute eosinophilic pneumonia, Idiopathic CD4 positive T-lymphocytopenia, IL12RB1 deficiency, Immune defect due to absence of thymus, Immune dysfunction with T-cell inactivation due to calcium entry defect 1, Immune dysfunction with T-cell inactivation due to calcium entry defect 2, Immunodeficiency with hyper IgM type 1, Immunodeficiency with hyper IgM type 2, Immunodeficiency with hyper IgM type 3, Immunodeficiency with hyper IgM type 4, Immunodeficiency with hyper IgM type 5, Immunodeficiency with thymoma, Immunodeficiency without anhidrotic ectodermal dysplasia, Immunodysregulation, polyendocrinopathy and enteropathy X-linked, Immunoglobulin A deficiency 2, Intestinal atresia multiple, IRAK-4 deficiency, Isolated growth hormone deficiency type 3, Kawasaki disease, Large granular lymphocyte leukemia, Leukocyte adhesion deficiency type 1, LRBA deficiency, Lupus-Not a rare disease, Lymphocytic hypophysitis, Majeed syndrome, Melkersson-Rosenthal syndrome, MHC class 1 deficiency, Muckle-Wells syndrome, Multifocal fibrosclerosis, Multiple sclerosis, MYD88 deficiency, Neonatal systemic lupus erythematosus, Netherton syndrome, Neutrophil-specific granule deficiency, Nijmegen breakage syndrome, Omenn syndrome, Osteopetrosis autosomal recessive 7, Palindromic rheumatism, Papillon Lefevre syndrome, Partial androgen insensitivity syndrome, PASLI disease, Pearson syndrome, Pediatric multiple sclerosis, Periodic fever, aphthous stomatitis, pharyngitis and adenitis, PGM3-CDG, Poikiloderma with neutropenia, Pruritic urticarial papules plaques of pregnancy, Purine nucleoside phosphorylase deficiency, Pyogenic arthritis, pyoderma gangrenosum and acne, Relapsing polychondritis, Reticular dysgenesis, Sarcoidosis, Say Barber Miller syndrome, Schimke immunoosseous dysplasia, Schnitzler syndrome, Selective IgA deficiency, Selective IgM deficiency, Severe combined immunodeficiency, Severe combined immunodeficiency due to complete RAG1/2 deficiency, Severe combined immunodeficiency with sensitivity to ionizing radiation, Severe combined immunodeficiency, atypical, Severe congenital neutropenia autosomal recessive 3, Severe congenital neutropenia X-linked, Shwachman-Diamond syndrome, Singleton-Merten syndrome, SLC35C1-CDG (CDG-IIc), Specific antibody deficiency, Spondyloenchondrodysplasia, Stevens- Johnson syndrome, T-cell immunodeficiency, congenital alopecia and nail dystrophy, TARP syndrome, Trichohepatoenteric syndrome, Tumor necrosis factor receptor-associated periodic syndrome, Twin to twin transfusion syndrome, Vici syndrome, WHIM syndrome, Wiskott Aldrich syndrome, Woods Black Norbury syndrome, X-linked agammaglobulinemia, X-linked lymphoproliferative syndrome, X-linked lymphoproliferative syndrome 1, X-linked lymphoproliferative syndrome 2, X-linked magnesium deficiency with Epstein-Barr virus infection and neoplasia, X-linked severe combined immunodeficiency, and ZAP-70 deficiency.

Autoimmune diseases (not mutually exclusive with list of immune system disorders) include but are not limited to Achalasia, Addison's disease, Adult Still's disease, Agammaglobulinemia, Alopecia areata, Amyloidosis, Ankylosing spondylitis, Anti-GBM/Anti-TBM nephritis, Antiphospholipid syndrome, Autoimmune angioedema, Autoimmune dysautonomia, Autoimmune encephalomyelitis, Autoimmune hepatitis, Autoimmune inner ear disease (AIED), Autoimmune myocarditis, Autoimmune oophoritis, Autoimmune orchitis, Autoimmune pancreatitis, Autoimmune retinopathy, Autoimmune urticaria, Axonal & neuronal neuropathy (AMAN), Baló disease, Behcet's disease, Benign mucosal pemphigoid, Bullous pemphigoid, Castleman disease (CD), Celiac disease, Chagas disease, Chronic inflammatory demyelinating polyneuropathy (CIDP), Chronic recurrent multifocal osteomyelitis (CRMO), Churg-Strauss Syndrome (CSS) or Eosinophilic Granulomatosis (EGPA), Cicatricial pemphigoid, Cogan's syndrome, Cold agglutinin disease, Congenital heart block, Coxsackie myocarditis, CREST syndrome, Crohn's disease, Dermatitis herpetiformis, Dermatomyositis, Devic's disease (neuromyelitis optica), Discoid lupus, Dressler's syndrome, Endometriosis, Eosinophilic esophagitis (EoE), Eosinophilic fasciitis, Erythema nodosum, Essential mixed cryoglobulinemia, Evans syndrome, Fibromyalgia, Fibrosing alveolitis, Giant cell arteritis (temporal arteritis), Giant cell myocarditis, Glomerulonephritis, Goodpasture's syndrome, Granulomatosis with Polyangiitis, Graves' disease, Guillain-Barre syndrome, Hashimoto's thyroiditis, Hemolytic anemia, Henoch-Schonlein purpura (HSP), Herpes gestationis or pemphigoid gestationis (PG), Hidradenitis Suppurativa (HS) (Acne Inversa), Hypogammalglobulinemia, IgA Nephropathy, IgG4-related sclerosing disease, Immune thrombocytopenia purpura (ITP), Inclusion body myositis (IBM), Interstitial cystitis (IC), Juvenile arthritis, Juvenile diabetes (Type 1 diabetes), Juvenile myositis (JM), Kawasaki disease, Lambert-Eaton syndrome, Leukocytoclastic vasculitis, Lichen planus, Lichen sclerosus, Ligneous conjunctivitis, Linear IgA disease (LAD), Lupus, Lyme disease chronic, Meniere's disease, Microscopic polyangiitis (MPA), Mixed connective tissue disease (MCTD), Mooren's ulcer, Mucha-Habermann disease, Multifocal Motor Neuropathy (MMN) or MMNCB, Multiple sclerosis, Myasthenia gravis, Myositis, Narcolepsy, Neonatal Lupus, Neuromyelitis optica, Neutropenia, Ocular cicatricial pemphigoid, Optic neuritis, Palindromic rheumatism (PR), PANDAS, Paraneoplastic cerebellar degeneration (PCD), Paroxysmal nocturnal hemoglobinuria (PNH), Parry Romberg syndrome, Pars planitis (peripheral uveitis), Parsonnage-Turner syndrome, Pemphigus, Peripheral neuropathy, Perivenous encephalomyelitis, Pernicious anemia (PA), POEMS syndrome, Polyarteritis nodosa, Polyglandular syndromes type I, II, III, Polymyalgia rheumatica, Polymyositis, Postmyocardial infarction syndrome, Postpericardiotomy syndrome, Primary biliary cirrhosis, Primary sclerosing cholangitis, Progesterone dermatitis, Psoriasis, Psoriatic arthritis, Pure red cell aplasia (PRCA), Pyoderma gangrenosum, Raynaud's phenomenon, Reactive Arthritis, Reflex sympathetic dystrophy, Relapsing polychondritis, Restless legs syndrome (RLS), Retroperitoneal fibrosis, Rheumatic fever, Rheumatoid arthritis, Sarcoidosis, Schmidt syndrome, Scleritis, Scleroderma, Sjögren's syndrome, Sperm & testicular autoimmunity, Stiff person syndrome (SPS), Subacute bacterial endocarditis (SBE), Susac's syndrome, Sympathetic ophthalmia (SO), Takayasu's arteritis, Temporal arteritis/Giant cell arteritis, Thrombocytopenia purpura (TTP), Tolosa-Hunt syndrome (THS), Transverse myelitis, Type 1 diabetes, Ulcerative colitis (UC), Undifferentiated connective tissue disease (UCTD), Uveitis, Vasculitis, Vitiligo, Vogt-Koyanagi-Harada Disease, and Wegener's granulomatosis (or Granulomatosis with Polyangiitis (GPA)).

The invention includes compositions and methods for treating cancer. Types of cancer that can be treated include, but are not limited to, Acute Lymphoblastic Leukemia (ALL), Acute Myeloid Leukemia (AML), Adrenocortical Carcinoma, AIDS-Related Cancers, Kaposi Sarcoma, AIDS-Related Lymphoma, Primary CNS Lymphoma, Anal Cancer, Appendix Cancer (Gastrointestinal Carcinoid Tumors), Astrocytomas, Atypical Teratoid/Rhabdoid Tumor, Brain Cancer, Basal Cell Carcinoma of the Skin, Bile Duct Cancer, Bladder Cancer, Bone Cancer (includes Ewing Sarcoma and Osteosarcoma and Malignant Fibrous Histiocytoma), Brain Tumors, Breast Cancer, Bronchial Tumors, Burkitt Lymphoma, Non-Hodgkin Lymphoma, Carcinoid Tumors, Carcinoma of Unknown Primary, Cardiac (Heart) Tumors, Embryonal Tumors, Germ Cell Tumor, Primary CNS Lymphoma, Cervical Cancer, Cholangiocarcinoma, Chordoma, Chronic Lymphocytic Leukemia (CLL), Chronic Myelogenous Leukemia (CML), Chronic Myeloproliferative Neoplasms, Colorectal Cancer, Craniopharyngioma, Cutaneous T-Cell Lymphoma (Mycosis Fungoides and Sézary Syndrome), Ductal Carcinoma In Situ (DCIS), Endometrial Cancer, Ependymoma, Esophageal Cancer, Esthesioneuroblastoma, Ewing Sarcoma, Extracranial Germ Cell Tumor, Eye Cancer, Intraocular Melanoma, Fallopian Tube Cancer, Fibrous Histiocytoma of Bone, Osteosarcoma, Gallbladder Cancer, Gastric Cancer, Stomach Cancer, Gastrointestinal Carcinoid Tumor, Gastrointestinal Stromal Tumors (GIST), Central Nervous System Germ Cell Tumors, Extracranial Germ Cell Tumors, Extragonadal Germ Cell Tumors, Ovarian Germ Cell Tumors, Testicular Cancer, Gestational Trophoblastic Disease, Hairy Cell Leukemia, Head and Neck Cancer, Heart Tumors, Hepatocellular (Liver) Cancer, Histiocytosis (Langerhans Cell), Hodgkin Lymphoma, Hypopharyngeal Cancer, Intraocular Melanoma, Islet Cell Tumors, Pancreatic Neuroendocrine Tumors, Kidney Cancer, Renal Cell Cancer, Langerhans Cell Histiocytosis, Laryngeal Cancer, Leukemia, Lip and Oral Cavity Cancer, Liver Cancer, Lung Cancer (Non-Small Cell and Small Cell), Lymphoma, Male Breast Cancer, Malignant Fibrous Histiocytoma of Bone and Osteosarcoma, Melanoma, Intraocular (Eye) Melanoma, Merkel Cell Carcinoma (Skin Cancer), Malignant Mesothelioma, Metastatic Cancer, Metastatic Squamous Neck Cancer with Occult Primary, Midline Tract Carcinoma With NUT Gene Changes, Mouth Cancer, Multiple Endocrine Neoplasia Syndromes, Multiple Myeloma/Plasma Cell Neoplasms, Mycosis Fungoides (Lymphoma), Myelodysplastic Syndromes, Myelodysplastic/Myeloproliferative Neoplasms, Nasal Cavity and Paranasal Sinus Cancer, Nasopharyngeal Cancer, Neuroblastoma, Non-Small Cell Lung Cancer, Oral Cancer, and Oropharyngeal Cancer, Ovarian Cancer, Pancreatic Cancer, Papillomatosis, Paraganglioma, Paranasal Sinus and Nasal Cavity Cancer, Parathyroid Cancer, Penile Cancer, Pharyngeal Cancer, Pheochromocytoma, Pituitary Tumor, Plasma Cell Neoplasm/Multiple Myeloma, Pleuropulmonary Blastoma, Primary Central Nervous System (CNS) Lymphoma, Primary Peritoneal Cancer, Prostate Cancer, Rectal Cancer Recurrent Cancer, Retinoblastoma, Rhabdomyosarcoma, Salivary Gland Cancer, Sarcoma, Vascular Tumors, Uterine Sarcoma, Sézary Syndrome (Lymphoma), Small Cell Lung Cancer, Small Intestine Cancer, Soft Tissue Sarcoma, Squamous Cell Carcinoma, Stomach (Gastric) Cancer, Throat Cancer, Thymoma, Thymic Carcinoma, Thyroid Cancer, Transitional Cell Cancer of the Renal Pelvis and Ureter, Carcinoma of Unknown Primary, Ureter and Renal Pelvis, Transitional Cell Cancer, Urethral Cancer, Uterine Cancer, Vaginal Cancer, Vulvar Cancer, Wilms Tumor, and combinations thereof.

In certain embodiments, the subject can be administered an additional treatment. For example, the subject can be administered a combination of a composition of the present invention and an additional treatment. Examples of additional treatments include but are not limited to, chemotherapy, radiation, surgery, medication, immune checkpoint inhibitors, immune checkpoint blockade (ICB) antibodies, immune checkpoint inhibitors that block CTLA-4 or PD1, anti-CTLA4 monoclonal antibody, anti-PD1 monoclonal antibody, anti-PD-L1 monoclonal antibody, adoptive cell transfer, human recombinant cytokines, cancer vaccines, immunotherapy, targeted therapy, hormone therapy, stem cell transplant, precision medicine, non-specific immunotherapy (e.g. cytokines and chemokines, such as IL-2, IFNa, IFNb, IFNg), oncolytic virus therapy, T-cell therapy (e.g. adoptive transfer of TILs, CAR-T therapy), cancer vaccines (e.g. conventional DC vaccine), Ipilimumab (Yervoy), Nivolumab (Opdivo), Pembrolizumab (Keytruda), Atezolizumab (Tecentriq), Avelumab (Bavencio), Durvalumab (Imfinzi), Anti-LAG-3, anti-TIM1, Anti-TIM3, Anti-CSF-R, IDO inhibitor, OX-40 agonist, GITR agonist, CD80 agonist, CD86 agonist, ICOS agonist, ICOSLG agonist, CD276 agonist, VTCN1 agonist, TNFSF14 agonist, TNFSF9 agonist, TNFSF4 agonist, CD70 agonist, CD40 agonist, LGALS9 agonist, CD80 inhibitor, CD86 inhibitor, ICOS inhibitor, ICOSLG inhibitor, CD276 inhibitor, VTCN1 inhibitor, TNFSF14 inhibitor, TNFSF9 inhibitor, TNFSF4 inhibitor, CD70 inhibitor, CD40 inhibitor, LGALS9 inhibitor, TLR9 agonist, CD20 antibody, CD80 antibody, TIGIT antibody, B7-H1 antibody, B7-H2 antibody, B7-H3 antibody, B7-H4 antibody, CD28 antibody, CD47 antibody, anti-BTLA, anti-Galetin9, anti-IL15R, anti-GD2. In some embodiments the monoclonal antibody is fully human, humanized or chimeric.

CRISPR/Cas9

The CRISPR/Cas9 system is a facile and efficient system for inducing targeted genetic alterations. Target recognition by the Cas9 protein requires a 'seed' sequence within the guide RNA (gRNA) and a conserved dinucleotide containing protospacer adjacent motif (PAM) sequence upstream of the gRNA-binding region. The CRISPR/Cas9 system can thereby be engineered to cleave virtually any DNA sequence by redesigning the gRNA in cell lines (such as 293T cells), primary cells, and CAR T cells. The CRISPR/Cas9 system can simultaneously target multiple genomic loci by co-expressing a single Cas9 protein with two or more gRNAs, making this system uniquely suited for multiple gene editing or synergistic activation of target genes.

The Cas9 protein and guide RNA form a complex that identifies and cleaves target sequences. Cas9 is comprised of six domains: REC I, REC II, Bridge Helix, PAM interacting, HNH, and RuvC. The RecI domain binds the guide RNA, while the Bridge helix binds to target DNA. The HNH and RuvC domains are nuclease domains. Guide RNA is engineered to have a 5' end that is complementary to the target DNA sequence. Upon binding of the guide RNA to the Cas9 protein, a conformational change occurs activating the protein. Once activated, Cas9 searches for target DNA by binding to sequences that match its protospacer adjacent motif (PAM) sequence. A PAM is a two or three nucleotide base sequence within one nucleotide downstream of the region complementary to the guide RNA. In one non-limiting example, the PAM sequence is 5'-NGG-3'. When the Cas9 protein finds its target sequence with the appropriate PAM, it melts the bases upstream of the PAM and pairs them with the complementary region on the guide RNA. Then the RuvC and HNH nuclease domains cut the target DNA after the third nucleotide base upstream of the PAM.

One non-limiting example of a CRISPR/Cas system used to inhibit gene expression, CRISPRi, is described in U.S. Patent Appl. Publ. No. US20140068797. CRISPRi induces permanent gene disruption that utilizes the RNA-guided Cas9 endonuclease to introduce DNA double stranded breaks, which trigger error-prone repair pathways to result in frame shift mutations. A catalytically dead Cas9 lacks endonuclease activity. When coexpressed with a guide RNA, a DNA recognition complex is generated that specifically interferes with transcriptional elongation, RNA polymerase binding, or transcription factor binding. This CRISPRi system efficiently represses expression of targeted genes.

CRISPR/Cas gene disruption occurs when a guide nucleotide sequence specific for a target gene and a Cas endonuclease are introduced into a cell and form a complex that enables the Cas endonuclease to introduce a double strand break at the target gene. In certain embodiments, the CRISPR/Cas system comprises an expression vector, such as, but not limited to, an pAd5F35-CRISPR vector. In other embodiments, the Cas expression vector induces expression of Cas9 endonuclease. Other endonucleases may also be used, including but not limited to, T7, Cas3, Cas8a, Cas8b, Cas10d, Cse1, Csy1, Csn2, Cas4, Cas10, Csm2, Cmr5, Fok1, other nucleases known in the art, and any combinations thereof.

In certain embodiments, inducing the Cas9 expression vector comprises exposing the cell to an agent that activates an inducible promoter in the Cas9 expression vector. In such embodiments, the Cas9 expression vector includes an inducible promoter, such as one that is inducible by exposure to an antibiotic (e.g., by tetracycline or a derivative of tetracycline, for example doxycycline). However, it should be appreciated that other inducible promoters can be used. The inducing agent can be a selective condition (e.g., exposure to an agent, for example an antibiotic) that results in induction of the inducible promoter. This results in expression of the Cas expression vector.

In certain embodiments, guide RNA(s) and Cas9 can be delivered to a cell as a ribonucleoprotein (RNP) complex. RNPs are comprised of purified Cas9 protein complexed with gRNA and are well known in the art to be efficiently delivered to multiple types of cells, including but not limited to stem cells and immune cells (Addgene, Cambridge, MA, Mirus Bio LLC, Madison, WI).

The guide RNA is specific for a genomic region of interest and targets that region for Cas endonuclease-induced double strand breaks. The target sequence of the guide RNA sequence may be within a loci of a gene or within a non-coding region of the genome. In certain embodiments, the guide nucleotide sequence is at least 10, 11, 12, 13, 14, 15, 16, 17, 18, 19, 20, 21, 22, 23, 24, 25, 26, 27, 30, 31, 32, 33, 34, 35, 36, 37, 38, 39, 40 or more nucleotides in length.

Guide RNA (gRNA), also referred to as "short guide RNA" or "sgRNA", provides both targeting specificity and scaffolding/binding ability for the Cas9 nuclease. The gRNA can be a synthetic RNA composed of a targeting sequence and scaffold sequence derived from endogenous bacterial crRNA and tracrRNA. gRNA is used to target Cas9 to a specific genomic locus in genome engineering experiments. Guide RNAs can be designed using standard tools well known in the art.

In the context of formation of a CRISPR complex, "target sequence" refers to a sequence to which a guide sequence is designed to have some complementarity, where hybridization between a target sequence and a guide sequence promotes the formation of a CRISPR complex. Full complementarity is not necessarily required, provided there is sufficient complementarity to cause hybridization and promote formation of a CRISPR complex. A target sequence may comprise any polynucleotide, such as a DNA or a RNA polynucleotide. In certain embodiments, a target sequence is located in the nucleus or cytoplasm of a cell. In other embodiments, the target sequence may be within an organelle of a eukaryotic cell, for example, mitochondrion or nucleus. Typically, in the context of an endogenous CRISPR system, formation of a CRISPR complex (comprising a guide sequence hybridized to a target sequence and complexed with one or more Cas proteins) results in cleavage of one or both strands in or near (e.g., within about 1, 2, 3, 4, 5, 6, 7, 8, 9, 10, 20, 50 or more base pairs) the target sequence. As with the target sequence, it is believed that complete complementarity is not needed, provided this is sufficient to be functional.

In certain embodiments, one or more vectors driving expression of one or more elements of a CRISPR system are introduced into a host cell, such that expression of the elements of the CRISPR system direct formation of a CRISPR complex at one or more target sites. For example, a Cas enzyme, a guide sequence linked to a tracr-mate sequence, and a tracr sequence could each be operably linked to separate regulatory elements on separate vectors. Alternatively, two or more of the elements expressed from the same or different regulatory elements may be combined in a single vector, with one or more additional vectors providing any components of the CRISPR system not included in the first vector. CRISPR system elements that are combined in a single vector may be arranged in any suitable orientation, such as one element located 5' with respect to ("upstream" of) or 3' with respect to ("downstream" of) a second element. The coding sequence of one element may be located on the same or opposite strand of the coding sequence of a second element, and oriented in the same or opposite direction. In certain embodiments, a single promoter drives expression of a transcript encoding a CRISPR enzyme and one or more of the guide sequence, tracr mate sequence (optionally operably linked to the guide sequence), and a tracr sequence embedded within one or more intron sequences (e.g., each in a different intron, two or more in at least one intron, or all in a single intron).

In certain embodiments, the CRISPR enzyme is part of a fusion protein comprising one or more heterologous protein domains (e.g. about or more than about 1, 2, 3, 4, 5, 6, 7, 8, 9, 10, or more domains in addition to the CRISPR enzyme). A CRISPR enzyme fusion protein may comprise any additional protein sequence, and optionally a linker sequence between any two domains. Examples of protein domains that may be fused to a CRISPR enzyme include, without limitation, epitope tags, reporter gene sequences, and protein domains having one or more of the following activities: methylase activity, demethylase activity, transcription activation activity, transcription repression activity, transcription release factor activity, histone modification activity, RNA cleavage activity and nucleic acid binding activity. Additional domains that may form part of a fusion protein comprising a CRISPR enzyme are described in U.S. Patent Appl. Publ. No. US20110059502, which is incorporated herein by reference. In certain embodiments, a tagged CRISPR enzyme is used to identify the location of a target sequence.

Conventional viral and non-viral based gene transfer methods can be used to introduce nucleic acids in mammalian and non-mammalian cells or target tissues. Such methods can be used to administer nucleic acids encoding components of a CRISPR system to cells in culture, or in a host organism. Non-viral vector delivery systems include DNA plasmids, RNA (e.g., a transcript of a vector described herein), naked nucleic acid, and nucleic acid complexed with a delivery vehicle, such as a liposome. Viral vector delivery systems include DNA and RNA viruses, which have either episomal or integrated genomes after delivery to the cell (Anderson, 1992, Science 256:808-813; and Yu, et al., 1994, Gene Therapy 1:13-26).

In certain embodiments, the CRISPR/Cas is derived from a type II CRISPR/Cas system. In some embodiments, the CRISPR/Cas system is derived from a Cas9 protein. The Cas9 protein can be from *Streptococcus pyogenes, Streptococcus thermophilus*, or other species.

In general, Cas proteins comprise at least one RNA recognition and/or RNA binding domain. RNA recognition and/or RNA binding domains interact with the guiding RNA. Cas proteins can also comprise nuclease domains (i.e., DNase or RNase domains), DNA binding domains, helicase domains, RNAse domains, protein-protein interaction domains, dimerization domains, as well as other domains. The Cas proteins can be modified to increase nucleic acid binding affinity and/or specificity, alter an enzymatic activity, and/or change another property of the protein. In certain embodiments, the Cas-like protein of the fusion protein can be derived from a wild type Cas9 protein or fragment thereof. In other embodiments, the Cas can be derived from modified Cas9 protein. For example, the amino acid sequence of the Cas9 protein can be modified to alter one or more properties (e.g., nuclease activity, affinity, stability, and so forth) of the protein. Alternatively, domains of the Cas9 protein not involved in RNA-guided cleavage can be eliminated from the protein such that the modified Cas9 protein is smaller than the wild type Cas9 protein. In general, a Cas9 protein comprises at least two nuclease (i.e., DNase) domains. For example, a Cas9 protein can comprise a RuvC-like nuclease domain and a HNH-like nuclease domain. The RuvC and HNH domains work together to cut single strands to make a double-stranded break in DNA. (Jinek, et al., 2012, Science, 337:816-821). In certain embodiments, the Cas9-derived protein can be modified to contain only one functional nuclease domain (either a RuvC-like or a HNH-like nuclease domain). For example, the Cas9-derived protein can be modified such that one of the nuclease domains is deleted or mutated such that it is no longer functional (i.e., the nuclease activity is absent). In some embodiments in which one of the nuclease domains is inactive, the Cas9-derived protein is able to introduce a nick into a double-stranded nucleic acid (such protein is termed a "nickase"), but not cleave the double-stranded DNA. In any of the above-described embodiments, any or all of the nuclease domains can be inactivated by one or more deletion mutations, insertion mutations, and/or substitution mutations using well-known methods, such as site-directed mutagenesis, PCR-mediated mutagenesis, and total gene synthesis, as well as other methods known in the art.

In one non-limiting embodiment, a vector drives the expression of the CRISPR system. The art is replete with suitable vectors that are useful in the present invention. The vectors to be used are suitable for replication and, optionally, integration in eukaryotic cells. Typical vectors contain transcription and translation terminators, initiation sequences, and promoters useful for regulation of the expression of the desired nucleic acid sequence. The vectors of the present invention may also be used for nucleic acid standard gene delivery protocols. Methods for gene delivery are known in the art (U.S. Pat. Nos. 5,399,346, 5,580,859 & 5,589,466, incorporated by reference herein in their entireties).

Further, the vector may be provided to a cell in the form of a viral vector. Viral vector technology is well known in the art and is described, for example, in Sambrook et al. (4th Edition, Molecular Cloning: A Laboratory Manual, Cold Spring Harbor Laboratory, New York, 2012), and in other virology and molecular biology manuals. Viruses, which are useful as vectors include, but are not limited to, retroviruses, adenoviruses, adeno-associated viruses, herpes viruses, Sindbis virus, gammaretrovirus and lentiviruses. In general, a suitable vector contains an origin of replication functional in at least one organism, a promoter sequence, convenient restriction endonuclease sites, and one or more selectable markers (e.g., WO 01/96584; WO 01/29058; and U.S. Pat. No. 6,326,193).

Introduction of Nucleic Acids

In certain embodiments an expression system is used for the introduction of dgRNAs and Cas9 proteins into the cells of interest. Typically employed options include but are not limited to plasmids and viral vectors such as adeno-associated virus (AAV) vector or lentivirus vector.

Methods of introducing nucleic acids into a cell include physical, biological and chemical methods. Physical methods for introducing a polynucleotide, such as RNA, into a host cell include calcium phosphate precipitation, lipofection, particle bombardment, microinjection, electroporation, and the like. RNA can be introduced into target cells using commercially available methods which include electroporation (Amaxa Nucleofector-II (Amaxa Biosystems, Cologne, Germany)), (ECM 830 (BTX) (Harvard Instruments, Boston, Mass.) or the Gene Pulser II (BioRad, Denver, Colo.), Multiporator (Eppendort, Hamburg Germany). RNA can also be introduced into cells using cationic liposome mediated transfection using lipofection, using polymer encapsulation, using peptide mediated transfection, or using biolistic particle delivery systems such as "gene guns" (see, for example, Nishikawa, et al. Hum Gene Ther., 12(8): 861-70 (2001).

Biological methods for introducing a polynucleotide of interest into a host cell include the use of DNA and RNA vectors. Viral vectors, and especially retroviral vectors, have become the most widely used method for inserting genes into mammalian, e.g., human cells. Other viral vectors can be derived from lentivirus, poxviruses, herpes simplex virus I, adenoviruses and adeno-associated viruses, and the like. See, for example, U.S. Pat. Nos. 5,350,674 and 5,585,362.

Chemical means for introducing a polynucleotide into a host cell include colloidal dispersion systems, such as macromolecule complexes, nanocapsules, microspheres, beads, and lipid-based systems including oil-in-water emulsions, micelles, mixed micelles, and liposomes. An exemplary colloidal system for use as a delivery vehicle in vitro and in vivo is a liposome (e.g., an artificial membrane vesicle).

Lipids suitable for use can be obtained from commercial sources. For example, dimyristyl phosphatidylcholine ("DMPC") can be obtained from Sigma, St. Louis, MO; dicetyl phosphate ("DCP") can be obtained from K & K Laboratories (Plainview, NY); cholesterol ("Choi") can be obtained from Calbiochem-Behring; dimyristyl phosphatidylglycerol ("DMPG") and other lipids may be obtained from Avanti Polar Lipids, Inc. (Birmingham, AL). Stock solutions of lipids in chloroform or chloroform/methanol can be stored at about −20° C. Chloroform is used as the only solvent since it is more readily evaporated than methanol. "Liposome" is a generic term encompassing a variety of single and multilamellar lipid vehicles formed by the generation of enclosed lipid bilayers or aggregates. Liposomes can be characterized as having vesicular structures with a phospholipid bilayer membrane and an inner aqueous medium. Multilamellar liposomes have multiple lipid layers separated by aqueous medium. They form spontaneously when phospholipids are suspended in an excess of aqueous solution. The lipid components undergo self-rearrangement before the formation of closed structures and entrap water and dissolved solutes between the lipid bilayers (Ghosh et al., 1991 Glycobiology 5:505-10). However, compositions that have different structures in solution than the normal vesicular structure are also encompassed. For example, the lipids may assume a micellar structure or merely exist as nonuniform aggregates of lipid molecules. Also contemplated are lipofectamine-nucleic acid complexes.

Regardless of the method used to introduce exogenous nucleic acids into a host cell or otherwise expose a cell to the inhibitor of the present invention, in order to confirm the presence of the nucleic acids in the host cell, a variety of assays may be performed. Such assays include, for example, "molecular biological" assays well known to those of skill in the art, such as Southern and Northern blotting, RT-PCR and PCR; "biochemical" assays, such as detecting the presence or absence of a particular peptide, e.g., by immunological means (ELISAs and Western blots) or by assays described herein to identify agents falling within the scope of the invention.

Moreover, the nucleic acids may be introduced by any means, such as transducing the cells, transfecting the cells, and electroporating the cells. One nucleic acid may be introduced by one method and another nucleic acid may be introduced into the cell by a different method.

RNA

In one embodiment, the nucleic acids introduced into the cell are RNA. In another embodiment, the RNA is mRNA that comprises in vitro transcribed RNA or synthetic RNA. The RNA is produced by in vitro transcription using a polymerase chain reaction (PCR)-generated template. DNA of interest from any source can be directly converted by PCR into a template for in vitro mRNA synthesis using appropriate primers and RNA polymerase. The source of the DNA can be, for example, genomic DNA, plasmid DNA, phage DNA, cDNA, synthetic DNA sequence or any other appropriate source of DNA.

PCR can be used to generate a template for in vitro transcription of mRNA which is then introduced into cells. Methods for performing PCR are well known in the art. Primers for use in PCR are designed to have regions that are substantially complementary to regions of the DNA to be used as a template for the PCR. "Substantially complementary", as used herein, refers to sequences of nucleotides where a majority or all of the bases in the primer sequence are complementary, or one or more bases are non-complementary, or mismatched. Substantially complementary sequences are able to anneal or hybridize with the intended DNA target under annealing conditions used for PCR. The primers can be designed to be substantially complementary to any portion of the DNA template. For example, the primers can be designed to amplify the portion of a gene that is normally transcribed in cells (the open reading frame), including 5' and 3' UTRs. The primers can also be designed to amplify a portion of a gene that encodes a particular domain of interest. In one embodiment, the primers are designed to amplify the coding region of a human cDNA, including all or portions of the 5' and 3' UTRs. Primers useful for PCR are generated by synthetic methods that are well known in the art. "Forward primers" are primers that contain a region of nucleotides that are substantially complementary to nucleotides on the DNA template that are upstream of the DNA sequence that is to be amplified. "Upstream" is used herein to refer to a location 5, to the DNA sequence to be amplified relative to the coding strand. "Reverse primers" are primers that contain a region of nucleotides that are substantially complementary to a double-stranded DNA template that are downstream of the DNA sequence that is to be amplified. "Downstream" is used herein to refer to a location 3' to the DNA sequence to be amplified relative to the coding strand.

Chemical structures that have the ability to promote stability and/or translation efficiency of the RNA may also be used. The RNA preferably has 5' and 3' UTRs. In one embodiment, the 5' UTR is between zero and 3000 nucleotides in length. The length of 5' and 3' UTR sequences to be added to the coding region can be altered by different methods, including, but not limited to, designing primers for PCR that anneal to different regions of the UTRs. Using this approach, one of ordinary skill in the art can modify the 5' and 3' UTR lengths required to achieve optimal translation efficiency following transfection of the transcribed RNA.

The 5' and 3' UTRs can be the naturally occurring, endogenous 5' and 3' UTRs for the gene of interest. Alternatively, UTR sequences that are not endogenous to the gene of interest can be added by incorporating the UTR sequences into the forward and reverse primers or by any other modifications of the template. The use of UTR sequences that are not endogenous to the gene of interest can be useful for modifying the stability and/or translation efficiency of the RNA. For example, it is known that AU-rich elements in 3' UTR sequences can decrease the stability of mRNA. Therefore, 3' UTRs can be selected or designed to increase the stability of the transcribed RNA based on properties of UTRs that are well known in the art.

In one embodiment, the 5' UTR can contain the Kozak sequence of the endogenous gene. Alternatively, when a 5' UTR that is not endogenous to the gene of interest is being added by PCR as described above, a consensus Kozak sequence can be redesigned by adding the 5' UTR sequence. Kozak sequences can increase the efficiency of translation of some RNA transcripts, but does not appear to be required for all RNAs to enable efficient translation. The requirement for Kozak sequences for many mRNAs is known in the art. In other embodiments the 5' UTR can be derived from an RNA virus whose RNA genome is stable in cells. In other embodiments various nucleotide analogues can be used in the 3' or 5' UTR to impede exonuclease degradation of the mRNA.

To enable synthesis of RNA from a DNA template, a promoter of transcription should be attached to the DNA template upstream of the sequence to be transcribed. When a sequence that functions as a promoter for an RNA polymerase is added to the 5' end of the forward primer, the RNA polymerase promoter becomes incorporated into the PCR product upstream of the open reading frame that is to be transcribed. In one embodiment, the promoter is a T7 polymerase promoter, as described elsewhere herein. Other useful promoters include, but are not limited to, T3 and SP6 RNA polymerase promoters. Consensus nucleotide sequences for T7, T3 and SP6 promoters are known in the art.

In one embodiment, the mRNA has a cap on the 5' end and a 3' poly(A) tail which determine ribosome binding, initiation of translation and stability mRNA in the cell. On a circular DNA template, for instance, plasmid DNA, RNA polymerase produces a long concatameric product which may not be suitable for expression in eukaryotic cells. The transcription of plasmid DNA linearized at the end of the 3' UTR results in normal sized mRNA which may not be effective in eukaryotic transfection even if it is polyadenylated after transcription.

On a linear DNA template, phage T7 RNA polymerase can extend the 3' end of the transcript beyond the last base of the template (Schenborn and Mierendorf, Nuc Acids Res., 13:6223-36 (1985); Nacheva and Berzal-Herranz, Eur. J. Biochem., 270:1485-65 (2003)).

The conventional method of integration of polyA/T stretches into a DNA template is by molecular cloning. However polyA/T sequence integrated into plasmid DNA can cause plasmid instability, which is why plasmid DNA templates obtained from bacterial cells are often highly contaminated with deletions and other aberrations. This makes cloning procedures not only laborious and time consuming but often not reliable. That is why a method which allows construction of DNA templates with polyA/T 3' stretch without cloning highly desirable.

The polyA/T segment of the transcriptional DNA template can be produced during PCR by using a reverse primer containing a polyT tail, such as 100 T tail (size can be 50-5000 T), or after PCR by any other method, including, but not limited to, DNA ligation or in vitro recombination. Poly(A) tails also provide stability to RNAs and reduce their degradation. Generally, the length of a poly(A) tail positively correlates with the stability of the transcribed RNA. In one embodiment, the poly(A) tail is between 100 and 5000 adenosines.

Poly(A) tails of RNAs can be further extended following in vitro transcription with the use of a poly(A) polymerase, such as E. coli polyA polymerase (E-PAP). In one embodiment, increasing the length of a poly(A) tail from 100 nucleotides to between 300 and 400 nucleotides results in about a two-fold increase in the translation efficiency of the RNA. Additionally, the attachment of different chemical groups to the 3' end can increase mRNA stability. Such attachment can contain modified/artificial nucleotides, aptamers and other compounds. For example, ATP analogs can be incorporated into the poly(A) tail using poly(A) polymerase. ATP analogs can further increase the stability of the RNA.

5' caps also provide stability to RNA molecules. In a preferred embodiment, RNAs produced by the methods disclosed herein include a 5' cap. The 5' cap is provided using techniques known in the art and described herein (Cougot, et al., Trends in Biochem. Sci., 29:436-444 (2001); Stepinski, et al., RNA, 7:1468-95 (2001); Elango, et al., Biochim. Biophys. Res. Commun., 330:958-966 (2005)).

The RNAs produced by the methods disclosed herein can also contain an internal ribosome entry site (IRES) sequence. The IRES sequence may be any viral, chromosomal or artificially designed sequence which initiates cap-independent ribosome binding to mRNA and facilitates the initiation of translation. Any solutes suitable for cell electroporation, which can contain factors facilitating cellular permeability and viability such as sugars, peptides, lipids, proteins, antioxidants, and surfactants can be included.

In some embodiments, the RNA is electroporated into the cells, such as in vitro transcribed RNA.

The methods also provide the ability to control the level of expression over a wide range by changing, for example, the promoter or the amount of input RNA, making it possible to individually regulate the expression level. Furthermore, the PCR-based technique of mRNA production greatly facilitates the design of the mRNAs with different structures and combination of their domains.

One advantage of RNA transfection methods of the invention is that RNA transfection is essentially transient and vector-free. A RNA transgene can be delivered to a lymphocyte and expressed therein following a brief in vitro cell activation, as a minimal expressing cassette without the need for any additional viral sequences. Under these conditions, integration of the transgene into the host cell genome is unlikely. Cloning of cells is not necessary because of the efficiency of transfection of the RNA and its ability to uniformly modify the entire lymphocyte population.

Genetic modification of cells with in vitro-transcribed RNA (IVT-RNA) makes use of two different strategies both of which have been successively tested in various animal models. Cells are transfected with in vitro-transcribed RNA by means of lipofection or electroporation. It is desirable to stabilize IVT-RNA using various modifications in order to achieve prolonged expression of transferred IVT-RNA.

Some IVT vectors are known in the literature which are utilized in a standardized manner as template for in vitro transcription and which have been genetically modified in such a way that stabilized RNA transcripts are produced. Currently protocols used in the art are based on a plasmid vector with the following structure: a 5' RNA polymerase promoter enabling RNA transcription, followed by a gene of interest which is flanked either 3' and/or 5' by untranslated regions (UTR), and a 3' polyadenyl cassette containing 50-70 A nucleotides. Prior to in vitro transcription, the circular plasmid is linearized downstream of the polyadenyl cassette by type II restriction enzymes (recognition sequence corresponds to cleavage site). The polyadenyl cassette thus corresponds to the later poly(A) sequence in the transcript. As a result of this procedure, some nucleotides remain as part of the enzyme cleavage site after linearization and extend or mask the poly(A) sequence at the 3' end. It is not clear, whether this nonphysiological overhang affects the amount of protein produced intracellularly from such a construct.

RNA has several advantages over more traditional plasmid or viral approaches. Gene expression from an RNA source does not require transcription and the protein product is produced rapidly after the transfection. Further, since the RNA has to only gain access to the cytoplasm, rather than the nucleus, and therefore typical transfection methods result in an extremely high rate of transfection. In addition, plasmid based approaches require that the promoter driving the expression of the gene of interest be active in the cells under study.

In another aspect, the RNA construct is delivered into the cells by electroporation. See, e.g., the formulations and methodology of electroporation of nucleic acid constructs into mammalian cells as taught in US 2004/0014645, US 2005/0052630A1, US 2005/0070841A1, US 2004/0059285A1, US 2004/0092907A1. The various parameters including electric field strength required for electroporation of any known cell type are generally known in the relevant research literature as well as numerous patents and applications in the field. See e.g., U.S. Pat. Nos. 6,678,556, 7,171,264, and 7,173,116. Apparatus for therapeutic application of electroporation are available commercially, e.g., the MedPulser™ DNA Electroporation Therapy System (Inovio/Genetronics, San Diego, Calif.), and are described in patents such as U.S. Pat. Nos. 6,567,694; 6,516,223, 5,993,434, 6,181,964, 6,241,701, and 6,233,482; electroporation may also be used for transfection of cells in vitro as described e.g. in US20070128708A1. Electroporation may also be utilized to deliver nucleic acids into cells in vitro. Accordingly, electroporation-mediated administration into cells of nucleic acids including expression constructs utilizing any of the many available devices and electroporation systems known to those of skill in the art presents an exciting new means for delivering an RNA of interest to a target cell.

Sources of Cells

In one embodiment, cells are obtained from a subject. Non-limiting examples of subjects include humans, dogs, cats, mice, rats, pigs and transgenic species thereof. Preferably, the subject is a human. Cells can be obtained from a number of sources, including peripheral blood mononuclear cells, bone marrow, lymph node tissue, spleen tissue, umbilical cord, cancer cells and tumors. In certain embodiments, any number of cell lines available in the art, may be used. In certain embodiments, cells can be obtained from a unit of blood collected from a subject using any number of techniques known to the skilled artisan, such as Ficoll separation. In one embodiment, cells from the circulating blood of an individual are obtained by apheresis or leukapheresis. The apheresis product typically contains lymphocytes, including T cells, monocytes, granulocytes, B cells, other nucleated white blood cells, red blood cells, and platelets. The cells collected by apheresis may be washed to remove the plasma fraction and to place the cells in an appropriate buffer or media, such as phosphate buffered saline (PBS) or wash solution lacks calcium and may lack magnesium or may lack many if not all divalent cations, for subsequent processing steps. After washing, the cells may be resuspended in a variety of biocompatible buffers, such as, for example, Ca-free, Mg-free PBS. Alternatively, the undesirable components of the apheresis sample may be removed and the cells directly resuspended in culture media.

In another embodiment, cells are isolated from peripheral blood. Alternatively, cells can be isolated from umbilical cord. In any event, a specific subpopulation of cells can be further isolated by positive or negative selection techniques.

Cells can also be frozen. While many freezing solutions and parameters are known in the art and will be useful in this context, in a non-limiting example, one method involves using PBS containing 20% DMSO and 8% human serum albumin, or other suitable cell freezing media. The cells are then frozen to −80° C. at a rate of 1° per minute and stored in the vapor phase of a liquid nitrogen storage tank. Other methods of controlled freezing may be used as well as uncontrolled freezing immediately at −20° C. or in liquid nitrogen.

Pharmaceutical Compositions

Pharmaceutical compositions of the present invention may comprise an agonist of a gene (e.g. Prodh2, Ccnblip1, Sreklip1, or Wdr37), as described herein, in combination with one or more pharmaceutically or physiologically acceptable carriers, diluents or excipients. Also provided are pharmaceutical compositions comprising an engineered immune cell of the invention. Further provided are pharmaceutical compositions comprising a Prodh2 peptide or a fragment thereof.

Compositions of the present invention may comprise buffers such as neutral buffered saline, phosphate buffered saline and the like; carbohydrates such as glucose, mannose, sucrose or dextrans, mannitol; proteins; polypeptides or amino acids such as glycine; antioxidants; chelating agents such as EDTA or glutathione; adjuvants (e.g., aluminum hydroxide); and preservatives. Compositions of the present invention are preferably formulated for intravenous administration.

Pharmaceutical compositions of the present invention may be administered in a manner appropriate to the disease to be treated (or prevented). The quantity and frequency of administration will be determined by such factors as the condition of the patient, and the type and severity of the patient's disease, although appropriate dosages may be determined by clinical trials.

The administration of the composition of the invention may be carried out in any convenient manner known to those of skill in the art. The composition of the present invention may be administered to a subject by aerosol inhalation, injection, ingestion, transfusion, implantation or transplantation. The compositions described herein may be administered to a patient transarterially, subcutaneously, intradermally, intratumorally, intranodally, intramedullarly, intracystically intramuscularly, by intravenous (i.v.) injection, parenterally or intraperitoneally. In other instances, the composition of the invention are injected directly into a site of inflammation in the subject, a local disease site in the subject, a lymph node, an organ, a tumor, and the like.

It should be understood that the methods and compositions that would be useful in the present invention are not limited to the particular formulations set forth in the examples. The following examples are put forth so as to provide those of ordinary skill in the art with a complete disclosure and description of how to make and use the cells, expansion and culture methods, and therapeutic methods of the invention, and are not intended to limit the scope of what the inventors regard as their invention.

The practice of the present invention employs, unless otherwise indicated, conventional techniques of molecular biology (including recombinant techniques), microbiology, cell biology, biochemistry and immunology, which are well within the purview of the skilled artisan. Such techniques are explained fully in the literature, such as, "Molecular Cloning: A Laboratory Manual", fourth edition (Sambrook, 2012); "Oligonucleotide Synthesis" (Gait, 1984); "Culture of Animal Cells" (Freshney, 2010); "Methods in Enzymology" "Handbook of Experimental Immunology" (Weir, 1997); "Gene Transfer Vectors for Mammalian Cells" (Miller and Calos, 1987); "Short Protocols in Molecular Biology" (Ausubel, 2002); "Polymerase Chain Reaction: Principles, Applications and Troubleshooting", (Babar, 2011); "Current Protocols in Immunology" (Coligan, 2002). These techniques are applicable to the production of the polynucleotides and polypeptides of the invention, and, as such, may be considered in making and practicing the invention. Particularly useful techniques for particular embodiments will be discussed in the sections that follow.

Experimental Examples

The invention is now described with reference to the following Examples. These Examples are provided for the purpose of illustration only, and the invention is not limited to these Examples, but rather encompasses all variations that are evident as a result of the teachings provided herein.

The materials and methods employed in these experiments are now described.

Mice (Examples 1-10): Rosa26-Cas9-2A-EGFP constitutive expressed mice (Cas9-mice); OT-I TCR transgenic mice were used in this study. OT-I;Cas9 mice were generated by breeding OT-I and Cas9 mice. Mice, both female and male, aged 8-12 weeks were used for naïve $CD8^+$ T cell isolation.

Cell culture (Examples 1-10): HEK293FT, B16F10, and E0771 cell lines were obtained from the American Type Culture Collection (Manassas, VA) and cultured in DMEM (Gibco) medium supplemented with 10% FBS (Sigma) and 200 U/mL penicillin-streptomycin (Gibco), named D10 medium. Naïve $CD8^+$ T cells were cultured in RPMI-1640 (Gibco) medium supplemented with 10% FBS, 2 mM L-Glutamine, 200 U/mL penicillin-streptomycin (Gibco), and 49 µM β-mercaptoethanol (Sigma). For T cell in vitro experiments, complete RPMI-1640 medium was supplemented with 2 ng/mL IL-2, 1 µg/mL anti-CD28, and 12 ng/ml Il-12p70 cytokines or antibody. All cytokines and antibodies were purchased from BioLegend.

mm10dgLib design (Examples 1-4): The 250 bp sequences upstream of all mouse protein-coding genes were extracted by Ensembl Biomart. All possible dgRNA spacers (15mer-NGG) were identified, both on the sense and antisense strands. 18mers were then mapped to the mm 10 genome by Bowtie with settings bowtie-n 2-e 120--best. After discarding any alignments with mismatches in the 17th or 18th position ("GG" in NGG PAM), the number of alignments was tabulated for each spacer. Each alignment was then scored based on the number of mismatches, disregarding any mismatches in the 16th position (the "N" in NGG), using the following formula: (#of 0 mismatch alignments*1000)+(#of 1 mismatch alignments*50)+(#of 2 mismatch alignments*1). Larger mismatch scores indicate decreased genome-wide mapping specificity. Subsequently, all non-uniquely mapping spacers, as well as spacers with mismatch score>=2000, were discarded. The top 4 dgRNA spacers were then chosen based on the shortest distance to the −200 position from the TSS, since transcription factors generally bind to promoters at around this distance. In total, 83,601 dgRNAs targeting coding transcripts and 1,000 non-targeting controls (NTCs) were designed.

mm10dgLib design (Examples 5-10): The The 250 bp sequences upstream of all mouse protein-coding genes were extracted by Ensembl Biomart. All possible dgRNA spacers (15mer-NGG) were identified, both on the sense and antisense strands. 18mers were then mapped to the mm10 genome by Bowtie with settings bowtie-n 2-e 120--best. After discarding any alignments with mismatches in the 17th or 18th position ("GG" in NGG PAM), the number of alignments was tabulated for each spacer. Each alignment was then scored based on the number of mismatches, disregarding any mismatches in the 16th position (the "N" in NGG), using the following formula: (#of 0 mismatch alignments*1000)+(#of 1 mismatch alignments*50)+(#of 2 mismatch alignments*1). Larger mismatch scores indicate decreased genome-wide mapping specificity. Subsequently, all non-uniquely mapping spacers, as well as spacers with mismatch score>=2000, were discarded. The top 4 dgRNA spacers were then chosen based on shortest distance to the −200 position from the TSS, since transcription factors generally to bind to promoters at around this distance. In total, 83,601 dgRNAs targeting 22,391 coding transcripts and 1,000 non-targeting controls (NTCs) were designed.

Construction of T cell dgRNA activation (TdgA) vector (Examples 1-10): The gBlocks of U6-dgRNA-MS2 and EFS-Thy1.1-MS2-p65-HSF1 gene fragments were synthesized from Integrated DNA Technologies (IDT), then these cassettes were subcloned into a lentiviral vector via Gibson Assembly (NEB). The resulting activation vector, *lenti*-U6-dgRNA(BsmbI)-MS2-EFS-Thy1.1-MPH, was named TdgA vector

```
TdgA vector:
                                      (SEQ ID NO: 84,602)
TTAATGTAGTCTTATGCAATACTCTTGTAGTCTTGCAACATGGTAACGATGAG

TTAGCAACATGCCTTACAAGGAGAGAAAAAGCACCGTGCATGCCGATTGGTG

GAAGTAAGGTGGTACGATCGTGCCTTATTAGGAAGGCAACAGACGGGTCTGA

CATGGATTGGACGAACCACTGAATTGCCGCATTGCAGAGATATTGTATTTAAG

TGCCTAGCTCGATACATAAACGGGTCTCTCTGGTTAGACCAGATCTGAGCCTG

GGAGCTCTCTGGCTAACTAGGGAACCCACTGCTTAAGCCTCAATAAAGCTTGC

CTTGAGTGCTTCAAGTAGTGTGTGCCCGTCTGTTGTGTGACTCTGGTAACTAG

AGATCCCTCAGACCCTTTTAGTCAGTGTGGAAAATCTCTAGCAGTGGCGCCCG

AACAGGGACTTGAAAGCGAAAGGGAAACCAGAGGAGCTCTCTCGACGCAGG

ACTCGGCTTGCTGAAGCGCGCACGGCAAGAGGCGAGGGGCGGCGACTGGTG

AGTACGCCAAAAATTTTGACTAGCGGAGGCTAGAAGGAGAGAGATGGGTGC

GAGAGCGTCAGTATTAAGCGGGGGAGAATTAGATCGCGATGGGAAAAAATTC

GGTTAAGGCCAGGGGAAAGAAAAAATATAAATTAAAACATATAGTATGGG

CAAGCAGGGAGCTAGAACGATTCGCAGTTAATCCTGGCCTGTTAGAAACATC

AGAAGGCTGTAGACAAATACTGGGACAGCTACAACCATCCCTTCAGACAGGA

TCAGAAGAACTTAGATCATTATATAATACAGTAGCAACCCTCTATTGTGTGCA

TCAAAGGATAGAGATAAAAGACACCAAGGAAGCTTTAGACAAGATAGAGGA

AGAGCAAAACAAAAGTAAGACCACCGCACAGCAAGCGGCCGCTGATCTTCA

GACCTGGAGGAGGAGATATGAGGGACAATTGGAGAAGTGAATTATATAAAT

ATAAAGTAGTAAAAATTGAACCATTAGGAGTAGCACCCACCAAGGCAAAGA

GAAGAGTGGTGCAGAGAGAAAAAAGAGCAGTGGGAATAGGAGCTTTGTTCC

TTGGGTTCTTGGGAGCAGCAGGAAGCACTATGGGCGCAGCGTCAATGACGCT

GACGGTACAGGCCAGACAATTATTGTCTGGTATAGTGCAGCAGCAGAACAAT

TTGCTGAGGGCTATTGAGGCGCAACAGCATCTGTTGCAACTCACAGTCTGGG

GCATCAAGCAGCTCCAGGCAAGAATCCTGGCTGTGGAAAGATACCTAAAGGA

TCAACAGCTCCTGGGGATTTGGGGTTGCTCTGGAAAACTCATTTGCACCACTG

CTGTGCCTTGGAATGCTAGTTGGAGTAATAAATCTCTGGAACAGATTTGGAAT

CACACGACCTGGATGGAGTGGGACAGAGAAATTAACAATTACACAAGCTTAA

TACACTCCTTAATTGAAGAATCGCAAAACCAGCAAGAAAAGAATGAACAAGA

ATTATTGGAATTAGATAAATGGGCAAGTTTGTGGAATTGGTTTAACATAACAA

ATTGGCTGTGGTATATAAAATTATTCATAATGATAGTAGGAGGCTTGGTAGGT

TTAAGAATAGTTTTTGCTGTACTTTCTATAGTGAATAGAGTTAGGCAGGGATA

TTCACCATTATCGTTTCAGACCCACCTCCCAACCCCGAGGGGACCCAGAGAG

GGCCTATTTCCCATGATTCCTTCATATTTGCATATACGATACAAGGCTGTTAG

AGAGATAATTAGAATTAATTTGACTGTAAACACAAAGATATTAGTACAAAAT

ACGTGACGTAGAAAGTAATAATTTCTTGGGTAGTTTGCAGTTTTAAAATTATG

TTTTAAAATGGACTATCATATGCTTACCGTAACTTGAAAGTATTTCGATTTCTT
```

-continued

```
GGCTTTATATATCTTGTGGAAAGGACGAAACACCGGAGACGGGATACCGTCT

CTGTTTTAGAGCTAGGCCAACATGAGGATCACCCATGTCTGCAGGGCCTAGC

AAGTTAAAATAAGGCTAGTCCGTTATCAACTTGGCCAACATGAGGATCACCC

ATGTCTGCAGGGCCAAGTGGCACCGAGTCGGTGCTTTTTTTGGATCCAAGCTT

GGCGTAACTAGATCTTGAGACAAATGGCAGTATTCATCCACAATTTTAAAAG

AAAAGGGGGATTGGGGGGTACAGTGCAGGGGAAAGAATAGTAGACATAAT

AGCAACAGACATACAAACTAAAGAATTACAAAAACAAATTACAAAAATTCA

AAATTTTCGGGTTTATTACAGGGACAGCAGAGATCCACTTTGGCGCCGGCTCG

AGGGGGCCCGGGGAATTCGCTAGCTAGGTCTTGAAAGGAGTGGGAATTGGCT

CCGGTGCCCGTCAGTGGGCAGAGCGCACATCGCCCACAGTCCCCGAGAAGTT

GGGGGGAGGGGTCGGCAATTGATCCGGTGCCTAGAGAAGGTGGCGCGGGGT

AAACTGGGAAAGTGATGTCGTGTACTGGCTCCGCCTTTTTCCCGAGGGTGGGG

GAGAACCGTATATAAGTGCAGTAGTCGCCGTGAACGTTCTTTTTCGCAACGGG

TTTGCCGCCAGAACACAGGACCGGTTCTAGACGTACGGCCACCATGAACCCA

GCCATCAGCGTCGCTCTCCTGCTCTCAGTCTTGCAGGTGTCCCGAGGGCAGAA

GGTGACCAGCCTGACAGCCTGCCTGGTGAACCAAAACCTTCGCCTGGACTGC

CGCCATGAGAATAACACCAAGGATAACTCCATCCAGCATGAGTTCAGCCTGA

CCCGAGAGAAGAGGAAGCACGTGCTCTCAGGCACCCTTGGGATACCCGAGCA

CACGTACCGCTCCCGCGTCACCCTCTCCAACCAGCCCTATATCAAGGTCCTTA

CCCTAGCCAACTTCACCACCAAGGATGAGGGCGACTACTTTTGTGAGCTTCGC

GTGTCGGGCGCGAATCCCATGAGCTCCAATAAAAGTATCAGTGTGTATAGAG

ACAAGCTGGTCAAGTGTGGCGGCATAAGCCTGCTGGTTCAGAACACATCCTG

GATGCTGCTGCTGCTGCTTTCCCTCTCCCTCCTCCAAGCCCTGGACTTCATTTC

TCTGGGCAGTGGAGAGGGCAGAGGAAGTCTGCTAACATGCGGTGACGTCGAG

GAGAATCCTGGCCCAATGGCTTCAAACTTTACTCAGTTCGTGCTCGTGGACAA

TGGTGGGACAGGGGATGTGACAGTGGCTCCTTCTAATTTCGCTAATGGGGTG

GCAGAGTGGATCAGCTCCAACTCACGGAGCCAGGCCTACAAGGTGACATGCA

GCGTCAGGCAGTCTAGTGCCCAGAAGAGAAAGTATACCATCAAGGTGGAGGT

CCCCAAAGTGGCTACCCAGACAGTGGGCGGAGTCGAACTGCCTGTCGCCGCT

TGGAGGTCCTACCTGAACATGGAGCTCACTATCCCAATTTTCGCTACCAATTC

TGACTGTGAACTCATCGTGAAGGCAATGCAGGGGCTCCTCAAAGACGGTAAT

CCTATCCCTTCCGCCATCGCCGCTAACTCAGGTATCTACAGCGCTGGAGGAGG

TGGAAGCGGAGGAGGAGGAAGCGGAGGAGGAGGTAGCGGACCTAAGAAAA

AGAGGAAGGTGGCGGCCGCTGGATCCCCTTCAGGGCAGATCAGCAACCAGGC

CCTGGCTCTGGCCCCTAGCTCCGCTCCAGTGCTGGCCCAGACTATGGTGCCCT

CTAGTGCTATGGTGCCTCTGGCCCAGCCACCTGCTCCAGCCCCTGTGCTGACC

CCAGGACCACCCCAGTCACTGAGCGCTCCAGTGCCCAAGTCTACACAGGCCG

GCGAGGGGACTCTGAGTGAAGCTCTGCTGCACCTGCAGTTCGACGCTGATGA

GGACCTGGGAGCTCTGCTGGGGAACAGCACCGATCCCGGAGTGTTCACAGAT

CTGGCCTCCGTGGACAACTCTGAGTTTCAGCAGCTGCTGAATCAGGGCGTGTC
```

-continued

```
CATGTCTCATAGTACAGCCGAACCAATGCTGATGGAGTACCCCGAAGCCATT

ACCCGGCTGGTGACCGGCAGCCAGCGGCCCCCCGACCCCGCTCCAACTCCCC

TGGGAACCAGCGGCCTGCCTAATGGGCTGTCCGGAGATGAAGACTTCTCAAG

CATCGCTGATATGGACTTTAGTGCCCTGCTGTCACAGATTTCCTCTAGTGGGC

AGGGAGGAGGTGGAAGCGGCTTCAGCGTGGACACCAGTGCCCTGCTGGACCT

GTTCAGCCCCTCGGTGACCGTGCCCGACATGAGCCTGCCTGACCTTGACAGCA

GCCTGGCCAGTATCCAAGAGCTCCTGTCTCCCAGGAGCCCCCCAGGCCTCCC

GAGGCAGAGAACAGCAGCCCGGATTCAGGGAAGCAGCTGGTGCACTACACA

GCGCAGCCGCTGTTCCTGCTGGACCCCGGCTCCGTGGACACCGGGAGCAACG

ACCTGCCGGTGCTGTTTGAGCTGGGAGAGGGCTCCTACTTCTCCGAAGGGGA

CGGCTTCGCCGAGGACCCCACCATCTCCCTGCTGACAGGCTCGGAGCCTCCCA

AAGCCAAGGACCCCACTGTCTCCTAATGTACAAGCGCTAATAAAAGATCTTT

ATTTTCATTAGATCTGTGTGTTGGTTTTTTGTGTGGTAACTCTAGACGTGCGGT

CGACTTTAAGACCAATGACTTACAAGGCAGCTGTAGATCTTAGCCACTTTTTA

AAAGAAAAGGGGGGACTGGAAGGGCTAATTCACTCCCAACGAAGACAAGAT

CTGCTTTTTGCTTGTACTGGGTCTCTCTGGTTAGACCAGATCTGAGCCTGGGA

GCTCTCTGGCTAACTAGGGAACCCACTGCTTAAGCCTCAATAAAGCTTGCCTT

GAGTGCTTCAAGTAGTGTGTGCCCGTCTGTTGTGTGACTCTGGTAACTAGAGA

TCCCTCAGACCCTTTTAGTCAGTGTGGAAAATCTCTAGCAGTACGTATAGTAG

TTCATGTCATCTTATTATTCAGTATTTATAACTTGCAAAGAAATGAATATCAG

AGAGTGAGAGGAACTTGTTTATTGCAGCTTATAATGGTTACAAATAAAGCAA

TAGCATCACAAATTTCACAAATAAAGCATTTTTTCACTGCATTCTAGTTGTG

GTTTGTCCAAACTCATCAATGTATCTTATCATGTCTGGCTCTAGCTATCCCGCC

CCTAACTCCGCCCATCCCGCCCCTAACTCCGCCCAGTTCCGCCCATTCTCCGC

CCCATGGCTGACTAATTTTTTTTATTTATGCAGAGGCCGAGGCCGCCTCGGCC

TCTGAGCTATTCCAGAAGTAGTGAGGAGGCTTTTTTGGAGGCCTAGGGACGT

ACCCAATTCGCCCTATAGTGAGTCGTATTACGCGCGCTCACTGGCCGTCGTTT

TACAACGTCGTGACTGGGAAAACCCTGGCGTTACCCAACTTAATCGCCTTGCA

GCACATCCCCCTTTCGCCAGCTGGCGTAATAGCGAAGAGGCCCGCACCGATC

GCCCTTCCCAACAGTTGCGCAGCCTGAATGGCGAATGGGACGCGCCCTGTAG

CGGCGCATTAAGCGCGGCGGGTGTGGTGGTTACGCGCAGCGTGACCGCTACA

CTTGCCAGCGCCCTAGCGCCCGCTCCTTTCGCTTTCTTCCCTTCCTTTCTCGCC

ACGTTCGCCGGCTTTCCCCGTCAAGCTCTAAATCGGGGGCTCCCTTTAGGGTT

CCGATTTAGTGCTTTACGGCACCTCGACCCCAAAAAACTTGATTAGGGTGATG

GTTCACGTAGTGGGCCATCGCCCTGATAGACGGTTTTTCGCCCTTTGACGTTG

GAGTCCACGTTCTTTAATAGTGGACTCTTGTTCCAAACTGGAACAACACTCAA

CCCTATCTCGGTCTATTCTTTTGATTTATAAGGGATTTTGCCGATTTCGGCCTA

TTGGTTAAAAAATGAGCTGATTTAACAAAAATTTAACGCGAATTTTAACAAA

ATATTAACGCTTACAATTTAGGTGGCACTTTTCGGGGAAATGTGCGCGGAACC

CCTATTTGTTTATTTTTCTAAATACATTCAAATATGTATCCGCTCATGAGACAA

TAACCCTGATAAATGCTTCAATAATATTGAAAAAGGAAGAGTATGAGTATTC
```

```
AACATTTCCGTGTCGCCCTTATTCCCTTTTTTGCGGCATTTTGCCTTCCTGTTTT

TGCTCACCCAGAAACGCTGGTGAAAGTAAAAGATGCTGAAGATCAGTTGGGT

GCACGAGTGGGTTACATCGAACTGGATCTCAACAGCGGTAAGATCCTTGAGA

GTTTTCGCCCCGAAGAACGTTTTCCAATGATGAGCACTTTTAAAGTTCTGCTA

TGTGGCGCGGTATTATCCCGTATTGACGCCGGGCAAGAGCAACTCGGTCGCC

GCATACACTATTCTCAGAATGACTTGGTTGAGTACTCACCAGTCACAGAAAA

GCATCTTACGGATGGCATGACAGTAAGAGAATTATGCAGTGCTGCCATAACC

ATGAGTGATAACACTGCGGCCAACTTACTTCTGACAACGATCGGAGGACCGA

AGGAGCTAACCGCTTTTTTGCACAACATGGGGGATCATGTAACTCGCCTTGAT

CGTTGGGAACCGGAGCTGAATGAAGCCATACCAAACGACGAGCGTGACACCA

CGATGCCTGTAGCAATGGCAACAACGTTGCGCAAACTATTAACTGGCGAACT

ACTTACTCTAGCTTCCCGGCAACAATTAATAGACTGGATGGAGGCGGATAAA

GTTGCAGGACCACTTCTGCGCTCGGCCCTTCCGGCTGGCTGGTTTATTGCTGA

TAAATCTGGAGCCGGTGAGCGTGGGTCTCGCGGTATCATTGCAGCACTGGGG

CCAGATGGTAAGCCCTCCCGTATCGTAGTTATCTACACGACGGGGAGTCAGG

CAACTATGGATGAACGAAATAGACAGATCGCTGAGATAGGTGCCTCACTGAT

TAAGCATTGGTAACTGTCAGACCAAGTTTACTCATATATACTTTAGATTGATT

TAAAACTTCATTTTTAATTTAAAAGGATCTAGGTGAAGATCCTTTTTGATAAT

CTCATGACCAAAATCCCTTAACGTGAGTTTTCGTTCCACTGAGCGTCAGACCC

CGTAGAAAAGATCAAAGGATCTTCTTGAGATCCTTTTTTTCTGCGCGTAATCT

GCTGCTTGCAAACAAAAAAACCACCGCTACCAGCGGTGGTTTGTTTGCCGGA

TCAAGAGCTACCAACTCTTTTTCCGAAGGTAACTGGCTTCAGCAGAGCGCAG

ATACCAAATACTGTTCTTCTAGTGTAGCCGTAGTTAGGCCACCACTTCAAGAA

CTCTGTAGCACCGCCTACATACCTCGCTCTGCTAATCCTGTTACCAGTGGCTG

CTGCCAGTGGCGATAAGTCGTGTCTTACCGGGTTGGACTCAAGACGATAGTTA

CCGGATAAGGCGCAGCGGTCGGGCTGAACGGGGGGTTCGTGCACACAGCCCA

GCTTGGAGCGAACGACCTACACCGAACTGAGATACCTACAGCGTGAGCTATG

AGAAAGCGCCACGCTTCCCGAAGGGAGAAAGGCGGACAGGTATCCGGTAAG

CGGCAGGGTCGGAACAGGAGAGCGCACGAGGGAGCTTCCAGGGGAAACGC

CTGGTATCTTTATAGTCCTGTCGGGTTTCGCCACCTCTGACTTGAGCGTCGATT

TTTGTGATGCTCGTCAGGGGGCGGAGCCTATGGAAAAACGCCAGCAACGCG

GCCTTTTTACGGTTCCTGGCCTTTTGCTGGCCTTTTGCTCACATGTTCTTTCCTG

CGTTATCCCCTGATTCTGTGGATAACCGTATTACCGCCTTTGAGTGAGCTGAT

ACCGCTCGCCGCAGCCGAACGACCGAGCGCAGCGAGTCAGTGAGCGAGGAA

GCGGAAGAGCGCCCAATACGCAAACCGCCTCTCCCCGCGCGTTGGCCGATTC

ATTAATGCAGCTGGCACGACAGGTTTCCCGACTGGAAAGCGGGCAGTGAGCG

CAACGCAATTAATGTGAGTTAGCTCACTCATTAGGCACCCCAGGCTTTACACT

TTATGCTTCCGGCTCGTATGTTGTGTGGAATTGTGAGCGGATAACAATTTCAC

ACAGGAAACAGCTATGACCATGATTACGCCAAGCGCGCAATTAACCCTCACT

AAAGGGAACAAAAGCTGGAGCTGCAAGC
``` mm10dgLib cloning (Examples 1-10): Designed mm10dgLib was synthesized from IDT followed by subcloning into TdgA vector via Gibson assembly and electroporation. Approximately >230×coverage (~$2\times10^7$ clones were obtained) was achieved after electroporation. The mm 10dgLib plasmids were extracted via maxi plasmid preparation (Qiagen), followed by Illumina sequencing to confirm library representation. A total of 82,197/83,601 of GTS and 988/1,000 of NTC were cloned.

Lentivirus production (Examples 1-10): Lentivirus was produced using low-passage HEK239FT cells. One day before transfection, HEK293FT cells were seeded in 15 cm-dish at 50-60% confluency. Two hours before transfection, D10 media was replaced with 13 mL pre-warmed Opti-MEM medium (Invitrogen). For each plate, 450 µL of Opti-MEM was mixed with 20 µg 10dgLib plasmid or vector control plasmid, 15 µg psPAX2 (Addgene), 10 µg pMD2.G (Addgene) and 130 µl polyethylenimine (PEI). After brief vortex, the mixture was incubated for 15 min at room temperature and then dropwise added to cells. After 6 h of transfection, Opti-MEM media was replaced with 20 mL pre-warmed D10 medium. Viral supernatant was collected at 48 h and 72 h post-transfection, then filtered using 0.45 µm filters (Fisher/VWR) to remove cell debris, finally concentrated virus using AmiconUltra 100 kD ultracentrifugation units (Millipore), all virus was aliquoted and stored in −80° C.

Naïve $CD8^+$ T cell isolation and culture (Examples 1-4): Spleens and mesenteric lymph nodes (mLNs) were dissected from OT-I;Cas9β mice, then placed into ice-cold PBS supplemented with 2% FBS. Organs were mashed through a 100 µm filter and lymphocytes were re-suspended with 2% FBS. Red blood cells (RBCs) were lysed with 1 mL ACK lysis buffer (Lonza) per 3 spleens for 1-2 min at room temperature, then lysis was stopped by adding 50 mL 2% FBS PBS. RBC lysed lymphocytes were filtered with 40 µm filters to remove cell debris. Naïve $CD8a^+$ T cell purification was performed using Naïve $CD8a^+$ T cell Isolation Kits according to the Miltenyi Biotec's standard procedures. Naïve $CD8a^+$ T cells were cultured at 1-2×$10^6$ cells/mL density in anti-CD3, and cRPMI medium was supplemented with 2 ng/mL IL-2, 1 µg/mL anti-CD28, and 12 ng/ml IL-12p70. All cytokines and antibodies were purchased from the BioLegend.

Naïve $CD8^+$ T cell isolation and culture (Examples 5-10): Mesenteric lymph nodes (mLNs) and spleens were dissected from OT-I;Cas9β mice, then placed into ice-cold PBS supplemented with 2% FBS. Lymphocytes were released by grinding organs through a 100 µm filter, then re-suspended with 2% FBS. Red blood cells (RBCs) were lysed with 1 mL ACK lysis buffer (Lonza) for 2 spleens at 1-2 min at room temperature, then neutralized with 2% FBS PBS at 20 volumes per volume of lysis buffer. RBC-lysed lymphocyte solution was filtered through 40 µm filters to remove cell debris. Naïve $CD8a^+$ T cell purification was performed using Naïve $CD8a^+$ T cell Isolation Kits (Miltenyi Biotec) according to the manufacturer's protocols. Naïve $CD8a^+$ T cells were cultured at 1×$10^6$ cells/mL density in 2 µg/mL anti-CD3ε (BioLegend) treated plates or dishes.

Lentivirus titration (Examples 1-10): Naïve $CD8a^+$ T cells were infected with lentivirus in different volume ratios between cRPMI and lentivirus after isolation. At day 3 after T cell isolation, T cells were collected and stained with anti-CD8α-APC and anti-Thy 1.1-PE. The Thy 1.1-positive cells were successfully infected with lentivirus, as well as expressed after lentivirus infection. The ratio of $CD8^+$ and $Thy1.1^+$ cells were determined by flow cytometry. Viral titer was calculated by FACS of the mm10dgLib infected cells using Thy 1.1 marker. Each group had 3 independent biological replicates.

mm10dgLib lentivirus transduction (Examples 1-4): With the titration information of lentivirus, for each replicate, 1.5×$10^7$ OT-1;Cas9 naïve $CD8^+$ T cells were cultured in a 10-cm plate and transduced with 400 µL mm 10dgLib or empty vector lentivirus at a volume ratio 1:25 (media: virus).

mm10dgLib lentivirus transduction (Examples 5-10): Given the lentiviral titer information, for each replicate, 1.5×$10^7$ OT-I;Cas9β naïve $CD8^+$ T cells were cultured in a 10-cm plate and transduced with 400 µL mm10dgLib or empty vector lentivirus at a volume ratio of 1:25 (virus: media), which can successfully infect around 75% T cells (FIG. 12).

Kill assay and CRISPR screen: mm10dgLib lentivirus infected OT-I; Cas9i $CD8^+$ T cells were cultured 10-cm dishes pretreated with anti-CD3 treated dishes using cRPMI-1640 supplemented with 2 ng/ml IL-2,1 µg/mL anti-CD28, and 2 ng/ml IL-12p70 for 4 days. The medium was changed with fresh media every day. About 12 hours before kill assay, infected OT-I;Cas9e $CD8^+$ T cells were reseeded on new dishes which were untreated with anti-CD3ε and cRPMI-1640 only supplemented with 2 ng/ml IL-2 and 2 ng/ml IL-12p70 to rest cells. At the same time, 2×$10^6$ E0771 cells were seeded in 6-well plates in D10 medium. On day 5, E0771 cells were incubated with 1 ng/ml SIINFEKL (SEQ ID NO. 84,614) peptide for 4 hours. Before start kill assay, $CD8^+$ T cells were suspended with fresh cRPMI-1640 with 2 nM monensin and anti-CD107a-PE antibody (BioLegend) (1:400 dilution). The final cell concentration was 2× $10^6$ cells/mL. After SIINFEKL (SEQ ID NO. 84,614) peptide incubation, 3×$10^6$ $CD8^+$ T cells per replicate (E0771: T cell≈1:1) were added to E0771 cells and co-incubated for 2 h in the incubator. At the end of co-incubation, T cells were gently washed down with PBS and stained with anti-CD8α-APC, anti-CD38-PE/Cy7 for 30 min on the ice. Cells were analyzed and sorted using BD FACSAria. High killing population, i.e CD107a high-expressed cells, were sorted for library readout. For high killing gating, the top 5% of $CD8^+$ and $CD107a^+$ cell population of mm 10dgLib groups without SIINFEKL (SEQ ID NO. 84,614) peptide was set as the lowest limit for sorting.

Flow cytometry (Examples 1-10): T cells were collected and washed one time using MACS buffer (0.2% BSA and 5 mM EDTA in PBS) before staining. T cells were stained on ice for 30 min after adding antibodies (1:200 dilution). Samples were run on a BD FACSAria cytometer, and analysis was performed using FlowJo software 9.9.4 (Threestar, Ashland, OR).

Kill assay screen readout and deep sequencing (Examples 1-10): The sorted cells and cell pellets (2×$10^6$ cells/replicate, collected before kill assay) were lysed using QuickExtract solution (Epicentre) at 65° C. for 30 min. dgRNA readout was performed using two-step PCR amplification. PCR was performed using Phusion Flash High Fidelity Master Mix (Thermo Fisher). The first PCR (PCR #1) step used primers Forward: 5'-aatggactatcatatgcttaccgtaacttgaaagtatttcg-3' (SEQ ID NO: 84,603) and Reverse: 5'-ctttagtttgtatgtctgttgc-tattatgtctactattctttccc-3' (SEQ ID NO: 84,604) to amplify dgRNA cassette. The second PCR (PCR #2) amplification used uniquely barcoded primers, SF1 to SF12 and SNR1 to SNR12, to allow multiplexing of samples in a single Hiseq run. For PCR #1, each sample was performed using 5 reactions in a 50 µL volume. The cycle conditions were: 98° C. for 1 min, 25 cycles of (98° C. for 1s, 62° C. for 5 s, 72° C. for 15 s), and 72° C. for 2 min. PCR products of each sample were pooled together for barcoding PCR. For PCR #2, 2 μl of pooled PCR #1 products were used as template in a 50 μL reaction. The PCR cycle condition was: 98° C. for 1 min, 30 cycles of (98° C. for 1s, 62° C. for 5 s, 72° C. for 15 s), and 72° C. for 2 min. All PCR products were quantified with a gel-based method using the Low-Range Quantitative Ladder (Life Technologies), then gel purified using the QIAQuick gel extraction kit (Qiagen). Purified PCR products were equally pooled in one tube for deep sequencing. Diluted libraries with 5-20% PhiX were sequenced with HiSeq 2500 or HiSeq 4000 systems (Illumina).

dgRNA screen data analysis (Examples 1-10): Raw single-end fastq read files were filtered and demultiplexed using Cutadapt (Martin, M. (2011) EMBnet.journal 17, 10-12). To remove extra sequences downstream (i.e. 3' end) of the sgRNA spacer sequences, the following command was used: cutadapt-a GTTTTAGAGCTAGGC-e 0.2--discard-untrimmed (SEQ ID NO. 84,631). As the forward PCR primers used to readout sgRNA representation were designed to have a variety of barcodes to facilitate multiplexed sequencing, demultiplexing these filtered reads was performed with the following settings: cutadapt-g file: fbc.fasta--no-trim, where fbc.fasta contained the 12 possible barcode sequences within the forward primers (Table 1). Finally, to remove extra sequences upstream (i.e. 5' end) of the sgRNA spacers, the following command was used: cutadapt-g AAAGGACGAAACACCG-e 0.2-m 14-M 18 (SEQ ID NO. 84,632). Minimum/maximum read lengths were set at 14/18 bp respectively to exclude non-specific reads and enriched for the 15 bp dgRNA spacer sequences. The 15 bp dgRNA spacer sequences from each demulitplexed sample were then mapped to the designed dgRNA spacers in the mm10dgLib. A bowtie index of the dgRNA library was generated using the bowtie-build command in Bowtie 1.1.2 (Langmead, B., et al. (2009) *Genome Biol* 10, R25, doi: 10.1186/gb-2009-10-3-r25). The filtered fastq read files were mapped to the index using the following settings: bowtie-v 1-m 1 mm10dgLib-q<fastq_file>. Using the resultant mapping output, the number of reads that had mapped to each sgRNA within the library was quantified.

Enrichment analysis of dgRNAs (Examples 1-10): Enrichment analysis was performed using custom R scripts. The library representation of each sample was quantified by the number of read counts. Raw counts were normalized and log-transformed. Mean values were averaged from biological replicates of the same group (plasmid, unsorted cell or high-kill). FDR values were calculated from the null distribution of the 1,000 NTCs in each variable. Linear regression for the 1,000 NTCs between samples was performed using the 1 m ( ) function.

RT-qPCR (Examples 1-10): For single gene CRISPR/dgRNA activation, 3-5 days after lentivirus transduction, cells were lysed and total RNA was extracted from IM.Cas9 (immortalized hepatocyte as a Cas9-expressing control cell line) and Cas9β CD8+ T cells. For cDNA overexpression, 48 h and 72 h after lentivirus transduction, OT-I CD8+ T cells were collected for RNA preparation. All RNA preparations were performed using RNasy Plus Mini Kit (Qiagen). Gene expression was quantified using Taqman Fast Universal PCR Master Mix (Thermo Fisher) and Taqman probes (Invitrogen). RNA expression was normalized to Gapdh and compared to wells transduced with vector lentivirus. Relative mRNA expression was determined via the $\Delta\Delta\ C_t$ method.

Top candidate validation (Examples 1-4): Candidate hits Prodh2, Ccnblip1, Sreklip1, and Wdr37 were selected for further validation. All cDNAs were purchased from the Dharmacon, followed by cloning into a lentiviral overexpression vector (*lenti*-EF1a-Flag-WPRE vector). Before overexpression lentivirus transduction, OT-I CD8+ T cells were isolated and activated by 2 tion, OT-I CD88 coated plates for 3 days, then T cells were transduced with concentrated lentivirus. At day 6, infected OT-I; Cas9t CD8+ T cells were reseeded on new 6-well plates which were untreated with anti-CD38 and cRPMI-1640 only supplemented with 2 ng/ml IL-2 and 2 ng/mL IL-12p70 to rest cells. At the same time, $5\times10^5$/well of E0771 cells were seeded in 24-well plates for kill assay. The next day, E0771 cells were incubated with 1 ng/mL or 10 ng/mL SIINFEKL (SEQ ID NO. 84,614) peptide for 4 hours. The validation kill assay was performed as previously described. At the end of co-incubation, T cells were gently washed down with PBS and stained with anti-CD8α-APC for 30 min on ice, cells were analyzed using BD FACSAria.

Standard statistical analysis (Examples 1-4): Data between two groups were analyzed using a two-tailed paired t-test. Multiple t-test using the Holm-Sidak method was used for multiple group comparison. A p value less or equal to 0.05 was considered statistically significant. Prism (GraphPad Software Inc.) and RStudio were used for these analyses.

AAV-based HDR donor template construction (Examples 5-10): TRAC homologous recombination arms (HA) were cloned from the both sides of crRNA binding site located in the first exon of TRAC locus. A CD22-CAR sequence, containing a CD22 m971 scFv, 4-1BB intracellular domains, and CD3ζ intracellular domain, was synthesized as a gBlock from IDT. PRODH2 cDNA was purchased from GenScript, then subcloned into a AAV vector. The final vector was named as pLY57_TRAC-LHA-pAAV-EFS-CD22BBz-PRODH2-TRAC-RHA(3166mut). See FIG. 9A. pLY57 TRAC-LHA-pAAV-EFS-CD22BBZ-PRODH2-TRAC-RHA (3166mut) (SEQ ID NO: 84,605)

```
CCTGCAGGCAGCTGCGCGCTCGCTCGCTCACTGAGGCCGCCCGGGCAAAGCC

CGGGCGTCGGGCGACCTTTGGTCGCCCGGCCTCAGTGAGCGAGCGAGCGCGC

AGAGAGGGAGTGGCCAACTCCATCACTAGGGGTTCCTGCGGCCGCACGCGTT

GTCCTAGGTCTTGAAAGGAGTGGGAATTGGCTCCGGTGCCCGTCAGTGGGCA

GAGCGCACATCGCCCACAGTCCCCGAGAAGTTGGGGGGAGGGGTCGGCAATT

GATCCGGTGCCTAGAGAAGGTGGCGCGGGGTAAACTGGGAAAGTGATGTCGT

GTACTGGCTCCGCCTTTTTCCCGAGGGTGGGGGAGAACCGTATATAAGTGCA

GTAGTCGCCGTGAACGTTCTTTTTCGCAACGGGTTTGCCGCCAGAACACAGGA
```

-continued

```
CCGGTTCTAGACGTACGGCCACCTGCTTCTGCTCGTGACAAGCCTGCTGCTGT
GCGAGCTGCCCCACCCTGCCTTTCTGCTGTCCCTCAGGTGCAGCTGCAGCAGT
CTGGCCCTGGCCTCGTGAAGCCTAGCCAGACCCTGGCCTGACCTGTGCCATCA
GCGGCGATAGCGTGTCCAGCAATAGCGCCGCCTGGAACTGGTCAGACAGAGC
CCTAGCAGAGGCCTGGAATGGCTGGGCCGGACCTACTACCGGTCCAAGGGTA
CAACGACTACGCCGTGTCCGTGAAGTCCCGGATCACCATCAACCCCGACACC
AGCAGAACCAGTTCTCCCTGCAGCTGAACAGCGTGACCCCCGAGGATACCGC
CGTGTACTACGCGCCAGAGAAGTGACCGGCGACCTGGAAGATGCCTTCGACA
TCTGGGCCAGGGCACATGGTCACCGTGTCTAGCGGAGGCGGCGGAAGCGAC
ATCCAGATGACACAGAGCCCCAGCCCCTGAGCGCCAGCGTGGGAGACAGAGT
GACCATCACCTGTCGGGCCAGCCAGACCATCGGTCCTACCTGAACTGGTATC
AGCAGCGGCCTGGCAAGGCCCCCAACCTGCTGATCTATCCGCCAGCTCACTG
CAGAGCGGCGTGCCCAGCAGATTTTCCGGCAGAGGCAGCGGCACCACTTCAC
CCTGACAATCAGTTCCCTGCAGGCCGAGGACTTCGCCACCTACTACTGCCAGC
AGAGCTACAGCATCCCCCAGACCTTCGGCCAGGGGACCAAGCTGGAAATCAA
AGCGGCCGCAGGTACCCCACGACGCCAGCGCCGCGACCACCAACACCGGCGC
CCACCATCGCGTCGCAGCCCCTGCCCTGCGCCCAGAGGCATGCCGGCCAGCA
GCAGGGGCGCAGTGCACACGAGGGGCTGACTTCGCCTGTGATATCTACAT
CTGGGCGCCCTTGGCCGGGACTTGTGGGGTCCTTCTCTGTCACTGGTTATCAC
CCTTTACTGCAAACGGGGCAGAAAGAAACTCCTGTATATATTCAACAACCATT
TATGAGACCAGTACAAACTACTCAAGAGGAAGATGGCTGTAGCTGCCGATTC
CAGAAGAAGAAGAAGGAGGATGTGAACTGAGAGTGAAGTTCAGCAGGAGCG
CAGACCCCCCGCGTACCAGCAGGGCCAGAACCAGCTCTATAACGAGCTCAAT
CTAGGACGAAGAAGGAGTACGATGTTTTGGACAAGAGACGTGGCCGGGACCC
TGAGATGGGGGGAAAGCCGGAAGGAAGAACCCTCAGGAAGGCCTGTACAAT
GAACTGCAGAAAGATAAGATGGCGGAGCCTACAGTGAGATTGGGATGAAAG
GCGAGCGCCGGAGGGGCAAGGGGCACGATGGCCTTACCAGGGTCTCAGTACA
GCCACCAAGGACACCTACGACGCCCTTCACATGCAGGCCCTGCCCCTCGCGG
CAGTGGAGAGGGCAGAGGAAGTCTGCTAACATGCGGTGACGTCGAGGAGAA
TCCTGGCCCAGGTACCACGGACCGAGCGGCCGCAGGAACCCCTAGTGATGGA
GTTGGCCACTCCCTCTCTGCGCGCTCGCTCGCTCACTGAGGCCGGGCGACCAA
AGGTCGCCCGACGCCCGGGCTTTGCCCGGGCGGCCTCAGTGAGCGAGCGAGC
GCGCAGCTGCCTGCAGGGGCGCCTGATGCGGTATTTTCTCCTTACGCATCTGT
GCGGTATTTCACACCGCATACGTCAAAGCAACCATAGTACGCGCCCTGTAGC
GGCGCATTAAGCGCGGCGGGTGTGGTGGTTACGCGCAGCGTGACCGCTACAC
TTGCCAGCGCCCTAGCGCCCGCTCCTTTCGCTTTCTTCCCTTCCTTTCTCGCCA
CGTTCGCCGGCTTTCCCCGTCAAGCTCTAAATCGGGGGCTCCCTTTAGGGTTC
CGATTTAGTGCTTTACGGCACCTCGACCCCAAAAAACTTGATTTGGGTGATGG
TTCACGTAGTGGGCCATCGCCCTGATAGACGGTTTTTCGCCCTTTGACGTTGG
AGTCCACGTTCTTTAATAGTGGACTCTTGTTCCAAACTGGAACAACACTCAAC
```

-continued
```
CCTATCTCGGGCTATTCTTTTGATTTATAAGGGATTTTGCCGATTTCGGCCTAT

TGGTTAAAAAATGAGCTGATTTAACAAAAATTTAACGCGAATTTTAACAAAA

TATTAACGTTTACAATTTTATGGTGCACTCTCAGTACAATCTGCTCTGATGCCG

CATAGTTAAGCCAGCCCCGACACCCGCCAACACCCGCTGACGCGCCCTGACG

GGCTTGTCTGCTCCCGGCATCCGCTTACAGACAAGCTGTGACCGTCTCCGGGA

GCTGCATGTGTCAGAGGTTTTCACCGTCATCACCGAAACGCGCGAGACGAAA

GGGCCTCGTGATACGCCTATTTTTATAGGTTAATGTCATGATAATAATGGTTT

CTTAGACGTCAGGTGGCACTTTTCGGGGAAATGTGCGCGGAACCCCTATTTGT

TTATTTTTCTAAATACATTCAAATATGTATCCGCTCATGAGACAATAACCCTG

ATAAATGCTTCAATAATATTGAAAAAGGAAGAGTATGAGTATTCAACATTTC

CGTGTCGCCCTTATTCCCTTTTTGCGGCATTTTGCCTTCCTGTTTTTGCTCACC

CAGAAACGCTGGTGAAAGTAAAAGATGCTGAAGATCAGTTGGGTGCACGAGT

GGGTTACATCGAACTGGATCTCAACAGCGGTAAGATCCTTGAGAGTTTTCGCC

CCGAAGAACGTTTTCCAATGATGAGCACTTTTAAAGTTCTGCTATGTGGCGCG

GTATTATCCCGTATTGACGCCGGGCAAGAGCAACTCGGTCGCCGCATACACT

ATTCTCAGAATGACTTGGTTGAGTACTCACCAGTCACAGAAAAGCATCTTACG

GATGGCATGACAGTAAGAGAATTATGCAGTGCTGCCATAACCATGAGTGATA

ACACTGCGGCCAACTTACTTCTGACAACGATCGGAGGACCGAAGGAGCTAAC

CGCTTTTTTGCACAACATGGGGGATCATGTAACTCGCCTTGATCGTTGGGAAC

CGGAGCTGAATGAAGCCATACCAAACGACGAGCGTGACACCACGATGCCTGT

AGCAATGGCAACAACGTTGCGCAAACTATTAACTGGCGAACTACTTACTCTA

GCTTCCCGGCAACAATTAATAGACTGGATGGAGGCGGATAAAGTTGCAGGAC

CACTTCTGCGCTCGGCCCTTCCGGCTGGCTGGTTTATTGCTGATAAATCTGGA

GCCGGTGAGCGTGGGTCTCGCGGTATCATTGCAGCACTGGGGCCAGATGGTA

AGCCCTCCCGTATCGTAGTTATCTACACGACGGGGAGTCAGGCAACTATGGA

TGAACGAAATAGACAGATCGCTGAGATAGGTGCCTCACTGATTAAGCATTGG

TAACTGTCAGACCAAGTTTACTCATATATACTTTAGATTGATTTAAAACTTCA

TTTTTAATTTAAAAGGATCTAGGTGAAGATCCTTTTTGATAATCTCATGACCA

AAATCCCTTAACGTGAGTTTTCGTTCCACTGAGCGTCAGACCCCGTAGAAAAG

ATCAAAGGATCTTCTTGAGATCCTTTTTTTCTGCGCGTAATCTGCTGCTTGCAA

ACAAAAAAACCACCGCTACCAGCGGTGGTTTGTTTGCCGGATCAAGAGCTAC

CAACTCTTTTTCCGAAGGTAACTGGCTTCAGCAGAGCGCAGATACCAAATACT

GTCCTTCTAGTGTAGCCGTAGTTAGGCCACCACTTCAAGAACTCTGTAGCACC

GCCTACATACCTCGCTCTGCTAATCCTGTTACCAGTGGCTGCTGCCAGTGGCG

ATAAGTCGTGTCTTACCGGGTTGGACTCAAGACGATAGTTACCGGATAAGGC

GCAGCGGTCGGGCTGAACGGGGGGTTCGTGCACACAGCCCAGCTTGGAGCGA

ACGACCTACACCGAACTGAGATACCTACAGCGTGAGCTATGAGAAAGCGCCA

CGCTTCCCGAAGGGAGAAAGGCGGACAGGTATCCGGTAAGCGGCAGGGTCG

GAACAGGAGAGCGCACGAGGGAGCTTCCAGGGGGAAACGCCTGGTATCTTTA
```

-continued

```
TAGTCCTGTCGGGTTTCGCCACCTCTGACTTGAGCGTCGATTTTTGTGATGCTC

GTCAGGGGGCGGAGCCTATGGAAAAACGCCAGCAACGCGGCCTTTTTACGG

TTCCTGGCCTTTTGCTGGCCTTTTGCTCACATGT
```

Control vectors were also generated with a stop codon in PRODH2 (See FIGS. 9A-9D) and with a mutation in PRODH2 (catalytic domain mutant of PRODH2 CAR construct with specific amino acid substitutions to kill the catalytic activity). pLY59 TRAC-LHA-pAAV-EFS-CD22BBz-PRODH2 (STOP)-TRAC-RHA (3166mut) (SEQ ID NO: 84,606):

```
plY59_TRAC-LHA-pAAV-EFS-CD22BBz-PRODH2(STOP)-TRAC-RHA(3166mut)
(SEQ ID NO: 84,606):
CCTGCAGGCAGCTGCGCGCTCGCTCGCTCACTGAGGCCGCCCGGGCAAAGCC

CGGGCGTCGGGCGACCTTTGGTCGCCCGGCCTCAGTGAGCGAGCGAGCGCGC

AGAGAGGGAGTGGCCAACTCCATCACTAGGGGTTCCTGCGGCCGCACGCGTT

GTCCTAGGTCTTGAAAGGAGTGGGAATTGGCTCCGGTGCCCGTCAGTGGGCA

GAGCGCACATCGCCCACAGTCCCCGAGAAGTTGGGGGGAGGGGTCGGCAATT

GATCCGGTGCCTAGAGAAGGTGGCGCGGGGTAAACTGGGAAAGTGATGTCGT

GTACTGGCTCCGCCTTTTTCCCGAGGGTGGGGGAGAACCGTATATAAGTGCA

GTAGTCGCCGTGAACGTTCTTTTTCGCAACGGGTTTGCCGCCAGAACACAGGA

CCGGTTCTAGACGTACGGCCACCTGCTTCTGCTCGTGACAAGCCTGCTGCTGT

GCGAGCTGCCCCACCCTGCCTTTCTGCTGTCCCTCAGGTGCAGCTGCAGCAGT

CTGGCCCTGGCCTCGTGAAGCCTAGCCAGACCCTGGCCTGACCTGTGCCATCA

GCGGCGATAGCGTGTCCAGCAATAGCGCCGCCTGGAACTGGTCAGACAGAGC

CCTAGCAGAGGCCTGGAATGGCTGGGCCGGACCTACTACCGGTCCAAGGGTA

CAACGACTACGCCGTGTCCGTGAAGTCCCGGATCACCATCAACCCCGACACC

AGCAGAACCAGTTCTCCCTGCAGCTGAACAGCGTGACCCCCGAGGATACCGC

CGTGTACTACGCGCCAGAGAAGTGACCGGCGACCTGGAAGATGCCTTCGACA

TCTGGGGCCAGGGCACATGGTCACCGTGTCTAGCGGAGGCGGCGGAAGCGAC

ATCCAGATGACACAGAGCCCCAGCCCCTGAGCGCCAGCGTGGGAGACAGAGT

GACCATCACCTGTCGGGCCAGCCAGACCATCGGTCCTACCTGAACTGGTATC

AGCAGCGGCCTGGCAAGGCCCCCAACCTGCTGATCTATCCGCCAGCTCACTG

CAGAGCGGCGTGCCCAGCAGATTTTCCGGCAGAGGCAGCGGCACCACTTCAC

CCTGACAATCAGTTCCCTGCAGGCCGAGGACTTCGCCACCTACTACTGCCAGC

AGAGCTACAGCATCCCCCAGACCTTCGGCCAGGGGACCAAGCTGGAAATCAA

AGCGGCCGCAGGTACCCCACGACGCCAGCGCCGCGACCACCAACACCGGCGC

CCACCATCGCGTCGCAGCCCCTGCCCTGCGCCCAGAGGCATGCCGGCCAGCA

GCAGGGGCGCAGTGCACACGAGGGGGCTGACTTCGCCTGTGATATCTACAT

CTGGGCGCCCTTGGCCGGGACTTGTGGGGTCCTTCTCTGTCACTGGTTATCAC

CCTTTACTGCAAACGGGGCAGAAAGAAACTCCTGTATATATTCAACAACCATT

TATGAGACCAGTACAAACTACTCAAGAGGAAGATGGCTGTAGCTGCCGATTC

CAGAAGAAGAAGAAGGAGGATGTGAACTGAGAGTGAAGTTCAGCAGGAGCG

CAGACCCCCCGCGTACCAGCAGGGCCAGAACCAGCTCTATAACGAGCTCAAT
```

-continued

```
CTAGGACGAAGAAGGAGTACGATGTTTTGGACAAGAGACGTGGCCGGGACCC

TGAGATGGGGGAAAGCCGGAAGGAAGAACCCTCAGGAAGGCCTGTACAAT

GAACTGCAGAAAGATAAGATGGCGGAGCCTACAGTGAGATTGGGATGAAAG

GCGAGCGCCGGAGGGGCAAGGGGCACGATGGCCTTACCAGGGTCTCAGTACA

GCCACCAAGGACACCTACGACGCCCTTCACATGCAGGCCCTGCCCCTCGCGG

CAGTGGAGAGGGCAGAGGAAGTCTGCTAACATGCGGTGACGTCGAGGAGAA

TCCTGGCCCATAATAGTGAGGTACCACGGACCGAGCGGCCGCAGGAACCCCT

AGTGATGGAGTTGGCCACTCCCTCTCTGCGCGCTCGCTCGCTCACTGAGGCCG

GGCGACCAAAGGTCGCCCGACGCCCGGGCTTTGCCCGGGCGGCCTCAGTGAG

CGAGCGAGCGCGCAGCTGCCTGCAGGGGCGCCTGATGCGGTATTTTCTCCTTA

CGCATCTGTGCGGTATTTCACACCGCATACGTCAAAGCAACCATAGTACGCGC

CCTGTAGCGGCGCATTAAGCGCGGCGGGTGTGGTGGTTACGCGCAGCGTGAC

CGCTACACTTGCCAGCGCCCTAGCGCCCGCTCCTTTCGCTTTCTTCCCTTCCTT

TCTCGCCACGTTCGCCGGCTTTCCCCGTCAAGCTCTAAATCGGGGGCTCCCTT

TAGGGTTCCGATTTAGTGCTTTACGGCACCTCGACCCCAAAAAACTTGATTTG

GGTGATGGTTCACGTAGTGGGCCATCGCCCTGATAGACGGTTTTTCGCCCTTT

GACGTTGGAGTCCACGTTCTTTAATAGTGGACTCTTGTTCCAAACTGGAACAA

CACTCAACCCTATCTCGGGCTATTCTTTTGATTTATAAGGGATTTTGCCGATTT

CGGCCTATTGGTTAAAAAATGAGCTGATTTAACAAAAATTTAACGCGAATTTT

AACAAAATATTAACGTTTACAATTTTATGGTGCACTCTCAGTACAATCTGCTC

TGATGCCGCATAGTTAAGCCAGCCCCGACACCCGCCAACACCCGCTGACGCG

CCCTGACGGGCTTGTCTGCTCCCGGCATCCGCTTACAGACAAGCTGTGACCGT

CTCCGGGAGCTGCATGTGTCAGAGGTTTTCACCGTCATCACCGAAACGCGCG

AGACGAAAGGGCCTCGTGATACGCCTATTTTTATAGGTTAATGTCATGATAAT

AATGGTTTCTTAGACGTCAGGTGGCACTTTTCGGGGAAATGTGCGCGGAACCC

CTATTTGTTTATTTTTCTAAATACATTCAAATATGTATCCGCTCATGAGACAAT

AACCCTGATAAATGCTTCAATAATATTGAAAAAGGAAGAGTATGAGTATTCA

ACATTTCCGTGTCGCCCTTATTCCCTTTTTTGCGGCATTTTGCCTTCCTGTTTTT

GCTCACCCAGAAACGCTGGTGAAAGTAAAAGATGCTGAAGATCAGTTGGGTG

CACGAGTGGGTTACATCGAACTGGATCTCAACAGCGGTAAGATCCTTGAGAG

TTTTCGCCCCGAAGAACGTTTTCCAATGATGAGCACTTTTAAAGTTCTGCTAT

GTGGCGCGGTATTATCCCGTATTGACGCCGGGCAAGAGCAACTCGGTCGCCG

CATACACTATTCTCAGAATGACTTGGTTGAGTACTCACCAGTCACAGAAAAGC

ATCTTACGGATGGCATGACAGTAAGAGAATTATGCAGTGCTGCCATAACCAT

GAGTGATAACACTGCGGCCAACTTACTTCTGACAACGATCGGAGGACCGAAG

GAGCTAACCGCTTTTTTGCACAACATGGGGGATCATGTAACTCGCCTTGATCG

TTGGGAACCGGAGCTGAATGAAGCCATACCAAACGACGAGCGTGACACCACG

ATGCCTGTAGCAATGGCAACAACGTTGCGCAAACTATTAACTGGCGAACTAC

TTACTCTAGCTTCCCGGCAACAATTAATAGACTGGATGGAGGCGGATAAAGT

TGCAGGACCACTTCTGCGCTCGGCCCTTCCGGCTGGCTGGTTTATTGCTGATA
```

```
AATCTGGAGCCGGTGAGCGTGGGTCTCGCGGTATCATTGCAGCACTGGGGCC

AGATGGTAAGCCCTCCCGTATCGTAGTTATCTACACGACGGGGAGTCAGGCA

ACTATGGATGAACGAAATAGACAGATCGCTGAGATAGGTGCCTCACTGATTA

AGCATTGGTAACTGTCAGACCAAGTTTACTCATATATACTTTAGATTGATTTA

AAACTTCATTTTTAATTTAAAAGGATCTAGGTGAAGATCCTTTTTGATAATCT

CATGACCAAAATCCCTTAACGTGAGTTTTCGTTCCACTGAGCGTCAGACCCCG

TAGAAAAGATCAAAGGATCTTCTTGAGATCCTTTTTTTCTGCGCGTAATCTGC

TGCTTGCAAACAAAAAAACCACCGCTACCAGCGGTGGTTTGTTTGCCGGATC

AAGAGCTACCAACTCTTTTTCCGAAGGTAACTGGCTTCAGCAGAGCGCAGAT

ACCAAATACTGTCCTTCTAGTGTAGCCGTAGTTAGGCCACCACTTCAAGAACT

CTGTAGCACCGCCTACATACCTCGCTCTGCTAATCCTGTTACCAGTGGCTGCT

GCCAGTGGCGATAAGTCGTGTCTTACCGGGTTGGACTCAAGACGATAGTTAC

CGGATAAGGCGCAGCGGTCGGGCTGAACGGGGGGTTCGTGCACACAGCCCAG

CTTGGAGCGAACGACCTACACCGAACTGAGATACCTACAGCGTGAGCTATGA

GAAAGCGCCACGCTTCCCGAAGGGAGAAAGGCGGACAGGTATCCGGTAAGC

GGCAGGGTCGGAACAGGAGAGCGCACGAGGGAGCTTCCAGGGGGAAACGCC

TGGTATCTTTATAGTCCTGTCGGGTTTCGCCACCTCTGACTTGAGCGTCGATTT

TTGTGATGCTCGTCAGGGGGCGGAGCCTATGGAAAAACGCCAGCAACGCGG

CCTTTTTACGGTTCCTGGCCTTTTGCTGGCCTTTTGCTCACATGT pLY58_TRAC-LHA-pAAV-EFS-CD22BBz-PRODH2(Mut)-TRAC-RHA(3166mut)
(SEQ ID NO: 84,607);
CCTGCAGGCAGCTGCGCGCTCGCTCGCTCACTGAGGCCGCCCGGGCAAAGCC

CGGGCGTCGGGCGACCTTTGGTCGCCCGGCCTCAGTGAGCGAGCGAGCGCGC

AGAGAGGGAGTGGCCAACTCCATCACTAGGGGTTCCTGCGGCCGCACGCGTT

GTCCTAGGTCTTGAAAGGAGTGGGAATTGGCTCCGGTGCCCGTCAGTGGGCA

GAGCGCACATCGCCCACAGTCCCCGAGAAGTTGGGGGGAGGGGTCGGCAATT

GATCCGGTGCCTAGAGAAGGTGGCGCGGGGTAAACTGGGAAAGTGATGTCGT

GTACTGGCTCCGCCTTTTTCCCGAGGGTGGGGGAGAACCGTATATAAGTGCA

GTAGTCGCCGTGAACGTTCTTTTTCGCAACGGGTTTGCCGCCAGAACACAGGA

CCGGTTCTAGACGTACGGCCACCTGCTTCTGCTCGTGACAAGCCTGCTGCTGT

GCGAGCTGCCCCACCCTGCCTTTCTGCTGTCCCTCAGGTGCAGCTGCAGCAGT

CTGGCCCTGGCCTCGTGAAGCCTAGCCAGACCCTGGCCTGACCTGTGCCATCA

GCGGCGATAGCGTGTCCAGCAATAGCGCCGCCTGGAACTGGTCAGACAGAGC

CCTAGCAGAGGCCTGGAATGGCTGGGCCGGACCTACTACCGGTCCAAGGGTA

CAACGACTACGCCGTGTCCGTGAAGTCCCGGATCACCATCAACCCCGACACC

AGCAGAACCAGTTCTCCCTGCAGCTGAACAGCGTGACCCCCGAGGATACCGC

CGTGTACTACGCGCCAGAGAAGTGACCGGCGACCTGGAAGATGCCTTCGACA

TCTGGGGCCAGGGCACATGGTCACCGTGTCTAGCGGAGGCGGCGGAAGCGAC

ATCCAGATGACACAGAGCCCCAGCCCCTGAGCGCCAGCGTGGGAGACAGAGT

GACCATCACCTGTCGGGCCAGCCAGACCATCGGTCCTACCTGAACTGGTATC

AGCAGCGGCCTGGCAAGGCCCCCAACCTGCTGATCTATCCGCCAGCTCACTG

CAGAGCGGCGTGCCCAGCAGATTTTCCGGCAGAGGCAGCGGCACCACTTCAC
```

-continued

```
CCTGACAATCAGTTCCCTGCAGGCCGAGGACTTCGCCACCTACTACTGCCAGC

AGAGCTACAGCATCCCCCAGACCTTCGGCCAGGGGACCAAGCTGGAAATCAA

AGCGGCCGCAGGTACCCCACGACGCCAGCGCCGCGACCACCAACACCGGCGC

CCACCATCGCGTCGCAGCCCCTGCCCTGCGCCCAGAGGCATGCCGGCCAGCA

GCAGGGGGCGCAGTGCACACGAGGGGGCTGACTTCGCCTGTGATATCTACAT

CTGGGCGCCCTTGGCCGGGACTTGTGGGGTCCTTCTCTGTCACTGGTTATCAC

CCTTTACTGCAAACGGGGCAGAAAGAAACTCCTGTATATATTCAACAACCATT

TATGAGACCAGTACAAACTACTCAAGAGGAAGATGGCTGTAGCTGCCGATTC

CAGAAGAAGAAGAAGGAGGATGTGAACTGAGAGTGAAGTTCAGCAGGAGCG

CAGACCCCCGCGTACCAGCAGGGCCAGAACCAGCTCTATAACGAGCTCAAT

CTAGGACGAAGAAGGAGTACGATGTTTTGGACAAGAGACGTGGCCGGGACCC

TGAGATGGGGGAAAGCCGGAAGGAAGAACCCTCAGGAAGGCCTGTACAAT

GAACTGCAGAAAGATAAGATGGCGGAGCCTACAGTGAGATTGGGATGAAAG

GCGAGCGCCGGAGGGGCAAGGGGCACGATGGCCTTACCAGGGTCTCAGTACA

GCCACCAAGGACACCTACGACGCCCTTCACATGCAGGCCCTGCCCCTCGCGG

CAGTGGAGAGGGCAGAGGAAGTCTGCTAACATGCGGTGACGTCGAGGAGAA

TCCTGGCCCAGCTGCTGCCGCTGCCGGTACCACGGACCGAGCGGCCGCAGGA

ACCCCTAGTGATGGAGTTGGCCACTCCCTCTCTGCGCGCTCGCTCGCTCACTG

AGGCCGGGCGACCAAAGGTCGCCCGACGCCCGGGCTTTGCCCGGGCGGCCTC

AGTGAGCGAGCGAGCGCGCAGCTGCCTGCAGGGGCGCCTGATGCGGTATTTT

CTCCTTACGCATCTGTGCGGTATTTCACACCGCATACGTCAAAGCAACCATAG

TACGCGCCCTGTAGCGGCGCATTAAGCGCGGCGGGTGTGGTGGTTACGCGCA

GCGTGACCGCTACACTTGCCAGCGCCCTAGCGCCCGCTCCTTTCGCTTTCTTC

CCTTCCTTTCTCGCCACGTTCGCCGGCTTTCCCCGTCAAGCTCTAAATCGGGG

GCTCCCTTTAGGGTTCCGATTTAGTGCTTTACGGCACCTCGACCCCAAAAAAC

TTGATTTGGGTGATGGTTCACGTAGTGGGCCATCGCCCTGATAGACGGTTTTT

CGCCCTTTGACGTTGGAGTCCACGTTCTTTAATAGTGGACTCTTGTTCCAAACT

GGAACAACACTCAACCCTATCTCGGGCTATTCTTTTGATTTATAAGGGATTTT

GCCGATTTCGGCCTATTGGTTAAAAAATGAGCTGATTTAACAAAAATTTAACG

CGAATTTTAACAAAATATTAACGTTTACAATTTTATGGTGCACTCTCAGTACA

ATCTGCTCTGATGCCGCATAGTTAAGCCAGCCCCGACACCCGCCAACACCCG

CTGACGCGCCCTGACGGGCTTGTCTGCTCCCGGCATCCGCTTACAGACAAGCT

GTGACCGTCTCCGGGAGCTGCATGTGTCAGAGGTTTTCACCGTCATCACCGAA

ACGCGCGAGACGAAAGGGCCTCGTGATACGCCTATTTTTATAGGTTAATGTCA

TGATAATAATGGTTTCTTAGACGTCAGGTGGCACTTTTCGGGGAAATGTGCGC

GGAACCCCTATTTGTTTATTTTTCTAAATACATTCAAATATGTATCCGCTCATG

AGACAATAACCCTGATAAATGCTTCAATAATATTGAAAAAGGAAGAGTATGA

GTATTCAACATTTCCGTGTCGCCCTTATTCCCTTTTTTGCGGCATTTTGCCTTCC

TGTTTTTGCTCACCCAGAAACGCTGGTGAAAGTAAAAGATGCTGAAGATCAG

TTGGGTGCACGAGTGGGTTACATCGAACTGGATCTCAACAGCGGTAAGATCC
```

-continued

TTGAGAGTTTTCGCCCCGAAGAACGTTTTCCAATGATGAGCACTTTTAAAGTT

CTGCTATGTGGCGCGGTATTATCCCGTATTGACGCCGGGCAAGAGCAACTCG

GTCGCCGCATACACTATTCTCAGAATGACTTGGTTGAGTACTCACCAGTCACA

GAAAAGCATCTTACGGATGGCATGACAGTAAGAGAATTATGCAGTGCTGCCA

TAACCATGAGTGATAACACTGCGGCCAACTTACTTCTGACAACGATCGGAGG

ACCGAAGGAGCTAACCGCTTTTTTGCACAACATGGGGGATCATGTAACTCGC

CTTGATCGTTGGGAACCGGAGCTGAATGAAGCCATACCAAACGACGAGCGTG

ACACCACGATGCCTGTAGCAATGGCAACAACGTTGCGCAAACTATTAACTGG

CGAACTACTTACTCTAGCTTCCCGGCAACAATTAATAGACTGGATGGAGGCG

GATAAAGTTGCAGGACCACTTCTGCGCTCGGCCCTTCCGGCTGGCTGGTTTAT

TGCTGATAAATCTGGAGCCGGTGAGCGTGGGTCTCGCGGTATCATTGCAGCA

CTGGGGCCAGATGGTAAGCCCTCCCGTATCGTAGTTATCTACACGACGGGGA

GTCAGGCAACTATGGATGAACGAAATAGACAGATCGCTGAGATAGGTGCCTC

ACTGATTAAGCATTGGTAACTGTCAGACCAAGTTTACTCATATATACTTTAGA

TTGATTTAAAACTTCATTTTTAATTTAAAAGGATCTAGGTGAAGATCCTTTTTG

ATAATCTCATGACCAAAATCCCTTAACGTGAGTTTTCGTTCCACTGAGCGTCA

GACCCCGTAGAAAAGATCAAAGGATCTTCTTGAGATCCTTTTTTTCTGCGCGT

AATCTGCTGCTTGCAAACAAAAAAACCACCGCTACCAGCGGTGGTTTGTTTGC

CGGATCAAGAGCTACCAACTCTTTTTCCGAAGGTAACTGGCTTCAGCAGAGC

GCAGATACCAAATACTGTCCTTCTAGTGTAGCCGTAGTTAGGCCACCACTTCA

AGAACTCTGTAGCACCGCCTACATACCTCGCTCTGCTAATCCTGTTACCAGTG

GCTGCTGCCAGTGGCGATAAGTCGTGTCTTACCGGGTTGGACTCAAGACGAT

AGTTACCGGATAAGGCGCAGCGGTCGGGCTGAACGGGGGGTTCGTGCACACA

GCCCAGCTTGGAGCGAACGACCTACACCGAACTGAGATACCTACAGCGTGAG

CTATGAGAAAGCGCCACGCTTCCCGAAGGGAGAAAGGCGGACAGGTATCCG

GTAAGCGGCAGGGTCGGAACAGGAGAGCGCACGAGGGAGCTTCCAGGGGGA

AACGCCTGGTATCTTTATAGTCCTGTCGGGTTTCGCCACCTCTGACTTGAGCG

TCGATTTTTGTGATGCTCGTCAGGGGGGCGGAGCCTATGGAAAAACGCCAGC

AACGCGGCCTTTTTACGGTTCCTGGCCTTTTGCTGGCCTTTTGCTCACATGT pLY55_TRAC-LHA-pAAV-U6LbcrTRAC-EFS-CD22BBz-PRODH2-TRAC-
RHA(3166mut) (SEQ ID NO: 84,608):
CCTGCAGGCAGCTGCGCGCTCGCTCGCTCACTGAGGCCGCCCGGGCAAAGCC

CGGGCGTCGGGCGACCTTTGGTCGCCCGGCCTCAGTGAGCGAGCGAGCGCGC

AGAGAGGGAGTGGCCAACTCCATCACTAGGGGTTCCTGCGGCCGCACGCGTG

TCGCGTTCTAGAAGAGGGCCTATTTCCCATGATTCCTTCATATTTGCATATAC

GATACAAGGCTGTTAGAGAGATAATTGGAATTAATTTGACTGTAAACACAAA

GATATTAGTACAAAATACGTGACGTAGAAAGTAATAATTTCTTGGGTAGTTTG

CAGTTTTAAAATTATGTTTTAAAATGGACTATCATATGCTTACCGTAACTTGA

AAGTATTTCGATTTCTTGGCTTTATATATCTTGAAGCTTGGCGTAACTAGATCT

TGAGACAAGGTACCTAGGTCTTGAAAGGAGTGGGAATTGGCTCCGGTGCCCG

TCAGTGGGCAGAGCGCACATCGCCCACAGTCCCCGAGAAGTTGGGGGGAGGG

GTCGGCAATTGATCCGGTGCCTAGAGAAGGTGGCGCGGGGTAAACTGGGAAA

-continued

```
GTGATGTCGTGTACTGGCTCCGCCTTTTTCCCGAGGGTGGGGGAGAACCGTAT

ATAAGTGCAGTAGTCGCCGTGAACGTTCTTTTTCGCAACGGGTTTGCCGCCAG

AACACAGGACCGGTTCTAGACGTACGGCCACCTGCTTCTGCTCGTGACAAGC

CTGCTGCTGTGCGAGCTGCCCCACCCTGCCTTTCTGCTGTCCCTCAGGTGCAG

CTGCAGCAGTCTGGCCCTGGCCTCGTGAAGCCTAGCCAGACCCTGGCCTGAC

CTGTGCCATCAGCGGCGATAGCGTGTCCAGCAATAGCGCCGCCTGGAACTGG

TCAGACAGAGCCCTAGCAGAGGCCTGGAATGGCTGGGCCGGACCTACTACCG

GTCCAAGGGTACAACGACTACGCCGTGTCCGTGAAGTCCCGGATCACCATCA

ACCCCGACACCAGCAGAACCAGTTCTCCCTGCAGCTGAACAGCGTGACCCCC

GAGGATACCGCCGTGTACTACGCGCCAGAGAAGTGACCGGCGACCTGGAAGA

TGCCTTCGACATCTGGGGCCAGGGCACATGGTCACCGTGTCTAGCGGAGGCG

GCGGAAGCGACATCCAGATGACACAGAGCCCCAGCCCCTGAGCGCCAGCGTG

GGAGACAGAGTGACCATCACCTGTCGGGCCAGCCAGACCATCGGTCCTACCT

GAACTGGTATCAGCAGCGGCCTGGCAAGGCCCCCAACCTGCTGATCTATCCG

CCAGCTCACTGCAGAGCGGCGTGCCCAGCAGATTTTCCGGCAGAGGCAGCGG

CACCACTTCACCCTGACAATCAGTTCCCTGCAGGCCGAGGACTTCGCCACCTA

CTACTGCCAGCAGAGCTACAGCATCCCCCAGACCTTCGGCCAGGGGACCAAG

CTGGAAATCAAAGCGGCCGCAGGTACCCCACGACGCCAGCGCCGCGACCACC

AACACCGGCGCCCACCATCGCGTCGCAGCCCCTGCCCTGCGCCCAGAGGCAT

GCCGGCCAGCAGCAGGGGCGCAGTGCACACGAGGGGGCTGACTTCGCCTGT

GATATCTACATCTGGGCGCCCTTGGCCGGGACTTGTGGGGTCCTTCTCTGTCA

CTGGTTATCACCCTTTACTGCAAACGGGGCAGAAAGAAACTCCTGTATATATT

CAACAACCATTTATGAGACCAGTACAAACTACTCAAGAGGAAGATGGCTGTA

GCTGCCGATTCCAGAAGAAGAAGAAGGAGGATGTGAACTGAGAGTGAAGTT

CAGCAGGAGCGCAGACCCCCCGCGTACCAGCAGGGCCAGAACCAGCTCTATA

ACGAGCTCAATCTAGGACGAAGAAGGAGTACGATGTTTTGGACAAGAGACGT

GGCCGGGACCCTGAGATGGGGGGAAAGCCGGAAGGAAGAACCCTCAGGAAG

GCCTGTACAATGAACTGCAGAAAGATAAGATGGCGGAGCCTACAGTGAGATT

GGGATGAAAGGCGAGCGCCGGAGGGGCAAGGGGCACGATGGCCTTACCAGG

GTCTCAGTACAGCCACCAAGGACACCTACGACGCCCTTCACATGCAGGCCCT

GCCCCTCGCGGCAGTGGAGAGGGCAGAGGAAGTCTGCTAACATGCGGTGACG

TCGAGGAGAATCCTGGCCCAGACTACAAAGACCATGACGGTGATTATAAAGA

TCATGACATCGGTACCACGGACCGAGCGGCCGCAGGAACCCCTAGTGATGGA

GTTGGCCACTCCCTCTCTGCGCGCTCGCTCGCTCACTGAGGCCGGGCGACCAA

AGGTCGCCCGACGCCCGGGCTTTGCCCGGGCGGCCTCAGTGAGCGAGCGAGC

GCGCAGCTGCCTGCAGGGGCGCCTGATGCGGTATTTTCTCCTTACGCATCTGT

GCGGTATTTCACACCGCATACGTCAAAGCAACCATAGTACGCGCCCTGTAGC

GGCGCATTAAGCGCGGCGGGTGTGGTGGTTACGCGCAGCGTGACCGCTACAC

TTGCCAGCGCCCTAGCGCCCGCTCCTTTCGCTTTCTTCCCTTCCTTTCTCGCCA

CGTTCGCCGGCTTTCCCCGTCAAGCTCTAAATCGGGGGCTCCCTTTAGGGTTC
```

-continued

```
CGATTTAGTGCTTTACGGCACCTCGACCCCAAAAAACTTGATTTGGGTGATGG
TTCACGTAGTGGGCCATCGCCCTGATAGACGGTTTTTCGCCCTTTGACGTTGG
AGTCCACGTTCTTTAATAGTGGACTCTTGTTCCAAACTGGAACAACACTCAAC
CCTATCTCGGGCTATTCTTTTGATTTATAAGGGATTTTGCCGATTTCGGCCTAT
TGGTTAAAAAATGAGCTGATTTAACAAAAATTTAACGCGAATTTTAACAAAA
TATTAACGTTTACAATTTTATGGTGCACTCTCAGTACAATCTGCTCTGATGCCG
CATAGTTAAGCCAGCCCCGACACCCGCCAACACCCGCTGACGCGCCCTGACG
GGCTTGTCTGCTCCCGGCATCCGCTTACAGACAAGCTGTGACCGTCTCCGGGA
GCTGCATGTGTCAGAGGTTTTCACCGTCATCACCGAAACGCGCGAGACGAAA
GGGCCTCGTGATACGCCTATTTTTATAGGTTAATGTCATGATAATAATGGTTT
CTTAGACGTCAGGTGGCACTTTTCGGGGAAATGTGCGCGGAACCCCTATTTGT
TTATTTTTCTAAATACATTCAAATATGTATCCGCTCATGAGACAATAACCCTG
ATAAATGCTTCAATAATATTGAAAAAGGAAGAGTATGAGTATTCAACATTTC
CGTGTCGCCCTTATTCCCTTTTTGCGGCATTTTGCCTTCCTGTTTTTGCTCACC
CAGAAACGCTGGTGAAAGTAAAAGATGCTGAAGATCAGTTGGGTGCACGAGT
GGGTTACATCGAACTGGATCTCAACAGCGGTAAGATCCTTGAGAGTTTTCGCC
CCGAAGAACGTTTTCCAATGATGAGCACTTTTAAAGTTCTGCTATGTGGCGCG
GTATTATCCCGTATTGACGCCGGGCAAGAGCAACTCGGTCGCCGCATACACT
ATTCTCAGAATGACTTGGTTGAGTACTCACCAGTCACAGAAAAGCATCTTACG
GATGGCATGACAGTAAGAGAATTATGCAGTGCTGCCATAACCATGAGTGATA
ACACTGCGGCCAACTTACTTCTGACAACGATCGGAGGACCGAAGGAGCTAAC
CGCTTTTTTGCACAACATGGGGGATCATGTAACTCGCCTTGATCGTTGGGAAC
CGGAGCTGAATGAAGCCATACCAAACGACGAGCGTGACACCACGATGCCTGT
AGCAATGGCAACAACGTTGCGCAAACTATTAACTGGCGAACTACTTACTCTA
GCTTCCCGGCAACAATTAATAGACTGGATGGAGGCGGATAAAGTTGCAGGAC
CACTTCTGCGCTCGGCCCTTCCGGCTGGCTGGTTTATTGCTGATAAATCTGGA
GCCGGTGAGCGTGGGTCTCGCGGTATCATTGCAGCACTGGGGCCAGATGGTA
AGCCCTCCCGTATCGTAGTTATCTACACGACGGGGAGTCAGGCAACTATGGA
TGAACGAAATAGACAGATCGCTGAGATAGGTGCCTCACTGATTAAGCATTGG
TAACTGTCAGACCAAGTTTACTCATATATACTTTAGATTGATTTAAAACTTCA
TTTTTAATTTAAAAGGATCTAGGTGAAGATCCTTTTTGATAATCTCATGACCA
AAATCCCTTAACGTGAGTTTTCGTTCCACTGAGCGTCAGACCCCGTAGAAAAG
ATCAAAGGATCTTCTTGAGATCCTTTTTTTCTGCGCGTAATCTGCTGCTTGCAA
ACAAAAAAACCACCGCTACCAGCGGTGGTTTGTTTGCCGGATCAAGAGCTAC
CAACTCTTTTTCCGAAGGTAACTGGCTTCAGCAGAGCGCAGATACCAAATACT
GTCCTTCTAGTGTAGCCGTAGTTAGGCCACCACTTCAAGAACTCTGTAGCACC
GCCTACATACCTCGCTCTGCTAATCCTGTTACCAGTGGCTGCTGCCAGTGGCG
ATAAGTCGTGTCTTACCGGGTTGGACTCAAGACGATAGTTACCGGATAAGGC
GCAGCGGTCGGGCTGAACGGGGGGTTCGTGCACACAGCCCAGCTTGGAGCGA
ACGACCTACACCGAACTGAGATACCTACAGCGTGAGCTATGAGAAAGCGCCA
CGCTTCCCGAAGGGAGAAAGGCGGACAGGTATCCGGTAAGCGGCAGGGTCG
```

-continued

GAACAGGAGAGCGCACGAGGGAGCTTCCAGGGGGAAACGCCTGGTATCTTTA

TAGTCCTGTCGGGTTTCGCCACCTCTGACTTGAGCGTCGATTTTTGTGATGCTC

GTCAGGGGGCGGAGCCTATGGAAAAACGCCAGCAACGCGGCCTTTTTACGG

TTCCTGGCCTTTTGCTGGCCTTTTGCTCACATGT pLY56_TRAC-LHA-pAAV-U6LbcrTRAC-EFS-CD22BBz-GFP-TRAC-RHA(3166mut)
(SEQ ID NO: 84,609):
CCTGCAGGCAGCTGCGCGCTCGCTCGCTCACTGAGGCCGCCCGGGCAA

AGCCCGGGCGTCGGGCGACCTTTGGTCGCCCGGCCTCAGTGAGCGAGCGAGC

GCGCAGAGAGGGAGTGGCCAACTCCATCACTAGGGGTTCCTGCGGCCGCACG

CGTGTCGCGTTCTAGAAGAGGGCCTATTTCCCATGATTCCTTCATATTTGCAT

ATACGATACAAGGCTGTTAGAGAGATAATTGGAATTAATTTGACTGTAAACA

CAAAGATATTAGTACAAAATACGTGACGTAGAAAGTAATAATTTCTTGGGTA

GTTTGCAGTTTTAAAATTATGTTTTAAAATGGACTATCATATGCTTACCGTAA

CTTGAAAGTATTTCGATTTCTTGGCTTTATATATCTTGAAGCTTGGCGTAACTA

GATCTTGAGACAAGGTACCTAGGTCTTGAAAGGAGTGGGAATTGGCTCCGGT

GCCCGTCAGTGGGCAGAGCGCACATCGCCCACAGTCCCCGAGAAGTTGGGGG

GAGGGGTCGGCAATTGATCCGGTGCCTAGAGAAGGTGGCGCGGGGTAAACTG

GGAAAGTGATGTCGTGTACTGGCTCCGCCTTTTTCCCGAGGGTGGGGGAGAA

CCGTATATAAGTGCAGTAGTCGCCGTGAACGTTCTTTTTCGCAACGGGTTTGC

CGCCAGAACACAGGACCGGTTCTAGACGTACGGCCACCTGCTTCTGCTCGTG

ACAAGCCTGCTGCTGTGCGAGCTGCCCCACCCTGCCTTTCTGCTGTCCCTCAG

GTGCAGCTGCAGCAGTCTGGCCCTGGCCTCGTGAAGCCTAGCCAGACCCTGG

CCTGACCTGTGCCATCAGCGGCGATAGCGTGTCCAGCAATAGCGCCGCCTGG

AACTGGTCAGACAGAGCCCTAGCAGAGGCCTGGAATGGCTGGGCCGGACCTA

CTACCGGTCCAAGGGTACAACGACTACGCCGTGTCCGTGAAGTCCCGGATCA

CCATCAACCCCGACACCAGCAGAACCAGTTCTCCCTGCAGCTGAACAGCGTG

ACCCCCGAGGATACCGCCGTGTACTACGCGCCAGAGAAGTGACCGGCGACCT

GGAAGATGCCTTCGACATCTGGGGCCAGGGCACATGGTCACCGTGTCTAGCG

GAGGCGGCGGAAGCGACATCCAGATGACACAGAGCCCCAGCCCCTGAGCGC

CAGCGTGGGAGACAGAGTGACCATCACCTGTCGGGCCAGCCAGACCATCGGT

CCTACCTGAACTGGTATCAGCAGCGGCCTGGCAAGGCCCCCAACCTGCTGAT

CTATCCGCCAGCTCACTGCAGAGCGGCGTGCCCAGCAGATTTTCCGGCAGAG

GCAGCGGCACCACTTCACCCTGACAATCAGTTCCCTGCAGGCCGAGGACTTC

GCCACCTACTACTGCCAGCAGAGCTACAGCATCCCCCAGACCTTCGGCCAGG

GGACCAAGCTGGAAATCAAAGCGGCCGCAGGTACCCCACGACGCCAGCGCC

GCGACCACCAACACCGGCGCCCACCATCGCGTCGCAGCCCCTGCCCTGCGCC

CAGAGGCATGCCGGCCAGCAGCAGGGGCGCAGTGCACACGAGGGGCTGA

CTTCGCCTGTGATATCTACATCTGGGCGCCCTTGGCCGGGACTTGTGGGGTCC

TTCTCTGTCACTGGTTATCACCCTTTACTGCAAACGGGGCAGAAAGAAACTCC

TGTATATATTCAACAACCATTTATGAGACCAGTACAAACTACTCAAGAGGAA

GATGGCTGTAGCTGCCGATTCCAGAAGAAGAAGAAGGAGGATGTGAACTGA

-continued

```
GAGTGAAGTTCAGCAGGAGCGCAGACCCCCGCGTACCAGCAGGGCCAGAA

CCAGCTCTATAACGAGCTCAATCTAGGACGAAGAAGGAGTACGATGTTTTGG

ACAAGAGACGTGGCCGGGACCCTGAGATGGGGGGAAAGCCGGAAGGAAGAA

CCCTCAGGAAGGCCTGTACAATGAACTGCAGAAAGATAAGATGGCGGAGCCT

ACAGTGAGATTGGGATGAAAGGCGAGCGCCGGAGGGGCAAGGGGCACGATG

GCCTTACCAGGGTCTCAGTACAGCCACCAAGGACACCTACGACGCCCTTCAC

ATGCAGGCCCTGCCCCTCGCGGCAGTGGAGAGGGCAGAGGAAGTCTGCTAAC

ATGCGGTGACGTCGAGGAGAATCCTGGCCCAGGTACCACGGACCGAGCGGCC

GCAGGAACCCCTAGTGATGGAGTTGGCCACTCCCTCTCTGCGCGCTCGCTCGC

TCACTGAGGCCGGGCGACCAAAGGTCGCCCGACGCCCGGGCTTTGCCCGGGC

GGCCTCAGTGAGCGAGCGAGCGCGCAGCTGCCTGCAGGGGCGCCTGATGCGG

TATTTTCTCCTTACGCATCTGTGCGGTATTTCACACCGCATACGTCAAAGCAA

CCATAGTACGCGCCCTGTAGCGGCGCATTAAGCGCGGCGGGTGTGGTGGTTA

CGCGCAGCGTGACCGCTACACTTGCCAGCGCCCTAGCGCCCGCTCCTTTCGCT

TTCTTCCCTTCCTTTCTCGCCACGTTCGCCGGCTTTCCCCGTCAAGCTCTAAAT

CGGGGGCTCCCTTTAGGGTTCCGATTTAGTGCTTTACGGCACCTCGACCCCAA

AAAACTTGATTTGGGTGATGGTTCACGTAGTGGGCCATCGCCCTGATAGACG

GTTTTTCGCCCTTTGACGTTGGAGTCCACGTTCTTTAATAGTGGACTCTTGTTC

CAAACTGGAACAACACTCAACCCTATCTCGGGCTATTCTTTTGATTTATAAGG

GATTTTGCCGATTTCGGCCTATTGGTTAAAAAATGAGCTGATTTAACAAAAAT

TTAACGCGAATTTTAACAAAATATTAACGTTTACAATTTTATGGTGCACTCTC

AGTACAATCTGCTCTGATGCCGCATAGTTAAGCCAGCCCCGACACCCGCCAA

CACCCGCTGACGCGCCCTGACGGGCTTGTCTGCTCCCGGCATCCGCTTACAGA

CAAGCTGTGACCGTCTCCGGGAGCTGCATGTGTCAGAGGTTTTCACCGTCATC

ACCGAAACGCGCGAGACGAAAGGGCCTCGTGATACGCCTATTTTTATAGGTT

AATGTCATGATAATAATGGTTTCTTAGACGTCAGGTGGCACTTTTCGGGGAAA

TGTGCGCGGAACCCCTATTTGTTTATTTTTCTAAATACATTCAAATATGTATCC

GCTCATGAGACAATAACCCTGATAAATGCTTCAATAATATTGAAAAAGGAAG

AGTATGAGTATTCAACATTTCCGTGTCGCCCTTATTCCCTTTTTTGCGGCATTT

TGCCTTCCTGTTTTTGCTCACCCAGAAACGCTGGTGAAAGTAAAAGATGCTGA

AGATCAGTTGGGTGCACGAGTGGGTTACATCGAACTGGATCTCAACAGCGGT

AAGATCCTTGAGAGTTTTCGCCCCGAAGAACGTTTTCCAATGATGAGCACTTT

TAAAGTTCTGCTATGTGGCGCGGTATTATCCCGTATTGACGCCGGGCAAGAGC

AACTCGGTCGCCGCATACACTATTCTCAGAATGACTTGGTTGAGTACTCACCA

GTCACAGAAAAGCATCTTACGGATGGCATGACAGTAAGAGAATTATGCAGTG

CTGCCATAACCATGAGTGATAACACTGCGGCCAACTTACTTCTGACAACGATC

GGAGGACCGAAGGAGCTAACCGCTTTTTTGCACAACATGGGGGATCATGTAA

CTCGCCTTGATCGTTGGGAACCGGAGCTGAATGAAGCCATACCAAACGACGA

GCGTGACACCACGATGCCTGTAGCAATGGCAACAACGTTGCGCAAACTATTA

ACTGGCGAACTACTTACTCTAGCTTCCCGGCAACAATTAATAGACTGGATGGA

GGCGGATAAAGTTGCAGGACCACTTCTGCGCTCGGCCCTTCCGGCTGGCTGGT
```

-continued

```
TTATTGCTGATAAATCTGGAGCCGGTGAGCGTGGGTCTCGCGGTATCATTGCA

GCACTGGGGCCAGATGGTAAGCCCTCCCGTATCGTAGTTATCTACACGACGG

GGAGTCAGGCAACTATGGATGAACGAAATAGACAGATCGCTGAGATAGGTGC

CTCACTGATTAAGCATTGGTAACTGTCAGACCAAGTTTACTCATATATACTTT

AGATTGATTTAAAACTTCATTTTTAATTTAAAAGGATCTAGGTGAAGATCCTT

TTTGATAATCTCATGACCAAAATCCCTTAACGTGAGTTTTCGTTCCACTGAGC

GTCAGACCCCGTAGAAAAGATCAAAGGATCTTCTTGAGATCCTTTTTTTCTGC

GCGTAATCTGCTGCTTGCAAACAAAAAAACCACCGCTACCAGCGGTGGTTTG

TTTGCCGGATCAAGAGCTACCAACTCTTTTTCCGAAGGTAACTGGCTTCAGCA

GAGCGCAGATACCAAATACTGTCCTTCTAGTGTAGCCGTAGTTAGGCCACCAC

TTCAAGAACTCTGTAGCACCGCCTACATACCTCGCTCTGCTAATCCTGTTACC

AGTGGCTGCTGCCAGTGGCGATAAGTCGTGTCTTACCGGGTTGGACTCAAGA

CGATAGTTACCGGATAAGGCGCAGCGGTCGGGCTGAACGGGGGTTCGTGCA

CACAGCCCAGCTTGGAGCGAACGACCTACACCGAACTGAGATACCTACAGCG

TGAGCTATGAGAAAGCGCCACGCTTCCCGAAGGGAGAAAGGCGGACAGGTA

TCCGGTAAGCGGCAGGGTCGGAACAGGAGAGCGCACGAGGGAGCTTCCAGG

GGGAAACGCCTGGTATCTTTATAGTCCTGTCGGGTTTCGCCACCTCTGACTTG

AGCGTCGATTTTTGTGATGCTCGTCAGGGGGGCGGAGCCTATGGAAAAACGC

CAGCAACGCGGCCTTTTTACGGTTCCTGGCCTTTTGCTGGCCTTTTGCTCACAT

GT
```

AAV production (Examples 5-10): Low-passage HEK293FT cells were used for AAV production. Briefly, 2 h before transfection, D10 media was replaced by pre-warmed DMEM (FBS-free). For each 15 cm-dish, HEK293FT cells were transiently transfected with 5.2 µg transfer, 8.9 µg AAV6 serotype and 10.4 µg pDF6 plasmids using 130 µL PEI. After 6-12 h of transfection, DMEM was replaced with 20 mL pre-warmed D10 media. Cells were dislodged and transferred to 50 mL Falcon tubes after 48-72 h post-transfection. For AAV purification, 1/10 volume of pure chloroform was added and the solution was incubated at 37° C. in the shaker with speed of 200 rpm for 1 h. NaCl was added to a final concentration of 1 M, then pelleted at 20,000×g at 4° C. for 15 min. The aqueous layer was gently transferred to another clean tube and the chloroform layer was discarded. 10% (w/v) of PEG8000 (Promega) was added and shaken within the tubes until dissolved. The mixture was incubated on the ice for 1 h followed by centrifuge at 20,000×g at 4° C. for 15 min. The pellet was resuspended with 5-15 mL PBS including $MgCl_2$ and benzonase (Sigma). After 30-60 min digestion, one volume of chloroform was added, shaken vigorously and spun down at 15,000×g at 4° C. for 10 min. The aqueous layer was collected carefully and AAV was concentrated using AmiconUltra 100 kD ultracentrifugation units (Millipore). Virus was aliquoted and stored in −80° C. To measure virus titer, RT-qPCR was performed using Taqman assays (ThermoFisher) targeted to EFS promoter engineered in the AAV vector.

Human primary $CD8^+$ T cell electroporation and CD22-CAR-PRODH2 knock-in: Human primary $CD8^+$ T cells were isolated from PBMCs obtained from health donors. $CD8^+$ T cells were cultured in X-VIVO™ 15 media (Lonza) supplied with 5% human serum and IL-2. Before electroporation, TRAC crRNA and tracrRNA were mixed in 1:1 ratio (final concentration 50 µM), heated at 95° C. for 5 min in the thermal cycler, then cooled to room temperature. 0.3 µL Cas9 protein (61 µM) was mixed with 0.2 µL Buffer R for each reaction (Neon Transfection System Kit, Thermo Fisher), then mixed with 0.5 µL annealed crRNA: tracrRNA duplex, incubated the mixture at room temperature for 10-20 min. Human $CD8^+$ T cells were collected and washed with PBS to completely remove the media. $5\times10^5$ of T cells per reaction were resuspended in 10 µL Buffer R which included 1 µL RNP complex. 10 µL of cell: RNP mixture was loaded into the Neon Pipette without any bubbles. The electroporation parameter was set at 1600 V, 10 ms for 3 pluses. Cells were immediately transferred to a 48-well plate with pre-warmed media after electroporation. A total of ~$1.5\times10^9$ viral genome copy of AAV6 HDR donor was added into each electroporated T cell reaction within 1 h after electroporation.

Immunoblots (Examples 5-10): Human $CD8^+$ T cells with CD22-CAR-PRODH2 or CD22-CAR-PRODH2 (Stop) KI were collected and washed with PBS to remove media. Cells were lysed with RIPA lysis buffer supplied with protease and phosphatase inhibitor cocktail (Thermo Fisher) and incubated on ice for 30 min, followed by centrifugation at ≥15,000×g for 15 min at 4° C. The supernatant was collected for protein quantification. The total protein concentration was quantified by performing a Bradford protein assay (Bio-Rad), a total of 10 µg protein per sample was loaded into SDS-PAGE gel (Bio-Rad), proteins in the gel were transferred into Amersham Protran 0.45 µm NC Nitrocellulose Blotting membrane (GE Healthcare) after electrophoresis. Membranes were blocked with 2% BSA in TBST buffer for 1 h at room temperature, followed by the primary antibody incubation at 4° C. overnight. Anti-PRODH2 antibody was purchased from Atlas Antibodies (HPA051287) and anti-Vinculin was purchased from Abcam (ab129002) which was used as internal control. Antibody binding was detected using horseradish peroxidase-conjugated secondary antibody and ECL substrate (Bio-Rad).

Top candidate validation in kill assay (Examples 5-10): Candidate hits mouse Prodh2, Ccnblip1, Sreklip1, and Wdr37 were selected for further validation. All cDNAs were purchased from the Dharmacon, then cloned into a lentiviral overexpression vector (*lenti*-EF1a-Flag-WPRE vector).

```
pLY040_FLAG_rat Ccnblip1 (SEQ ID NO: 84,610):
GTCGACGGATCGGGAGATCTCCCGATCCCCTATGGTGCACTCTCAGTACAATC

TGCTCTGATGCCGCATAGTTAAGCCAGTATCTGCTCCCTGCTTGTGTGTTGGA

GGTCGCTGAGTAGTGCGCGAGCAAAATTTAAGCTACAACAAGGCAAGGCTTG

ACCGACAATTGCATGAAGAATCTGCTTAGGGTTAGGCGTTTTGCGCTGCTTCG

CGATGTACGGGCCAGATATACGCGTTGACATTGATTATTGACTAGTTATTAAT

AGTAATCAATTACGGGGTCATTAGTTCATAGCCCATATATGGAGTTCCGCGTT

ACATAACTTACGGTAAATGGCCCGCCTGGCTGACCGCCCAACGACCCCCGCC

CATTGACGTCAATAATGACGTATGTTCCCATAGTAACGCCAATAGGGACTTTC

CATTGACGTCAATGGGTGGAGTATTTACGGTAAACTGCCCACTTGGCAGTACA

TCAAGTGTATCATATGCCAAGTACGCCCCCTATTGACGTCAATGACGGTAAAT

GGCCCGCCTGGCATTATGCCCAGTACATGACCTTATGGGACTTTCCTACTTGG

CAGTACATCTACGTATTAGTCATCGCTATTACCATGGTGATGCGGTTTTGGCA

GTACATCAATGGGCGTGGATAGCGGTTTGACTCACGGGGATTTCCAAGTCTCC

ACCCCATTGACGTCAATGGGAGTTTGTTTTGGCACCAAAATCAACGGGACTTT

CCAAAATGTCGTAACAACTCCGCCCCATTGACGCAAATGGGCGGTAGGCGTG

TACGGTGGGAGGTCTATATAAGCAGCGCGTTTTGCCTGTACTGGGTCTCTCTG

GTTAGACCAGATCTGAGCCTGGGAGCTCTCTGGCTAACTAGGGAACCCACTG

CTTAAGCCTCAATAAAGCTTGCCTTGAGTGCTTCAAGTAGTGTGTGCCCGTCT

GTTGTGTGACTCTGGTAACTAGAGATCCCTCAGACCCTTTTAGTCAGTGTGGA

AAATCTCTAGCAGTGGCGCCCGAACAGGGACTTGAAAGCGAAAGGGAAACC

AGAGGAGCTCTCTCGACGCAGGACTCGGCTTGCTGAAGCGCGCACGGCAAGA

GGCGAGGGGCGGCGACTGGTGAGTACGCCAAAAATTTTGACTAGCGGAGGCT

AGAAGGAGAGAGATGGGTGCGAGAGCGTCAGTATTAAGCGGGGAGAATTA

GATCGCGATGGGAAAAAATTCGGTTAAGGCCAGGGGGAAAGAAAAAATATA

AATTAAAACATATAGTATGGGCAAGCAGGGAGCTAGAACGATTCGCAGTTAA

TCCTGGCCTGTTAGAAACATCAGAAGGCTGTAGACAAATACTGGGACAGCTA

CAACCATCCCTTCAGACAGGATCAGAAGAACTTAGATCATTATATAATACAG

TAGCAACCCTCTATTGTGTGCATCAAAGGATAGAGATAAAAGACACCAAGGA

AGCTTTAGACAAGATAGAGGAAGAGCAAAACAAAAGTAAGACCACCGCACA

GCAAGCGGCCGCTGATCTTCAGACCTGGAGGAGGAGATATGAGGGACAATTG

GAGAAGTGAATTATATAAATATAAAGTAGTAAAAATTGAACCATTAGGAGTA

GCACCCACCAAGGCAAAGAGAAGAGTGGTGCAGAGAGAAAAAAGAGCAGTG

GGAATAGGAGCTTTGTTCCTTGGGTTCTTGGGAGCAGCAGGAAGCACTATGG

GCGCAGCGTCAATGACGCTGACGGTACAGGCCAGACAATTATTGTCTGGTAT

AGTGCAGCAGCAGAACAATTTGCTGAGGGCTATTGAGGCGCAACAGCATCTG
```

-continued

```
TTGCAACTCACAGTCTGGGGCATCAAGCAGCTCCAGGCAAGAATCCTGGCTG
TGGAAAGATACCTAAAGGATCAACAGCTCCTGGGGATTTGGGGTTGCTCTGG
AAAACTCATTTGCACCACTGCTGTGCCTTGGAATGCTAGTTGGAGTAATAAAT
CTCTGGAACAGATTTGGAATCACACGACCTGGATGGAGTGGGACAGAGAAAT
TAACAATTACACAAGCTTAATACACTCCTTAATTGAAGAATCGCAAACCAG
CAAGAAAAGAATGAACAAGAATTATTGGAATTAGATAAATGGGCAAGTTTGT
GGAATTGGTTTAACATAACAAATTGGCTGTGGTATATAAAATTATTCATAATG
ATAGTAGGAGGCTTGGTAGGTTTAAGAATAGTTTTTGCTGTACTTTCTATAGT
GAATAGAGTTAGGCAGGGATATTCACCATTATCGTTTCAGACCCACCTCCCAA
CCCCGAGGGGACCCGACAGGCCCGAAGGAATAGAAGAAGAAGGTGGAGAGA
GAGACAGAGACAGATCCATTCGATTAGTGAACGGATCGGCACTGCGTGCGCC
AATTCTGCAGACAAATGGCAGTATTCATCCACAATTTTAAAAGAAAAGGGGG
GATTGGGGGGTACAGTGCAGGGGAAAGAATAGTAGACATAATAGCAACAGA
CATACAAACTAAAGAATTACAAAAACAAATTACAAAAATTCAAAATTTTCGG
GTTTATTACAGGGACAGCAGAGATCCAGTTTGGTTAATTAGCTAGCTGCAAA
GATGGATAAAGTTTTAAACAGAGAGGAATCTTTGCAGCTAATGGACCTTCTA
GGTCTTGAAAGGAGTGGGAATTGGCTCCGGTGCCCGTCAGTGGGCAGAGCGC
ACATCGCCCACAGTCCCCGAGAAGTTGGGGGGAGGGGTCGGCAATTGAACCG
GTGCCTAGAGAAGGTGGCGCGGGGTAAACTGGGAAAGTGATGTCGTGTACTG
GCTCCGCCTTTTTCCCGAGGGTGGGGGAGAACCGTATATAAGTGCAGTAGTC
GCCGTGAACGTTCTTTTTCGCAACGGGTTTGCCGCCAGAACACAGGTAAGTGC
CGTGTGTGGTTCCCGCGGGCCTGGCCTCTTTACGGGTTATGGCCCTTGCGTGC
CTTGAATTACTTCCACCTGGCTGCAGTACGTGATTCTTGATCCCGAGCTTCGG
GTTGGAAGTGGGTGGGAGAGTTCGAGGCCTTGCGCTTAAGGAGCCCCTTCGC
CTCGTGCTTGAGTTGAGGCCTGGCCTGGGCGCTGGGGCCGCCGCGTGCGAAT
CTGGTGGCACCTTCGCGCCTGTCTCGCTGCTTTCGATAAGTCTCTAGCCATTTA
AAATTTTTGATGACCTGCTGCGACGCTTTTTTTCTGGCAAGATAGTCTTGTAA
ATGCGGGCCAAGATCTGCACACTGGTATTTCGGTTTTTGGGGCCGCGGGCGGC
GACGGGGCCCGTGCGTCCCAGCGCACATGTTCGGCGAGGCGGGGCCTGCGAG
CGCGGCCACCGAGAATCGGACGGGGGTAGTCTCAAGCTGGCCGGCCTGCTCT
GGTGCCTGGCCTCGCGCCGCCGTGTATCGCCCCGCCCTGGGCGGCAAGGCTG
GCCCGGTCGGCACCAGTTGCGTGAGCGGAAAGATGGCCGCTTCCCGGCCCTG
CTGCAGGGAGCTCAAAATGGAGGACGCGGCGCTCGGGAGAGCGGGCGGGTG
AGTCACCCACACAAAGGAAAAGGGCCTTTCCGTCCTCAGCCGTCGCTTCATGT
GACTCCACGGAGTACCGGGCGCCGTCCAGGCACCTCGATTAGTTCTCGAGCTT
TTGGAGTACGTCGTCTTTAGGTTGGGGGGAGGGGTTTTATGCGATGGAGTTTC
CCCACACTGAGTGGGTGGAGACTGAAGTTAGGCCAGCTTGGCACTTGATGTA
ATTCTCCTTGGAATTTGCCCTTTTTGAGTTTGGATCTTGGTTCATTCTCAAGCC
TCAGACAGTGGTTCAAAGTTTTTTTCTTCCATTTCAGGTGTCGTGACGTACGG
CCACCATGGATTACAAAGACGATGACGATAAGATGTCTTTGTGTGAAGACAT
GTTGCTGTGCAATTATCGGAAGTGTCGTATCAAGCTCTCTGGCTATGCTTGGG
```

-continued

```
TCACGGCCTGCTCTCACATCTTCTGTGATCAGCATGGCAGTGGTGAGTTCAGT

CATTCACCAGCAATCTGCCCTGCTTGCAACAGCACCCTTTCTGGAAAGCTAGA

CATTGTCCGGACAGAGCTCAGTCCGTCAGAGGAGTACAAAGCTATGGTATTG

GCAGGGCTTCGACCCGAGGTTGTTTTGGACATTAGCTCCCGAGCATTGGCCTT

CTGGACGTACCAGGTGCACCAGGAACGTCTCTATCAAGAATACAATTTCAGC

AAGGCTGAGAACCACTTAAAACAGATGGAGAAGATATACACGCAGCAAATA

CAGAGCAAGGACGTAGAATTGACCTCTATGAAAGGGGAGGTTACCTCCATGA

AGAAAGTTCTGGAGGAATACAAGAAGAAGTTTAGTGATATCTCTGAGAAACT

GATGGAGCGCAACCGCCAATACCAAAAGCTCCAAGGCCTTTATGATAGCCTC

AGGCTAAGGAATATCACTATCGCTAGCCAGGAGGGCTCCCTGGAACCAGCTA

TGATCCCACAGTCTGGAGTCTTTGGCTTCCCATCAGGGAATAGCTCAAAGTTT

TCTTTGGACCATACACCAGCTGGAAATCAAGGTGGTGGAGATGAAGATGTTC

AGTTCAGACCATTTTTTGTGTGTTCTCCCACAGCACCTGAACCTGTTAACAAC

TTCTTTAGTTTTGCGTCTCAAAGCCATGAAGCAGAGCAGCAAGTCTGCAGCAG

GGCCTTTAAAGCAAAAAGAATTTAGGAATTCGATATCAAGCTTATCGATAAT

CAACCTCTGGATTACAAAATTTGTGAAAGATTGACTGGTATTCTTAACTATGT

TGCTCCTTTTACGCTATGTGGATACGCTGCTTTAATGCCTTTGTATCATGCTAT

TGCTTCCCGTATGGCTTTCATTTTCTCCTCCTTGTATAAATCCTGGTTGCTGTCT

CTTTATGAGGAGTTGTGGCCCGTTGTCAGGCAACGTGGCGTGGTGTGCACTGT

GTTTGCTGACGCAACCCCCACTGGTTGGGGCATTGCCACCACCTGTCAGCTCC

TTTCCGGGACTTTCGCTTTCCCCCTCCCTATTGCCACGGCGGAACTCATCGCC

GCCTGCCTTGCCCGCTGCTGGACAGGGGCTCGGCTGTTGGGCACTGACAATTC

CGTGGTGTTGTCGGGGAAATCATCGTCCTTTCCTTGGCTGCTCGCCTGTGTTGC

CACCTGGATTCTGCGCGGGACGTCCTTCTGCTACGTCCCTTCGGCCCTCAATC

CAGCGGACCTTCCTTCCCGCGGCCTGCTGCCGGCTCTGCGGCCTCTTCCGCGT

CTTCGCCTTCGCCCTCAGACGAGTCGGATCTCCCTTTGGGCCGCCTCCCCGCA

TCGATACCGTCGACCTCGAGACCTAGAAAAACATGGAGCAATCACAAGTAGC

AATACAGCAGCTACCAATGCTGATTGTGCCTGGCTAGAAGCACAAGAGGAGG

AGGAGGTGGGTTTTCCAGTCACACCTCAGGTACCTTTAAGACCAATGACTTAC

AAGGCAGCTGTAGATCTTAGCCACTTTTTAAAAGAAAAGGGGGGACTGGAAG

GGCTAATTCACTCCCAACGAAGACAAGATATCCTTGATCTGTGGATCTACCAC

ACACAAGGCTACTTCCCTGATTGGCAGAACTACACACCAGGGCCAGGGATCA

GATATCCACTGACCTTTGGATGGTGCTACAAGCTAGTACCAGTTGAGCAAGA

GAAGGTAGAAGAAGCCAATGAAGGAGAGAACACCCGCTTGTTACACCCTGTG

AGCCTGCATGGGATGGATGACCCGGAGAGAGAAGTATTAGAGTGGAGGTTTG

ACAGCCGCCTAGCATTTCATCACATGGCCCGAGAGCTGCATCCGGACTGTACT

GGGTCTCTCTGGTTAGACCAGATCTGAGCCTGGGAGCTCTCTGGCTAACTAGG

GAACCCACTGCTTAAGCCTCAATAAAGCTTGCCTTGAGTGCTTCAAGTAGTGT

GTGCCCGTCTGTTGTGTGACTCTGGTAACTAGAGATCCCTCAGACCCTTTTAG

TCAGTGTGGAAAATCTCTAGCAGGGCCCGTTTAAACCCGCTGATCAGCCTCGA
```

```
CTGTGCCTTCTAGTTGCCAGCCATCTGTTGTTTGCCCCTCCCCCGTGCCTTCCT

TGACCCTGGAAGGTGCCACTCCCACTGTCCTTTCCTAATAAAATGAGGAAATT

GCATCGCATTGTCTGAGTAGGTGTCATTCTATTCTGGGGGGTGGGGTGGGGCA

GGACAGCAAGGGGGAGGATTGGGAAGACAATAGCAGGCATGCTGGGGATGC

GGTGGGCTCTATGGCTTCTGAGGCGGAAAGAACCAGCTGGGGCTCTAGGGGG

TATCCCCACGCGCCCTGTAGCGGCGCATTAAGCGCGGCGGGTGTGGTGGTTA

CGCGCAGCGTGACCGCTACACTTGCCAGCGCCCTAGCGCCCGCTCCTTTCGCT

TTCTTCCCTTCCTTTCTCGCCACGTTCGCCGGCTTTCCCCGTCAAGCTCTAAAT

CGGGGGCTCCCTTTAGGGTTCCGATTTAGTGCTTTACGGCACCTCGACCCCAA

AAAACTTGATTAGGGTGATGGTTCACGTAGTGGGCCATCGCCCTGATAGACG

GTTTTTCGCCCTTTGACGTTGGAGTCCACGTTCTTTAATAGTGGACTCTTGTTC

CAAACTGGAACAACACTCAACCCTATCTCGGTCTATTCTTTTGATTTATAAGG

GATTTTGCCGATTTCGGCCTATTGGTTAAAAAATGAGCTGATTTAACAAAAAT

TTAACGCGAATTAATTCTGTGGAATGTGTGTCAGTTAGGGTGTGGAAAGTCCC

CAGGCTCCCCAGCAGGCAGAAGTATGCAAAGCATGCATCTCAATTAGTCAGC

AACCAGGTGTGGAAAGTCCCCAGGCTCCCCAGCAGGCAGAAGTATGCAAAGC

ATGCATCTCAATTAGTCAGCAACCATAGTCCCGCCCCTAACTCCGCCCATCCC

GCCCCTAACTCCGCCCAGTTCCGCCCATTCTCCGCCCCATGGCTGACTAATTT

TTTTTATTTATGCAGAGGCCGAGGCCGCCTCTGCCTCTGAGCTATTCCAGAAG

TAGTGAGGAGGCTTTTTTGGAGGCCTAGGCTTTTGCAAAAAGCTCCCGGGAG

CTTGTATATCCATTTTCGGATCTGATCAGCACGTGTTGACAATTAATCATCGG

CATAGTATATCGGCATAGTATAATACGACAAGGTGAGGAACTAAACCATGGC

CAAGTTGACCAGTGCCGTTCCGGTGCTCACCGCGCGCGACGTCGCCGGAGCG

GTCGAGTTCTGGACCGACCGGCTCGGGTTCTCCCGGGACTTCGTGGAGGACG

ACTTCGCCGGTGTGGTCCGGGACGACGTGACCCTGTTCATCAGCGCGGTCCAG

GACCAGGTGGTGCCGGACAACACCCTGGCCTGGGTGTGGGTGCGCGGCCTGG

ACGAGCTGTACGCCGAGTGGTCGGAGGTCGTGTCCACGAACTTCCGGGACGC

CTCCGGGCCGGCCATGACCGAGATCGGCGAGCAGCCGTGGGGGGGGAGTTC

GCCCTGCGCGACCCGGCCGGCAACTGCGTGCACTTCGTGGCCGAGGAGCAGG

ACTGACACGTGCTACGAGATTTCGATTCCACCGCCGCCTTCTATGAAAGGTTG

GGCTTCGGAATCGTTTTCCGGGACGCCGGCTGGATGATCCTCCAGCGCGGGG

ATCTCATGCTGGAGTTCTTCGCCCACCCCAACTTGTTTATTGCAGCTTATAATG

GTTACAAATAAAGCAATAGCATCACAAATTTCACAAATAAAGCATTTTTTCA

CTGCATTCTAGTTGTGGTTTGTCCAAACTCATCAATGTATCTTATCATGTCTGT

ATACCGTCGACCTCTAGCTAGAGCTTGGCGTAATCATGGTCATAGCTGTTTCC

TGTGTGAAATTGTTATCCGCTCACAATTCCACACAACATACGAGCCGGAAGC

ATAAAGTGTAAAGCCTGGGGTGCCTAATGAGTGAGCTAACTCACATTAATTG

CGTTGCGCTCACTGCCCGCTTTCCAGTCGGGAAACCTGTCGTGCCAGCTGCAT

TAATGAATCGGCCAACGCGCGGGGAGAGGCGGTTTGCGTATTGGGCGCTCTT

CCGCTTCCTCGCTCACTGACTCGCTGCGCTCGGTCGTTCGGCTGCGGCGAGCG

GTATCAGCTCACTCAAAGGCGGTAATACGGTTATCCACAGAATCAGGGGATA
```

-continued

```
ACGCAGGAAAGAACATGTGAGCAAAAGGCCAGCAAAAGGCCAGGAACCGTA

AAAAGGCCGCGTTGCTGGCGTTTTTCCATAGGCTCCGCCCCCCTGACGAGCAT

CACAAAAATCGACGCTCAAGTCAGAGGTGGCGAAACCCGACAGGACTATAA

AGATACCAGGCGTTTCCCCCTGGAAGCTCCCTCGTGCGCTCTCCTGTTCCGAC

CCTGCCGCTTACCGGATACCTGTCCGCCTTTCTCCCTTCGGGAAGCGTGGCGC

TTTCTCATAGCTCACGCTGTAGGTATCTCAGTTCGGTGTAGGTCGTTCGCTCCA

AGCTGGGCTGTGTGCACGAACCCCCCGTTCAGCCCGACCGCTGCGCCTTATCC

GGTAACTATCGTCTTGAGTCCAACCCGGTAAGACACGACTTATCGCCACTGGC

AGCAGCCACTGGTAACAGGATTAGCAGAGCGAGGTATGTAGGCGGTGCTACA

GAGTTCTTGAAGTGGTGGCCTAACTACGGCTACACTAGAAGAACAGTATTTG

GTATCTGCGCTCTGCTGAAGCCAGTTACCTTCGGAAAAAGAGTTGGTAGCTCT

TGATCCGGCAAACAAACCACCGCTGGTAGCGGTGGTTTTTTTGTTTGCAAGCA

GCAGATTACGCGCAGAAAAAAAGGATCTCAAGAAGATCCTTTGATCTTTTCT

ACGGGGTCTGACGCTCAGTGGAACGAAAACTCACGTTAAGGGATTTTGGTCA

TGAGATTATCAAAAAGGATCTTCACCTAGATCCTTTTAAATTAAAAATGAAGT

TTTAAATCAATCTAAAGTATATATGAGTAAACTTGGTCTGACAGTTACCAATG

CTTAATCAGTGAGGCACCTATCTCAGCGATCTGTCTATTTCGTTCATCCATAGT

TGCCTGACTCCCCGTCGTGTAGATAACTACGATACGGGAGGGCTTACCATCTG

GCCCCAGTGCTGCAATGATACCGCGAGACCCACGCTCACCGGCTCCAGATTT

ATCAGCAATAAACCAGCCAGCCGGAAGGGCCGAGCGCAGAAGTGGTCCTGC

AACTTTATCCGCCTCCATCCAGTCTATTAATTGTTGCCGGGAAGCTAGAGTAA

GTAGTTCGCCAGTTAATAGTTTGCGCAACGTTGTTGCCATTGCTACAGGCATC

GTGGTGTCACGCTCGTCGTTTGGTATGGCTTCATTCAGCTCCGGTTCCCAACG

ATCAAGGCGAGTTACATGATCCCCCATGTTGTGCAAAAAAGCGGTTAGCTCCT

TCGGTCCTCCGATCGTTGTCAGAAGTAAGTTGGCCGCAGTGTTATCACTCATG

GTTATGGCAGCACTGCATAATTCTCTTACTGTCATGCCATCCGTAAGATGCTT

TTCTGTGACTGGTGAGTACTCAACCAAGTCATTCTGAGAATAGTGTATGCGGC

GACCGAGTTGCTCTTGCCCGGCGTCAATACGGGATAATACCGCGCCACATAG

CAGAACTTTAAAAGTGCTCATCATTGGAAAACGTTCTTCGGGGCGAAAACTCT

CAAGGATCTTACCGCTGTTGAGATCCAGTTCGATGTAACCCACTCGTGCACCC

AACTGATCTTCAGCATCTTTTACTTTCACCAGCGTTTCTGGGTGAGCAAAAAC

AGGAAGGCAAAATGCCGCAAAAAAGGGAATAAGGGCGACACGGAAATGTTG

AATACTCATACTCTTCCTTTTTCAATATTATTGAAGCATTTATCAGGGTTATTG

TCTCATGAGCGGATACATATTTGAATGTATTTAGAAAAATAAACAAATAGGG

GTTCCGCGCACATTTCCCCGAAAAGTGCCACCTGAC pLY040_FLAG_mWdr37 (SEQ ID NO: 84,611):
GTCGACGGATCGGGAGATCTCCCGATCCCCTATGGTGCACTCTCAGTACAATC

TGCTCTGATGCCGCATAGTTAAGCCAGTATCTGCTCCCTGCTTGTGTGTTGGA

GGTCGCTGAGTAGTGCGCGAGCAAAATTTAAGCTACAACAAGGCAAGGCTTG

ACCGACAATTGCATGAAGAATCTGCTTAGGGTTAGGCGTTTTGCGCTGCTTCG

CGATGTACGGGCCAGATATACGCGTTGACATTGATTATTGACTAGTTATTAAT
```

```
AGTAATCAATTACGGGGTCATTAGTTCATAGCCCATATATGGAGTTCCGCGTT
ACATAACTTACGGTAAATGGCCCGCCTGGCTGACCGCCCAACGACCCCCGCC
CATTGACGTCAATAATGACGTATGTTCCCATAGTAACGCCAATAGGGACTTTC
CATTGACGTCAATGGGTGGAGTATTTACGGTAAACTGCCCACTTGGCAGTACA
TCAAGTGTATCATATGCCAAGTACGCCCCCTATTGACGTCAATGACGGTAAAT
GGCCCGCCTGGCATTATGCCCAGTACATGACCTTATGGGACTTTCCTACTTGG
CAGTACATCTACGTATTAGTCATCGCTATTACCATGGTGATGCGGTTTTGGCA
GTACATCAATGGGCGTGGATAGCGGTTTGACTCACGGGGATTTCCAAGTCTCC
ACCCCATTGACGTCAATGGGAGTTTGTTTTGGCACCAAAATCAACGGGACTTT
CCAAAATGTCGTAACAACTCCGCCCCATTGACGCAAATGGGCGGTAGGCGTG
TACGGTGGGAGGTCTATATAAGCAGCGCGTTTTGCCTGTACTGGGTCTCTCTG
GTTAGACCAGATCTGAGCCTGGGAGCTCTCTGGCTAACTAGGGAACCCACTG
CTTAAGCCTCAATAAAGCTTGCCTTGAGTGCTTCAAGTAGTGTGTGCCCGTCT
GTTGTGTGACTCTGGTAACTAGAGATCCCTCAGACCCTTTTAGTCAGTGTGGA
AAATCTCTAGCAGTGGCGCCCGAACAGGGACTTGAAAGCGAAAGGGAAACC
AGAGGAGCTCTCTCGACGCAGGACTCGGCTTGCTGAAGCGCGCACGGCAAGA
GGCGAGGGGCGGCGACTGGTGAGTACGCCAAAAATTTTGACTAGCGGAGGCT
AGAAGGAGAGAGATGGGTGCGAGAGCGTCAGTATTAAGCGGGGGAGAATTA
GATCGCGATGGGAAAAAATTCGGTTAAGGCCAGGGGGAAAGAAAAAATATA
AATTAAAACATATAGTATGGGCAAGCAGGGAGCTAGAACGATTCGCAGTTAA
TCCTGGCCTGTTAGAAACATCAGAAGGCTGTAGACAAATACTGGGACAGCTA
CAACCATCCCTTCAGACAGGATCAGAAGAACTTAGATCATTATATAATACAG
TAGCAACCCTCTATTGTGTGCATCAAAGGATAGAGATAAAAGACACCAAGGA
AGCTTTAGACAAGATAGAGGAAGAGCAAAACAAAAGTAAGACCACCGCACA
GCAAGCGGCCGCTGATCTTCAGACCTGGAGGAGGAGATATGAGGGACAATTG
GAGAAGTGAATTATATAAATATAAAGTAGTAAAAATTGAACCATTAGGAGTA
GCACCCACCAAGGCAAAGAAGAAGAGTGGTGCAGAGAGAAAAAAGAGCAGTG
GGAATAGGAGCTTTGTTCCTTGGGTTCTTGGGAGCAGCAGGAAGCACTATGG
GCGCAGCGTCAATGACGCTGACGGTACAGGCCAGACAATTATTGTCTGGTAT
AGTGCAGCAGCAGAACAATTTGCTGAGGGCTATTGAGGCGCAACAGCATCTG
TTGCAACTCACAGTCTGGGGCATCAAGCAGCTCCAGGCAAGAATCCTGGCTG
TGGAAAGATACCTAAAGGATCAACAGCTCCTGGGGATTTGGGGTTGCTCTGG
AAAACTCATTTGCACCACTGCTGTGCCTTGGAATGCTAGTTGGAGTAATAAAT
CTCTGGAACAGATTTGGAATCACACGACCTGGATGGAGTGGGACAGAGAAAT
TAACAATTACACAAGCTTAATACACTCCTTAATTGAAGAATCGCAAAACCAG
CAAGAAAAGAATGAACAAGAATTATTGGAATTAGATAAATGGGCAAGTTTGT
GGAATTGGTTTAACATAACAAATTGGCTGTGGTATATAAAATTATTCATAATG
ATAGTAGGAGGCTTGGTAGGTTTAAGAATAGTTTTTGCTGTACTTTCTATAGT
GAATAGAGTTAGGCAGGGATATTCACCATTATCGTTTCAGACCCACCTCCCAA
CCCCGAGGGGACCCGACAGGCCCGAAGGAATAGAAGAAGAAGGTGGAGAGA
```

-continued
```
GAGACAGAGACAGATCCATTCGATTAGTGAACGGATCGGCACTGCGTGCGCC
AATTCTGCAGACAAATGGCAGTATTCATCCACAATTTTAAAAGAAAAGGGGG
GATTGGGGGGTACAGTGCAGGGGAAAGAATAGTAGACATAATAGCAACAGA
CATACAAACTAAAGAATTACAAAAACAAATTACAAAAATTCAAAATTTTCGG
GTTTATTACAGGGACAGCAGAGATCCAGTTTGGTTAATTAGCTAGCTGCAAA
GATGGATAAAGTTTTAAACAGAGAGGAATCTTTGCAGCTAATGGACCTTCTA
GGTCTTGAAAGGAGTGGGAATTGGCTCCGGTGCCCGTCAGTGGGCAGAGCGC
ACATCGCCCACAGTCCCCGAGAAGTTGGGGGGAGGGGTCGGCAATTGAACCG
GTGCCTAGAGAAGGTGGCGCGGGGTAAACTGGGAAAGTGATGTCGTGTACTG
GCTCCGCCTTTTTCCCGAGGGTGGGGGAGAACCGTATATAAGTGCAGTAGTC
GCCGTGAACGTTCTTTTTCGCAACGGGTTTGCCGCCAGAACACAGGTAAGTGC
CGTGTGTGGTTCCCGCGGGCCTGGCCTCTTTACGGGTTATGGCCCTTGCGTGC
CTTGAATTACTTCCACCTGGCTGCAGTACGTGATTCTTGATCCCGAGCTTCGG
GTTGGAAGTGGGTGGGAGAGTTCGAGGCCTTGCGCTTAAGGAGCCCCTTCGC
CTCGTGCTTGAGTTGAGGCCTGGCCTGGGCGCTGGGGCCGCCGCGTGCGAAT
CTGGTGGCACCTTCGCGCCTGTCTCGCTGCTTTCGATAAGTCTCTAGCCATTTA
AAATTTTTGATGACCTGCTGCGACGCTTTTTTTCTGGCAAGATAGTCTTGTAA
ATGCGGGCCAAGATCTGCACACTGGTATTTCGGTTTTTGGGGCCGCGGGCGGC
GACGGGCCCGTGCGTCCCAGCGCACATGTTCGGCGAGGCGGGGCCTGCGAG
CGCGGCCACCGAGAATCGGACGGGGGTAGTCTCAAGCTGGCCGGCCTGCTCT
GGTGCCTGGCCTCGCGCCGCCGTGTATCGCCCCGCCCTGGGCGGCAAGGCTG
GCCCGGTCGGCACCAGTTGCGTGAGCGGAAAGATGGCCGCTTCCCGGCCCTG
CTGCAGGGAGCTCAAAATGGAGGACGCGGCGCTCGGGAGAGCGGGCGGGTG
AGTCACCCACACAAAGGAAAAGGGCCTTTCCGTCCTCAGCCGTCGCTTCATGT
GACTCCACGGAGTACCGGGCGCCGTCCAGGCACCTCGATTAGTTCTCGAGCTT
TTGGAGTACGTCGTCTTTAGGTTGGGGGGAGGGGTTTTATGCGATGGAGTTTC
CCCACACTGAGTGGGTGGAGACTGAAGTTAGGCCAGCTTGGCACTTGATGTA
ATTCTCCTTGGAATTTGCCCTTTTTGAGTTTGGATCTTGGTTCATTCTCAAGCC
TCAGACAGTGGTTCAAAGTTTTTTTCTTCCATTTCAGGTGTCGTGACGTACGG
CCACCATGGATTACAAAGACGATGACGATAAGATGCCCACAGAAAGCGGAA
GTTGTTCAACTGCTCGCCAAGCAAAACAAAAGCGCAAGTCTCATAGCCTTTCT
ATACGAAGAACTAACAGCTCAGAACAAGAGAGGACTGGACTGCCAAGAGAA
ATGTTAGAAGGACAAGATTCTAAACTGCCGTCCTCAGTTCGCAGTACACTGCT
GGAATTGTTTGGCCAGATAGAAAGAGAATTTGAAAATCTTTACATCGAAAAC
TTAGAATTGCGCAGAGAAATTGATACTCTTAATGAACGTTTAGCTGGTGAAG
GACAAGCGATCGATGGGGCAGAATTGAGTAAGGGCCAACTCAAAACAAAAG
CCAGTCACAGTACCAGTCAGCTTTCTCAGAAGCTTAAGACCACCTACAAGGCT
TCCACCAGCAAGATTGTTTCCAGCTTTAAGATTACCACATCCAGGGCCATCTG
TCAGCTTGTGAAGGAGTATATTGGCCACAGGGATGGCATCTGGGATGTCAGT
GTTACAAGGACACAGCCTATTGTTCTTGGGACAGCATCTGCTGATCACACGGC
TTTGTTGTGGAGCATAGAGACTGGCAAATGTCTTGTCAAGTACGCTGGCCATG
```

-continued

```
TGGGCTCAGTAAATTCTATAAAATTCCATCCCTCAGAGCAGTTGGCTCTTACT
GCTTCTGGAGATCAGACTGCTCATATCTGGAGATACGTGGTACAGCTTCCAAC
ACCTCAGCCTGTTGCCGACACTAGTCAACAAATTTCTGGTGAAGATGAAATA
GAATGCTCTGATAAAGATGAGCCTGACATTGATGGAGACGTGTCCAGTGACT
GTCCTACTGTCCGAGTCCCACTGACATCTCTCAAAAGCCACCAGGGTGTGGTT
ATTGCTGCTGACTGGCTGGTTGGTGGGAAACAAGTGGTGACAGCCTCATGGG
ACAGAACTGCCAACCTGTATGATGTGGAGACATCTGAACTCGTTCATTCCCTG
ACAGGGCATGACCAGGAGTTAACACATTGTTGCACTCACCCCACCCAGCGGC
TCGTGGTGACCTCCTCCCGTGACACAACTTTCCGTCTCTGGGATTTCAGGGAC
CCTTCCATCCACTCCGTGAATGTTTTCCAAGGACACACGGACACTGTGACCTC
TGCTGTGTTCACTGTGGGAGACAACGTCGTTTCAGGCAGTGATGACCGCACA
GTAAAAGTCTGGGATTTAAAAAATATGAGATCTCCAATTGCGACAATTCGTA
CAGACTCTGCCATTAATAGGATCAATGTGTGTGTTGGCCAAAAAATCATAGCC
CTCCCCCATGACAACCGGCAAGTGCGATTGTTTGATATGTCGGGAGTGAGGCT
AGCACGGCTTCCCCGGAGCAGCCGACAGGGTCACAGACGAATGGTGTGCTGC
TCAGCGTGGAGTGAAGACCACCCCATATGCAATCTATTTACCTGTGGGTTCGA
TAGGCAAGCTATTGGGTGGAACATCAATATTCCTGCACTGTTACAAGAAAAA
TAAGAATTCGATATCAAGCTTATCGATAATCAACCTCTGGATTACAAAATTTG
TGAAAGATTGACTGGTATTCTTAACTATGTTGCTCCTTTTACGCTATGTGGATA
CGCTGCTTTAATGCCTTTGTATCATGCTATTGCTTCCCGTATGGCTTTCATTTT
CTCCTCCTTGTATAAATCCTGGTTGCTGTCTCTTTATGAGGAGTTGTGGCCCGT
TGTCAGGCAACGTGGCGTGGTGTGCACTGTGTTTGCTGACGCAACCCCCACTG
GTTGGGGCATTGCCACCACCTGTCAGCTCCTTTCCGGGACTTTCGCTTTCCCC
TCCCTATTGCCACGGCGGAACTCATCGCCGCCTGCCTTGCCCGCTGCTGGACA
GGGGCTCGGCTGTTGGGCACTGACAATTCCGTGGTGTTGTCGGGGAAATCATC
GTCCTTTCCTTGGCTGCTCGCCTGTGTTGCCACCTGGATTCTGCGCGGGACGTC
CTTCTGCTACGTCCCTTCGGCCCTCAATCCAGCGGACCTTCCTTCCCGCGGCCT
GCTGCCGGCTCTGCGGCCTCTTCCGCGTCTTCGCCTTCGCCCTCAGACGAGTC
GGATCTCCCTTTGGGCCGCCTCCCCGCATCGATACCGTCGACCTCGAGACCTA
GAAAAACATGGAGCAATCACAAGTAGCAATACAGCAGCTACCAATGCTGATT
GTGCCTGGCTAGAAGCACAAGAGGAGGAGGAGGTGGGTTTTCCAGTCACACC
TCAGGTACCTTTAAGACCAATGACTTACAAGGCAGCTGTAGATCTTAGCCACT
TTTTAAAAGAAAAGGGGGGACTGGAAGGGCTAATTCACTCCCAACGAAGACA
AGATATCCTTGATCTGTGGATCTACCACACACAAGGCTACTTCCCTGATTGGC
AGAACTACACACCAGGGCCAGGGATCAGATATCCACTGACCTTTGGATGGTG
CTACAAGCTAGTACCAGTTGAGCAAGAGAAGGTAGAAGAAGCCAATGAAGG
AGAGAACACCCGCTTGTTACACCCTGTGAGCCTGCATGGGATGGATGACCCG
GAGAGAGAAGTATTAGAGTGGAGGTTTGACAGCCGCCTAGCATTTCATCACA
TGGCCCGAGAGCTGCATCCGGACTGTACTGGGTCTCTCTGGTTAGACCAGATC
TGAGCCTGGGAGCTCTCTGGCTAACTAGGGAACCCACTGCTTAAGCCTCAATA
```

```
-continued
AAGCTTGCCTTGAGTGCTTCAAGTAGTGTGTGCCCGTCTGTTGTGTGACTCTG

GTAACTAGAGATCCCTCAGACCCTTTTAGTCAGTGTGGAAAATCTCTAGCAGG

GCCCGTTTAAACCCGCTGATCAGCCTCGACTGTGCCTTCTAGTTGCCAGCCAT

CTGTTGTTTGCCCCTCCCCCGTGCCTTCCTTGACCCTGGAAGGTGCCACTCCCA

CTGTCCTTTCCTAATAAAATGAGGAAATTGCATCGCATTGTCTGAGTAGGTGT

CATTCTATTCTGGGGGGTGGGGTGGGGCAGGACAGCAAGGGGGAGGATTGGG

AAGACAATAGCAGGCATGCTGGGGATGCGGTGGGCTCTATGGCTTCTGAGGC

GGAAAGAACCAGCTGGGGCTCTAGGGGGTATCCCCACGCGCCCTGTAGCGGC

GCATTAAGCGCGGCGGGTGTGGTGGTTACGCGCAGCGTGACCGCTACACTTG

CCAGCGCCCTAGCGCCCGCTCCTTTCGCTTTCTTCCCTTCCTTTCTCGCCACGT

TCGCCGGCTTTCCCCGTCAAGCTCTAAATCGGGGGCTCCCTTTAGGGTTCCGA

TTTAGTGCTTTACGGCACCTCGACCCCAAAAAACTTGATTAGGGTGATGGTTC

ACGTAGTGGGCCATCGCCCTGATAGACGGTTTTTCGCCCTTTGACGTTGGAGT

CCACGTTCTTTAATAGTGGACTCTTGTTCCAAACTGGAACAACACTCAACCCT

ATCTCGGTCTATTCTTTTGATTTATAAGGGATTTTGCCGATTTCGGCCTATTGG

TTAAAAAATGAGCTGATTTAACAAAAATTTAACGCGAATTAATTCTGTGGAAT

GTGTGTCAGTTAGGGTGTGGAAAGTCCCCAGGCTCCCCAGCAGGCAGAAGTA

TGCAAAGCATGCATCTCAATTAGTCAGCAACCAGGTGTGGAAAGTCCCCAGG

CTCCCCAGCAGGCAGAAGTATGCAAAGCATGCATCTCAATTAGTCAGCAACC

ATAGTCCCGCCCCTAACTCCGCCCATCCCGCCCCTAACTCCGCCCAGTTCCGC

CCATTCTCCGCCCCATGGCTGACTAATTTTTTTTATTTATGCAGAGGCCGAGG

CCGCCTCTGCCTCTGAGCTATTCCAGAAGTAGTGAGGAGGCTTTTTTGGAGGC

CTAGGCTTTTGCAAAAAGCTCCCGGGAGCTTGTATATCCATTTTCGGATCTGA

TCAGCACGTGTTGACAATTAATCATCGGCATAGTATATCGGCATAGTATAATA

CGACAAGGTGAGGAACTAAACCATGGCCAAGTTGACCAGTGCCGTTCCGGTG

CTCACCGCGCGCGACGTCGCCGGAGCGGTCGAGTTCTGGACCGACCGGCTCG

GGTTCTCCCGGGACTTCGTGGAGGACGACTTCGCCGGTGTGGTCCGGGACGA

CGTGACCCTGTTCATCAGCGCGGTCCAGGACCAGGTGGTGCCGGACAACACC

CTGGCCTGGGTGTGGGTGCGCGGCCTGGACGAGCTGTACGCCGAGTGGTCGG

AGGTCGTGTCCACGAACTTCCGGGACGCCTCCGGGCCGGCCATGACCGAGAT

CGGCGAGCAGCCGTGGGGCGGGAGTTCGCCCTGCGCGACCCGGCCGGCAAC

TGCGTGCACTTCGTGGCCGAGGAGCAGGACTGACACGTGCTACGAGATTTCG

ATTCCACCGCCGCCTTCTATGAAAGGTTGGGCTTCGGAATCGTTTTCCGGGAC

GCCGGCTGGATGATCCTCCAGCGCGGGGATCTCATGCTGGAGTTCTTCGCCCA

CCCCAACTTGTTTATTGCAGCTTATAATGGTTACAAATAAAGCAATAGCATCA

CAAATTTCACAAATAAAGCATTTTTTTCACTGCATTCTAGTTGTGGTTTGTCCA

AACTCATCAATGTATCTTATCATGTCTGTATACCGTCGACCTCTAGCTAGAGC

TTGGCGTAATCATGGTCATAGCTGTTTCCTGTGTGAAATTGTTATCCGCTCAC

AATTCCACACAACATACGAGCCGGAAGCATAAAGTGTAAAGCCTGGGGTGCC

TAATGAGTGAGCTAACTCACATTAATTGCGTTGCGCTCACTGCCCGCTTTCCA

GTCGGGAAACCTGTCGTGCCAGCTGCATTAATGAATCGGCCAACGCGCGGGG
```

```
AGAGGCGGTTTGCGTATTGGGCGCTCTTCCGCTTCCTCGCTCACTGACTCGCT

GCGCTCGGTCGTTCGGCTGCGGCGAGCGGTATCAGCTCACTCAAAGGCGGTA

ATACGGTTATCCACAGAATCAGGGGATAACGCAGGAAAGAACATGTGAGCA

AAAGGCCAGCAAAAGGCCAGGAACCGTAAAAAGGCCGCGTTGCTGGCGTTTT

TCCATAGGCTCCGCCCCCTGACGAGCATCACAAAAATCGACGCTCAAGTCA

GAGGTGGCGAAACCCGACAGGACTATAAAGATACCAGGCGTTTCCCCCTGGA

AGCTCCCTCGTGCGCTCTCCTGTTCCGACCCTGCCGCTTACCGGATACCTGTC

CGCCTTTCTCCCTTCGGGAAGCGTGGCGCTTTCTCATAGCTCACGCTGTAGGT

ATCTCAGTTCGGTGTAGGTCGTTCGCTCCAAGCTGGGCTGTGTGCACGAACCC

CCCGTTCAGCCCGACCGCTGCGCCTTATCCGGTAACTATCGTCTTGAGTCCAA

CCCGGTAAGACACGACTTATCGCCACTGGCAGCAGCCACTGGTAACAGGATT

AGCAGAGCGAGGTATGTAGGCGGTGCTACAGAGTTCTTGAAGTGGTGGCCTA

ACTACGGCTACACTAGAAGAACAGTATTTGGTATCTGCGCTCTGCTGAAGCCA

GTTACCTTCGGAAAAAGAGTTGGTAGCTCTTGATCCGGCAAACAAACCACCG

CTGGTAGCGGTGGTTTTTTTGTTTGCAAGCAGCAGATTACGCGCAGAAAAAA

AGGATCTCAAGAAGATCCTTTGATCTTTTCTACGGGGTCTGACGCTCAGTGGA

ACGAAAACTCACGTTAAGGGATTTTGGTCATGAGATTATCAAAAAGGATCTT

CACCTAGATCCTTTTAAATTAAAAATGAAGTTTTAAATCAATCTAAAGTATAT

ATGAGTAAACTTGGTCTGACAGTTACCAATGCTTAATCAGTGAGGCACCTATC

TCAGCGATCTGTCTATTTCGTTCATCCATAGTTGCCTGACTCCCCGTCGTGTAG

ATAACTACGATACGGGAGGGCTTACCATCTGGCCCCAGTGCTGCAATGATAC

CGCGAGACCCACGCTCACCGGCTCCAGATTTATCAGCAATAAACCAGCCAGC

CGGAAGGGCCGAGCGCAGAAGTGGTCCTGCAACTTTATCCGCCTCCATCCAG

TCTATTAATTGTTGCCGGGAAGCTAGAGTAAGTAGTTCGCCAGTTAATAGTTT

GCGCAACGTTGTTGCCATTGCTACAGGCATCGTGGTGTCACGCTCGTCGTTTG

GTATGGCTTCATTCAGCTCCGGTTCCCAACGATCAAGGCGAGTTACATGATCC

CCCATGTTGTGCAAAAAAGCGGTTAGCTCCTTCGGTCCTCCGATCGTTGTCAG

AAGTAAGTTGGCCGCAGTGTTATCACTCATGGTTATGGCAGCACTGCATAATT

CTCTTACTGTCATGCCATCCGTAAGATGCTTTTCTGTGACTGGTGAGTACTCA

ACCAAGTCATTCTGAGAATAGTGTATGCGGCGACCGAGTTGCTCTTGCCCGGC

GTCAATACGGGATAATACCGCGCCACATAGCAGAACTTTAAAAGTGCTCATC

ATTGGAAAACGTTCTTCGGGGCGAAAACTCTCAAGGATCTTACCGCTGTTGAG

ATCCAGTTCGATGTAACCCACTCGTGCACCCAACTGATCTTCAGCATCTTTTA

CTTTCACCAGCGTTTCTGGGTGAGCAAAAACAGGAAGGCAAAATGCCGCAAA

AAAGGGAATAAGGGCGACACGGAAATGTTGAATACTCATACTCTTCCTTTTTC

AATATTATTGAAGCATTTATCAGGGTTATTGTCTCATGAGCGGATACATATTT

GAATGTATTTAGAAAAATAAACAAATAGGGGTTCCGCGCACATTTCCCCGAA

AAGTGCCACCTGAC
``` pLY040_FLAG_mSreklip1 (SEQ ID NO: 84,612):
```
GTCGACGGATCGGGAGATCTCCCGATCCCCTATGGTGCACTCTCAGTACAATC

TGCTCTGATGCCGCATAGTTAAGCCAGTATCTGCTCCCTGCTTGTGTGTTGGA
```

```
GGTCGCTGAGTAGTGCGCGAGCAAAATTTAAGCTACAACAAGGCAAGGCTTG

ACCGACAATTGCATGAAGAATCTGCTTAGGGTTAGGCGTTTTGCGCTGCTTCG

CGATGTACGGGCCAGATATACGCGTTGACATTGATTATTGACTAGTTATTAAT

AGTAATCAATTACGGGGTCATTAGTTCATAGCCCATATATGGAGTTCCGCGTT

ACATAACTTACGGTAAATGGCCCGCCTGGCTGACCGCCCAACGACCCCCGCC

CATTGACGTCAATAATGACGTATGTTCCCATAGTAACGCCAATAGGGACTTTC

CATTGACGTCAATGGGTGGAGTATTTACGGTAAACTGCCCACTTGGCAGTACA

TCAAGTGTATCATATGCCAAGTACGCCCCCTATTGACGTCAATGACGGTAAAT

GGCCCGCCTGGCATTATGCCCAGTACATGACCTTATGGGACTTTCCTACTTGG

CAGTACATCTACGTATTAGTCATCGCTATTACCATGGTGATGCGGTTTTGGCA

GTACATCAATGGGCGTGGATAGCGGTTTGACTCACGGGGATTTCCAAGTCTCC

ACCCCATTGACGTCAATGGGAGTTTGTTTTGGCACCAAAATCAACGGGACTTT

CCAAAATGTCGTAACAACTCCGCCCCATTGACGCAAATGGGCGGTAGGCGTG

TACGGTGGGAGGTCTATATAAGCAGCGCGTTTTGCCTGTACTGGGTCTCTCTG

GTTAGACCAGATCTGAGCCTGGGAGCTCTCTGGCTAACTAGGGAACCCACTG

CTTAAGCCTCAATAAAGCTTGCCTTGAGTGCTTCAAGTAGTGTGTGCCCGTCT

GTTGTGTGACTCTGGTAACTAGAGATCCCTCAGACCCTTTTAGTCAGTGTGGA

AAATCTCTAGCAGTGGCGCCCGAACAGGGACTTGAAAGCGAAAGGGAAACC

AGAGGAGCTCTCTCGACGCAGGACTCGGCTTGCTGAAGCGCGCACGGCAAGA

GGCGAGGGGCGGCGACTGGTGAGTACGCCAAAAATTTTGACTAGCGGAGGCT

AGAAGGAGAGAGATGGGTGCGAGAGCGTCAGTATTAAGCGGGGAGAATTA

GATCGCGATGGGAAAAAATTCGGTTAAGGCCAGGGGGAAAGAAAAAATATA

AATTAAAACATATAGTATGGGCAAGCAGGGAGCTAGAACGATTCGCAGTTAA

TCCTGGCCTGTTAGAAACATCAGAAGGCTGTAGACAAATACTGGGACAGCTA

CAACCATCCCTTCAGACAGGATCAGAAGAACTTAGATCATTATATAATACAG

TAGCAACCCTCTATTGTGTGCATCAAAGGATAGAGATAAAAGACACCAAGGA

AGCTTTAGACAAGATAGAGGAAGAGCAAAACAAAAGTAAGACCACCGCACA

GCAAGCGGCCGCTGATCTTCAGACCTGGAGGAGGAGATATGAGGGACAATTG

GAGAAGTGAATTATATAAATATAAAGTAGTAAAAATTGAACCATTAGGAGTA

GCACCCACCAAGGCAAAGAGAAGAGTGGTGCAGAGAGAAAAAAGAGCAGTG

GGAATAGGAGCTTTGTTCCTTGGGTTCTTGGGAGCAGCAGGAAGCACTATGG

GCGCAGCGTCAATGACGCTGACGGTACAGGCCAGACAATTATTGTCTGGTAT

AGTGCAGCAGCAGAACAATTTGCTGAGGGCTATTGAGGCGCAACAGCATCTG

TTGCAACTCACAGTCTGGGGCATCAAGCAGCTCCAGGCAAGAATCCTGGCTG

TGGAAAGATACCTAAAGGATCAACAGCTCCTGGGGATTTGGGGTTGCTCTGG

AAAACTCATTTGCACCACTGCTGTGCCTTGGAATGCTAGTTGGAGTAATAAAT

CTCTGGAACAGATTTGGAATCACACGACCTGGATGGAGTGGGACAGAGAAAT

TAACAATTACACAAGCTTAATACACTCCTTAATTGAAGAATCGCAAAACCAG

CAAGAAAAGAATGAACAAGAATTATTGGAATTAGATAAATGGGCAAGTTTGT

GGAATTGGTTTAACATAACAAATTGGCTGTGGTATATAAAATTATTCATAATG
```

-continued
```
ATAGTAGGAGGCTTGGTAGGTTTAAGAATAGTTTTTGCTGTACTTTCTATAGT

GAATAGAGTTAGGCAGGGATATTCACCATTATCGTTTCAGACCCACCTCCCAA

CCCCGAGGGGACCCGACAGGCCCGAAGGAATAGAAGAAGAAGGTGGAGAGA

GAGACAGAGACAGATCCATTCGATTAGTGAACGGATCGGCACTGCGTGCGCC

AATTCTGCAGACAAATGGCAGTATTCATCCACAATTTTAAAAGAAAAGGGGG

GATTGGGGGTACAGTGCAGGGGAAAGAATAGTAGACATAATAGCAACAGA

CATACAAACTAAAGAATTACAAAAACAAATTACAAAAATTCAAAATTTTCGG

GTTTATTACAGGGACAGCAGAGATCCAGTTTGGTTAATTAGCTAGCTGCAAA

GATGGATAAAGTTTTAAACAGAGAGGAATCTTTGCAGCTAATGGACCTTCTA

GGTCTTGAAAGGAGTGGGAATTGGCTCCGGTGCCCGTCAGTGGGCAGAGCGC

ACATCGCCCACAGTCCCCGAGAAGTTGGGGGGAGGGGTCGGCAATTGAACCG

GTGCCTAGAGAAGGTGGCGCGGGGTAAACTGGGAAAGTGATGTCGTGTACTG

GCTCCGCCTTTTTCCCGAGGGTGGGGGAGAACCGTATATAAGTGCAGTAGTC

GCCGTGAACGTTCTTTTTCGCAACGGGTTTGCCGCCAGAACACAGGTAAGTGC

CGTGTGTGGTTCCCGCGGGCCTGGCCTCTTTACGGGTTATGGCCCTTGCGTGC

CTTGAATTACTTCCACCTGGCTGCAGTACGTGATTCTTGATCCCGAGCTTCGG

GTTGGAAGTGGGTGGGAGAGTTCGAGGCCTTGCGCTTAAGGAGCCCCTTCGC

CTCGTGCTTGAGTTGAGGCCTGGCCTGGGCGCTGGGGCCGCCGCGTGCGAAT

CTGGTGGCACCTTCGCGCCTGTCTCGCTGCTTTCGATAAGTCTCTAGCCATTTA

AAATTTTTGATGACCTGCTGCGACGCTTTTTTTCTGGCAAGATAGTCTTGTAA

ATGCGGGCCAAGATCTGCACACTGGTATTTCGGTTTTTGGGGCCGCGGGCGGC

GACGGGCCCGTGCGTCCCAGCGCACATGTTCGGCGAGGCGGGGCCTGCGAG

CGCGGCCACCGAGAATCGGACGGGGGTAGTCTCAAGCTGGCCGGCCTGCTCT

GGTGCCTGGCCTCGCGCCGCCGTGTATCGCCCCGCCCTGGGCGGCAAGGCTG

GCCCGGTCGGCACCAGTTGCGTGAGCGGAAAGATGGCCGCTTCCCGGCCCTG

CTGCAGGGAGCTCAAAATGGAGGACGCGGCGCTCGGGAGAGCGGGCGGGTG

AGTCACCCACACAAAGGAAAAGGGCCTTTCCGTCCTCAGCCGTCGCTTCATGT

GACTCCACGGAGTACCGGGCGCCGTCCAGGCACCTCGATTAGTTCTCGAGCTT

TTGGAGTACGTCGTCTTTAGGTTGGGGGGAGGGGTTTTATGCGATGGAGTTTC

CCCACACTGAGTGGGTGGAGACTGAAGTTAGGCCAGCTTGGCACTTGATGTA

ATTCTCCTTGGAATTTGCCCTTTTTGAGTTTGGATCTTGGTTCATTCTCAAGCC

TCAGACAGTGGTTCAAAGTTTTTTTCTTCCATTTCAGGTGTCGTGACGTACGG

CCACCATGGATTACAAAGACGATGACGATAAGATGGCAGTCCCAGGTTGCAA

CAAGGACAATGTCAGAGCAGGCTGCAGAAAATGTGGCTACCCTGGTCATCTG

ACTTTCGAGTGCCGCAATTTTCTCCGGGTAGATCCCAAAAGGGACATTGTGTT

GGACGTCAGCAGCACCAGTAGTGAGGACAGTGATGAAGAAAATGAGGAGCT

GAACAAGCTGCAGGCTCTGCAGGAGAAAAGAATAAATGAAGAAGAGGAAAA

GAAAAAGGAAAAGAGCAGGGAGAAAATTAAATTGAAGAAAAGGAGGAAAA

GGTCTTACTCCAGTGCCACTGAAGAGGACTCCGCAAAACAAAAGAAACAGAA

GTATCAGAAAAAGAAAAGAAAAAGGAAAAAAAGAACAAGTCAAAGAAAG

GAAAGCATCACAAAAAGGAAAAAAAGAAGAGAAAAAAGGAAAAGCGTTCTT
```

-continued

```
CCCCTTACCATTCTGAACTCACCAAAAAGTAAGAATTCGATATCAAGCTTATC

GATAATCAACCTCTGGATTACAAAATTTGTGAAAGATTGACTGGTATTCTTAA

CTATGTTGCTCCTTTTACGCTATGTGGATACGCTGCTTTAATGCCTTTGTATCA

TGCTATTGCTTCCCGTATGGCTTTCATTTTCTCCTCCTTGTATAAATCCTGGTT

GCTGTCTCTTTATGAGGAGTTGTGGCCCGTTGTCAGGCAACGTGGCGTGGTGT

GCACTGTGTTTGCTGACGCAACCCCCACTGGTTGGGGCATTGCCACCACCTGT

CAGCTCCTTTCCGGGACTTTCGCTTTCCCCCTCCCTATTGCCACGGCGGAACTC

ATCGCCGCCTGCCTTGCCCGCTGCTGGACAGGGGCTCGGCTGTTGGGCACTGA

CAATTCCGTGGTGTTGTCGGGGAAATCATCGTCCTTTCCTTGGCTGCTCGCCT

GTGTTGCCACCTGGATTCTGCGCGGGACGTCCTTCTGCTACGTCCCTTCGGCC

CTCAATCCAGCGGACCTTCCTTCCCGCGGCCTGCTGCCGGCTCTGCGGCCTCT

TCCGCGTCTTCGCCTTCGCCCTCAGACGAGTCGGATCTCCCTTTGGGCCGCCT

CCCCGCATCGATACCGTCGACCTCGAGACCTAGAAAAACATGGAGCAATCAC

AAGTAGCAATACAGCAGCTACCAATGCTGATTGTGCCTGGCTAGAAGCACAA

GAGGAGGAGGAGGTGGGTTTTCCAGTCACACCTCAGGTACCTTTAAGACCAA

TGACTTACAAGGCAGCTGTAGATCTTAGCCACTTTTTAAAAGAAAAGGGGGG

ACTGGAAGGGCTAATTCACTCCCAACGAAGACAAGATATCCTTGATCTGTGG

ATCTACCACACACAAGGCTACTTCCCTGATTGGCAGAACTACACACCAGGGC

CAGGGATCAGATATCCACTGACCTTTGGATGGTGCTACAAGCTAGTACCAGTT

GAGCAAGAGAAGGTAGAAGAAGCCAATGAAGGAGAGAACACCCGCTTGTTA

CACCCTGTGAGCCTGCATGGGATGGATGACCCGGAGAGAGAAGTATTAGAGT

GGAGGTTTGACAGCCGCCTAGCATTTCATCACATGGCCCGAGAGCTGCATCC

GGACTGTACTGGGTCTCTCTGGTTAGACCAGATCTGAGCCTGGGAGCTCTCTG

GCTAACTAGGGAACCCACTGCTTAAGCCTCAATAAAGCTTGCCTTGAGTGCTT

CAAGTAGTGTGTGCCCGTCTGTTGTGTGACTCTGGTAACTAGAGATCCCTCAG

ACCCTTTTAGTCAGTGTGGAAAATCTCTAGCAGGGCCCGTTTAAACCCGCTGA

TCAGCCTCGACTGTGCCTTCTAGTTGCCAGCCATCTGTTGTTTGCCCCTCCCCC

GTGCCTTCCTTGACCCTGGAAGGTGCCACTCCCACTGTCCTTTCCTAATAAAA

TGAGGAAATTGCATCGCATTGTCTGAGTAGGTGTCATTCTATTCTGGGGGGTG

GGGTGGGGCAGGACAGCAAGGGGGAGGATTGGGAAGACAATAGCAGGCATG

CTGGGGATGCGGTGGGCTCTATGGCTTCTGAGGCGGAAAGAACCAGCTGGGG

CTCTAGGGGGTATCCCCACGCGCCCTGTAGCGGCGCATTAAGCGCGGCGGGT

GTGGTGGTTACGCGCAGCGTGACCGCTACACTTGCCAGCGCCCTAGCGCCCG

CTCCTTTCGCTTTCTTCCCTTCCTTTCTCGCCACGTTCGCCGGCTTTCCCCGTCA

AGCTCTAAATCGGGGGCTCCCTTTAGGGTTCCGATTTAGTGCTTTACGGCACC

TCGACCCCAAAAAACTTGATTAGGGTGATGGTTCACGTAGTGGGCCATCGCC

CTGATAGACGGTTTTTCGCCCTTTGACGTTGGAGTCCACGTTCTTTAATAGTG

GACTCTTGTTCCAAACTGGAACAACACTCAACCCTATCTCGGTCTATTCTTTTG

ATTTATAAGGGATTTTGCCGATTTCGGCCTATTGGTTAAAAAATGAGCTGATT

TAACAAAAATTTAACGCGAATTAATTCTGTGGAATGTGTGTCAGTTAGGGTGT
```

-continued

```
GGAAAGTCCCCAGGCTCCCCAGCAGGCAGAAGTATGCAAAGCATGCATCTCA

ATTAGTCAGCAACCAGGTGTGGAAAGTCCCCAGGCTCCCCAGCAGGCAGAAG

TATGCAAAGCATGCATCTCAATTAGTCAGCAACCATAGTCCCGCCCCTAACTC

CGCCCATCCCGCCCCTAACTCCGCCCAGTTCCGCCCATTCTCCGCCCCATGGC

TGACTAATTTTTTTATTTATGCAGAGGCCGAGGCCGCCTCTGCCTCTGAGCT

ATTCCAGAAGTAGTGAGGAGGCTTTTTTGGAGGCCTAGGCTTTTGCAAAAAG

CTCCCGGGAGCTTGTATATCCATTTTCGGATCTGATCAGCACGTGTTGACAAT

TAATCATCGGCATAGTATATCGGCATAGTATAATACGACAAGGTGAGGAACT

AAACCATGGCCAAGTTGACCAGTGCCGTTCCGGTGCTCACCGCGCGCGACGT

CGCCGGAGCGGTCGAGTTCTGGACCGACCGGCTCGGGTTCTCCCGGGACTTC

GTGGAGGACGACTTCGCCGGTGTGGTCCGGGACGACGTGACCCTGTTCATCA

GCGCGGTCCAGGACCAGGTGGTGCCGGACAACACCCTGGCCTGGGTGTGGGT

GCGCGGCCTGGACGAGCTGTACGCCGAGTGGTCGGAGGTCGTGTCCACGAAC

TTCCGGGACGCCTCCGGGCCGGCCATGACCGAGATCGGCGAGCAGCCGTGGG

GGCGGGAGTTCGCCCTGCGCGACCCGGCCGGCAACTGCGTGCACTTCGTGGC

CGAGGAGCAGGACTGACACGTGCTACGAGATTTCGATTCCACCGCCGCCTTCT

ATGAAAGGTTGGGCTTCGGAATCGTTTTCCGGGACGCCGGCTGGATGATCCTC

CAGCGCGGGGATCTCATGCTGGAGTTCTTCGCCCACCCCAACTTGTTTATTGC

AGCTTATAATGGTTACAAATAAAGCAATAGCATCACAAATTTCACAAATAAA

GCATTTTTTTCACTGCATTCTAGTTGTGGTTTGTCCAAACTCATCAATGTATCT

TATCATGTCTGTATACCGTCGACCTCTAGCTAGAGCTTGGCGTAATCATGGTC

ATAGCTGTTTCCTGTGTGAAATTGTTATCCGCTCACAATTCCACACAACATAC

GAGCCGGAAGCATAAAGTGTAAAGCCTGGGGTGCCTAATGAGTGAGCTAACT

CACATTAATTGCGTTGCGCTCACTGCCCGCTTTCCAGTCGGGAAACCTGTCGT

GCCAGCTGCATTAATGAATCGGCCAACGCGCGGGGAGAGGCGGTTTGCGTAT

TGGGCGCTCTTCCGCTTCCTCGCTCACTGACTCGCTGCGCTCGGTCGTTCGGCT

GCGGCGAGCGGTATCAGCTCACTCAAAGGCGGTAATACGGTTATCCACAGAA

TCAGGGGATAACGCAGGAAAGAACATGTGAGCAAAAGGCCAGCAAAAGGCC

AGGAACCGTAAAAAGGCCGCGTTGCTGGCGTTTTTCCATAGGCTCCGCCCCCC

TGACGAGCATCACAAAAATCGACGCTCAAGTCAGAGGTGGCGAAACCCGACA

GGACTATAAAGATACCAGGCGTTTCCCCCTGGAAGCTCCCTCGTGCGCTCTCC

TGTTCCGACCCTGCCGCTTACCGGATACCTGTCCGCCTTTCTCCCTTCGGGAA

GCGTGGCGCTTTCTCATAGCTCACGCTGTAGGTATCTCAGTTCGGTGTAGGTC

GTTCGCTCCAAGCTGGGCTGTGTGCACGAACCCCCCGTTCAGCCCGACCGCTG

CGCCTTATCCGGTAACTATCGTCTTGAGTCCAACCCGGTAAGACACGACTTAT

CGCCACTGGCAGCAGCCACTGGTAACAGGATTAGCAGAGCGAGGTATGTAGG

CGGTGCTACAGAGTTCTTGAAGTGGTGGCCTAACTACGGCTACACTAGAAGA

ACAGTATTTGGTATCTGCGCTCTGCTGAAGCCAGTTACCTTCGGAAAAAGAGT

TGGTAGCTCTTGATCCGGCAAACAAACCACCGCTGGTAGCGGTGGTTTTTTTG

TTTGCAAGCAGCAGATTACGCGCAGAAAAAAAGGATCTCAAGAAGATCCTTT

GATCTTTTCTACGGGGTCTGACGCTCAGTGGAACGAAAACTCACGTTAAGGG
```

-continued

```
ATTTTGGTCATGAGATTATCAAAAAGGATCTTCACCTAGATCCTTTTAAATTA
AAAATGAAGTTTTAAATCAATCTAAAGTATATATGAGTAAACTTGGTCTGACA
GTTACCAATGCTTAATCAGTGAGGCACCTATCTCAGCGATCTGTCTATTTCGT
TCATCCATAGTTGCCTGACTCCCCGTCGTGTAGATAACTACGATACGGGAGGG
CTTACCATCTGGCCCCAGTGCTGCAATGATACCGCGAGACCCACGCTCACCG
GCTCCAGATTTATCAGCAATAAACCAGCCAGCCGGAAGGGCCGAGCGCAGAA
GTGGTCCTGCAACTTTATCCGCCTCCATCCAGTCTATTAATTGTTGCCGGGAA
GCTAGAGTAAGTAGTTCGCCAGTTAATAGTTTGCGCAACGTTGTTGCCATTGC
TACAGGCATCGTGGTGTCACGCTCGTCGTTTGGTATGGCTTCATTCAGCTCCG
GTTCCCAACGATCAAGGCGAGTTACATGATCCCCCATGTTGTGCAAAAAAGC
GGTTAGCTCCTTCGGTCCTCCGATCGTTGTCAGAAGTAAGTTGGCCGCAGTGT
TATCACTCATGGTTATGGCAGCACTGCATAATTCTCTTACTGTCATGCCATCC
GTAAGATGCTTTTCTGTGACTGGTGAGTACTCAACCAAGTCATTCTGAGAATA
GTGTATGCGGCGACCGAGTTGCTCTTGCCCGGCGTCAATACGGGATAATACC
GCGCCACATAGCAGAACTTTAAAAGTGCTCATCATTGGAAAACGTTCTTCGG
GGCGAAAACTCTCAAGGATCTTACCGCTGTTGAGATCCAGTTCGATGTAACCC
ACTCGTGCACCCAACTGATCTTCAGCATCTTTTACTTTCACCAGCGTTTCTGGG
TGAGCAAAAACAGGAAGGCAAAATGCCGCAAAAAAGGGAATAAGGGCGACA
CGGAAATGTTGAATACTCATACTCTTCCTTTTTCAATATTATTGAAGCATTTAT
CAGGGTTATTGTCTCATGAGCGGATACATATTTGAATGTATTTAGAAAAATAA
ACAAATAGGGGTTCCGCGCACATTTCCCCGAAAAGTGCCACCTGAC
pLY040_FLAG_mProhd2 (SEQ ID NO: 84,613):
GTCGACGGATCGGGAGATCTCCCGATCCCCTATGGTGCACTCTCAGTACAATC
TGCTCTGATGCCGCATAGTTAAGCCAGTATCTGCTCCCTGCTTGTGTGTTGGA
GGTCGCTGAGTAGTGCGCGAGCAAAATTTAAGCTACAACAAGGCAAGGCTTG
ACCGACAATTGCATGAAGAATCTGCTTAGGGTTAGGCGTTTTGCGCTGCTTCG
CGATGTACGGGCCAGATATACGCGTTGACATTGATTATTGACTAGTTATTAAT
AGTAATCAATTACGGGGTCATTAGTTCATAGCCCATATATGGAGTTCCGCGTT
ACATAACTTACGGTAAATGGCCCGCCTGGCTGACCGCCCAACGACCCCCGCC
CATTGACGTCAATAATGACGTATGTTCCCATAGTAACGCCAATAGGGACTTTC
CATTGACGTCAATGGGTGGAGTATTTACGGTAAACTGCCCACTTGGCAGTACA
TCAAGTGTATCATATGCCAAGTACGCCCCCTATTGACGTCAATGACGGTAAAT
GGCCCGCCTGGCATTATGCCCAGTACATGACCTTATGGGACTTTCCTACTTGG
CAGTACATCTACGTATTAGTCATCGCTATTACCATGGTGATGCGGTTTTGGCA
GTACATCAATGGGCGTGGATAGCGGTTTGACTCACGGGGATTTCCAAGTCTCC
ACCCCATTGACGTCAATGGGAGTTTGTTTTGGCACCAAAATCAACGGGACTTT
CCAAAATGTCGTAACAACTCCGCCCCATTGACGCAAATGGGCGGTAGGCGTG
TACGGTGGGAGGTCTATATAAGCAGCGCGTTTTGCCTGTACTGGGTCTCTCTG
GTTAGACCAGATCTGAGCCTGGGAGCTCTCTGGCTAACTAGGGAACCCACTG
CTTAAGCCTCAATAAAGCTTGCCTTGAGTGCTTCAAGTAGTGTGTGCCCGTCT
GTTGTGTGACTCTGGTAACTAGAGATCCCTCAGACCCTTTTAGTCAGTGTGGA
```

-continued

```
AAATCTCTAGCAGTGGCGCCCGAACAGGGACTTGAAAGCGAAAGGGAAACC

AGAGGAGCTCTCTCGACGCAGGACTCGGCTTGCTGAAGCGCGCACGGCAAGA

GGCGAGGGGCGGCGACTGGTGAGTACGCCAAAAATTTTGACTAGCGGAGGCT

AGAAGGAGAGAGATGGGTGCGAGAGCGTCAGTATTAAGCGGGGGAGAATTA

GATCGCGATGGGAAAAAATTCGGTTAAGGCCAGGGGGAAAGAAAAAATATA

AATTAAAACATATAGTATGGGCAAGCAGGGAGCTAGAACGATTCGCAGTTAA

TCCTGGCCTGTTAGAAACATCAGAAGGCTGTAGACAAATACTGGGACAGCTA

CAACCATCCCTTCAGACAGGATCAGAAGAACTTAGATCATTATATAATACAG

TAGCAACCCTCTATTGTGTGCATCAAAGGATAGAGATAAAAGACACCAAGGA

AGCTTTAGACAAGATAGAGGAAGAGCAAAACAAAAGTAAGACCACCGCACA

GCAAGCGGCCGCTGATCTTCAGACCTGGAGGAGGAGATATGAGGGACAATTG

GAGAAGTGAATTATATAAATATAAAGTAGTAAAAATTGAACCATTAGGAGTA

GCACCCACCAAGGCAAAGAGAAGAGTGGTGCAGAGAGAAAAAAGAGCAGTG

GGAATAGGAGCTTTGTTCCTTGGGTTCTTGGGAGCAGCAGGAAGCACTATGG

GCGCAGCGTCAATGACGCTGACGGTACAGGCCAGACAATTATTGTCTGGTAT

AGTGCAGCAGCAGAACAATTTGCTGAGGGCTATTGAGGCGCAACAGCATCTG

TTGCAACTCACAGTCTGGGGCATCAAGCAGCTCCAGGCAAGAATCCTGGCTG

TGGAAAGATACCTAAAGGATCAACAGCTCCTGGGGATTTGGGGTTGCTCTGG

AAAACTCATTTGCACCACTGCTGTGCCTTGGAATGCTAGTTGGAGTAATAAAT

CTCTGGAACAGATTTGGAATCACACGACCTGGATGGAGTGGGACAGAGAAAT

TAACAATTACACAAGCTTAATACACTCCTTAATTGAAGAATCGCAAAACCAG

CAAGAAAAGAATGAACAAGAATTATTGGAATTAGATAAATGGGCAAGTTTGT

GGAATTGGTTTAACATAACAAATTGGCTGTGGTATATAAAATTATTCATAATG

ATAGTAGGAGGCTTGGTAGGTTTAAGAATAGTTTTTGCTGTACTTTCTATAGT

GAATAGAGTTAGGCAGGGATATTCACCATTATCGTTTCAGACCCACCTCCCAA

CCCCGAGGGGACCCGACAGGCCCGAAGGAATAGAAGAAGAAGGTGGAGAGA

GAGACAGAGACAGATCCATTCGATTAGTGAACGGATCGGCACTGCGTGCGCC

AATTCTGCAGACAAATGGCAGTATTCATCCACAATTTTAAAAGAAAAGGGGG

GATTGGGGGGTACAGTGCAGGGGAAAGAATAGTAGACATAATAGCAACAGA

CATACAAACTAAAGAATTACAAAAACAAATTACAAAAATTCAAAATTTTCGG

GTTTATTACAGGGACAGCAGAGATCCAGTTTGGTTAATTAGCTAGCTGCAAA

GATGGATAAAGTTTTAAACAGAGAGGAATCTTTGCAGCTAATGGACCTTCTA

GGTCTTGAAAGGAGTGGGAATTGGCTCCGGTGCCCGTCAGTGGGCAGAGCGC

ACATCGCCCACAGTCCCCGAGAAGTTGGGGGGAGGGGTCGGCAATTGAACCG

GTGCCTAGAGAAGGTGGCGCGGGGTAAACTGGGAAAGTGATGTCGTGTACTG

GCTCCGCCTTTTTCCCGAGGGTGGGGGAGAACCGTATATAAGTGCAGTAGTC

GCCGTGAACGTTCTTTTTCGCAACGGGTTTGCCGCCAGAACACAGGTAAGTGC

CGTGTGTGGTTCCCGCGGGCCTGGCCTCTTTACGGGTTATGGCCCTTGCGTGC

CTTGAATTACTTCCACCTGGCTGCAGTACGTGATTCTTGATCCCGAGCTTCGG

GTTGGAAGTGGGTGGGAGAGTTCGAGGCCTTGCGCTTAAGGAGCCCCTTCGC
```

```
-continued
CTCGTGCTTGAGTTGAGGCCTGGCCTGGGCGCTGGGGCCGCCGCGTGCGAAT

CTGGTGGCACCTTCGCGCCTGTCTCGCTGCTTTCGATAAGTCTCTAGCCATTTA

AAATTTTTGATGACCTGCTGCGACGCTTTTTTTCTGGCAAGATAGTCTTGTAA

ATGCGGGCCAAGATCTGCACACTGGTATTTCGGTTTTTGGGGCCGCGGGCGGC

GACGGGGCCCGTGCGTCCCAGCGCACATGTTCGGCGAGGCGGGGCCTGCGAG

CGCGGCCACCGAGAATCGGACGGGGGTAGTCTCAAGCTGGCCGGCCTGCTCT

GGTGCCTGGCCTCGCGCCGCCGTGTATCGCCCCGCCCTGGGCGGCAAGGCTG

GCCCGGTCGGCACCAGTTGCGTGAGCGGAAAGATGGCCGCTTCCCGGCCCTG

CTGCAGGGAGCTCAAAATGGAGGACGCGGCGCTCGGGAGAGCGGGCGGGTG

AGTCACCCACACAAAGGAAAAGGGCCTTTCCGTCCTCAGCCGTCGCTTCATGT

GACTCCACGGAGTACCGGGCGCCGTCCAGGCACCTCGATTAGTTCTCGAGCTT

TTGGAGTACGTCGTCTTTAGGTTGGGGGGAGGGGTTTTATGCGATGGAGTTTC

CCCACACTGAGTGGGTGGAGACTGAAGTTAGGCCAGCTTGGCACTTGATGTA

ATTCTCCTTGGAATTTGCCCTTTTTGAGTTTGGATCTTGGTTCATTCTCAAGCC

TCAGACAGTGGTTCAAAGTTTTTTTCTTCCATTTCAGGTGTCGTGACGTACGG

CCACCATGGATTACAAAGACGATGACGATAAGATGATCTGGACGCGTCTGCC

GCTGTATGGCCCCTCCAAGCCCTCTACAGGTGGCTGGCAGCCCTGCGCTTTG

ATGGTGGGCCTTCCATGTCAAGGGAACCGCAGAACTGGCACGGGCTTTGCT

AGTGCTTCGCCTATGCGCCTGGCCCCCTTTGGTCACTCATGGACTAGCGTTTC

AGGCCTGGTCTCAGCGACTCCTGGGATCCCGGCTCTCAGGCGCACTTCTTCGA

GCATCCATCTACGGGCAGTTTGTGGCCGGGGAGACAGCAGAGGAAGTGAGGA

ACTGTGTCGGGCAGCTGCAGGCCCTGGGACTCCAGCCCCTGTTGGCAGTACC

CACCGAGGAGGAACCAGACTCCACTGCCAAGACCAGTGAGGTCTGGTATGAG

GAGAACCTTAGCGCCATGCTGCGCTGTGTGGACTTATCCCGAGCCCTCGTGGA

CGCCCACGGCCCAGCCAGGAACAGCCTCATGCAGCTGAAGGTGACCGCGCTA

GCCAGCACTCGGCTTTGTAAAGAGCTGTCGGCTTGGATCCAAAGACCCAGAG

GCTCCTCGGAGCTGAGCCCTGAGAGGCTGGCAGAAGCCATGGACTCGGGTCG

GAACCTCCAGCTCTCCTGCCTCAGCACAGAACAGAATCAGCACCTGCAGGCC

TCCCTCAGCCGCTTGCACCGAGTGGCACAGCACGCCCGGGCGAAGTGTGTGC

GGCTGCTGGTAGATGCTGAATATACTTTCATTAACCCTGCACTGTCCCTGCTG

GTGGCTGCCCTGGCTGTGCGCTGGAACAGCCCTGAGGAAGGTGGTCCGTGGG

TGTGGAACACTTACCAGGCCTATCTAAAGGACACTCACCAACGGCTGGAGCA

GGACGCCGAGGCAGCACACAAGGCTGGCCTGGCATTTGGGGTGAAGTTGGTG

CGAGGTGCCTATCTGGACAAGGAGAGATCCATGACACAGCTCCAAGGGAAGG

AAGACTGTACCCAGCCTGACTATGAGGCCACTAGTCGGAGTTACAGCCGCTG

TCTAGAGCTGATGCTGCGCTGCGTGTCGAACCACGGTCCCCCGTGTCACCTCA

TGGTGGCTTCCCACAATGAAGAATCCGTTCGCCAGGCAACTAAGCGCATGTG

GGAGCTGGGCATTCCTCTGGATGGGCCTGTCTGTTTTGGACAACTTCTGGGCA

TGTGTGACCATGTCTCCCTGGCATTAGGGCAGGCTGGATATATGGTGTACAAG

TCTATTCCCTATGGCTGCCTGGAGGAGGTGATTCCCTACCTGATCCGAAGAGC

CCAGGAGAACAGGAGTGTGCTGCAGGGTGCCCGCAGGGAGCAGGCACTACTC
```

-continued

```
AGCCAGGAACTGTGGCGGAGACTGCTGGGAAGGACGGCCTAAGAATTCGATA
TCAAGCTTATCGATAATCAACCTCTGGATTACAAAATTTGTGAAAGATTGACT
GGTATTCTTAACTATGTTGCTCCTTTTACGCTATGTGGATACGCTGCTTTAATG
CCTTTGTATCATGCTATTGCTTCCCGTATGGCTTTCATTTTCTCCTCCTTGTATA
AATCCTGGTTGCTGTCTCTTTATGAGGAGTTGTGGCCCGTTGTCAGGCAACGT
GGCGTGGTGTGCACTGTGTTTGCTGACGCAACCCCCACTGGTTGGGGCATTGC
CACCACCTGTCAGCTCCTTTCCGGGACTTTCGCTTTCCCCCTCCCTATTGCCAC
GGCGGAACTCATCGCCGCCTGCCTTGCCCGCTGCTGGACAGGGGCTCGGCTG
TTGGGCACTGACAATTCCGTGGTGTTGTCGGGGAAATCATCGTCCTTTCCTTG
GCTGCTCGCCTGTGTTGCCACCTGGATTCTGCGCGGGACGTCCTTCTGCTACG
TCCCTTCGGCCCTCAATCCAGCGGACCTTCCTTCCCGCGGCCTGCTGCCGGCT
CTGCGGCCTCTTCCGCGTCTTCGCCTTCGCCCTCAGACGAGTCGGATCTCCCTT
TGGGCCGCCTCCCCGCATCGATACCGTCGACCTCGAGACCTAGAAAAACATG
GAGCAATCACAAGTAGCAATACAGCAGCTACCAATGCTGATTGTGCCTGGCT
AGAAGCACAAGAGGAGGAGGAGGTGGGTTTTCCAGTCACACCTCAGGTACCT
TTAAGACCAATGACTTACAAGGCAGCTGTAGATCTTAGCCACTTTTTAAAAGA
AAAGGGGGACTGGAAGGGCTAATTCACTCCCAACGAAGACAAGATATCCTT
GATCTGTGGATCTACCACACACAAGGCTACTTCCCTGATTGGCAGAACTACAC
ACCAGGGCCAGGGATCAGATATCCACTGACCTTTGGATGGTGCTACAAGCTA
GTACCAGTTGAGCAAGAGAAGGTAGAAGAAGCCAATGAAGGAGAGAACACC
CGCTTGTTACACCCTGTGAGCCTGCATGGGATGGATGACCCGGAGAGAGAAG
TATTAGAGTGGAGGTTTGACAGCCGCCTAGCATTTCATCACATGGCCCGAGA
GCTGCATCCGGACTGTACTGGGTCTCTCTGGTTAGACCAGATCTGAGCCTGGG
AGCTCTCTGGCTAACTAGGGAACCCACTGCTTAAGCCTCAATAAAGCTTGCCT
TGAGTGCTTCAAGTAGTGTGTGCCCGTCTGTTGTGTGACTCTGGTAACTAGAG
ATCCCTCAGACCCTTTTAGTCAGTGTGGAAAATCTCTAGCAGGGCCCGTTTAA
ACCCGCTGATCAGCCTCGACTGTGCCTTCTAGTTGCCAGCCATCTGTTGTTTGC
CCCTCCCCCGTGCCTTCCTTGACCCTGGAAGGTGCCACTCCCACTGTCCTTTCC
TAATAAAATGAGGAAATTGCATCGCATTGTCTGAGTAGGTGTCATTCTATTCT
GGGGGGTGGGGTGGGGCAGGACAGCAAGGGGGAGGATTGGGAAGACAATAG
CAGGCATGCTGGGGATGCGGTGGGCTCTATGGCTTCTGAGGCGGAAAGAACC
AGCTGGGGCTCTAGGGGGTATCCCCACGCGCCCTGTAGCGGCGCATTAAGCG
CGGCGGGTGTGGTGGTTACGCGCAGCGTGACCGCTACACTTGCCAGCGCCCT
AGCGCCCGCTCCTTTCGCTTTCTTCCCTTCCTTTCTCGCCACGTTCGCCGGCTT
TCCCCGTCAAGCTCTAAATCGGGGGCTCCCTTTAGGGTTCCGATTTAGTGCTT
TACGGCACCTCGACCCCAAAAAACTTGATTAGGGTGATGGTTCACGTAGTGG
GCCATCGCCCTGATAGACGGTTTTTCGCCCTTTGACGTTGGAGTCCACGTTCTT
TAATAGTGGACTCTTGTTCCAAACTGGAACAACACTCAACCCTATCTCGGTCT
ATTCTTTTGATTTATAAGGGATTTTGCCGATTTCGGCCTATTGGTTAAAAAATG
AGCTGATTTAACAAAAATTTAACGCGAATTAATTCTGTGGAATGTGTGTCAGT
```

-continued
TAGGGTGTGGAAAGTCCCCAGGCTCCCCAGCAGGCAGAAGTATGCAAAGCAT

GCATCTCAATTAGTCAGCAACCAGGTGTGGAAAGTCCCCAGGCTCCCCAGCA

GGCAGAAGTATGCAAAGCATGCATCTCAATTAGTCAGCAACCATAGTCCCGC

CCCTAACTCCGCCCATCCCGCCCCTAACTCCGCCCAGTTCCGCCCATTCTCCG

CCCCATGGCTGACTAATTTTTTTATTTATGCAGAGGCCGAGGCCGCCTCTGC

CTCTGAGCTATTCCAGAAGTAGTGAGGAGGCTTTTTTGGAGGCCTAGGCTTTT

GCAAAAAGCTCCCGGGAGCTTGTATATCCATTTTCGGATCTGATCAGCACGTG

TTGACAATTAATCATCGGCATAGTATATCGGCATAGTATAATACGACAAGGT

GAGGAACTAAACCATGGCCAAGTTGACCAGTGCCGTTCCGGTGCTCACCGCG

CGCGACGTCGCCGGAGCGGTCGAGTTCTGGACCGACCGGCTCGGGTTCTCCC

GGGACTTCGTGGAGGACGACTTCGCCGGTGTGGTCCGGGACGACGTGACCCT

GTTCATCAGCGCGGTCCAGGACCAGGTGGTGCCGGACAACACCCTGGCCTGG

GTGTGGGTGCGCGGCCTGGACGAGCTGTACGCCGAGTGGTCGGAGGTCGTGT

CCACGAACTTCCGGGACGCCTCCGGGCCGGCCATGACCGAGATCGGCGAGCA

GCCGTGGGGGCGGGAGTTCGCCCTGCGCGACCCGGCCGGCAACTGCGTGCAC

TTCGTGGCCGAGGAGCAGGACTGACACGTGCTACGAGATTTCGATTCCACCG

CCGCCTTCTATGAAAGGTTGGGCTTCGGAATCGTTTTCCGGGACGCCGGCTGG

ATGATCCTCCAGCGCGGGGATCTCATGCTGGAGTTCTTCGCCCACCCCAACTT

GTTTATTGCAGCTTATAATGGTTACAAATAAAGCAATAGCATCACAAATTTCA

CAAATAAAGCATTTTTTTCACTGCATTCTAGTTGTGGTTTGTCCAAACTCATCA

ATGTATCTTATCATGTCTGTATACCGTCGACCTCTAGCTAGAGCTTGGCGTAA

TCATGGTCATAGCTGTTTCCTGTGTGAAATTGTTATCCGCTCACAATTCCACAC

AACATACGAGCCGGAAGCATAAAGTGTAAAGCCTGGGGTGCCTAATGAGTGA

GCTAACTCACATTAATTGCGTTGCGCTCACTGCCCGCTTTCCAGTCGGGAAAC

CTGTCGTGCCAGCTGCATTAATGAATCGGCCAACGCGCGGGGAGAGGCGGTT

TGCGTATTGGGCGCTCTTCCGCTTCCTCGCTCACTGACTCGCTGCGCTCGGTCG

TTCGGCTGCGGCGAGCGGTATCAGCTCACTCAAAGGCGGTAATACGGTTATC

CACAGAATCAGGGGATAACGCAGGAAAGAACATGTGAGCAAAAGGCCAGCA

AAAGGCCAGGAACCGTAAAAAGGCCGCGTTGCTGGCGTTTTTCCATAGGCTC

CGCCCCCCTGACGAGCATCACAAAAATCGACGCTCAAGTCAGAGGTGGCGAA

ACCCGACAGGACTATAAAGATACCAGGCGTTTCCCCCTGGAAGCTCCCTCGT

GCGCTCTCCTGTTCCGACCCTGCCGCTTACCGGATACCTGTCCGCCTTTCTCCC

TTCGGGAAGCGTGGCGCTTTCTCATAGCTCACGCTGTAGGTATCTCAGTTCGG

TGTAGGTCGTTCGCTCCAAGCTGGGCTGTGTGCACGAACCCCCCGTTCAGCCC

GACCGCTGCGCCTTATCCGGTAACTATCGTCTTGAGTCCAACCCGGTAAGACA

CGACTTATCGCCACTGGCAGCAGCCACTGGTAACAGGATTAGCAGAGCGAGG

TATGTAGGCGGTGCTACAGAGTTCTTGAAGTGGTGGCCTAACTACGGCTACAC

TAGAAGAACAGTATTTGGTATCTGCGCTCTGCTGAAGCCAGTTACCTTCGGAA

AAAGAGTTGGTAGCTCTTGATCCGGCAAACAAACCACCGCTGGTAGCGGTGG

TTTTTTTGTTTGCAAGCAGCAGATTACGCGCAGAAAAAAAGGATCTCAAGAA

GATCCTTTGATCTTTTCTACGGGGTCTGACGCTCAGTGGAACGAAAACTCACG

-continued

```
TTAAGGGATTTTGGTCATGAGATTATCAAAAAGGATCTTCACCTAGATCCTTT

TAAATTAAAAATGAAGTTTTAAATCAATCTAAAGTATATATGAGTAAACTTGG

TCTGACAGTTACCAATGCTTAATCAGTGAGGCACCTATCTCAGCGATCTGTCT

ATTTCGTTCATCCATAGTTGCCTGACTCCCCGTCGTGTAGATAACTACGATAC

GGGAGGGCTTACCATCTGGCCCCAGTGCTGCAATGATACCGCGAGACCCACG

CTCACCGGCTCCAGATTTATCAGCAATAAACCAGCCAGCCGGAAGGGCCGAG

CGCAGAAGTGGTCCTGCAACTTTATCCGCCTCCATCCAGTCTATTAATTGTTG

CCGGGAAGCTAGAGTAAGTAGTTCGCCAGTTAATAGTTTGCGCAACGTTGTTG

CCATTGCTACAGGCATCGTGGTGTCACGCTCGTCGTTTGGTATGGCTTCATTC

AGCTCCGGTTCCCAACGATCAAGGCGAGTTACATGATCCCCCATGTTGTGCAA

AAAAGCGGTTAGCTCCTTCGGTCCTCCGATCGTTGTCAGAAGTAAGTTGGCCG

CAGTGTTATCACTCATGGTTATGGCAGCACTGCATAATTCTCTTACTGTCATG

CCATCCGTAAGATGCTTTTCTGTGACTGGTGAGTACTCAACCAAGTCATTCTG

AGAATAGTGTATGCGGCGACCGAGTTGCTCTTGCCCGGCGTCAATACGGGAT

AATACCGCGCCACATAGCAGAACTTTAAAAGTGCTCATCATTGGAAAACGTT

CTTCGGGGCGAAAACTCTCAAGGATCTTACCGCTGTTGAGATCCAGTTCGATG

TAACCCACTCGTGCACCCAACTGATCTTCAGCATCTTTTACTTTCACCAGCGTT

TCTGGGTGAGCAAAAACAGGAAGGCAAAATGCCGCAAAAAAGGGAATAAGG

GCGACACGGAAATGTTGAATACTCATACTCTTCCTTTTTCAATATTATTGAAG

CATTTATCAGGGTTATTGTCTCATGAGCGGATACATATTTGAATGTATTTAGA

AAAATAAACAAATAGGGGTTCCGCGCACATTTCCCCGAAAAGTGCCACCTGA

C
```

Before lentivirus transduction, OT-I CD8⁺ T cells were isolated and activated by anti-CD38 and anti-CD28 for 2-3 days, then T cells were transduced with concentrated lentivirus. At day 6, infected OT-I CD8⁺ T cells were reseeded onto new 6-well plates which were untreated with anti-CD38 and cRPMI only supplemented with 2 ng/ML IL-2 and 2 ng/ml IL-12p70 to rest cells. At the same time, 5e5/well of E0771 cells were seeded in 24-well plates for kill assay. The next day, E0771 cells were incubated with 1 ng/ml or 10 ng/mL SIINFEKL (SEQ ID NO: 84,614) peptide for 4 hours. The validation kill assay was performed in the same manner as the screen kill assay.

Testing T cells anti-tumor function with Prodh2 using mouse models (Examples 5-10): Naïve CD8⁺ T cells were isolated from OT-I;Cas9β mice, then activated with anti-CD3ε and anti-CD28, activated cells were transduced with lentivirus on day 3 after isolation. (1) For the melanoma model, 3×10⁶ B16F10-mCh-rOVA cells (OVA-low) were subcutaneously injected into recipient Rag1⁻/⁻ mice. Two doses, 3×10⁶ and 2×10⁶ T cells were intravenously injected on day 19 and day 30 after B16F10-mCh-rOVA transplantation, respectively. (2) For the triple-negative breast cancer (TNBC) models, first, 3×10⁶ E0771-mCh-rOVA cells (OVA-low) cells were injected into the mammary fat pad of recipient Rag1⁻/⁻ mice. Two doses, 3×10⁶ and 2×10⁶ T cells were intravenously injected on day 13 and day 24 post E0771-mCh-rOVA implantation, respectively. (3) For the TNBC models, secondly, 2×10⁶ E0771-mCh-rOVA cells (OVA-high) cells were injected into the mammary fat pad of recipient Rag1⁻/⁻ mice. A single dose of 5×10⁶ T cells were intravenously injected on day 11 post E0771-mCh-rOVA implantation, because the OVA-high cancer model has stronger killing so that one treatment is sufficient to induce tumor regression. Tumor sizes were measured every 2-3 days from adoptive transfer to the survival endpoint. Tumor volume was calculated as/6×(length×width×height) of the tumour. Comparison of tumor growth curves were performed by two-way ANOVA.

IL-2 withdrawal assay (Examples 5-10): Mouse OT-I; Cas9β CD8 T cells were activated with anti-CD3ε and anti-CD28, T cells were transduced with Prodh2-OE or Vector lentivirus after T cells were completely activated. At day 3 after lentivirus transduction, T cells were collected and washed with PBS, then equal cell numbers were plated in media without IL-2. Cells were stained with anti-caspase 3-PE (Cell signaling technology), CD3-FITC, and CD8-APC at day 1 and 4 after IL-2 withdrawal.

Human CD22-CAR-PRODH2 T cell kill assay (Examples 5-10): To sensitively detect CD22-CAR-PRODH2 T cell killing efficacy, NALM6 cells (purchased from ATCC) were transduced with lentivirus packaged with GFP-Luciferase (GL) reporter constructs. NALM6-GL positive cells were sorted using a BD FACSAria II machine. 2×10⁴ NALM6-GL cells were seeded in a 96-well plate, then different cancer: T cell ratio co-cultures were set up. NALM6-GL cell proliferation was measured after 24 and 48 h of co-culture by adding 150 µg/ml D-Luciferin (PerkinElmer) using a multi-channel pipette. Luciferase intensity was measured by a Plate Reader (PerkinElmer).

Large-scale patient Tumor Immune Dysfunction and Exclusion (TIDE) analysis (Examples 5-10): The gene signatures of T cell dysfunction and prediction of cancer immunotherapy response on cancer patient data was performed using the TIDE algorithm as previously described (P. Jiang et al., Signatures of T cell dysfunction and exclusion predict cancer immunotherapy response. *Nat Med* 24, 1550-1558 (2018)). Gene expression level of PRODH2 was associated to CTL-mediated patient survival with or without checkpoint blockade treatment.

Bulk mRNA sequencing (mRNA-seq, RNA-seq) library preparation (Examples 5-10): For the mouse CD8+ T cell mRNA-seq, activated OT-I;Cas9β CD8+ T cells were infected with Prodh2 overexpression or vector lentivirus. At day 3 after infection, T cells were collected for qPCR validation before doing the RNA-seq library preparations. mRNA library preparations were performed using a NEB-Next® Ultra™ RNA Library Prep Kit for Illumina and samples were multiplexed using barcoded primers provided by NEBNext® Multiplex Oligos for Illumina® (Index Primers Set 1). For the human CD8+ T cell RNA-seq, CD22-CAR-PRODH2 and CD22-CAR-PRODH2 (stop) cassettes were site-specifically KI into TRAC locus, the flow cytometry, qPCR, and western blot were performed to confirm that CD22-CAR-PRODH2 or CD22-CAR-PRODH2 (stop) were successfully KI and expressed before doing the mRNA-seq library preparations. Same RNA library preparation procedures as mouse were performed. Libraries were sequenced with HiSeq 4000 or Novaseq systems (Illumina).

Bulk mRNA-seq data processing (Examples 5-10): Raw FASTQ files from mRNA-seq were analyzed for transcript quantification using Kalliso quant algorithm (N. L. Bray, H. Pimentel, P. Melsted, L. Pachter, Near-optimal probabilistic RNA-seq quantification. *Nat Biotechnol* 34, 525-527 (2016)) with the setting-b 100. Transcriptome references were obtained from Ensembl. Differential gene expression analysis for the effect of PRODH2 overexpression or genomic knockin was then performed using Sleuth (H. Pimentel, N. L. Bray, S. Puente, P. Melsted, L. Pachter, Differential analysis of RNA-seq incorporating quantification uncertainty. *Nat Methods* 14, 687-690 (2017)) with gene-level aggregation. Visualization of differentially expressed (DE) genes including volcano plots, bar plots, and Venn diagrams were performed using standard R packages including ggplot2 and VennDiagram.

Gene set level pathway analysis of differentially expressed genes (Examples 5-10): Gene set enrichment analysis (GSEA) was performed using the Java application from the Broad Institute. The full gene set from the differential gene expression analysis was ranked by "beta" value and then used as an input for GSEA pre-ranked analysis with database reference C5 Gene Ontology-Biological Process (GO-BP). The Database for Annotation, Visualization and Integrated Discovery (DAVID) (D. W. Huang, B. T. Sherman, R. A. Lempicki, Systematic and integrative analysis of large gene lists using DAVID bioinformatics resources. *Nature Protocols* 4, 44-57 (2009)) was used for further annotation enrichment analysis. Upregulated and downregulated genes from the differential gene expression analysis were defined with adjusted p-value cutoff of 0.01 for human CAR-T experiments and 0.05 for mouse experiments. Pathway enrichments for GO-BP annotations were used for visualization.

Metabolite extraction and data collection (Examples 5-10): For extraction of intracellular metabolites, cell culture media was first aspirated, then harvested and washed twice with PBS. $2 \times 10^6$ alive cells for each sample were used for metabolite extraction. After normalizing cell counts, 800 µL of 80% (vol/vol) HPLC-grade methanol (Sigma) (precooled to −80° C. on dry ice) was added to fresh cells in a 1.5-mL microcentrifuge tube, then tubes were put on dry ice for 30 minutes. The tubes were then incubated on ice for 20 minutes and centrifuged at 15,000×g for 15 min at 4° C. to pellet the cell debris. The metabolite-containing supernatant was transferred to a new 1.5-mL microcentrifuge tube on dry ice. Metabolite extraction was repeated with 400 µL of 80% (vol/vol) HPLC-grade methanol. The cell lysate/methanol mixtures were dried by Speedvac at room temperature. The metabolites were dissolved again with 80% (vol/vol) methanol, then centrifuged at 18,000×g for 10 min to remove any particulates, and the metabolite mixtures were stored at −80° C. until LC-MS analysis. For the metabolite analysis, the untargeted metabolic profiling was firstly analyzed with an Agilent 6550 QTOF LC/MS System first, then targeted metabolites were analyzed with an Agilent 6490 Triple quadrupole (QQQ) LC/MS System. Multiple reaction monitoring (MRM) was employed for the quantitation of purified standard (Sigma). A HILIC liquid chromatograph were optimized with a bioZen™ 2.6 µm Glycan LC Column, 150×2.1 mm (Phenomenex) and a Glycan guard column, 4×2 mm (Phenomenex). The eluents included buffer A, 0.01% formic acid in HPLC-grade water, and buffer B, 0.01% formic acid in acetonitrile. The gradient was set as follows: 0-2 min 94% B, 2-8 min 94-90% B, 8-16 min 90-76% B, 16-36 min 76-50% B, 36-42 min hold at 50% B and then back to initial conditions for 2 min for column equilibration. The flow rate was set as 0.3 mL/min. Multiple reaction monitoring (MRM) was employed for the quantitation of purified standard (Sigma).

Metabolomics data processing (Examples 5-10): Two metabolomics strategies were adopted, i.e. untargeted metabolomics (aiming to unbiasedly detect all detectable metabolites) and targeted approaches (aiming to detect specifically defined metabolites, such as related metabolites in the proline metabolism and T cell metabolism). For untargeted metabolomics analysis, the optimized workflow consists of automated peak detection and integration, peak alignment, background noise subtraction, and multivariate data analysis. These steps were carried out for comprehensive metabolite phenotyping of the two groups using Agilent Mass Hunter Qualitative Analysis Software (Version B.07.0.0, build 7.0.7024.0) and Agilent Mass Profiler Professional (Version 14.5-Build 2772). The metabolites were first putatively identified based on accurate mass match (accurate mass±30 ppm error) and fragmentation pattern match. Putative structural annotation was carried out by searching the metabolite databases HMDB (www.hmdb.ca) and METLIN (metlin.scripps.edu) using the mass-to-charge ratio of the metabolic features.

For the targeted metabolomics, available metabolites from the significantly changed metabolites of untargeted metabolomics analysis, as well as related proline metabolism and immune system metabolism, were purchased from Sigma. Multiple reaction monitoring (MRM) was employed for the qualitative and quantitative analysis of purified standard (Sigma). The features of spectra were extracted using Agilent Mass Hunter Qualitative Analysis Software (Version B.07.0.0, build 7.0.7024.0). Each peak was manually checked and the abundances of all metabolites were exported. The retention time of the standards was cross-referenced with those detected in the untargeted method for consistency, which also confirmed the accuracy of the untargeted methods. The integration of untargeted and targeted metabolites includes the combination of non-overlapping metabolites and the selection of targeted metabolites of overlapping metabolites.

Multivariate data analyses were conducted using Statistical analysis module of MetaboAnalyst 4.0 (J. G. Xia, I. V. Sinelnikov, B. Han, D. S. Wishart, MetaboAnalyst 3.0-making metabolomics more meaningful. *Nucleic Acids Res* 43, W251-W257 (2015), J. Chong et al., MetaboAnalyst 4.0: towards more transparent and integrative metabolomics analysis. *Nucleic Acids Res* 46, W486-W494 (2018)). Briefly, Log transformation and auto scaling (mean-centered and divided by the standard deviation of each variable) were used for data processing. Heatmaps and volcano plots were generated plots with MetaboAnalyst 4.0. Distance Measure was set as Euclidean and the Clustering Algorithm was set as Ward. The functions of the metabolic flowchart were constructed with the software Pathvisio v3.3.0 based on the KEGG database (www.genome.jp/kegg). The integrated analysis of the changed metabolites and genes were done with Joint Pathway analysis module of MetaboAnalyst 4.0.

Intersection of mRNA-seq, metabolomics and KEGG pathways (Examples 5-10): Differential expressed genes from mRNA-seq analysis were cross-referenced with expected differential expressed genes from metabolomics analysis in order to obtain consensus upregulated and downregulated gene sets due to PRODH2 overexpression or genomic knockin. For a given metabolite, genes contributing to its production or consumption were defined using the KEGG (Kyoto Encyclopedia of Genes and Genomes) Pathway Database (M. Kanehisa, S. Goto, KEGG: kyoto encyclopedia of genes and genomes. *Nucleic Acids Res* 28, 27-30 (2000)). Genes could be both "producing" and "consuming" when involved in reversible reactions. Expected upregulated genes were defined as those producing metabolites with positive logFC or those consuming metabolites with negative logFC. Expected downregulated genes were defined as those producing metabolites with negative logFC or those consuming metabolites with positive logFC. For consensus "upregulated" genes, first the union of downregulated mRNA-seq genes from human donor 1 and donor 2 from the CAR-T experiments were removed from the union of upregulated mRNA-seq genes (setdiff). Then the resulting restricted gene set was intersected with expected upregulated metabolomics genes. For consensus "downregulated" genes, the union of upregulated mRNA-seq genes was removed from the downregulated mRNA-seq genes (setdiff). Then the resulting restricted gene set was intersected with expected downregulated metabolomics genes.

Multi-Omics analysis (Examples 5-10): Consensus differential expressed genes from intersection analysis and differentially represented metabolites with fold changes from metabolomics analysis were used as inputs for joint pathway analysis using the MetaboAnalyst Portal (J. Xia, N. Psychogios, N. Young, D. S. Wishart, MetaboAnalyst: a web server for metabolomic data analysis and interpretation. *Nucleic Acids Res* 37, W652-660 (2009)). Default parameters were used, with Hypergeometric Test for enrichment analysis, Degree Centrality for topology analysis, and Gene-metabolite pathways for pathway databases. Pathways were considered statistically significant if the p-values were less than 0.05. For visualization, upregulated gene set and downregulated gene set were separated, each compared against DR metabolites (both increased and decreased, as the gene activity can influence on either direction), using the MetaboAnalyst Portal.

In vivo efficacy testing: NALM6-GL cancer cells, as described, were injected by intravenous route at 0.5 million/mouse into NSG mice. Mice were imaged by IVIS and randomized into 3 groups. 10 days after cancer cell injection, each mouse was intravenously injected with PBS, CD22 CAR-T cells with PRODH2 (Stop) knockin, or CD22 CAR-T cells with PRODH2 knockin. Mice were imaged in subsequent time points indicated.

Standard statistical analysis (Examples 5-10): Data between two groups were analyzed using a two-tailed unpaired t-test. Multiple t-test using the Holm-Sidak method was used for multiple group comparison. Different levels of statistical significance were accessed based on specific p values and type I error cutoffs (0.05, 0.01, 0.001, 0.0001). GraphPad Prism Software and RStudio were used for these analyses.

The results of the experiments are now described.

Figure 4A:
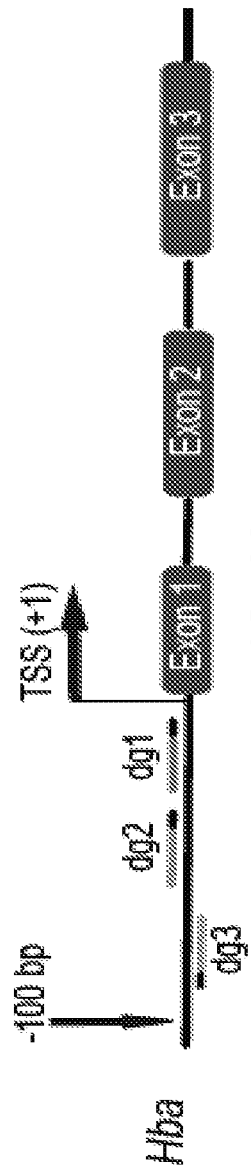
FIGS. 4A-4E illustrate results from testing the TdgA vector in immortalized cell lines and primary Cas9+ CD8+ T cells, and mm10dgLib lentivirus titration.
Figure 4C:
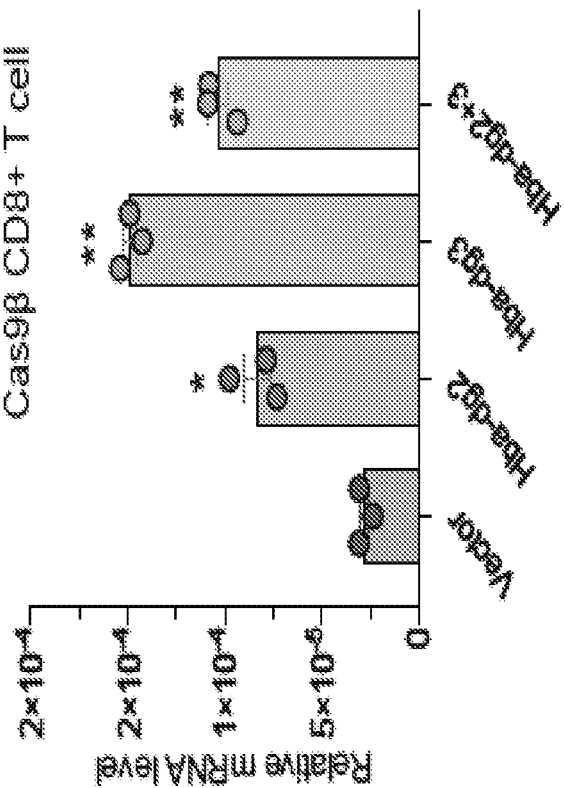
Figure 4B:
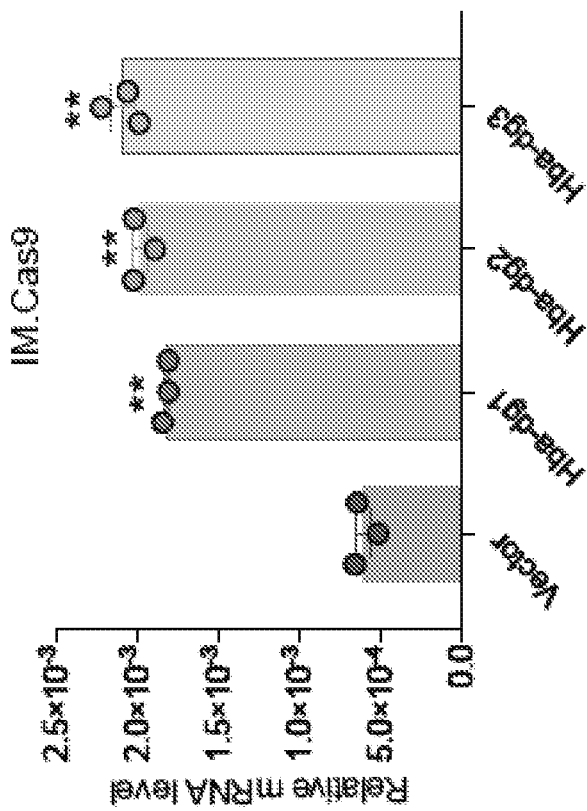

Example 1: Design and Generation of a Genome-Scale Dead-Guide RNA Activation Screen System for Primary T Cells To enable GOF screens, a lentiviral T cell dgRNA activation (TdgA) vector containing a dgRNA expression cassette driven by a U6 promoter with MS2-loop-containing chimeric backbone (U6-dgRNA-MS2), and a cassette expressing a fusion protein of Thy1.1 marker and transcription activators (EFS-Thy1.1-MPH) was designed and constructed (FIG. 1A). With 3 independent dgRNAs, the efficacy of the TdgA vector was verified by activating the mouse Hba gene in both immortalized cells (IM.Cas9, $p<0.01$ for all 3 dgRNAs) and Cas9-expressing primary murine $CD8^+$ T cells ($p<0.05$ for Hba-dg1, $p<0.01$ for Hba-dg2 and Hba-dg3) (FIG. 4A-4C).

Figure 1B:
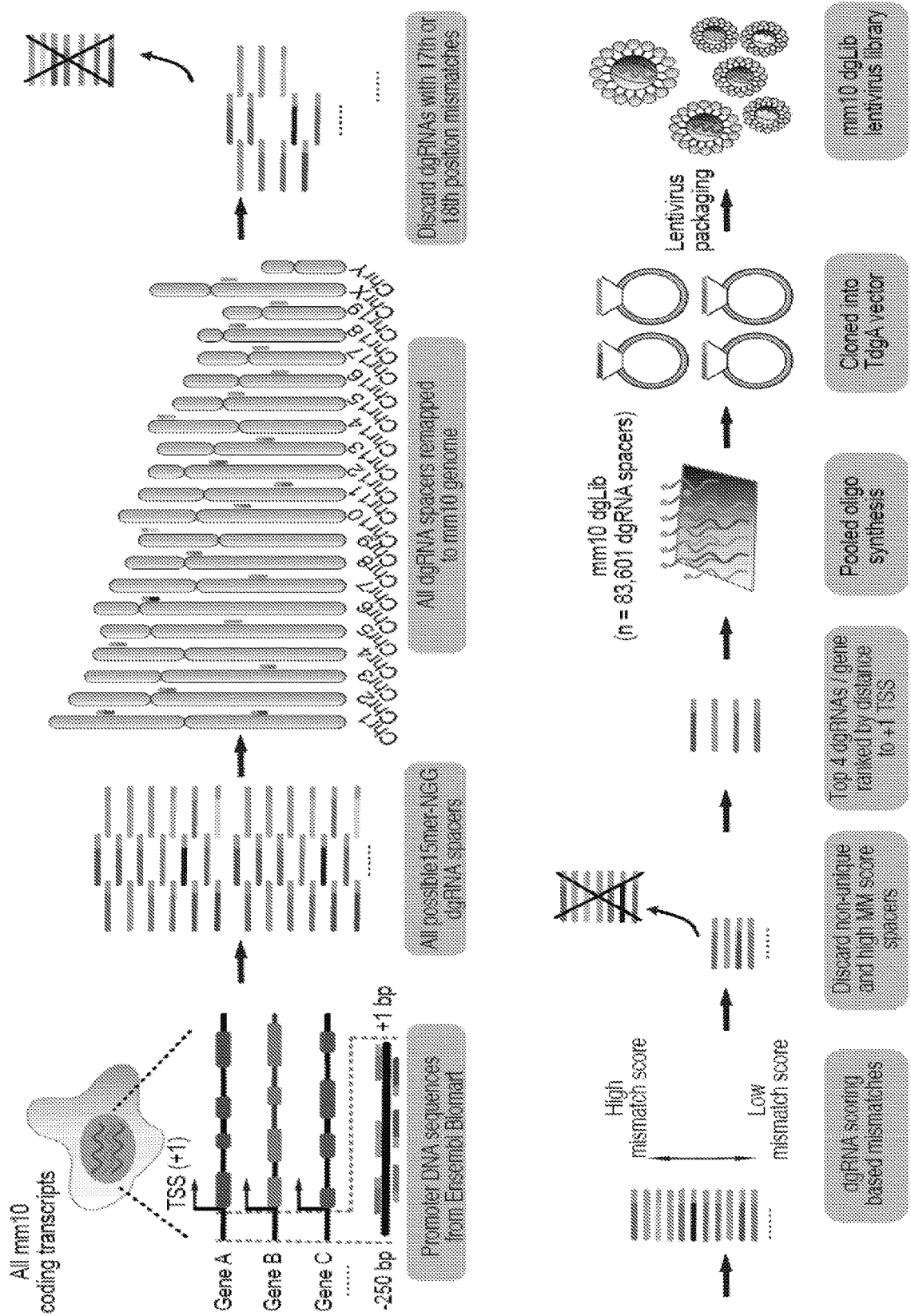
Figure 1D:
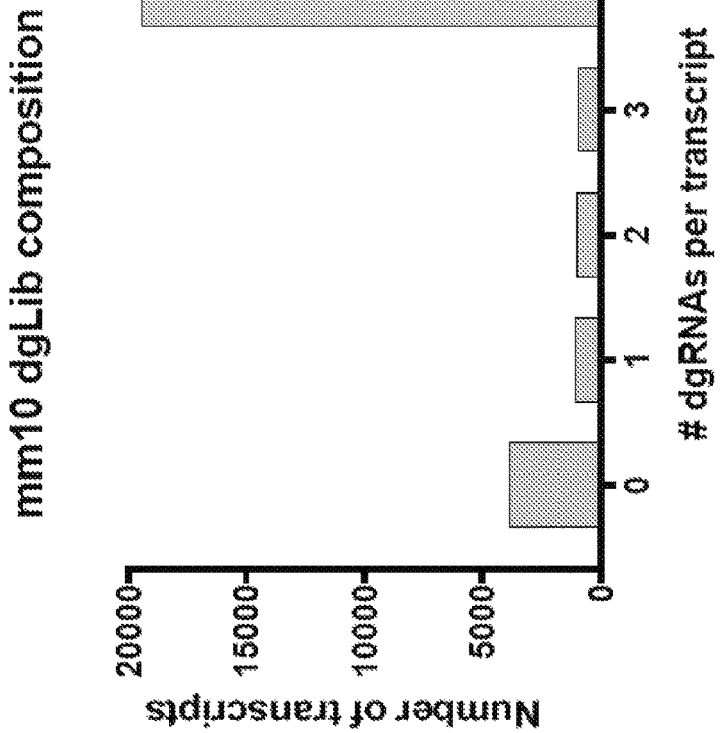
Figure 1C:
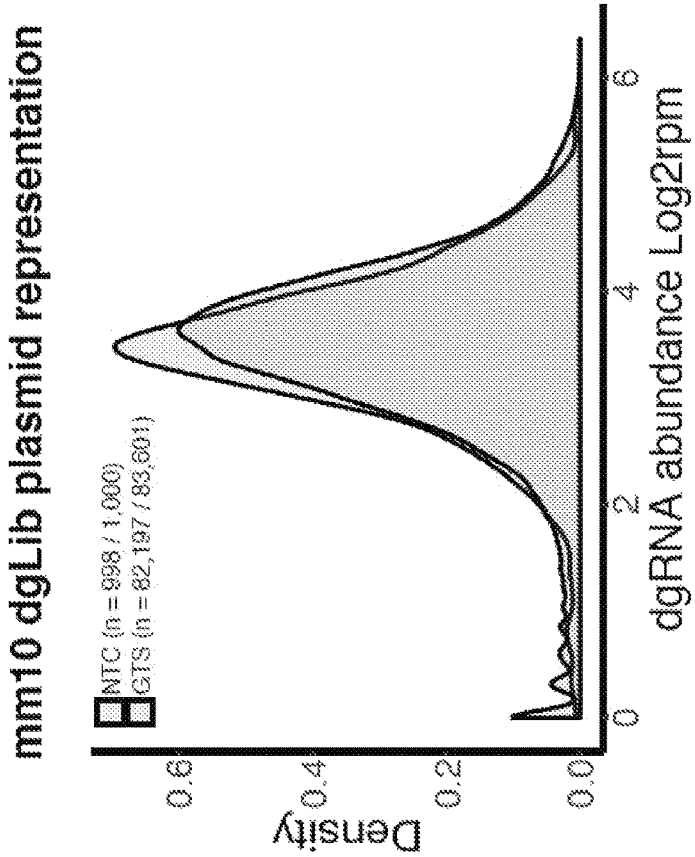
Figure 4D:
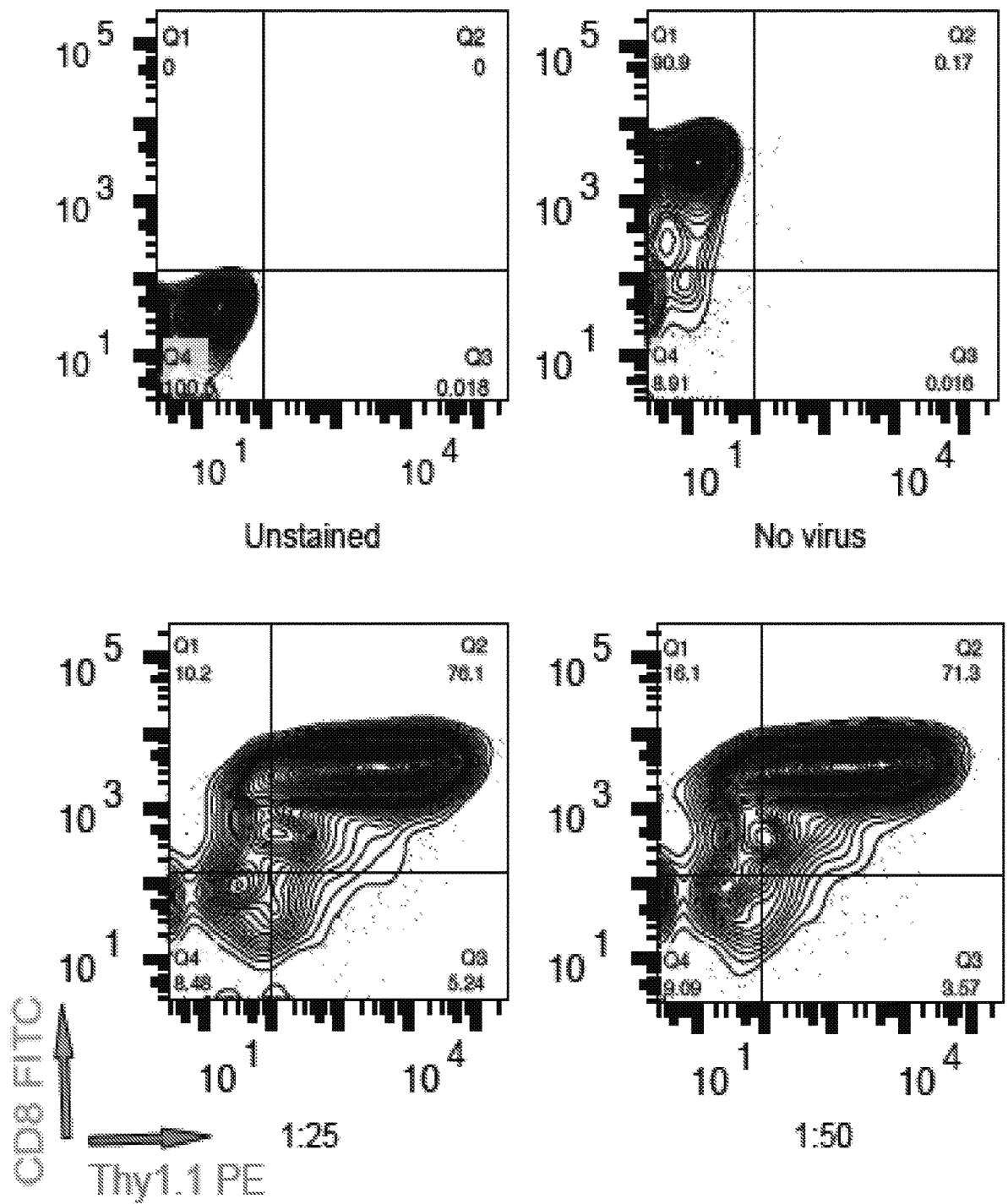
Figure 4E:
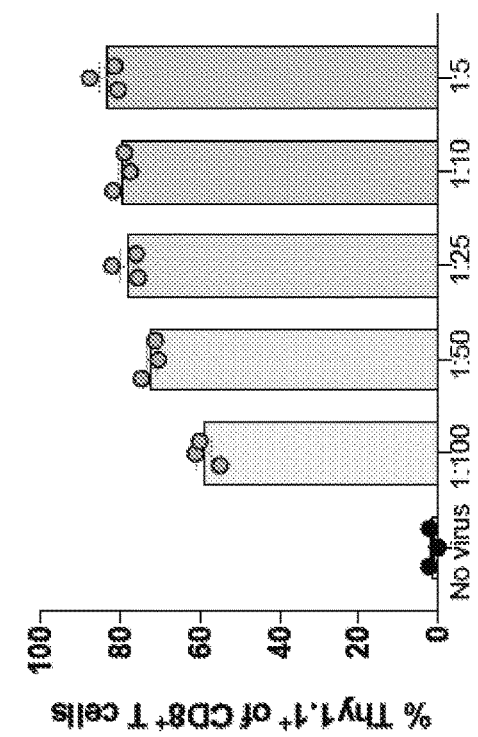

A mouse genome-scale dgRNA library (mm10dgLib) was designed using promoter sequences of all annotated protein-coding transcripts from the mm10 genome assembly (FIG. 1B). In this design, all possible 15-mer-NGG dgRNA spacer-PAM sequences within −250 bp of transcriptional start sites (TSSs) were identified. All spacer-PAM sequences were then re-mapped back to the mm10 mouse genome, dgRNAs with PAM mismatches were discarded, and ranked according to mismatch scores (MM scores). All dgRNA candidates with high MM scores were further filtered out and the top 4 dgRNAs per gene were chosen according to their distance to TSS (FIG. 1C). For genes with fewer than 4 dgRNAs passing all scoring criteria, all eligible dgRNAs were selected (FIG. 1C). Non-targeting control (NTC) sequences that did not map to the mouse genome were randomly generated, and the top 1,000 NTCs were chosen to spike into the library. As a result, the mm10dgLib consisted of 84,601 dgRNAs that target 83,601 coding transcripts (SEQ ID NOs. 1-83,601) and 1,000 NTCs (SEQ ID NOs. 83,602-84,601), which were synthesized as a pool and cloned into the TdgA vector (FIG. 1B). The mm10dgLib plasmid library representation was sequenced. 82,197/83,601 (98.3%) of gene-targeting spacers (GTSs) and 988/1,000 (98.8%) of NTCs were successfully cloned, and both GTSs and NTCs showed a log-normal distribution (FIG. 1D). The plasmid library was then packaged into lentivirus form with high titer (FIG. 4D-4E), enabling genome-scale activation screens for cells expressing catalytically active Cas9.

Figure 2A:
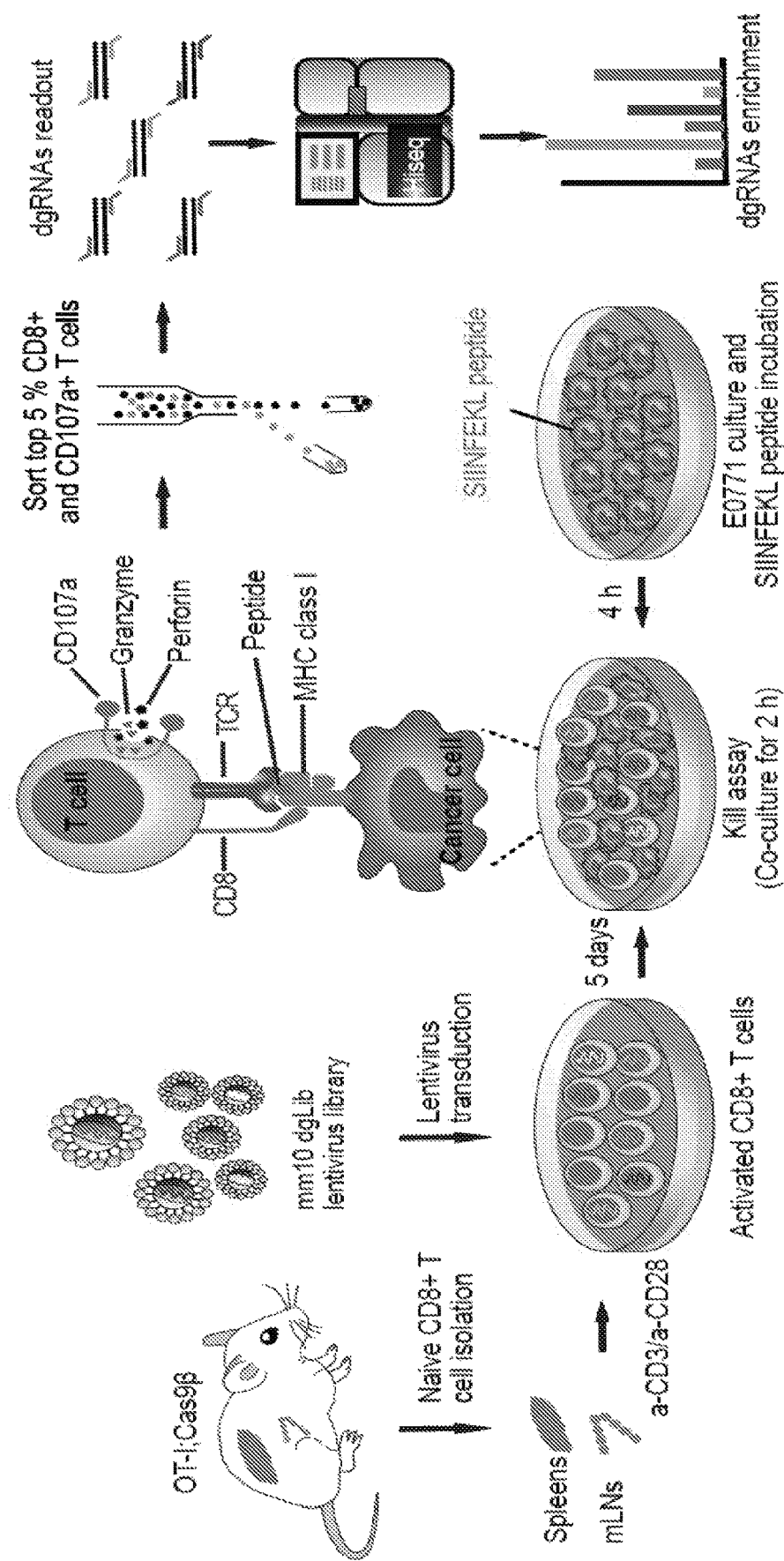
FIGS. 2A-2D illustrate genome-scale dgRNA activation screen identified genes that boost the effector function of CD8$^+$ T cells.
Figure 2B:
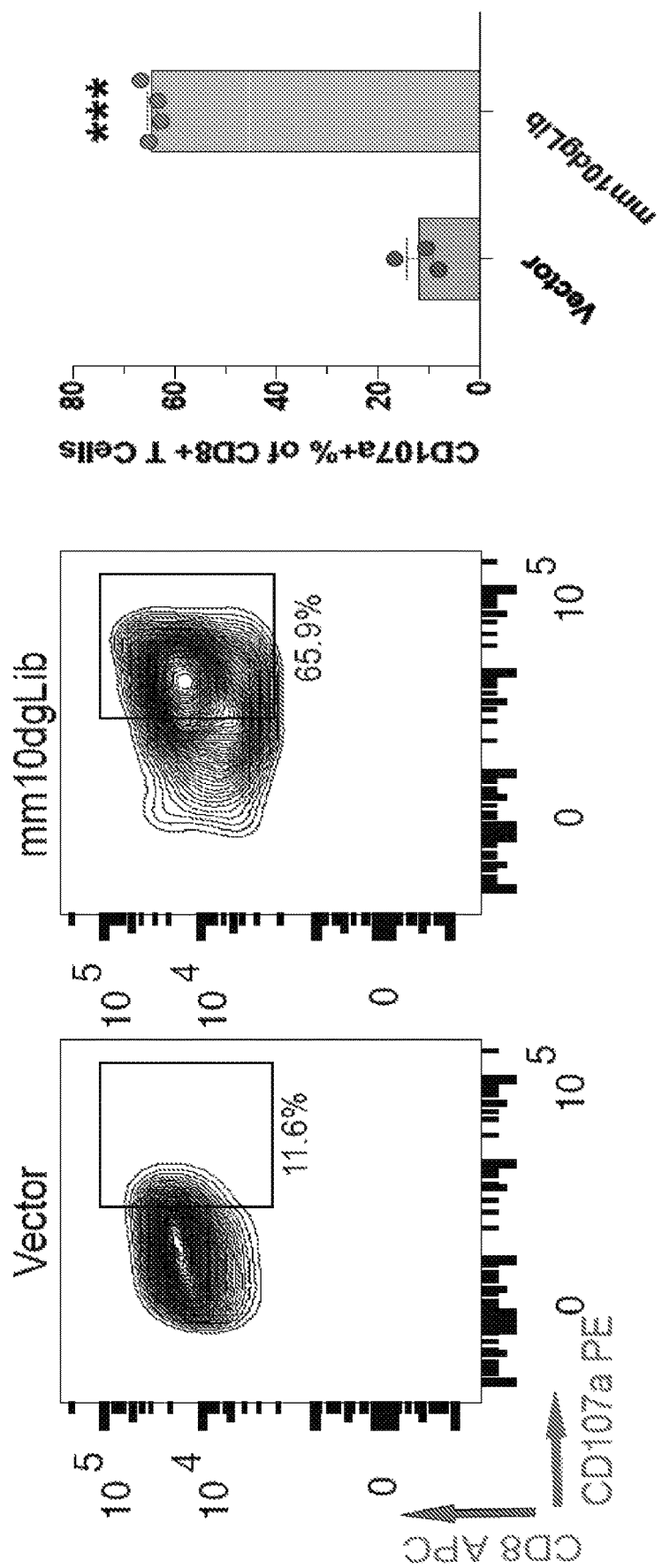

Example 2: Genome-Scale dgRNA Activation Screen Identified Genes that Boost the Effector Function of $CD8^+$ T Cells Degranulation is one of the major mechanisms through which cytotoxic CD8 T lymphocytes (CTL) mediate the killing of target cells. The granule-dependent (perforin and granzyme) pathway does not require de novo synthesis of proteins by effector CD8$^+$ T cells, but rather the release of pre-formed lytic granules within the cytoplasm. CD107a (LAMP-1) is a marker which can be presented on the cell surface after degranulation. To identify genes that when activated can enhance the degranulation ability of CD8$^+$ T cells after encountering their cognate antigen presented on the cell surface, a genome-scale dgRNA library based CD8$^+$ T cell kill assay activation screen (dgTKS) was devised (FIG. 2A). A co-culture system was developed in which OT-I;Cas9 CD8$^+$ T cells sensitively respond to E0771 breast cancer cells presenting SIINFEKL (SEQ ID NO. 84,614) peptide, the cognate antigen of the CD8$^+$ T cells from OT-I transgenic mice (FIG. 2A). Naïve CD8$^+$ T cells were isolated, transduced with the mm10dgLib or empty vector lentivirus, activated with anti-CD3 and anti-CD28, and cultured in cRPMI media with IL-2 and IL-12 for 4 days. The T cells were rested for 12 hours prior to the kill assay by exchanging fresh cRPMI media without anti-CD3 or anti-CD28. At day 5, E0771 cancer cells were pulsed with 1 ng/µL SIINFEKL (SEQ ID NO. 84,614) peptide for 4 hours, and the rested CD8$^+$ T cells were co-cultured with SIINFEKL (SEQ ID NO. 84,614)-incubated E0771 cancer cells at 1:1 ratio. The co-culture media also contained a specific anti-CD107a antibody that labeled the transiently presented surface CD107a. After 2 hours in co-culture, CD8$^+$ T cells were stained and flow cytometry analysis performed. The fraction of CD107a$^+$ cells was measured among the whole population of CD8$^+$ T cells co-cultured with E0771 cancer cells pulsed with SIINFEKL (SEQ ID NO. 84,614) peptide. mm 10dgLib lentivirus transduced CD8$^+$ T cells had a significantly higher CD107a$^+$ percentage compared to empty vector transduced cells (p<0.001) (FIG. 2B). Using fluorescence activated cell sorting (FACS), the mm10dgLib-transduced CD8$^+$ T cells expressing a high level (top 5%) of CD107a were sorted, in three independent biological replicates, for genomic DNA preparation and dgRNA library readout (FIG. 2A).

Figure 2C:
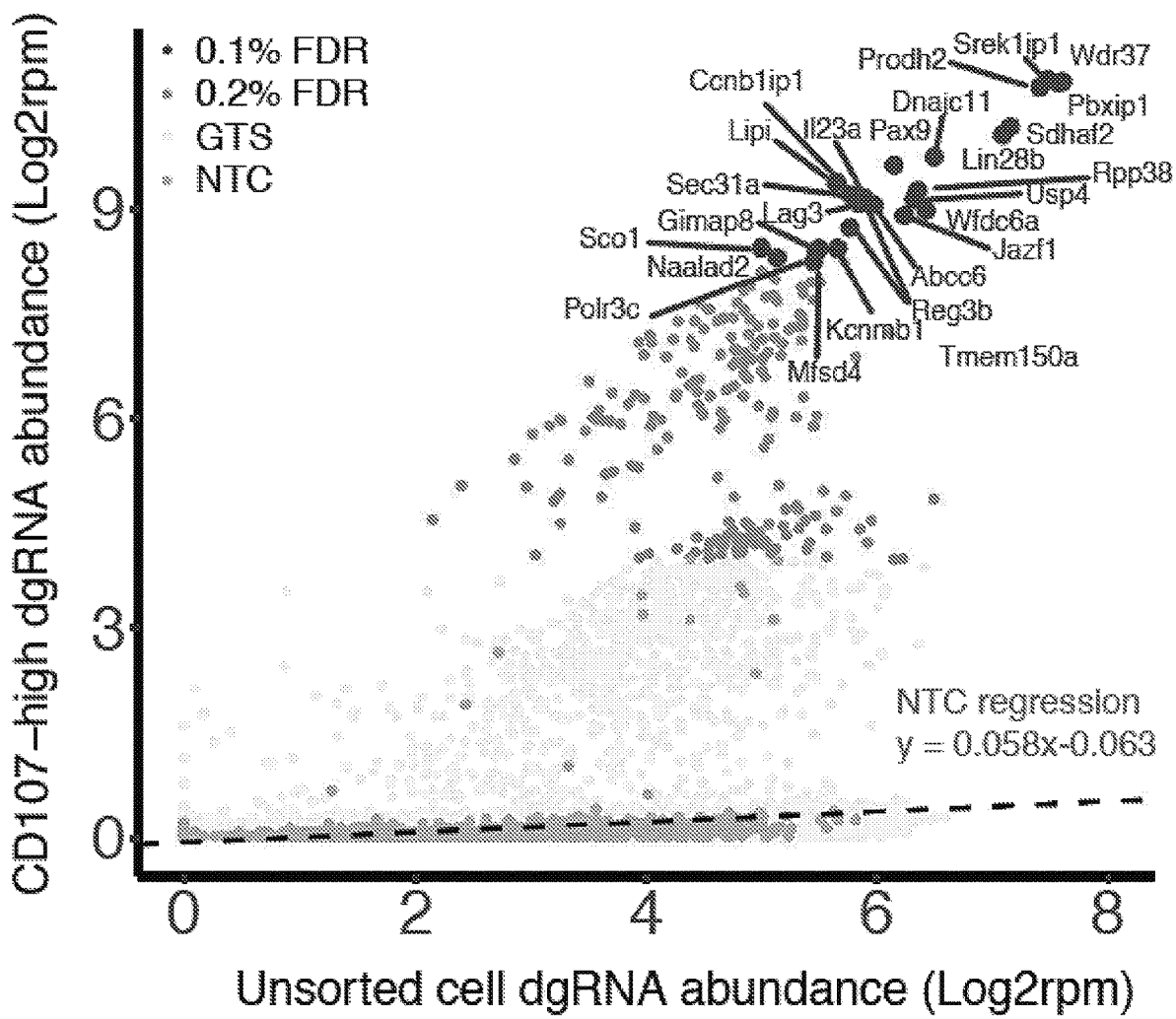
Figure 2D:
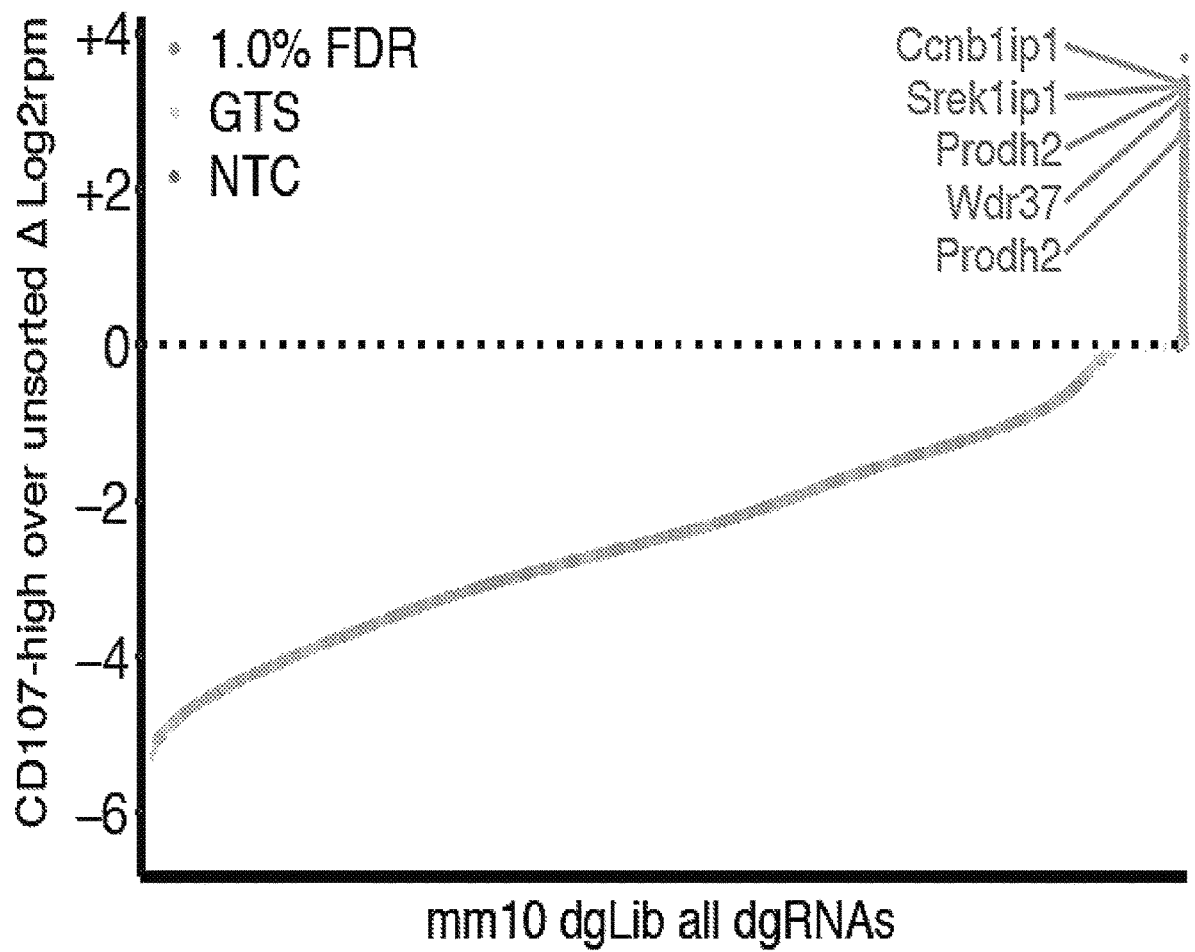

Illumina sequencing was used to read the dgRNA cassette of both CD107a$_+$-high sorted and unsorted CD8$^+$ T cells, and quantify the dgRNA abundance in the entire mm10dgLib. As a neutral baseline, the 1,000 NTCs were relatively evenly distributed in the unsorted cell population, but were rarely detected in the CD107a$^+$-high CD8$^+$ T cells (FIG. 2C). In contrast, there were two distinct populations of dgRNAs that deviated from the distribution and regression line of NTCs (FIG. 2C). With an FDR of 0.1%, significantly enriched dgRNAs were identified in sorted CD107a$^+$-high cells targeting 26 genes, such as Prodh2, Sreklip1, Wdr37, Ccnblip1, Pbxip1, and Sdhaf2 (FIG. 2C). Taking a differential dgRNA calculation by subtracting CD107a$^+$-high sorted from unsorted samples, similar hits were uncovered such as Prodh2, Ccnblip1, Sreklip1, and Wdr37 (FIG. 2D). Based on the results, it was hypothesized that overexpression of high-rank candidate genes from the dgTKS screen might enhance the degranulation ability of CD8$^+$ T effector cells.

Figure 3A:
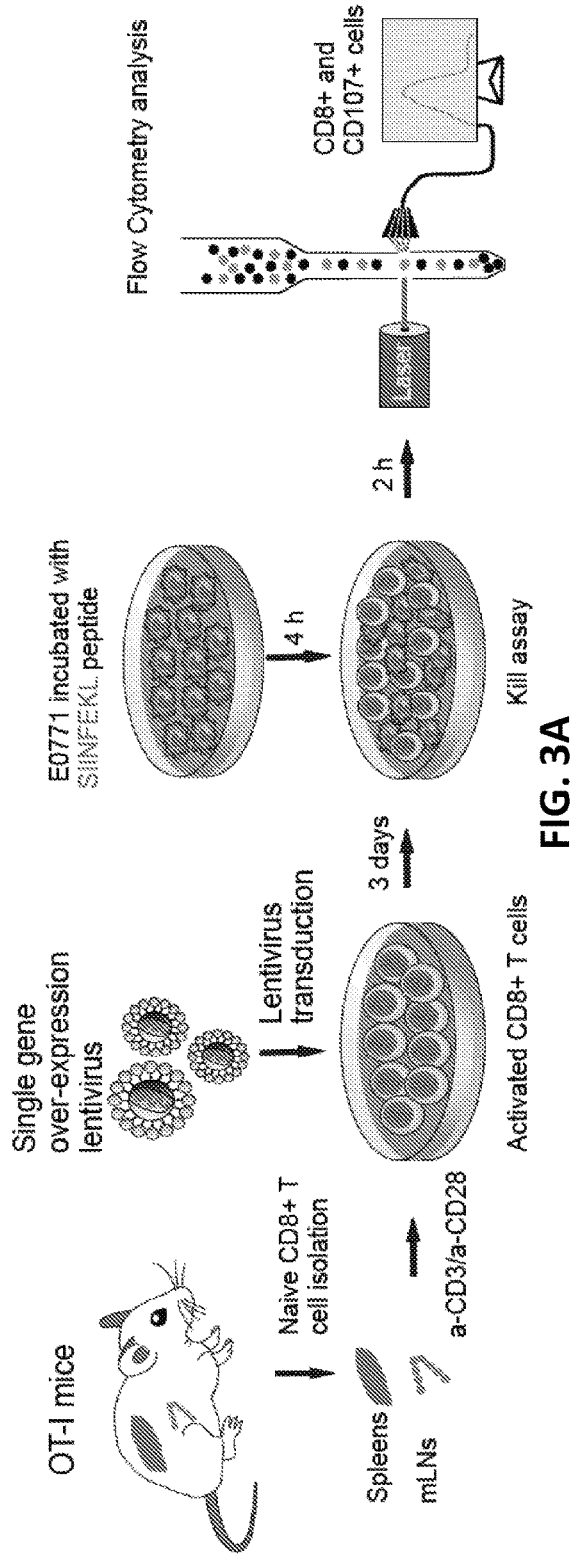
FIGS. 3A-3D illustrate testing gain-of-function of top candidates from dgTKS for enhancement of CD8+ T cell effector function.
Figure 3B:
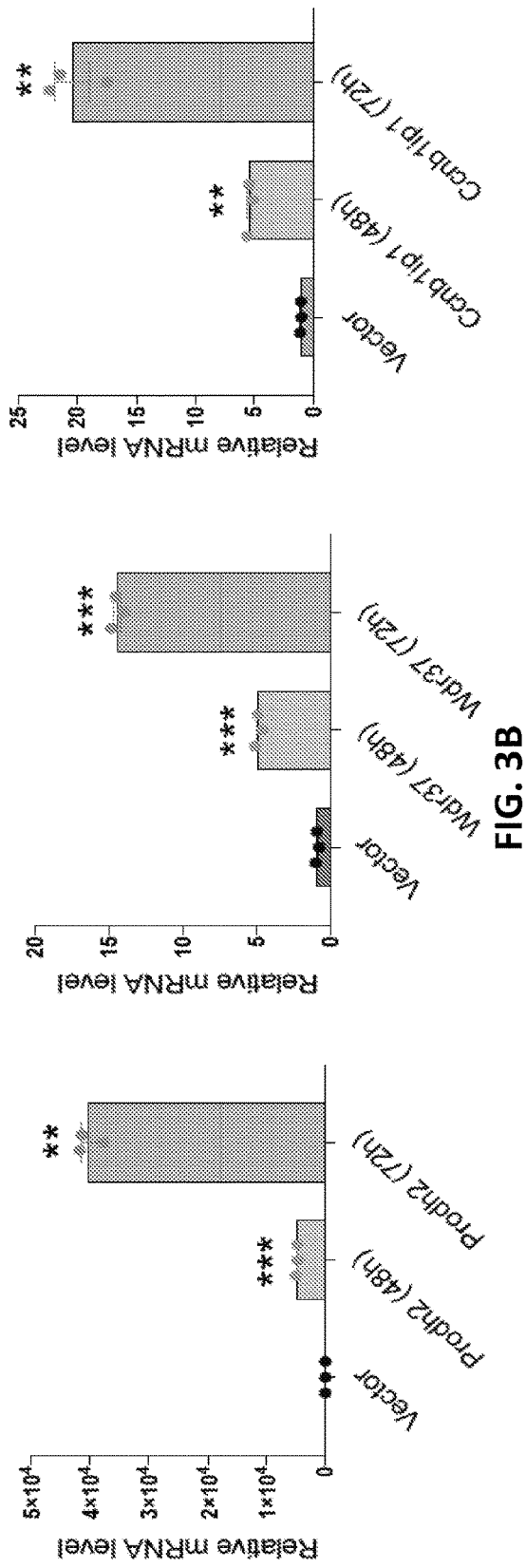
Figure 3C:
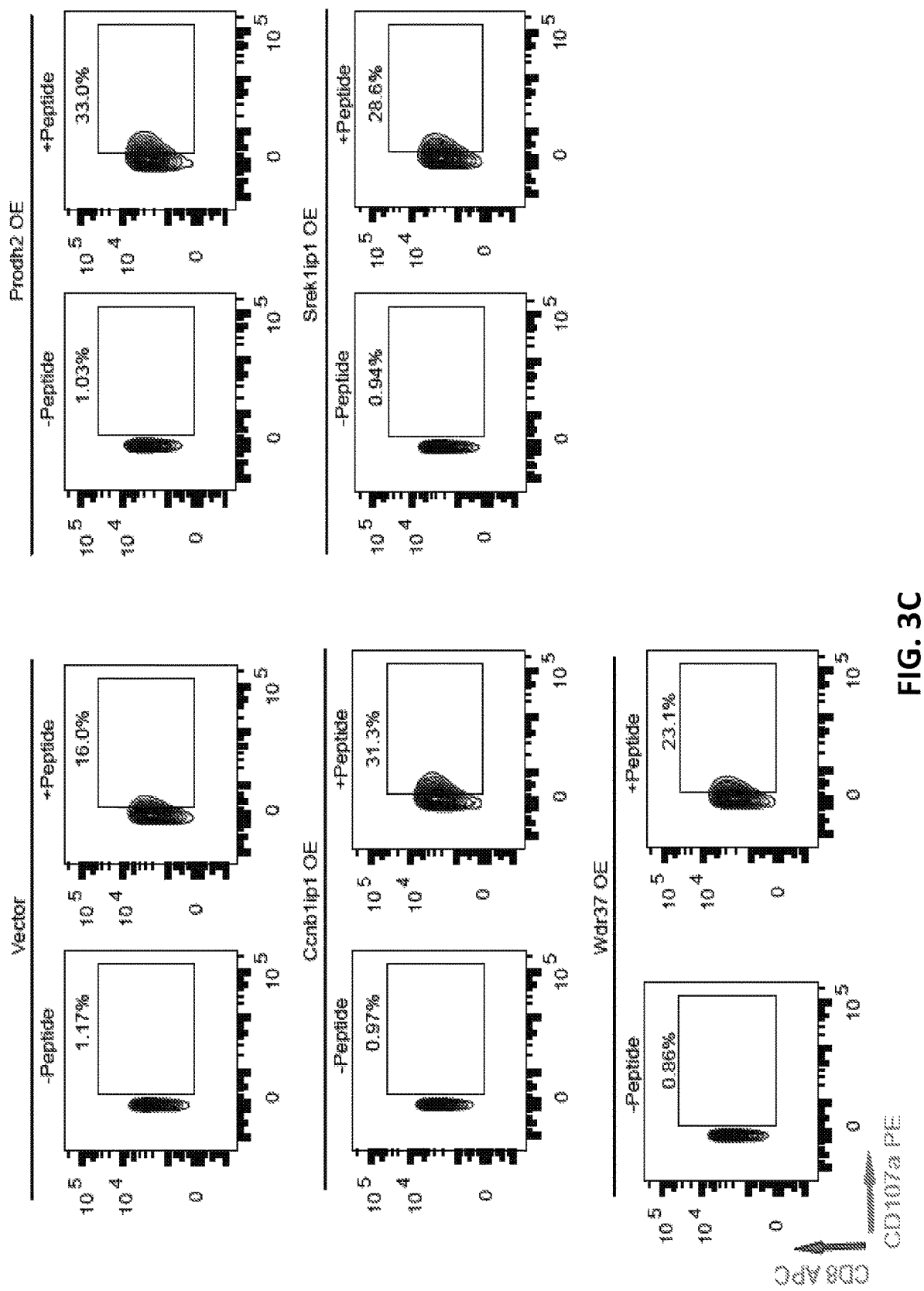
Figure 3D:
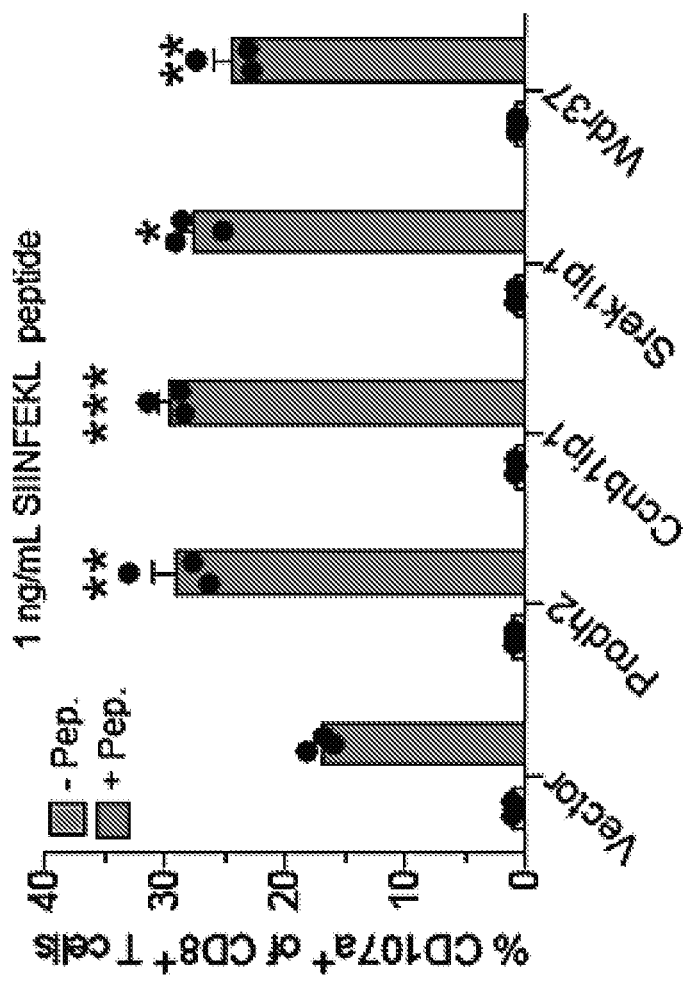
Figure 5A:
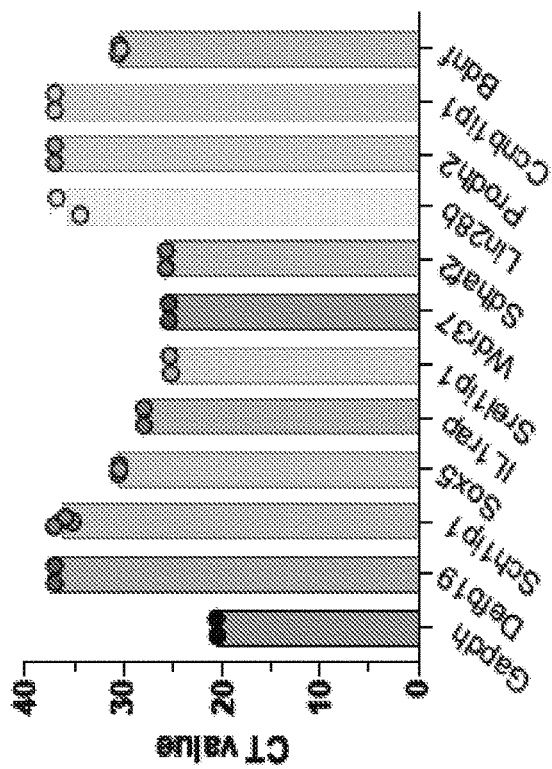
FIGS. 5A-5E illustrate CRISPR/dgRNA activation of representative candidates and kill assay validation.
Figure 5B:
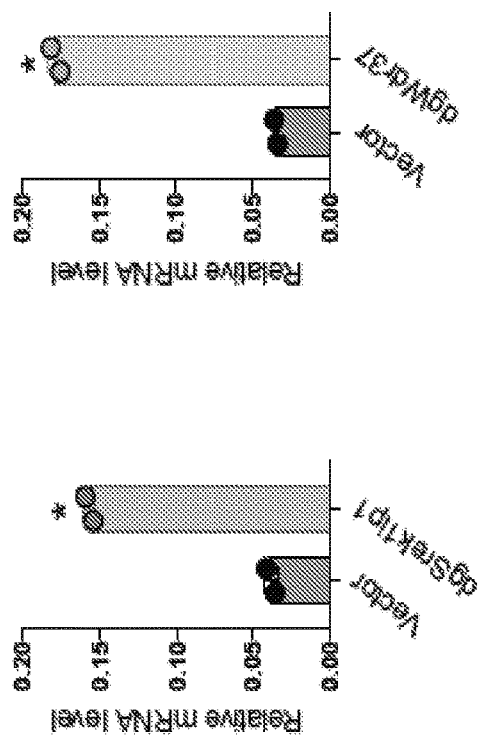
Figure 5C:
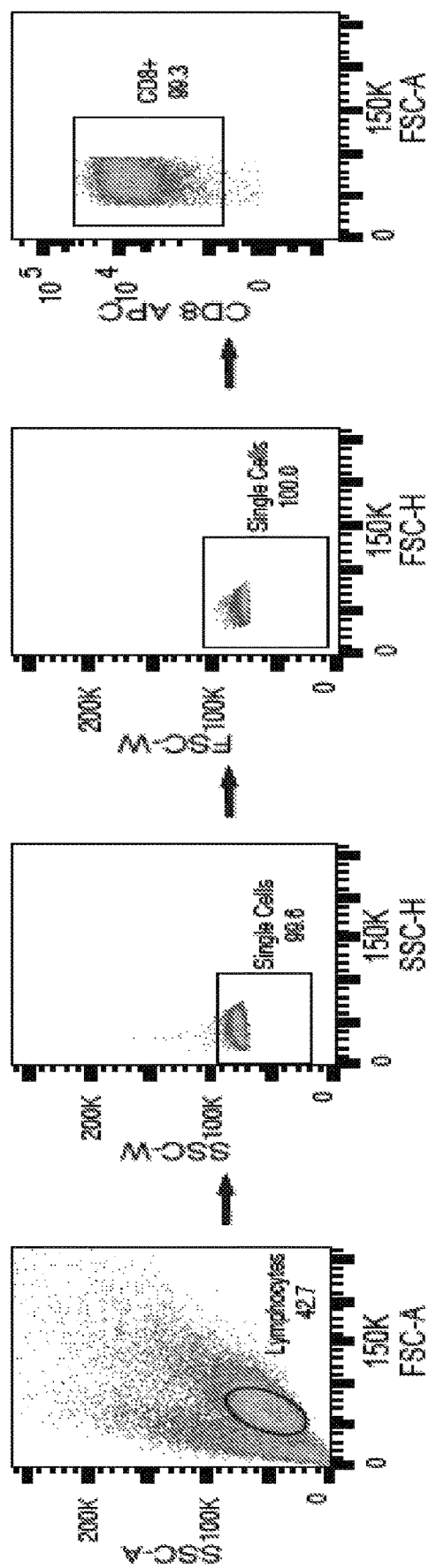
Figure 5D:
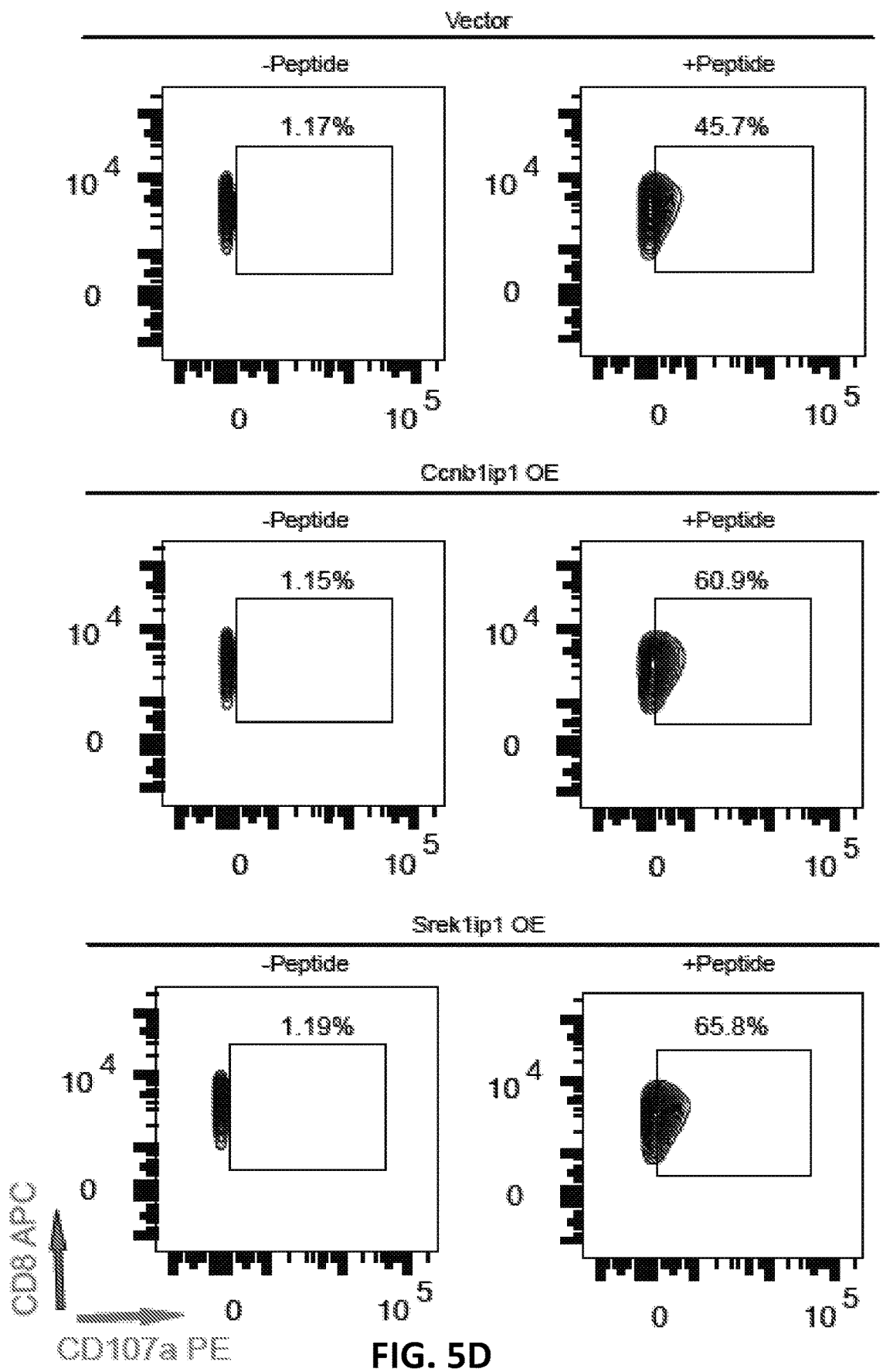
Figure 5E:
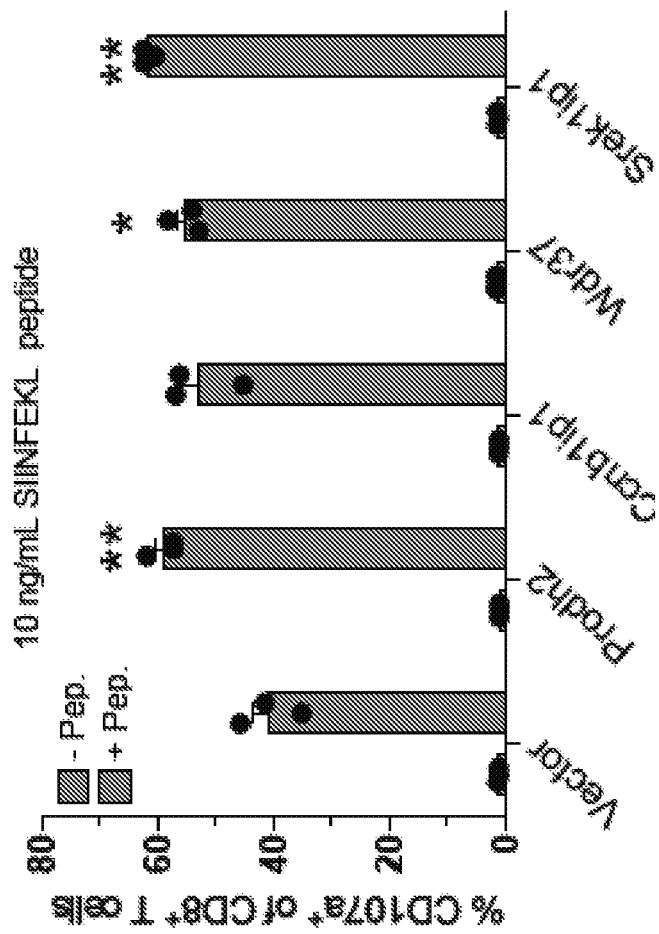

Example 3: Testing Activation of Top Candidates from dgTKS for Enhancement of CD8$^+$ T Cell Effector Function Using RT-qPCR, the natural level of expression for several high-rank candidate genes (including Defb19, Schlip1, Sox5, IL1rap, Srellip1, Wdr37, Sdhaf2, Lin28b, Prodh2, Ccnblip1 and Bdnf) were measured. Results showed that all of these genes had low levels of mRNA expression compared with a house-keeping gene Gapdh in primary CD8$^+$ T cells (FIG. 5A). Activation of Sreklip1, Wdr37 and Sdhaf2 was confirmed by a single dgRNA in CD8$^+$ T cells (FIG. 5B), yet the fold activation was modest (p<0.05 for vector vs. Sreklip1, Wdr37 or Sdhaf2). To better test these candidates' GOF phenotypes, cDNA overexpression of the entire coding region was directly leveraged. Full-length CDNAs for four top candidates, Prodh2, Ccnblip1, Sreklip1, or Wdr37, were cloned into a lentiviral overexpression vector and packaged into lentivirus (FIG. 3A). Transducing OT-I CD8$^+$ T cells with these lentiviral cDNAs led to robust and significant activation of targeted single candidate genes in 48 and 72 hours, as measured by RT-qPCR (p<0.01 for all vector vs. gene-specific cDNA comparisons) (FIG. 3B). Validation kill assays were performed 4 days after transduction. E0771 cancer cells were pulsed with 0 or 1 ng/µL SIINFEKL (SEQ ID NO. 84,614) peptide and co-cultured with single gene activated OT-I CD8$^+$ T cells, subsequently using flow cytometry to measure CD107a$^+$ (FIG. 5C). These data demonstrated that activation of Prodh2, Ccnblip1, Sreklip1, or Wdr37 significantly enhanced degranulation by CD8$^+$ T cells upon encountering SIINFEKL-pulsed cancer cells (compared to vector, p<0.01 for Prodh2, p<0.001 for Ccnblip1, p<0.05 for Sreklip1, and p<0.01 for Wdr37) (FIGS. 5C-5D). The experiment was repeated with E0771 cancer cells with 0 or 10 ng/µL SIINFEKL (SEQ ID NO. 84,614) peptide. Again, enhanced peptide-dependent degranulation was demonstrated (compared to vector, p<0.01 for Prodh2, p=0.06 for Ccnblip1 (marginal significant), p<0.05 for Sreklip1, and p<0.01 for Wdr37) (FIGS. 5D-5E). These data validated that augmented gene expression of Prodh2, Ccnblip1, Sreklip1, or Wdr37 can enhance CD8$^+$ T cell effector function, demonstrating the utility of the dgRNA-based genome-scale GOF screen for discovery of immune modulatory factors.

Example 4: Discussion

Advances in genome editing technologies have had a huge impact on basic sciences and translational medicine. CRISPR/Cas systems allow investigators to rapidly alter the genomes of virtually any eukaryotic species. In addition to enabling genomic engineering, Cas9 can be rendered catalytically inactive by mutating RuvC and HNH domains, thus repurposing Cas9 for genetic perturbation without introducing double stranded breaks (DSBs). Catalytically dead guide RNAs (dgRNAs), which are 14-nt or 15-nt in length, can be utilized to modulate gene expression without introducing DSBs at the target site. These innovations have expanded the potential applications of CRISPR technologies for genetic perturbations at the level of gene expression. High-throughput adaptations of these technologies can facilitate systematic interrogation of large numbers of genes or non-coding genetic elements for loss-of-function (LOF) and gain-of-function (GOF) screens.

GOF screens enable the identification of genes where ectopic activation produces a phenotype. By designing a catalytically dead guide RNA library, a high-throughput GOF screening using catalytically active Cas9 was enabled herein. This is particularly important because the existence of Cas9 transgenic mice means that Cas9$^+$ immune cells are readily available to be isolated and cultured at large scale. With the development of orthogonal screening technologies, the dgRNA library system may be used in conjunction with knockout systems to perform complex screens in individual Cas9+ cells.

Using a systems approach, a ranked list of GOF candidates enriched in T cells with superior effector function were unveiled. Four genes, Prodh2, Ccnblip1, Sreklip1, and Wdr37 were validated, where augmenting their expression consistently enhanced CD8$^+$ T cell degranulation. Prodh2 encodes an enzyme in proline metabolism by catalyzing the first step in the catabolism of trans-4-hydroxy-L-proline. L-arginine metabolism in T cells enhances anti-tumor activity and is linked to proline metabolism, although the latter is less well-characterized. Wdr37 encodes a member of the WD repeat proteins that are involved in a diverse set of cellular processes. Ccnblip1 encodes an E3 ubiquitin ligase that regulates the progression of the cell cycle. Sreklip1 encodes a protein that interacts with Srek1, a serine/arginine-rich (SR) splicing protein that interacts with other SR proteins to modulate splice site selection. These previously undocumented genes discovered through the dgRNA screening system herein provide a proof-of-principle for the discovery of new targets in primary T cells with relevance for cancer immunology.

Figure 6A:
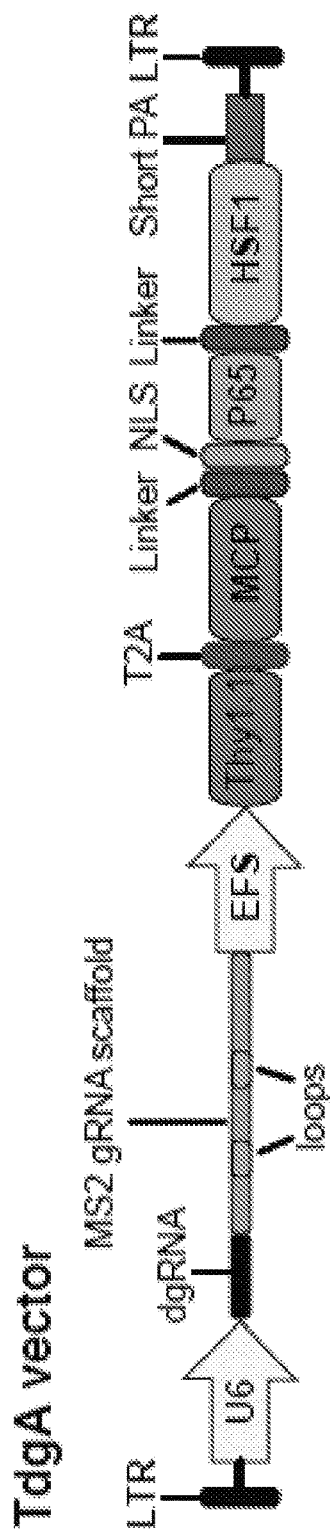
FIGS. 6A-6K illustrates genome-scale dgRNA activation screen design and identification of genes that boost the effector function of CD8+ T cells.
Figure 6B:
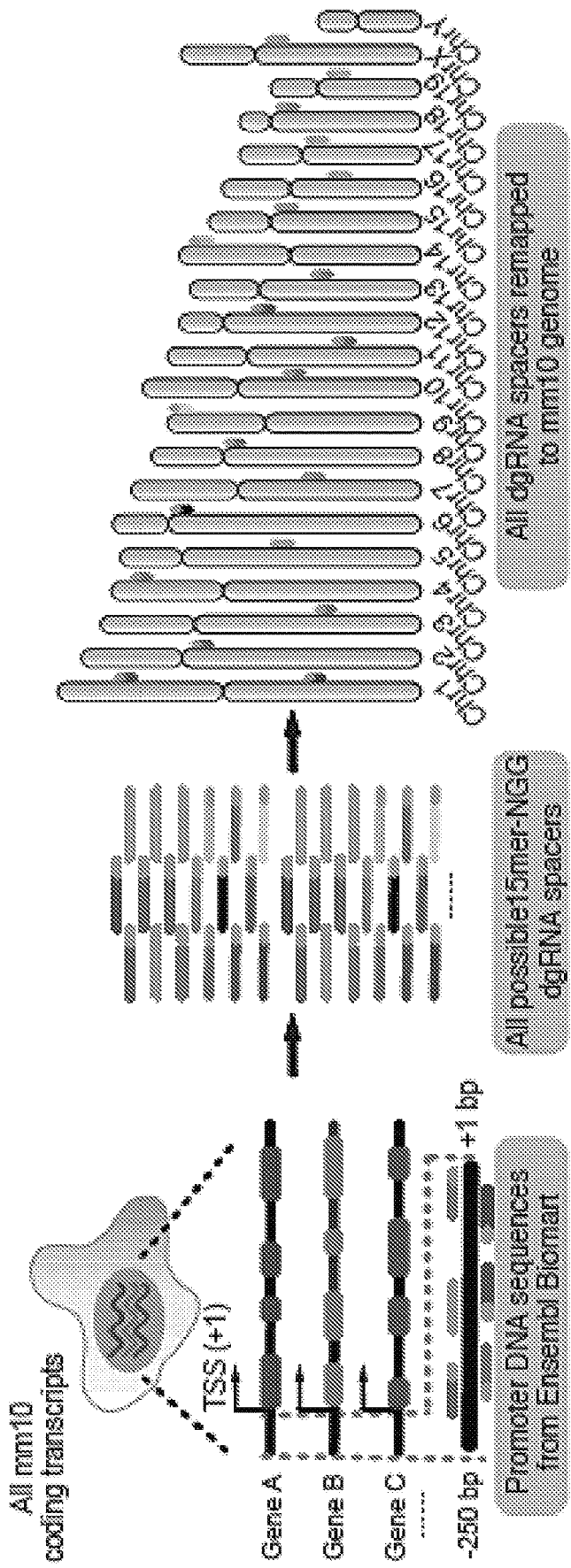
Figure 12D:
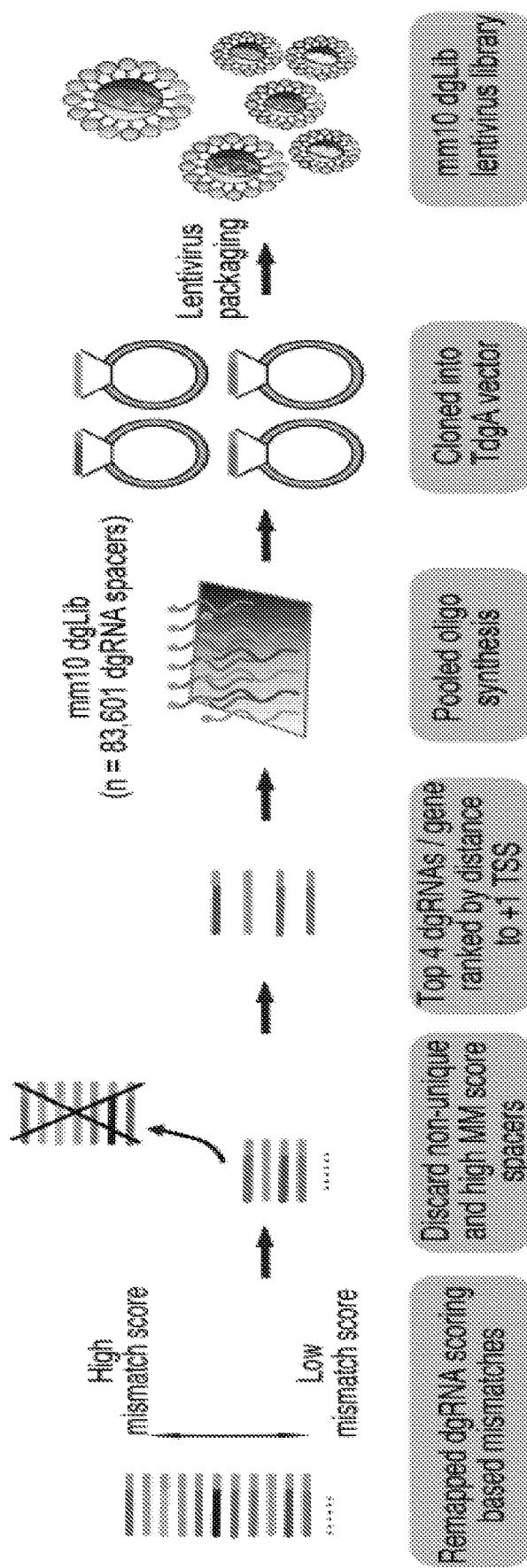
Figures 12E, 12F:
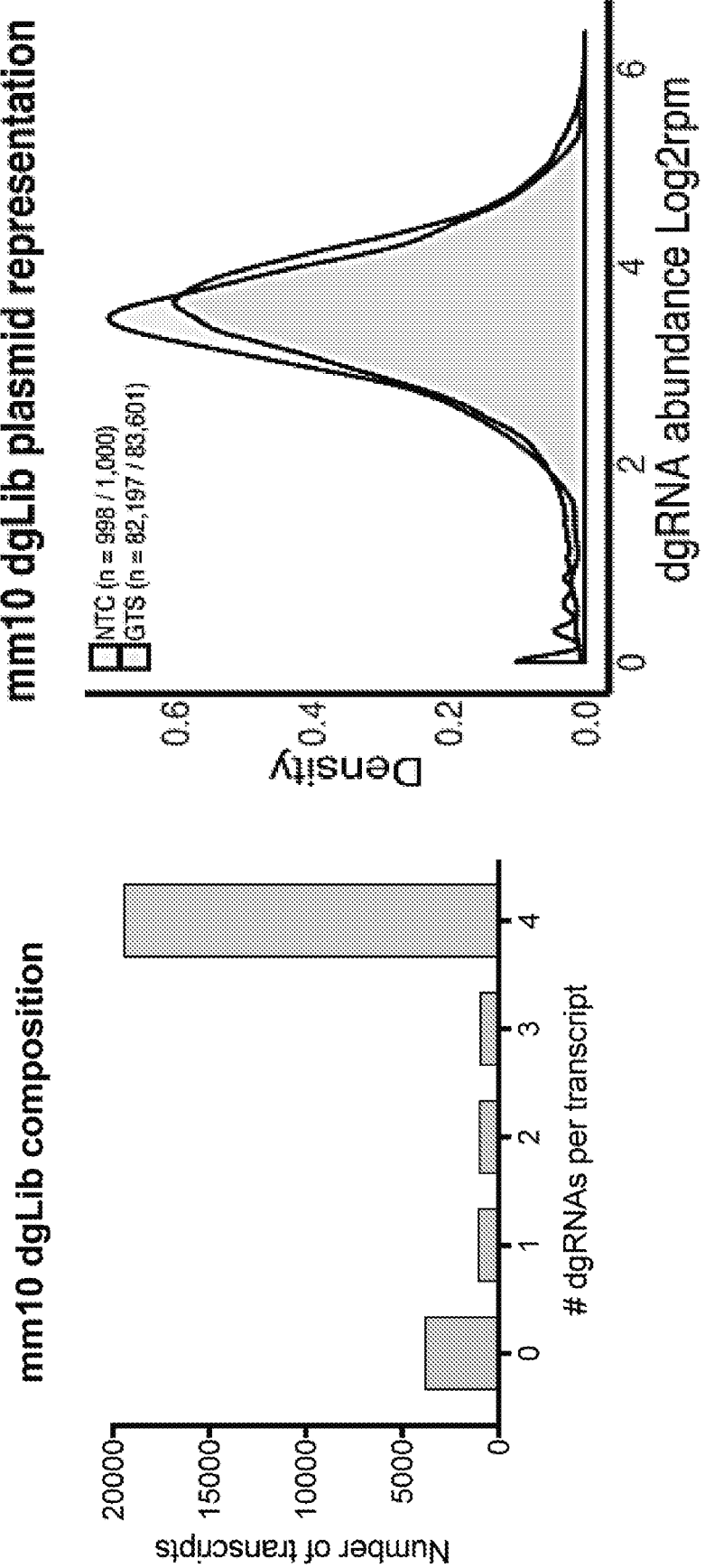
Figure 12G:
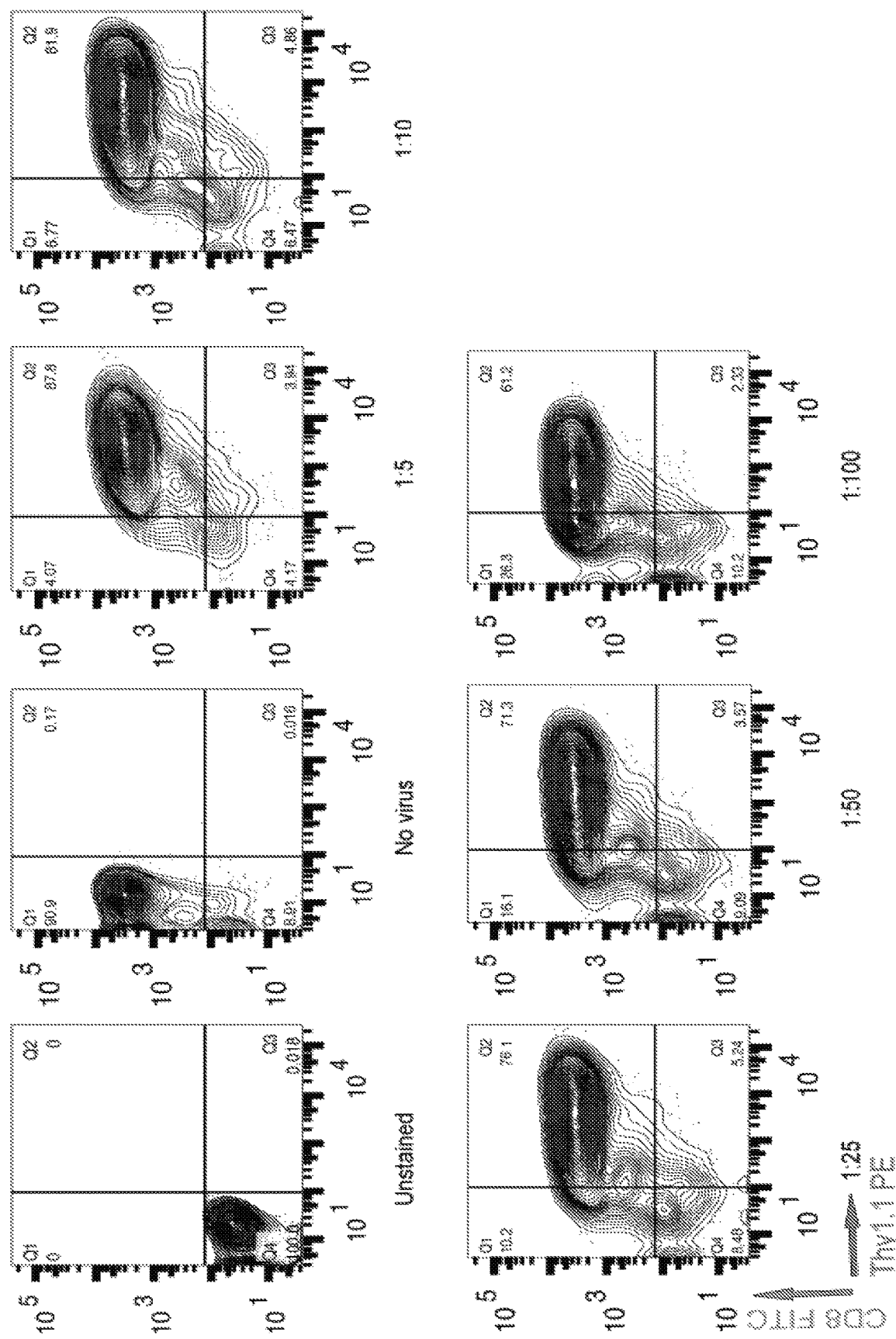
Figure 12H:
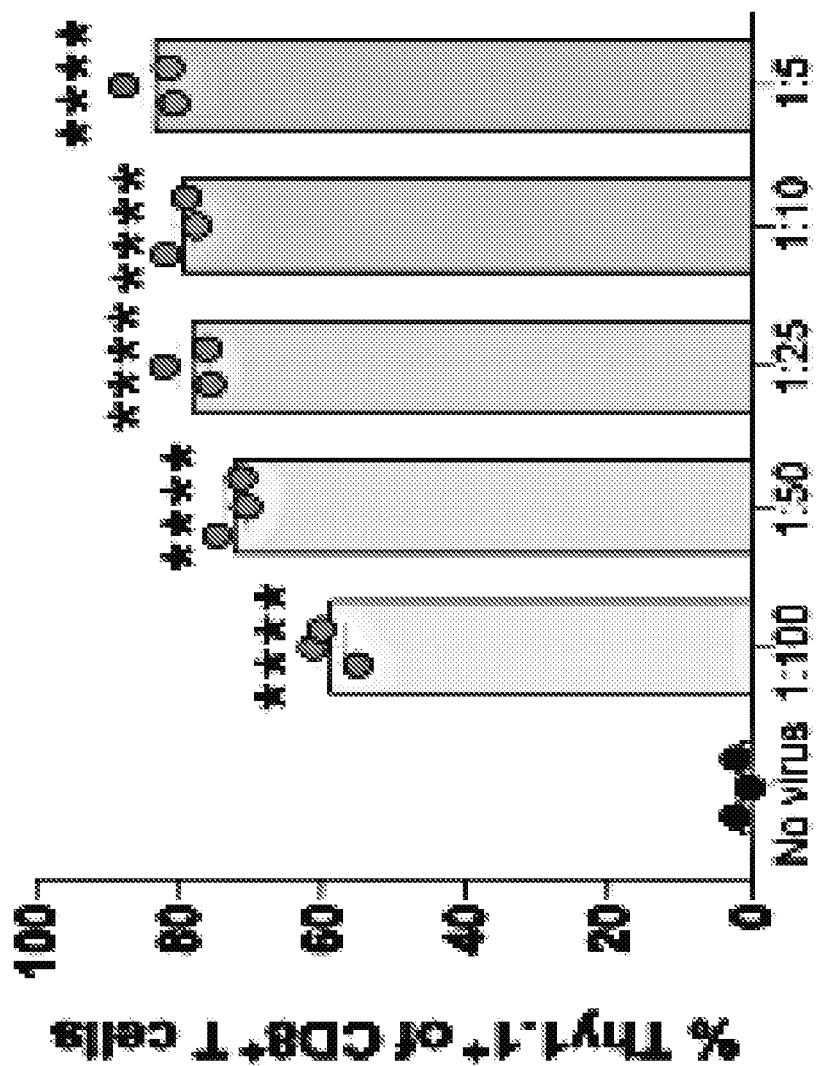

Example 5: Genome-Scale Identification of Effector Function Boosters for Primary CD8$^+$ T Cells A GOF screening approach for primary T cells was developed for unbiased identification of genes that enhance T cell effector function. Due to the challenges of introducing multiple components including Cas9, co-activators, and guide RNAs into primary T cells, the dgRNA system that with active Cas9 transgenic mice was utilized. First, a lentiviral T cell dgRNA activation (TdgA) vector (FIG. 6A) was designed and constructed. With 3 independent dgRNAs, the successful augmentation of gene expression of the mouse Hba gene in both immortalized cells and Cas9-expressing primary murine CD8$^+$ T cells was verified (FIGS. 12A-12C). A mouse genome-scale dgRNA library (mm 10dgLib) was then designed using promoter sequences of all annotated protein-coding transcripts from the mm10 genome assembly (Methods) (FIG. 6B, FIG. 12D). After spacer identification, on-target and off-target mapping and filtering, proximal score ranking, and spacer per gene choices for library balancing, the final mm10dgLib consists of 84,601 dgRNAs that target 22,391 coding transcripts and 1,000 non-targeting controls (NTCs) (Methods) (FIG. 6B, FIG. 12D), which was synthesized as a pool and cloned into the TdgA vector (FIG. 12D). The mm10dgLib plasmid library was sequenced and it was verified that 82, 197/83, 601 (98.3%) of gene-targeting spacers (GTSs) and 988/1, 000 (98.8%) of NTCs were successfully cloned, and that both GTSs and NTCs showed a log-normal distribution (FIGS. 12E-12F). The plasmid library was then packaged into lentivirus and functional titration was performed by flow cytometry to confirm adequate viral titer (FIGS. 12G-12H), enabling genome-scale activation screens for primary cells expressing catalytically active Cas9.

Figure 6C:
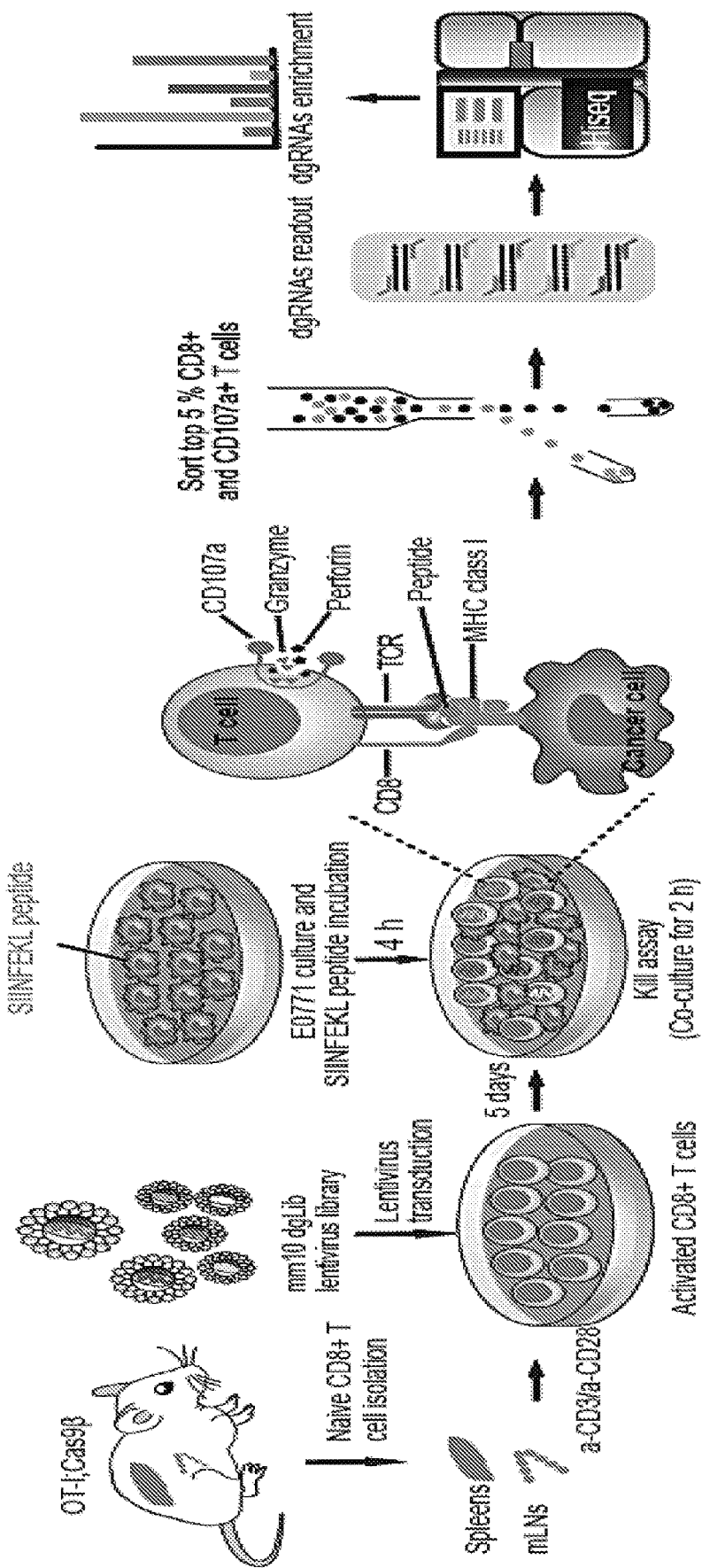
Figure 6D:
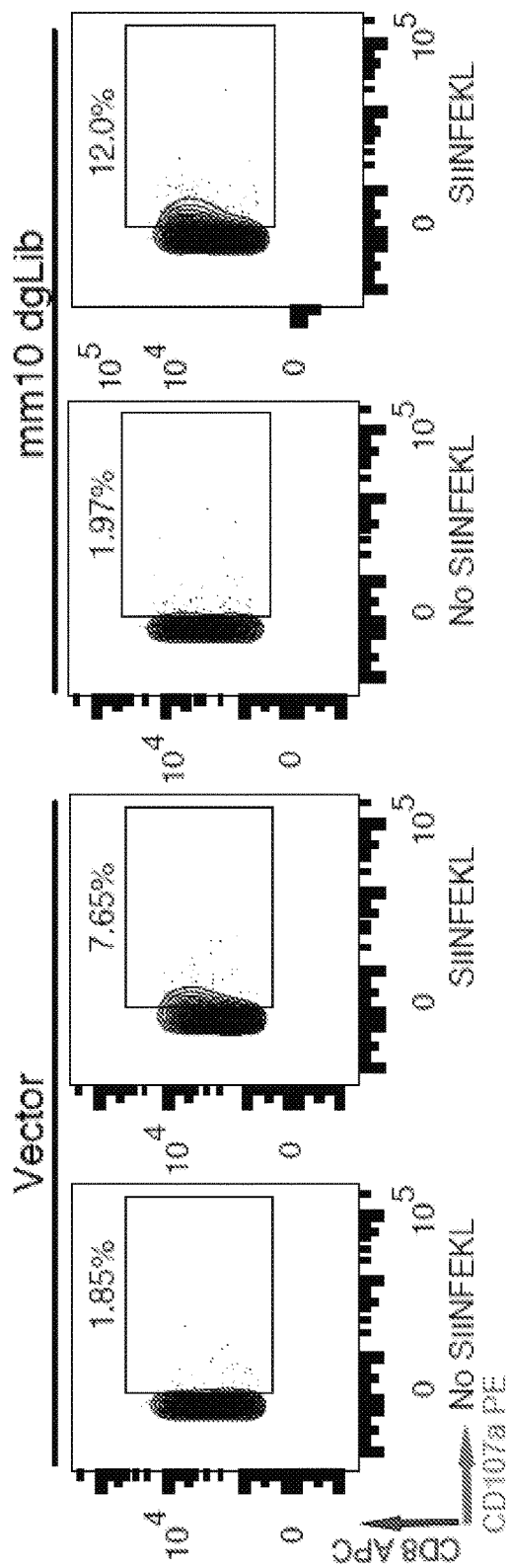
Figure 6E:
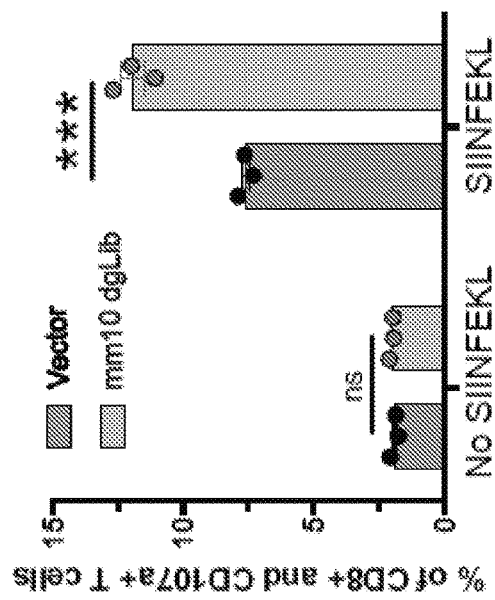
Figure 6F:
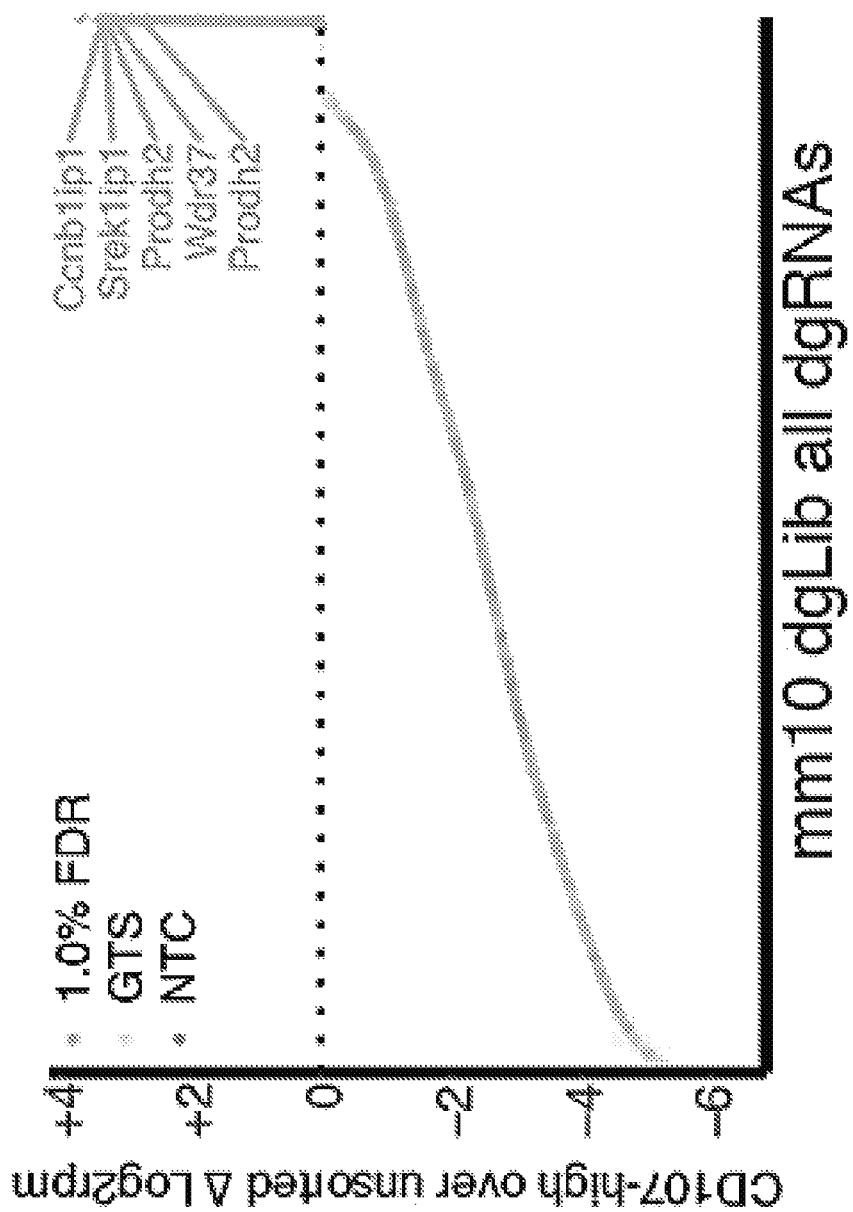
Figure 13:
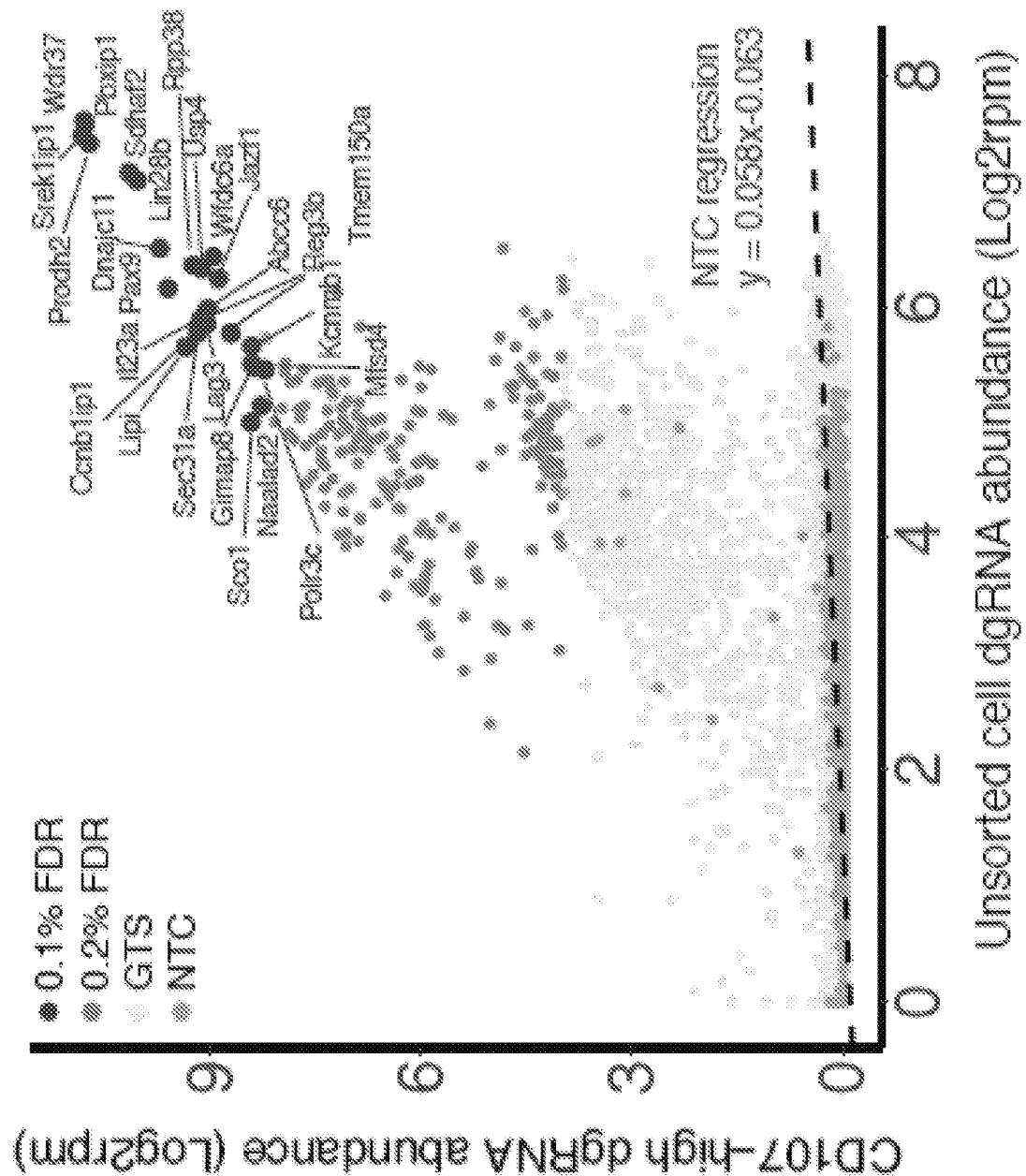
FIG. 13 illustrates bulk screen data analysis of dgTKS. The figure shows scatterplot of relative dgRNA abundances in the entire mm10dgLib library, with CD107a$^+$-high FACS sorted CD8$^+$ T cells, as compared to unsorted T cells. Blue dots are NTCs; brown dots are scoring GTSs that passed FDR 0.1% cutoff, with gene name labeled; orange dots are scoring GTSs that passed FDR 0.2% cutoff but did not pass FDR 0.1%; grey dots are remaining GTSs. Black dashed regression line of 1,000 NTCs represents a neutral baseline. GTSs deviating from the baseline showed enrichment in the CD107a"-high FACS as compared to the behavior of NTCs.

Degranulation is one of the major mechanisms through which cytotoxic CD8$^+$ T lymphocytes (CTL) mediate the killing of target cells. CD107a (LAMP-1) is a marker which can be presented on the cell surface after degranulation. To identify genes that when activated can enhance the degranulation ability of CD8$^+$ T cells after encountering their cognate antigen presented on the cell surface, a genome-scale dgRNA library-based CD8$^+$ T cell Kill assay activation Screen (dgTKS) was devised and performed (FIG. 6C). To do this, a co-culture system (kill assay) was developed in which OT-I;Cas9β CD8$^+$ T cells sensitively respond to E0771 breast cancer cells presenting SIINFEKL (SEQ ID NO. 84,614) peptide, the cognate antigen of the CD8$^+$ T cells from OT-I transgenic mice (FIG. 6C). In this system, CD107a$^+$ expression was measured among CD8$^+$ T cells co-cultured with E0771 cancer cells with or without SIIN-FEKL (SEQ ID NO. 84,614) peptide pulsing, and it was found that mm 10dgLib lentivirus transduced CD8$^+$ T cells had significantly higher CD107a$^+$ levels compared to empty vector transduced cells (p<0.001) (FIG. 6D-6E). Using fluorescence activated cell sorting (FACS), the mm 10dgLib-transduced CD8$^+$ T cells expressing a high level (top 5%) of CD107a were sorted, in three independent biological replicates, for genomic DNA preparation and dgRNA library readout (Methods; FIG. 6C). Illumina sequencing was used to read the dgRNA cassette of both CD107a$^+$-high sorted and unsorted CD8$^+$ T cells, and quantified the dgRNA abundance in the entire mm10dgLib. As a neutral baseline, it was found that the NTCs were relatively evenly distributed in the unsorted cell population, but were rarely detected in the CD107a$^+$-high CD8$^+$ T cells (FIG. 13). In contrast, there were two distinct populations of dgRNAs that deviated from the distribution and regression line of NTCs (FIG. 13). With an FDR of 0.1%, significantly enriched dgRNAs were identified in sorted CD107a$^+$-high cells targeting 26 genes, including Prodh2, Sreklip1, Wdr37, Ccnblip1, Pbxipl, and Sdhaf2 (FIG. 13). Taking a differential dgRNA calculation by subtracting CD107a$^+$-high sorted from unsorted samples, similar hits were uncovered, including Prodh2, Ccnblip1, Sreklip1, and Wdr37 (FIG. 6F). This screen revealed a global picture of GOF effects of endogenous genes on CD8$^+$ T cell degranulation and provided a ranked list of potential targets for T cell engineering.

Figure 6G:
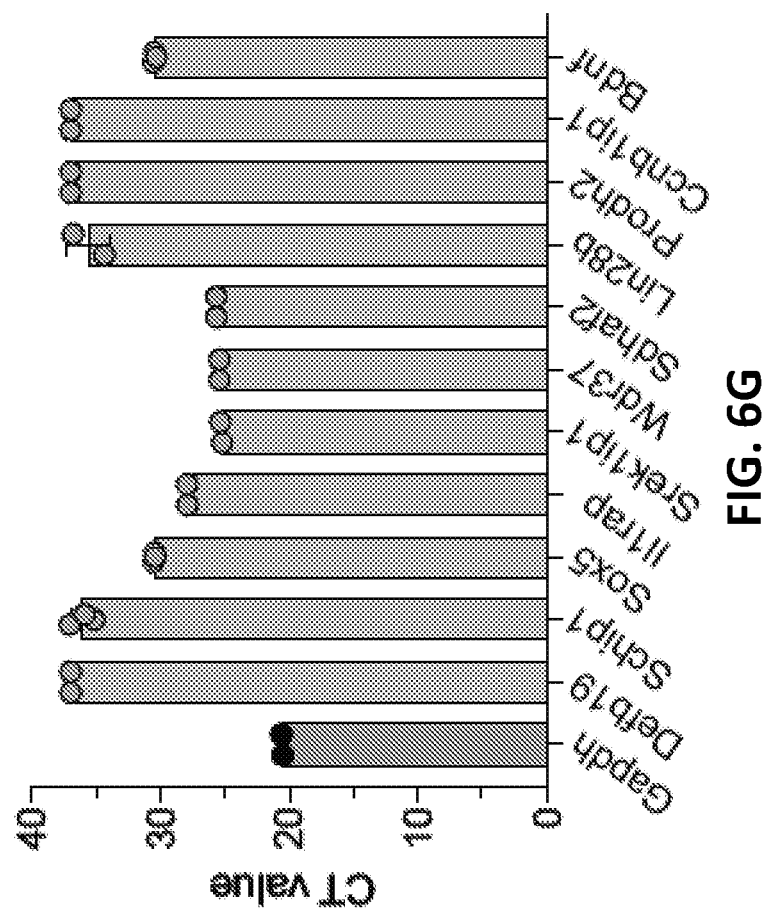
Figure 6H:
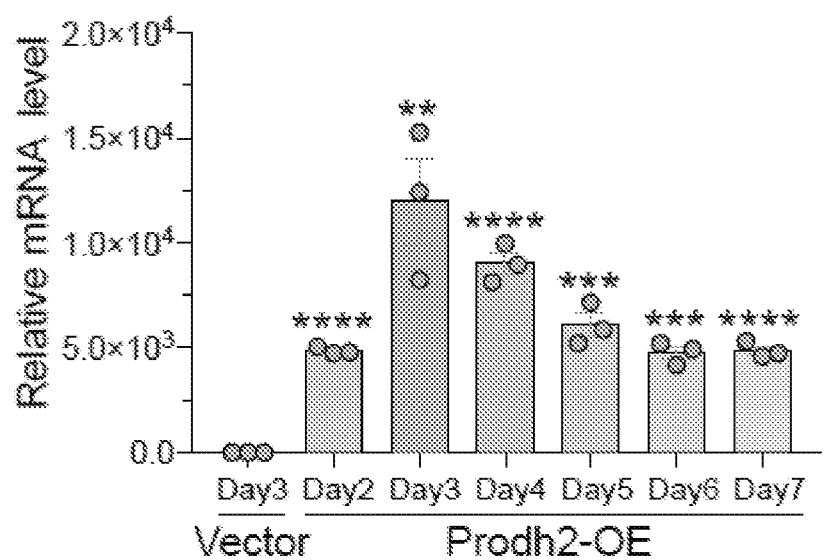
Figure 6I:
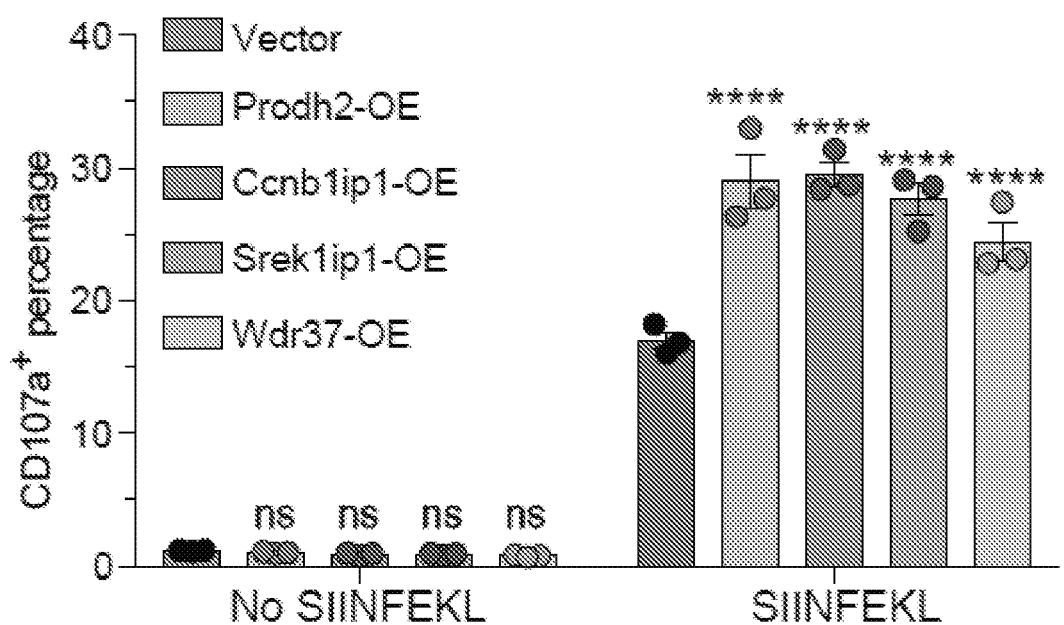
Figure 14A:
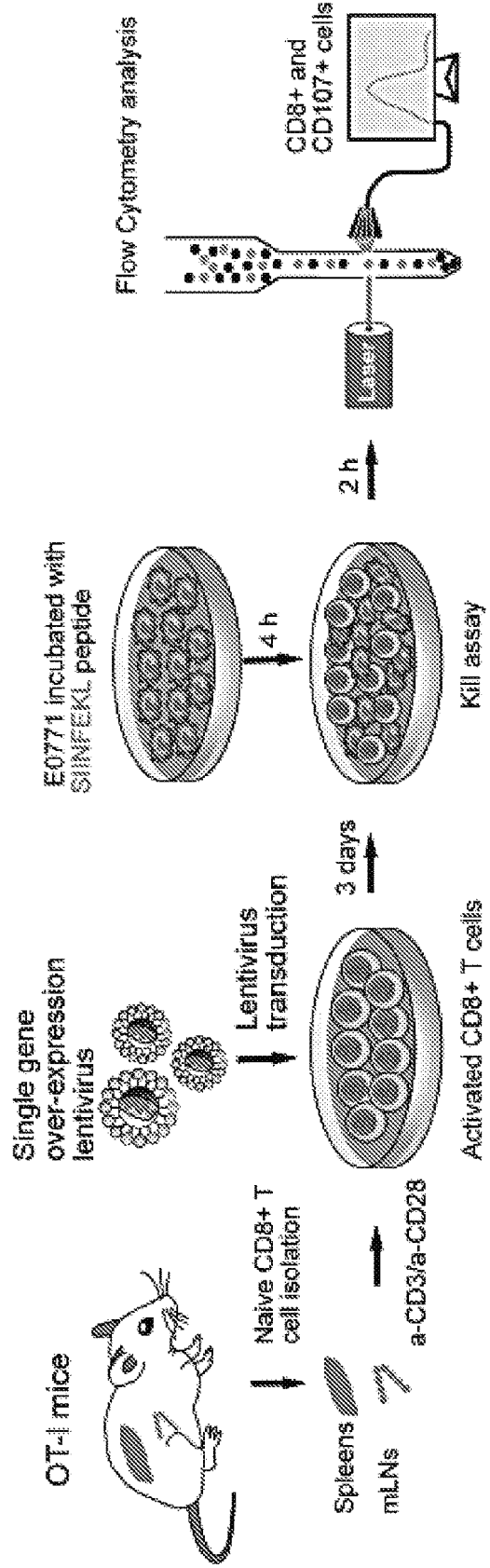
FIGS. 14A-14E illustrate testing gain-of-function of top candidates from dgTKS for enhancement of CD8$^+$ T cell effector function.
Figure 14B:
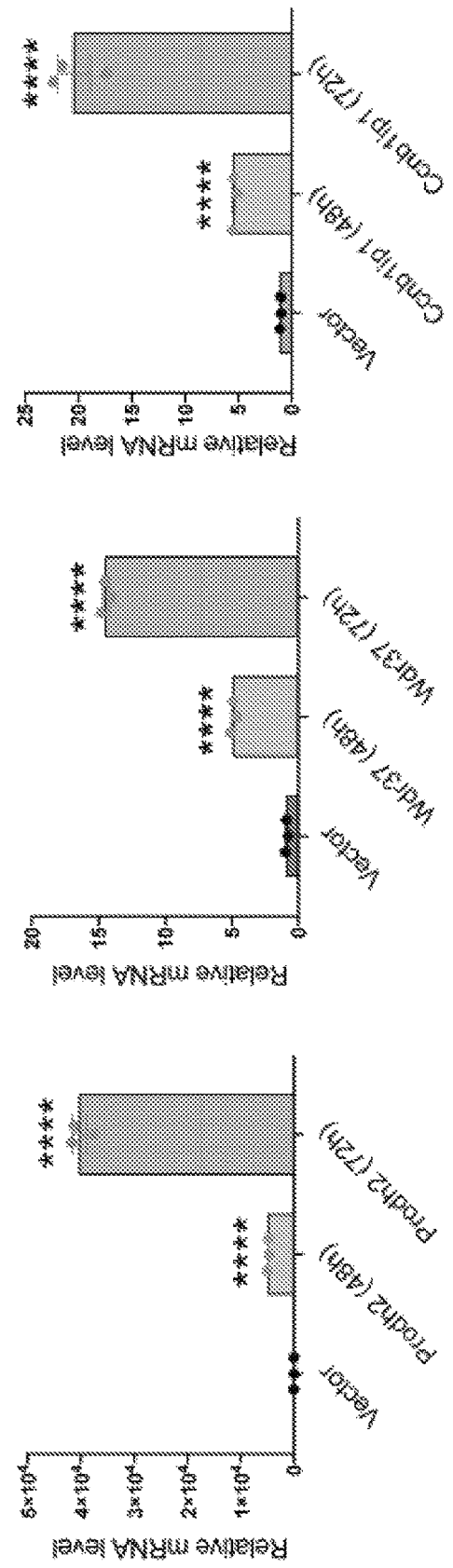
Figure 14C:
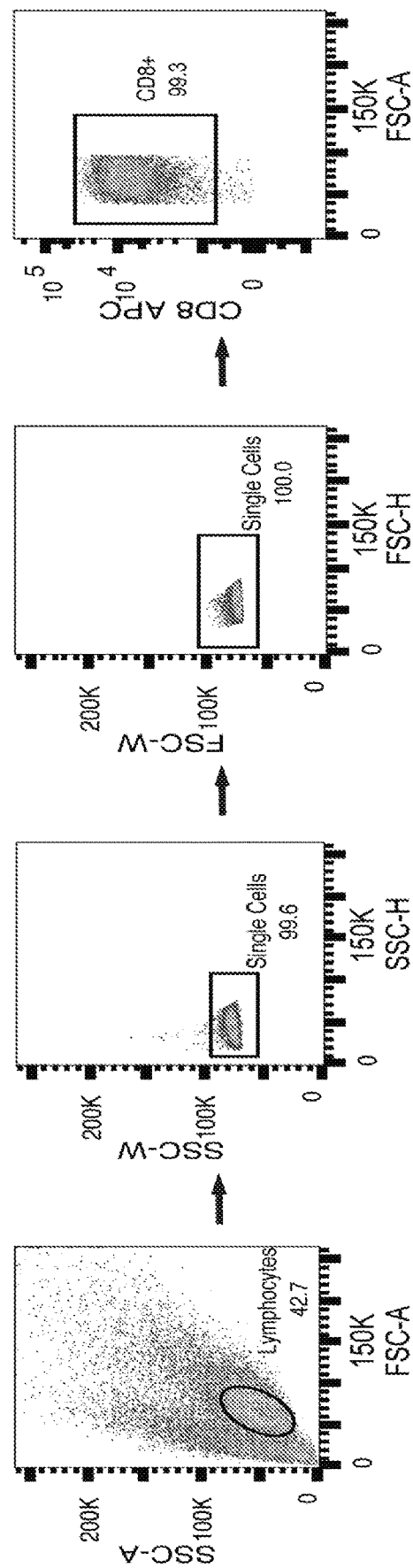
Figure 14D:
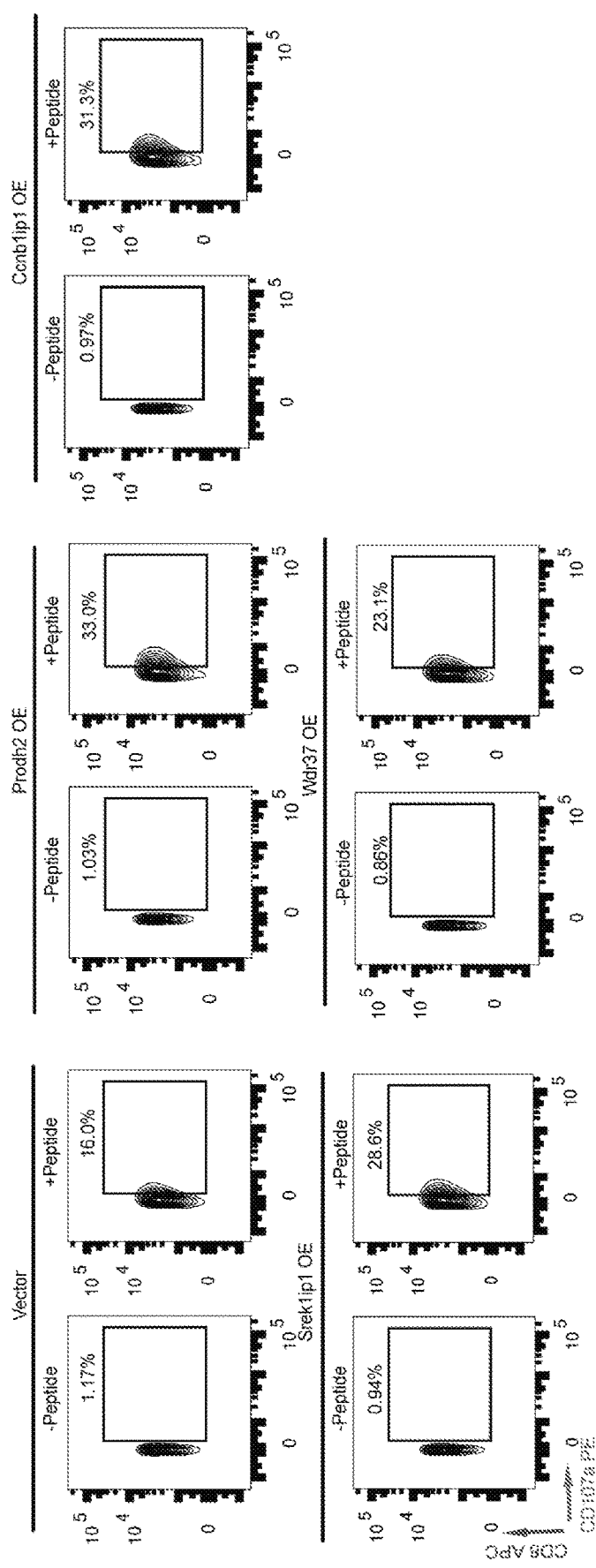

Example 6: Gain-of-Function Screen Hits from dgTKS Enhance CD8$^+$ T Cell Effector Function Without wishing to be bound by theory, based on the enrichment in the GOF screen, it was hypothesized that increased expression of high-rank candidate genes from the dgTKS screen might enhance the degranulation ability of CD8$^+$ T effector cells. Using RT-qPCR, the natural expression levels for several high-rank candidate genes, including Defb19, Schip1, Sox5, Ill1rap, Sreklip1, Wdr37, Sdhaf2, Lin28b, Prodh2, Ccnblip1 and Bdnf were measured. Results showed that all of these genes have low baseline levels of mRNA expression compared with a house-keeping gene Gapdh in primary CD8$^+$ T cells (FIG. 6G), leaving sufficient room for augmentation of gene expression for T cell engineering. After harnessing the dgRNA system's scalability for high-throughput screening, cDNA overexpression of the entire open reading frame (ORF) was directly leveraged for functional studies of individual target hits in order to (1) achieve consistently stronger fold augmentation, and (2) to enable "engineerability" in subsequent studies because knocking a short ORF into human T cells is practically simpler than the Cas9: Transactivator: sgRNA complex. Full-length cDNAs for four top candidates were cloned into a lentiviral overexpression vector and the lentivirus was packaged (Methods). It was found that transducing OT-I CD8$^+$ T cells with these lentiviral cDNAs led to robust and significant activation of targeted single candidate genes in 48 and 72 hours, as measured by RT-qPCR (FIG. 14A). A more refined time-course of gene expression on Prodh2 revealed that the transgene peaks on days 3-4 post-transduction with 8,000-12,000 fold of overexpression (FIG. 6H). Validation kill assays were performed 4 days after transduction for the four hits (Prodh2, Ccnblip1, Sreklip1, or Wdr37) and it was found that activation of each significantly enhanced degranulation by CD8+ T cells upon encountering SIINFEKL-pulsed cancer cells (FIG. 6I, FIG. 14B-14D). These data validated that augmented gene expression of Prodh2, Ccnblip1, Sreklip1, or Wdr37 can enhance CD8+ T cell effector function, providing GOF candidates for engineering improved T cell capabilities.

Figure 6K:
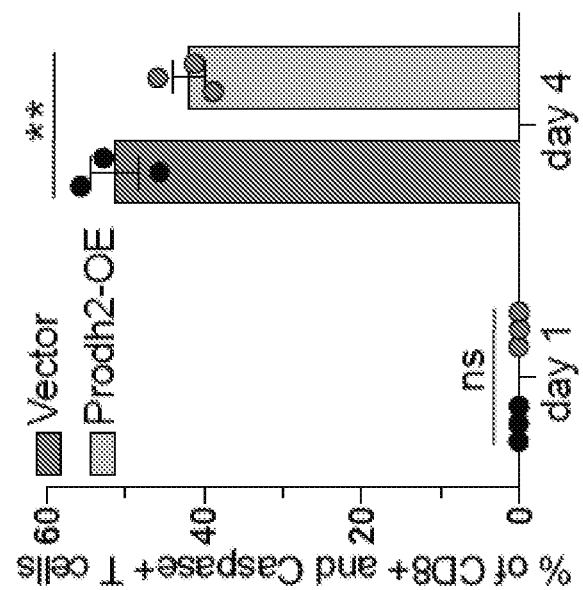
Figure 6J:
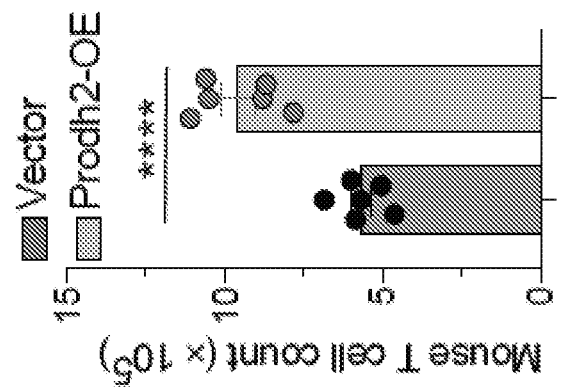
Figure 14E:

Example 7: Augmenting Prodh2 Expression Changes CD8+ T Cell Phenotypes, Enhances Anti-Tumor Activity and Dramatically Alters Transcriptional Programs Interestingly, among all targets, Prodh2-OE transduced T cells were found to proliferate rapidly in culture and it was noted that the T cell media turned yellow every day despite splitting, which was not observed in the culture of T cells that were untransduced or vector-transduced. Under the IL-2 withdrawal condition, quantification of cell numbers showed that the bulk Prodh2-OE CD8+ T cells proliferate 1.8 times faster than the vector-transduced counterparts (FIG. 6J). In addition, Prodh2-OE CD8+ T cells have lower levels of apoptosis (FIG. 6K, FIG. 14E). In vivo testing of the effect of Prodh2 overexpression on CD8 T cells' anti-tumor activity was performed using TCR-transgenic OT-I;Cas9β T cells that can recognize the cognate chicken ovalbumin (OVA) antigen (FIG. 15A). In both a subcutaneous melanoma model and an orthotopic triple-negative breast cancer (TNBC) model with clonal cell lines expressing low levels of OVA antigen, it was observed that Prodh2 overexpression significantly enhanced CD8+ T cells' anti-tumor activity in vivo (FIG. 15B-15C). This effect is consistent when using a TNBC model with cancer cells expressing high levels of OVA antigen (FIG. 15D).

Figures 7A, 7B:
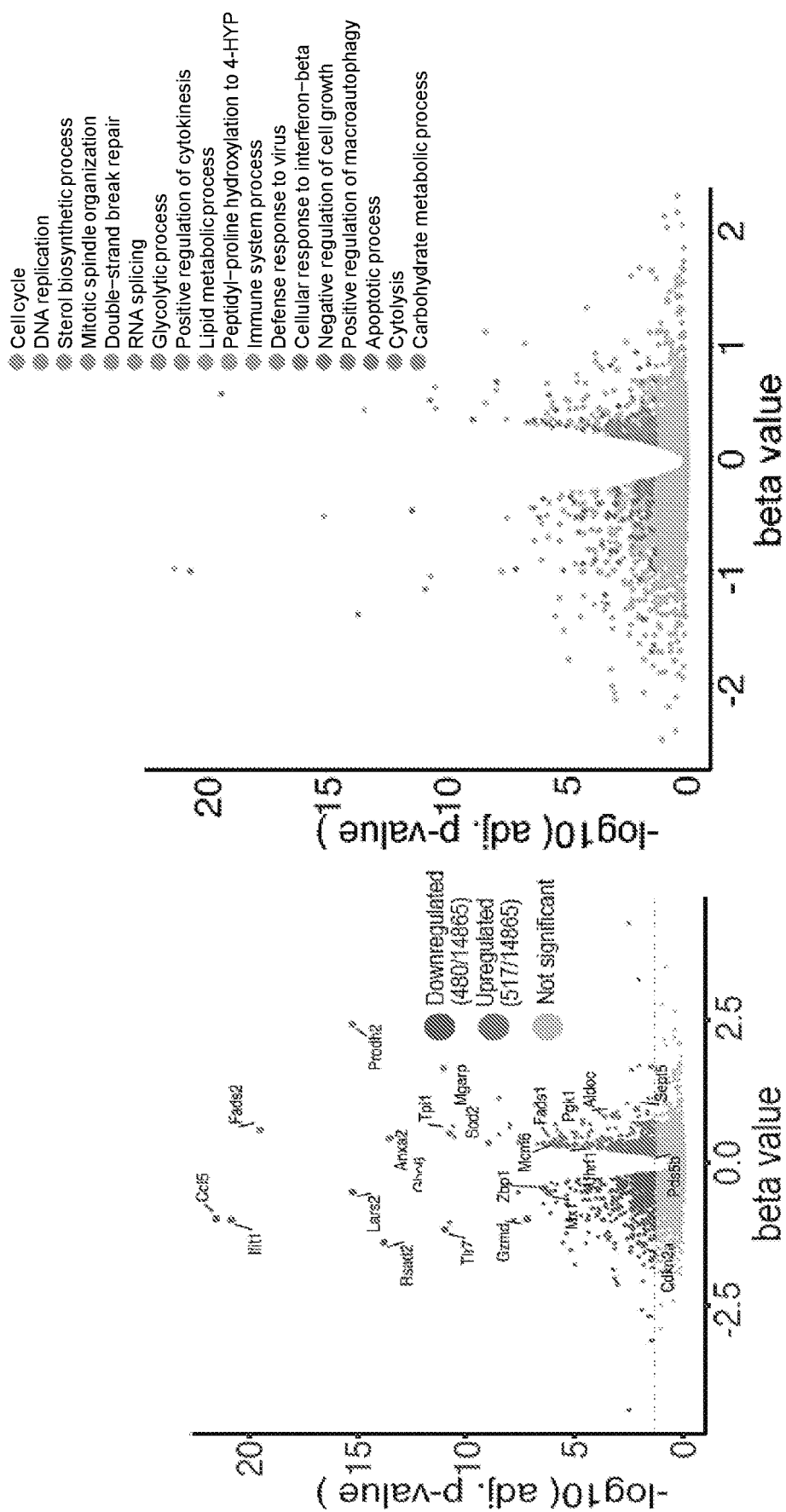
FIGS. 7A-7F illustrate that whole transcriptome profiling identified transcriptomic programs driven by Prodh2-OE in mouse primary CD8 T cells.
Figure 7C:
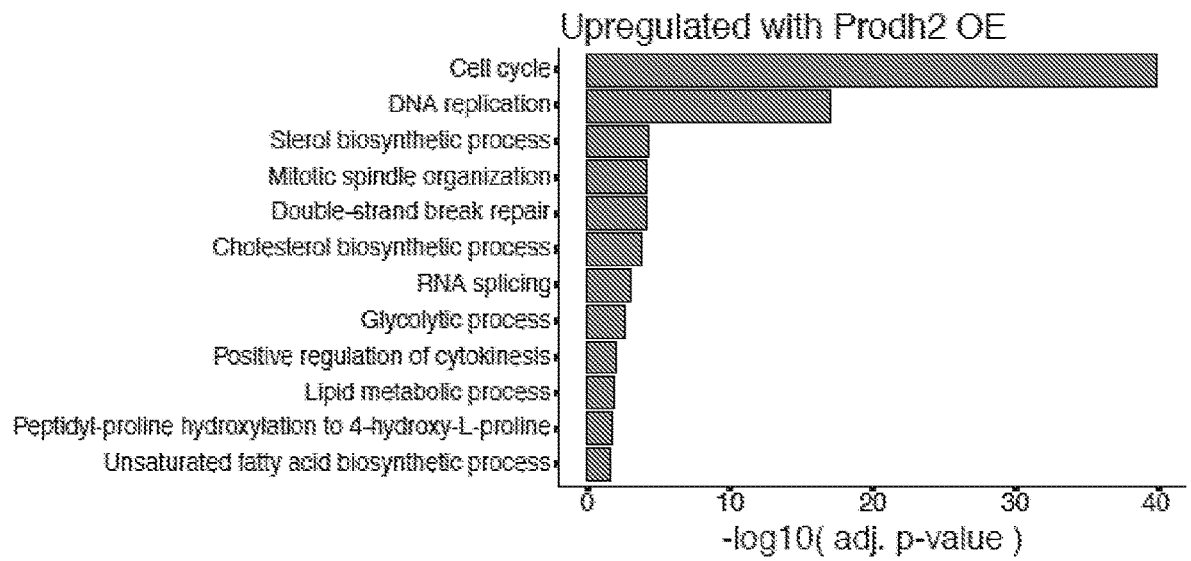
Figure 7D:
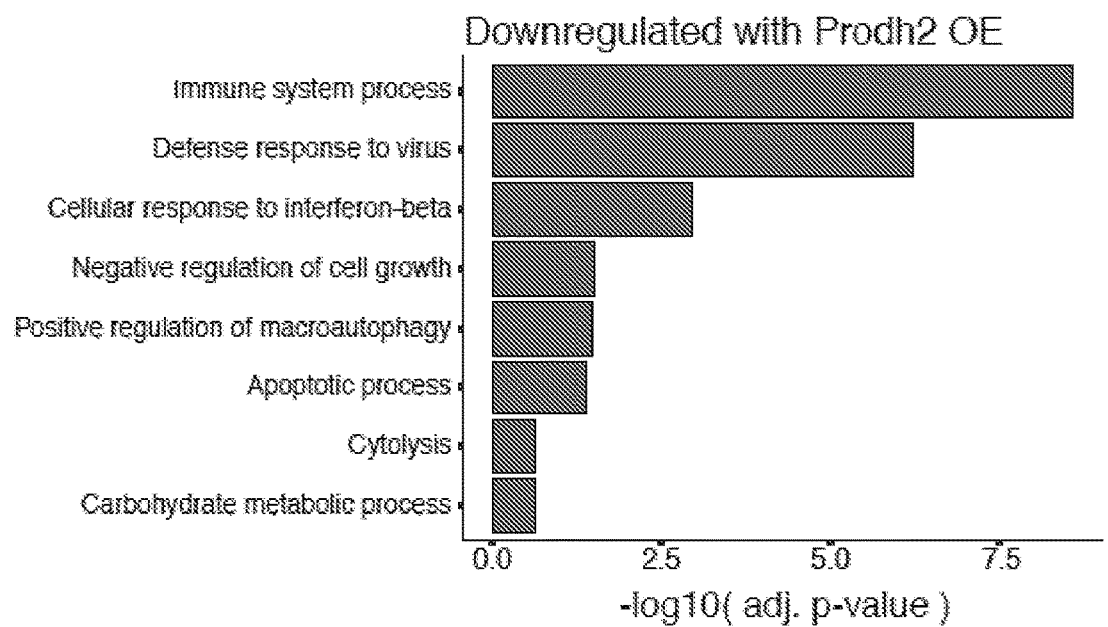
Figure 7E:
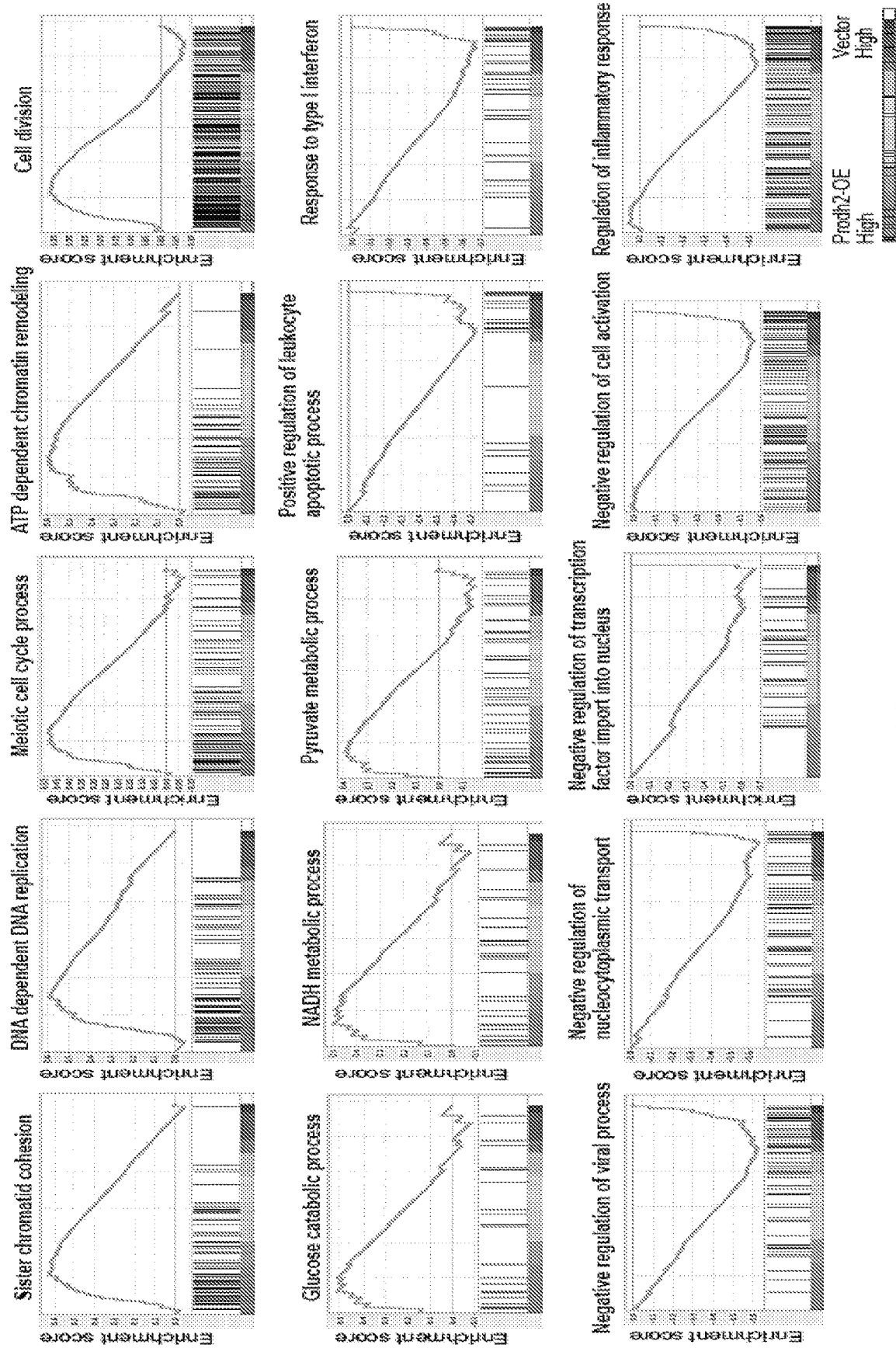
Figure 7F:
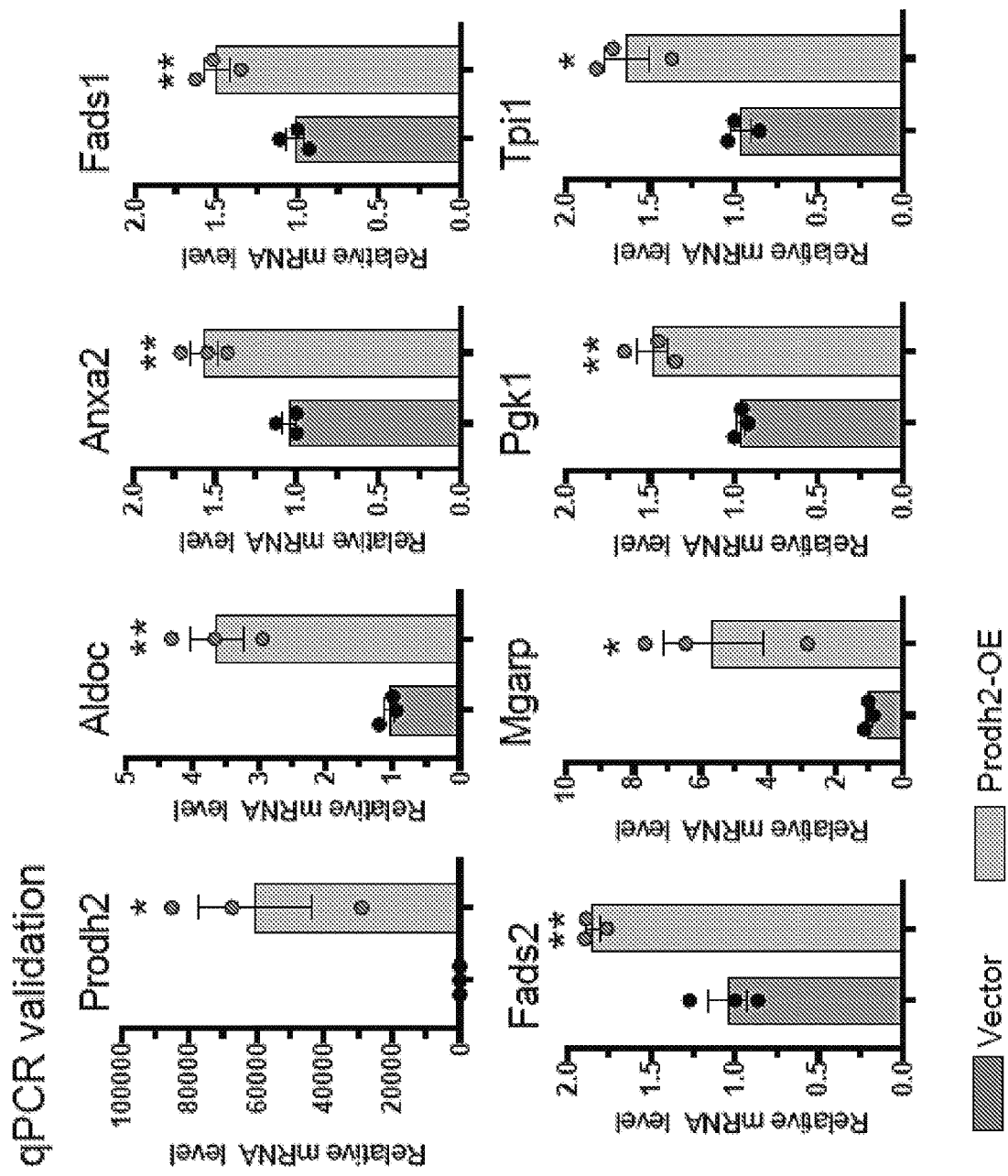

These phenotypes prompted the investigation of the molecular consequences of Prodh2 activation in CD8 T cells. To first provide a global map of the transcriptomic changes, bulk mRNA-seq was performed on Prodh2-OE mouse CD8+ T cells as compared to vector-transduced cells (Methods). Differential expression (DE) analysis revealed a broadly altered gene expression landscape upon augmentation of Prodh2, with 517 genes significantly upregulated and 480 genes significantly downregulated (FDR adjusted p value, q<0.05) (FIG. 7A), including Prodh2 as the second-most significantly upregulated genes ensuring the targeted effect of transduction (FIG. 7A). Biological processes pathway analysis of the upregulated genes revealed strong enrichment in two major transcriptomic programs: cell cycle program and the broadly-defined metabolic program (FIG. 7B-7C). On the other hand, biological processes of the downregulated genes revealed significant enrichment in immune systems processes, viral response and apoptosis (FIGS. 7B, 7D). In the cell cycle master program, a broad range of specific pathways were found to be augmented when the CD8+ T cells were supplied with high levels of exogenous Prodh2, where the populations of pathway-associated genes significantly shifted towards the Prodh2-OE direction, as revealed by gene set enrichment analysis (GSEA) (FIG. 7E). These include the pathways for cell division (sister chromatid cohesion, meiosis), DNA replication, and chromatin remodeling (FIG. 7C, 7E). In the metabolic master program, upregulated gene sets were linked to diverse metabolic pathways including proline metabolism, glucose metabolism, sterol metabolism, lipid metabolism, and fatty acid metabolism (FIG. 7C, 7E). Using qPCR, the upregulation of gene expression of multiple individual genes including Prodh2, those involved in cell cycle regulation (Anxa2), cytoskeletal function (Mgarp), as well as those involved in glucose metabolism (Aldoc, Pgk1, Tpi1) and fatty acid metabolism (Fads1, Fads2) were validated (FIG. 7F). Together, without wishing to be bound by theory, these data suggest that engineered exogenous Prodh2 expression significantly changes CD8+ T cell phenotypes, enhances anti-tumor activity and dramatically alters multiple transcriptional programs.

Example 7: PRODH2 Augmentation Alters Human CD8+ T Cell Metabolism

Figure 8D:
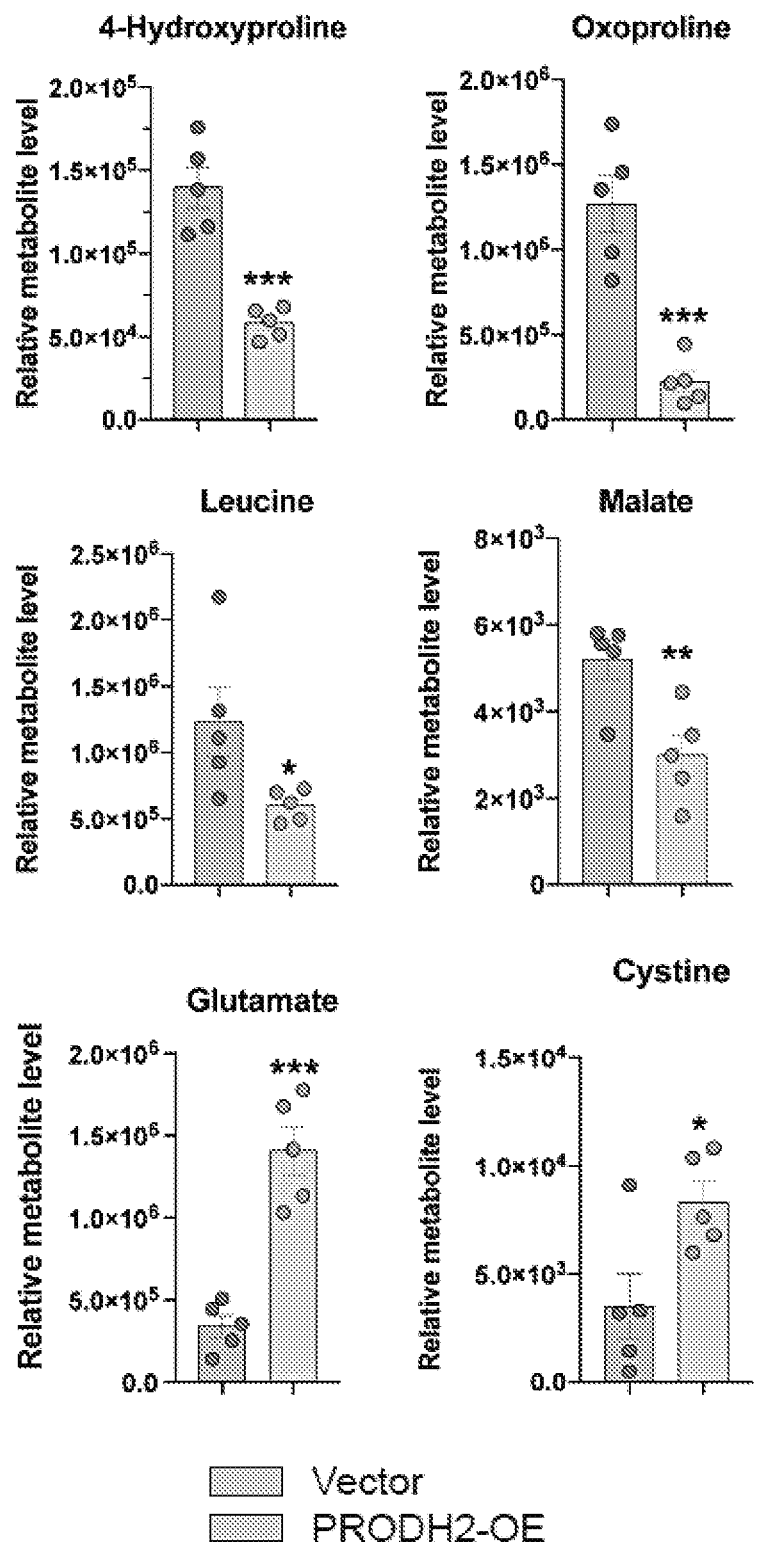
Figure 17:
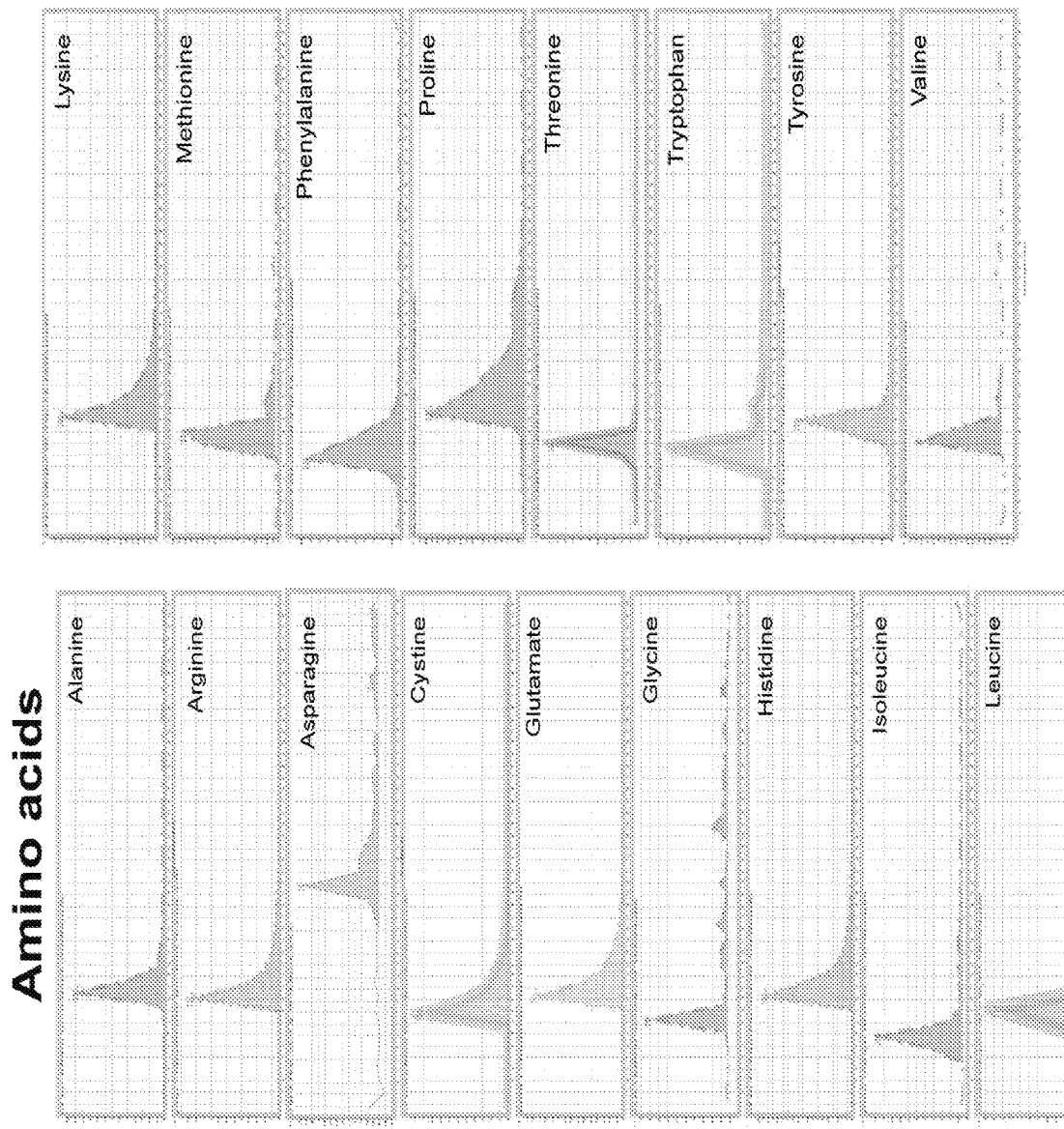
FIG. 17 illustrates representative mass-spec peaks of metabolites in T cell metabolomics analyses. The figure shows representative mass-spec peaks of metabolites in T cell metabolomics analyses, including proline metabolites, amino acids, and TCA cycle metabolites.

PRODH2/Prodh2 encodes an enzyme that catalyze the conversion of 4-Hydroxyproline (IUPAC name (2S,4R)-4-Hydroxypyrrolidine-2-carboxylic acid; Aliases: Hyp, Hydroxyproline, L-Hydroxyproline, Trans-4-Hydroxy-L-proline) into 1-Pyrroline-3-hydroxy-5-carboxylate (PHC), a key step of the proline metabolic pathway without known redundancy. This enzyme is lowly expressed across most organs or cell types in the human body, including primary CD4+ and CD8+ T cells. Although the baseline expression is low in normal tissues, Tumor Immune Dysfunction and Exclusion (TIDE) analysis of the tumor immune gene expression in human cancer showed that high level of PRODH2 is associated with stronger effective cytotoxic T lymphocyte (CTL) signatures that are beneficial for overall survival, across several solid tumor types including TNBC, melanoma, bladder cancer and lung adenocarcinoma (FIGS. 16A-16D). These features, together with the observations in mice, make it a promising candidate to be harnessed for T cell functional manipulation. Whether augmenting PRODH2 expression can change the characteristics of human T cells was then investigated (FIG. 8A). An overexpression construct for human PRODH2 (hPRODH2-OE) was generated, and a potent augmentation of 75-fold gene expression over endogenous level in human primary CD8+ T cells was confirmed (FIG. 8B). The human T cells with augmented PRODH2 also proliferated significantly faster than vector control (FIG. 8C), suggesting a conserved growth phenotype. A targeted metabolomics experiment focused on proline and arginine metabolism was then performed (Methods) (FIG. 8A, FIG. 17). In hPRODH2-OE CD8+ T cells, it was observed that 4-Hydroxyproline levels were significantly decreased, and the PHC level was significantly increased (FIG. 8D), suggestive of an increased level of biochemical activity consistent with the augmented gene expression. Moreover, hPRODH2-OE CD8+ T cells have significantly lower levels of metabolites including oxoproline, ornithine, pyruvate, aspartate, leucine, malate and oxaloacetate; and higher levels of metabolites including choline, glutamate, cysteine and lactate. Without wishing to be bound by theory, these data suggested that elevation of PRODH2 level in human CD8+ T cells significantly changed their proliferation and metabolism.

Example 8: PRODH2 Genomic Knockin Boosts CAR-T Cell Effector Function

Figure 9A:
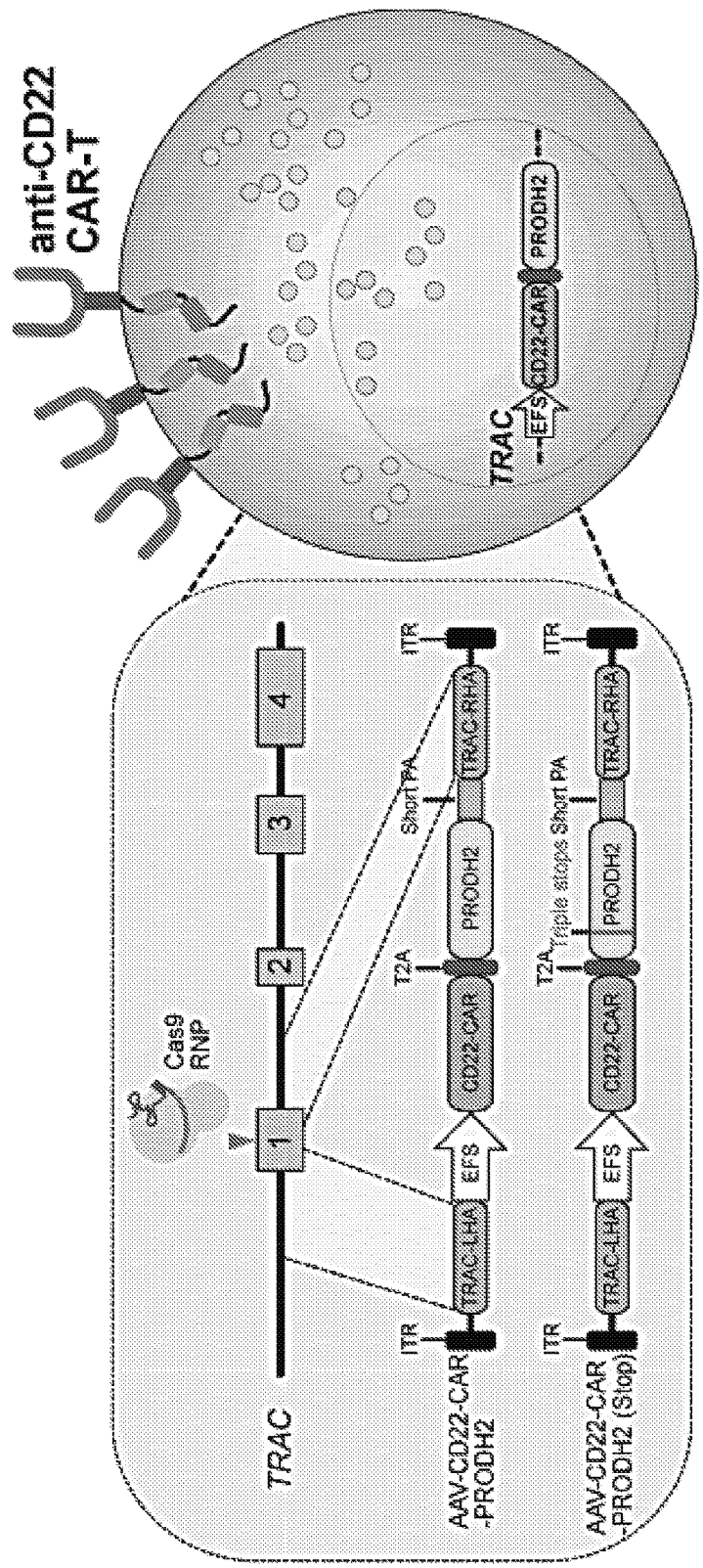
FIGS. 9A-9D illustrates that genomic knockin of PRODH2 boosts the effector function of CD22-specific CAR-T.
Figure 9B:
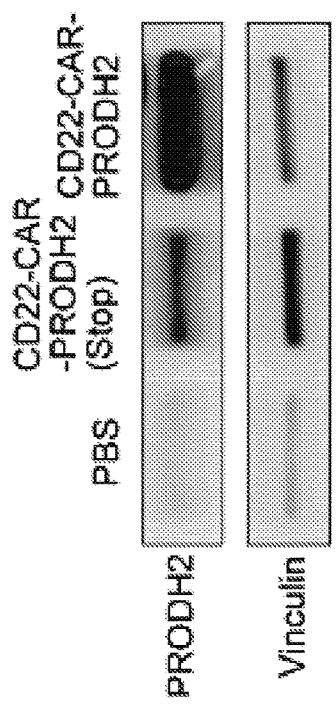
Figure 9C:
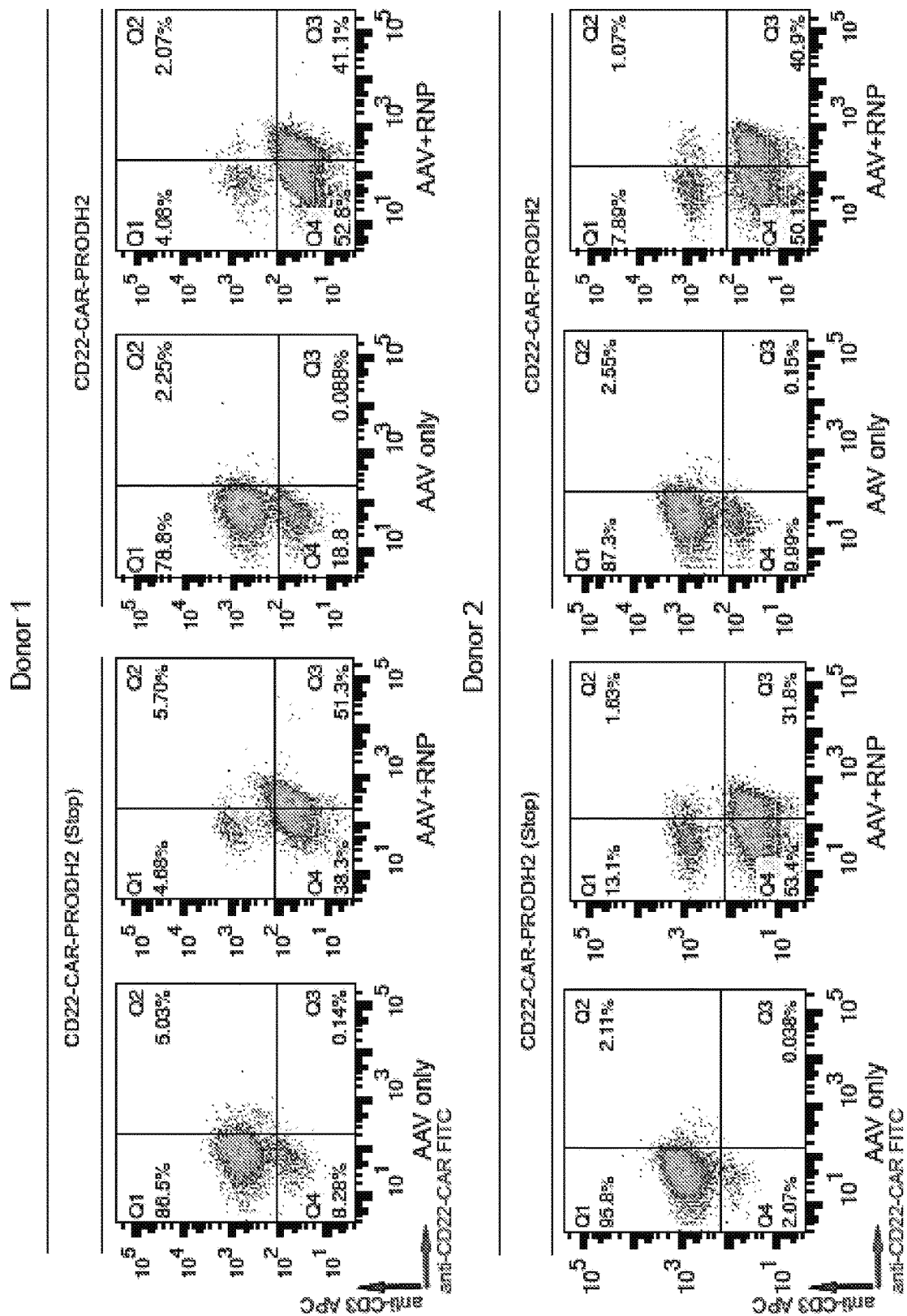
Figure 9D:
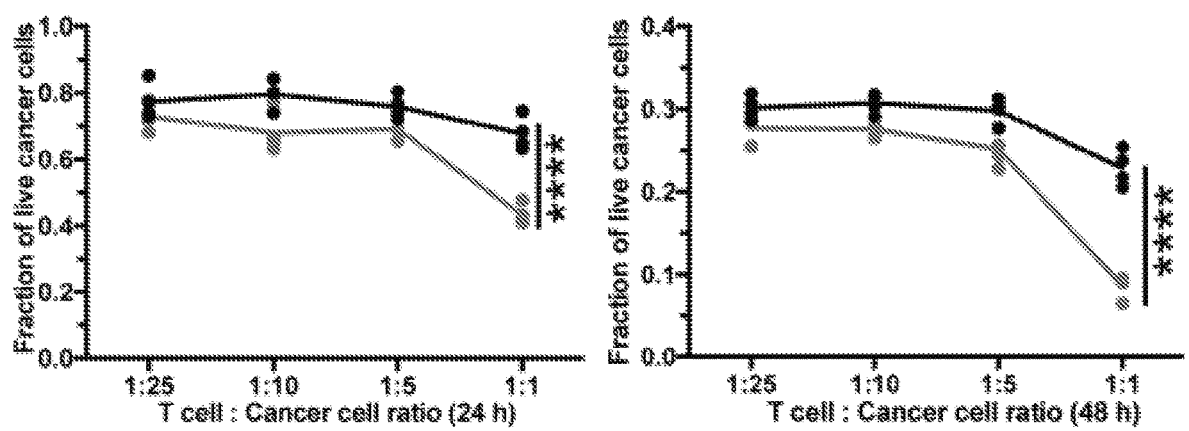
Figure 9D:
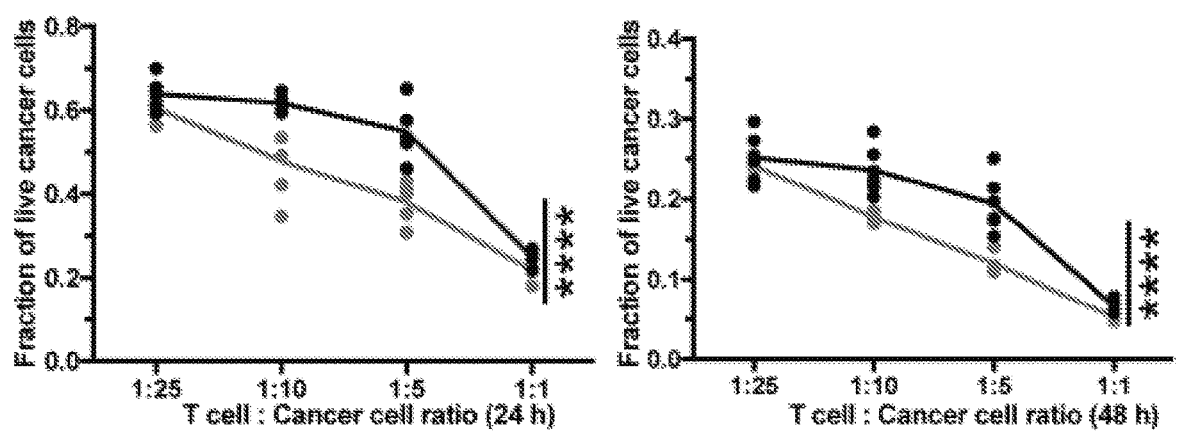
Figure 22:
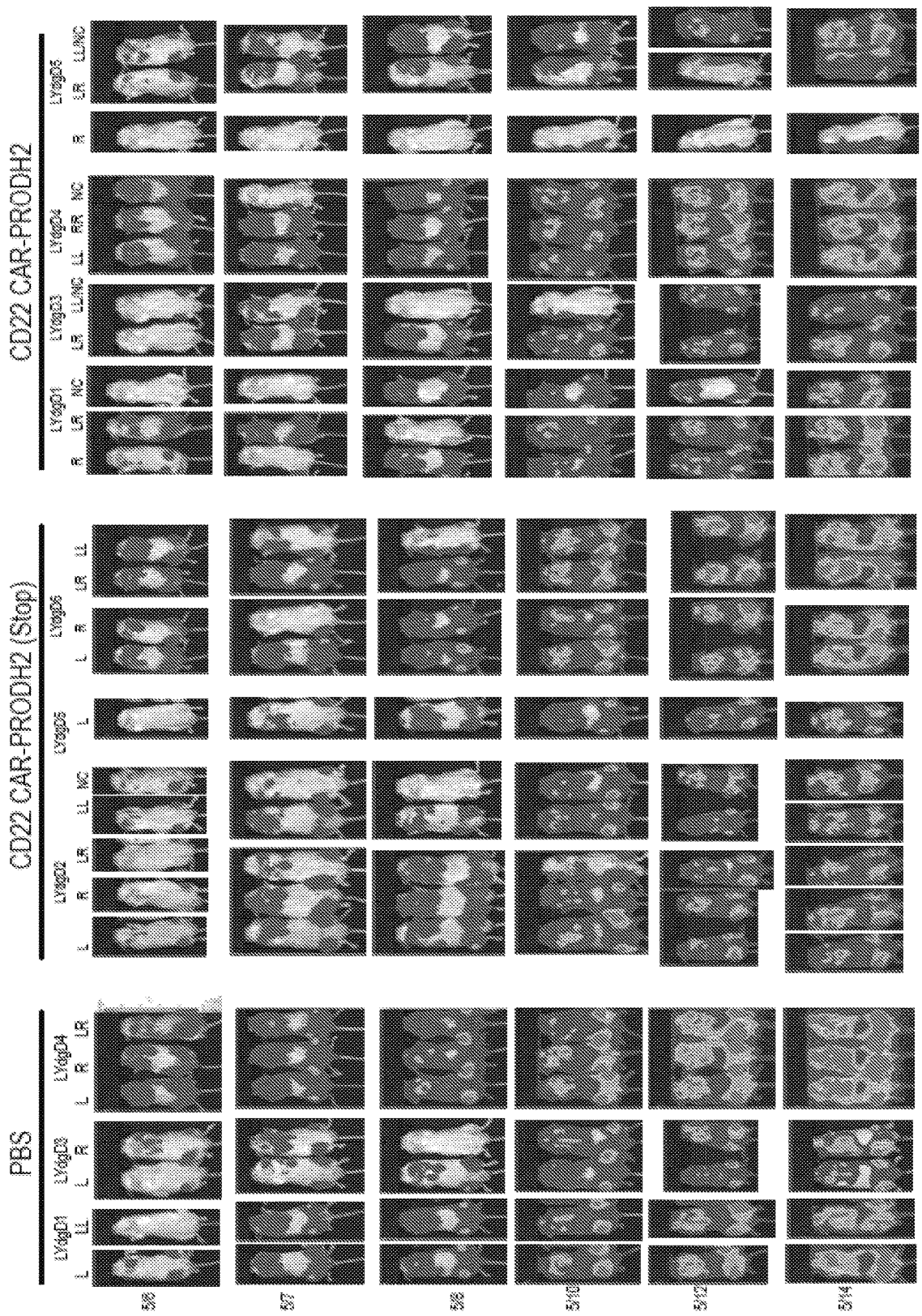
FIG. 22 is a series of images illustrating the in vivo efficacy testing of PRODH2-knockin CAR-T IVIS imaging pictures of NALM6-GL cancer cell injected NSG mice treated with PBS, CD22 CAR-T cells with PRODH2 (Stop) knockin, or CD22 CAR-T cells with PRODH2 knockin. Each column is an individual mouse in a matched manner. Each row is a time point.

To harness the function of PRODH2 to program T cells relevant to cell therapy, PRODH2 and CAR were co-engineered in human T cells. An anti-CD22 CAR (CD22-CAR) AAV construct specifically targeted to the TRAC locus was generated, with simultaneous knockin of the PRODH2 transgene (AAV-CD22-CAR-T2A-PRODH2), to allow simultaneous expression of CD22-CAR and PRODH2 in the same T cells (FIG. 9A). In parallel, for functional studies, because untargeted primary cells or CAR-T cells without any other transgene are imperfect controls, a matched control was generated with a prematurely stopped PRODH2 CDS (AAV-CD22-CAR-T2A-PRODH2 (Stop)) (Methods) (FIG. 9A). With electroporation of Cas9 ribonucleoprotein (RNP) targeting TRAC exon 1 followed by transduction of the AAV constructs, these transgenes were introduced into the endogenous TRAC locus of primary CD8 T cells to generate CD22-CAR;PRODH2 stable knockin CAR-T cells, as well as the CD22-CAR;PRODH2 (Stop) control knockin CAR-T cells (Methods) (FIG. 9A). Western blot analysis showed that CD22-CAR;PRODH2 knockin CAR-T cells express dramatically higher PRODH2 protein as compared to the endogenous level of untransduced primary $CD8^+$ T cells (FIG. 9B). Of note, PRODH2 protein is also detected in the CD22-CAR;PRODH2 (Stop) control knockin CAR-T cells (FIG. 9B), potentially due to baseline translational read-through or upregulated endogenous level, although still much lower than that of CD22-CAR;PRODH2 knockin as a direct comparison. Flow cytometry analysis of both AAV knockin constructs in the $CD8^+$ T cells from two human donors showed a near-complete TRAC editing by Cas9 RNP, as evident by the level of surface CD3 (FIG. 9C), as CD3 and TCR form a functional complex. CD22-CAR flow analysis showed that the bulk knockin efficiency of CD22-CAR;PRODH2 was at 41% for both donors; and the efficiency of CD22-CAR; PRODH2 (Stop) was at 51% and 32% for donors 1 and 2 (FIG. 9C). A co-culture assay to test the ability of CD22-CAR;PRODH2 CAR-T cells to kill cognate leukemic cells, NALM-6, was performed. As compared to the CD22-CAR; PRODH2 (Stop) control, CD22-CAR;PRODH2 CAR-T cells have a significantly stronger ability to kill the antigen-specific NALM-6 (FIG. 9D). This was confirmed at multiple doses, with two time points and in both donors, although with donor-specific variation of the optimal effector: target (E: T) ratio (FIG. 9D). Lastly, the ability of CD22-CAR; PRODH2 CAR-T cells to control tumor growth in vivo was examined. NALM6-GL cells were injected i.v. into NSG mice, imaged by IVIS, and randomized into 3 groups. Ten days after cancer cell injection, each mouse received CD22 CAR-T cells with PRODH2 (Stop) knockin, or CD22 CAR-T cells with PRODH2 knockin, or a PBS control. Mice were then imaged at subsequent time points (FIG. 22). Similar to in vitro assays, mice treated with CD22 CAR-PRODH2 cells displayed lower tumor burdens over the duration of the experiment. In total, without wishing to be bound by theory, these data suggest that PRODH2 knockin enhanced the cancer-killing ability of CD22-specific CAR-T cells.

Figure 10C:
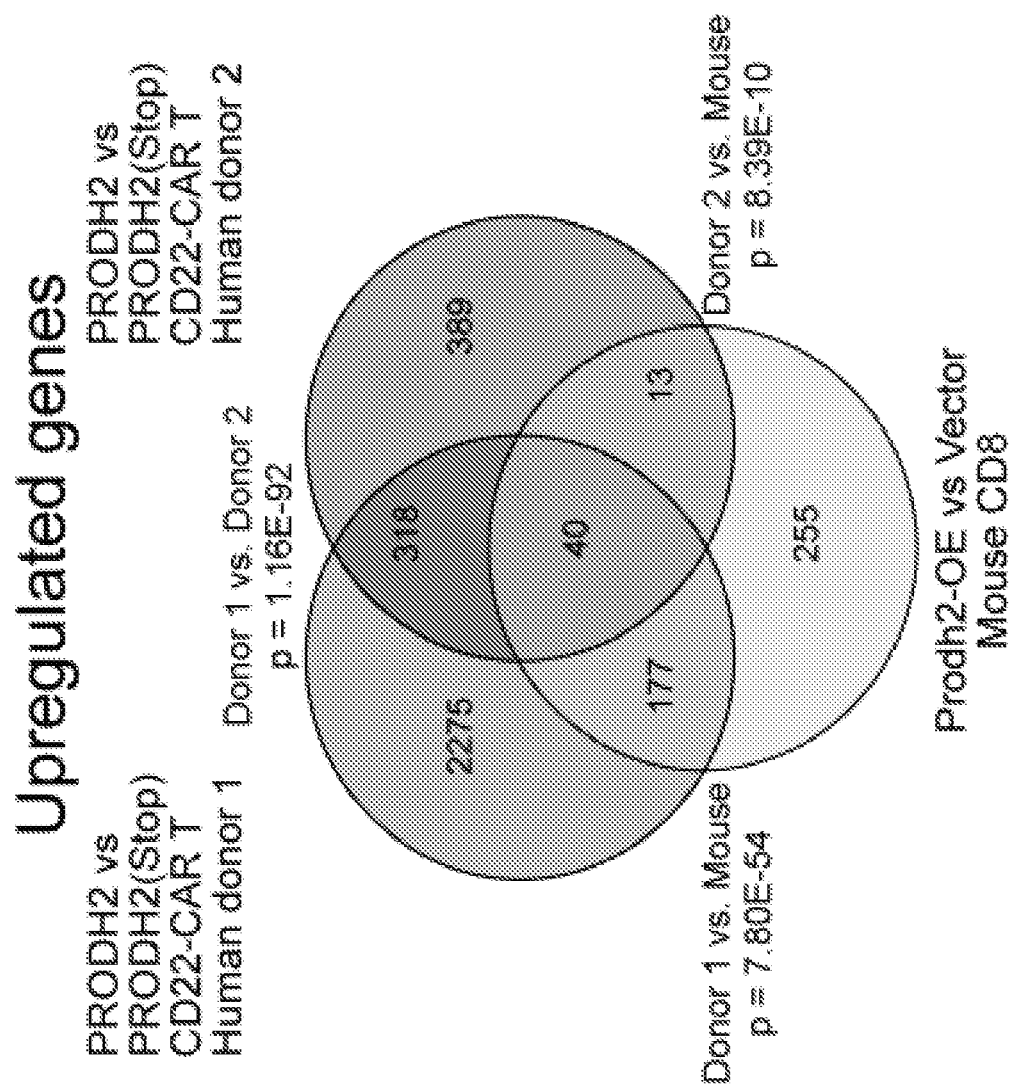
Figure 10D:
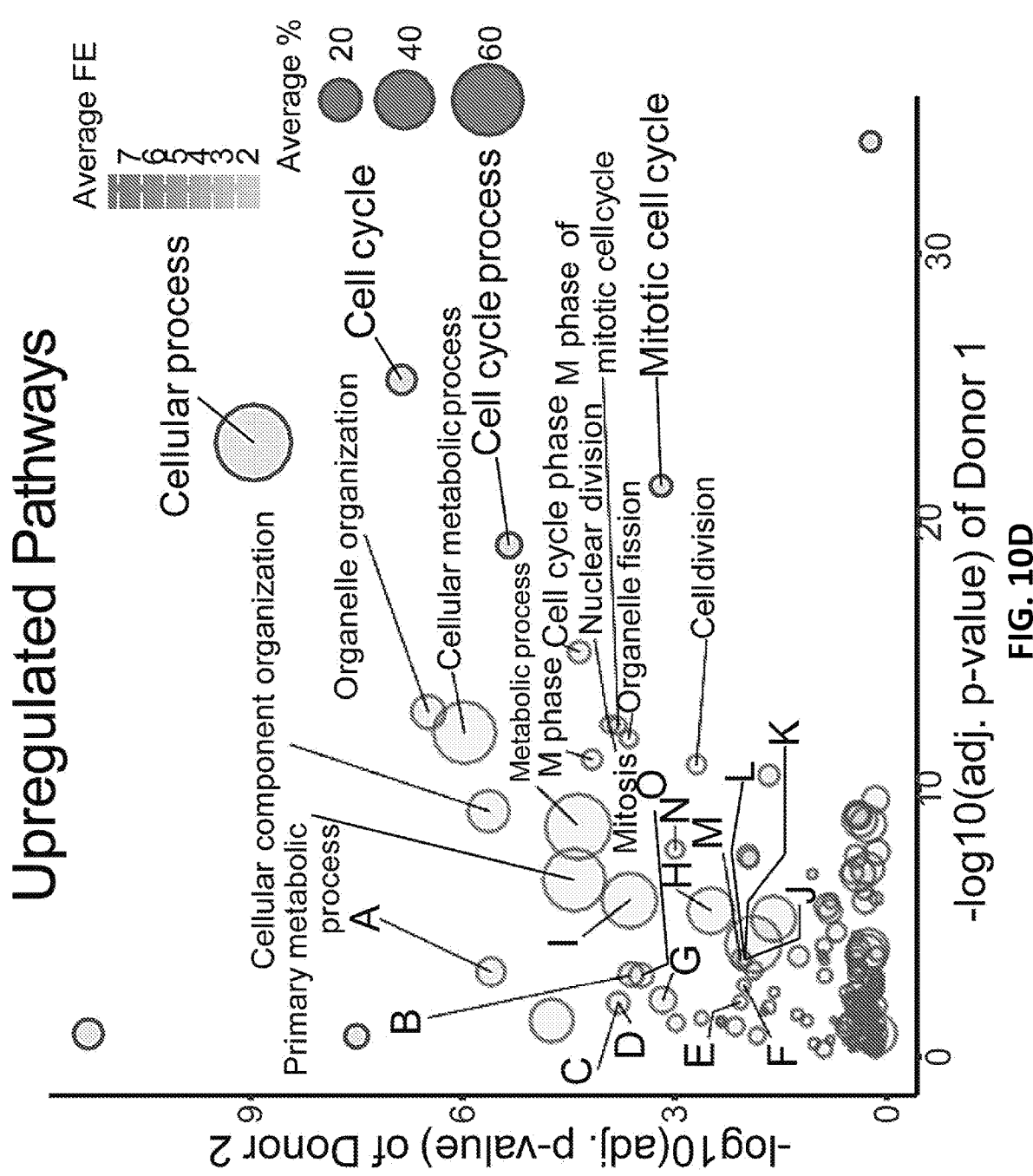
Figure 10F:
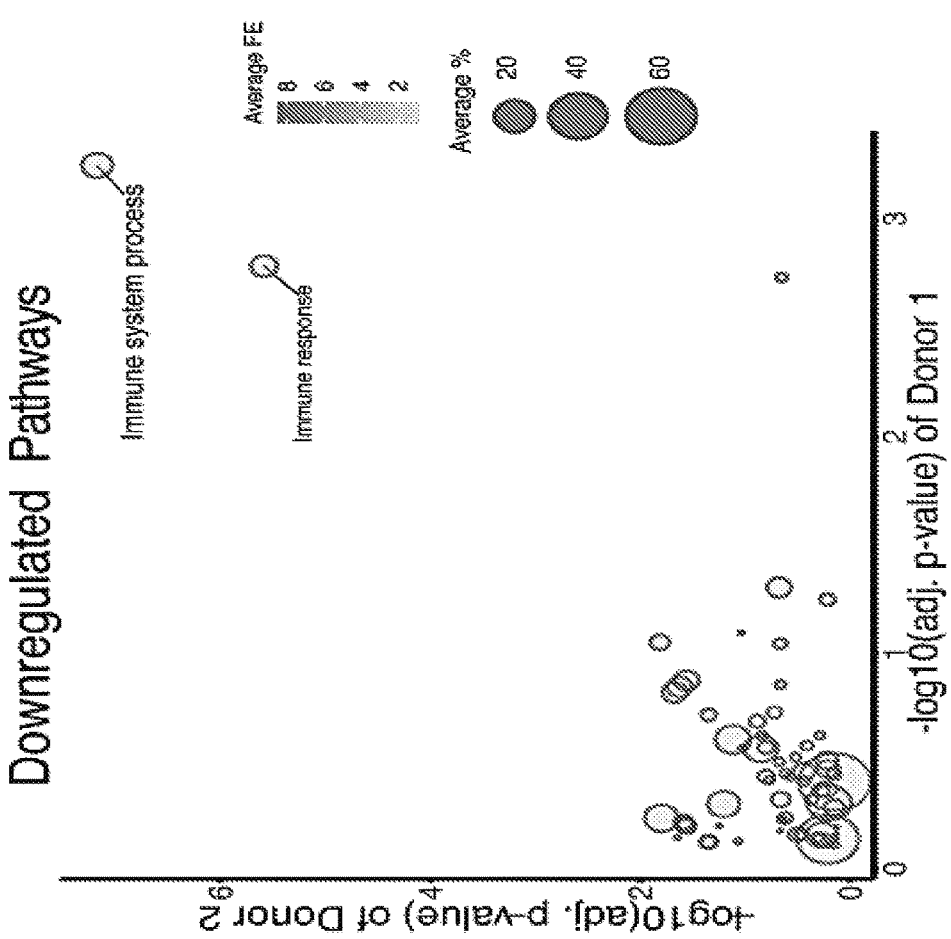
Figure 10E:
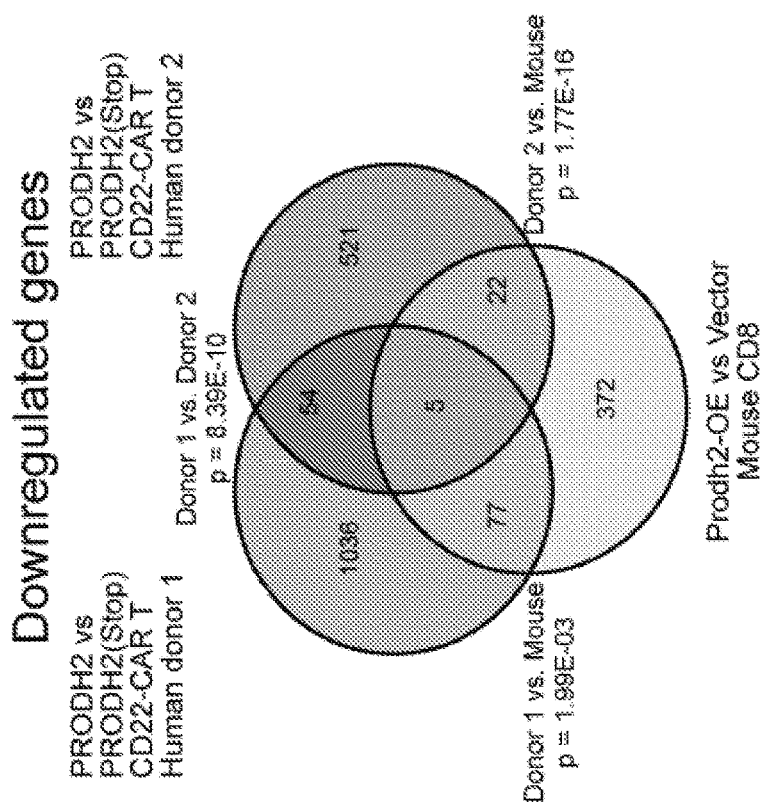
Figure 18A:
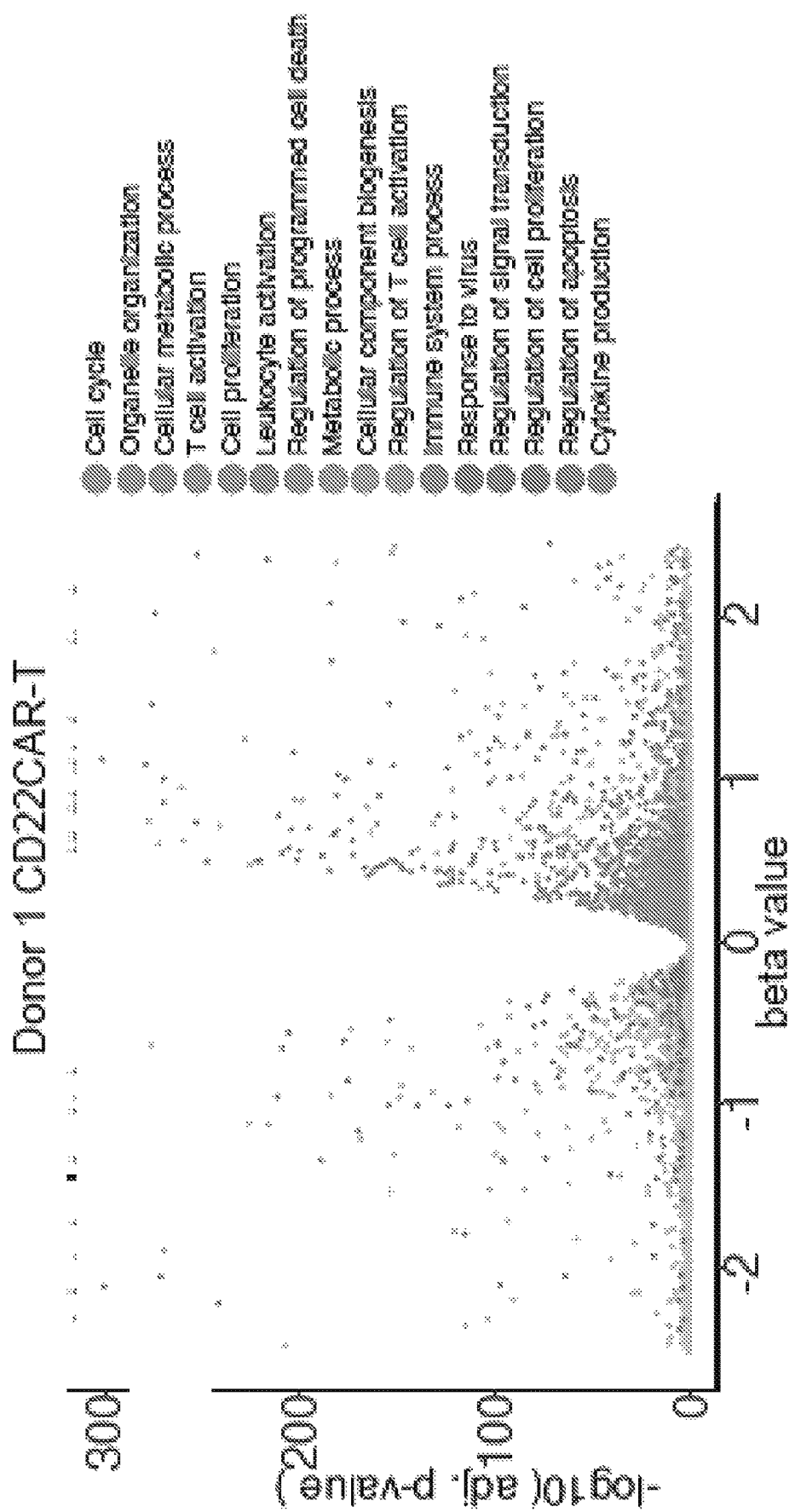
FIGS. 18A-18B illustrate whole transcriptome profiling of PRODH2 knockin CD22-CAR-T cells.
Figure 18B:
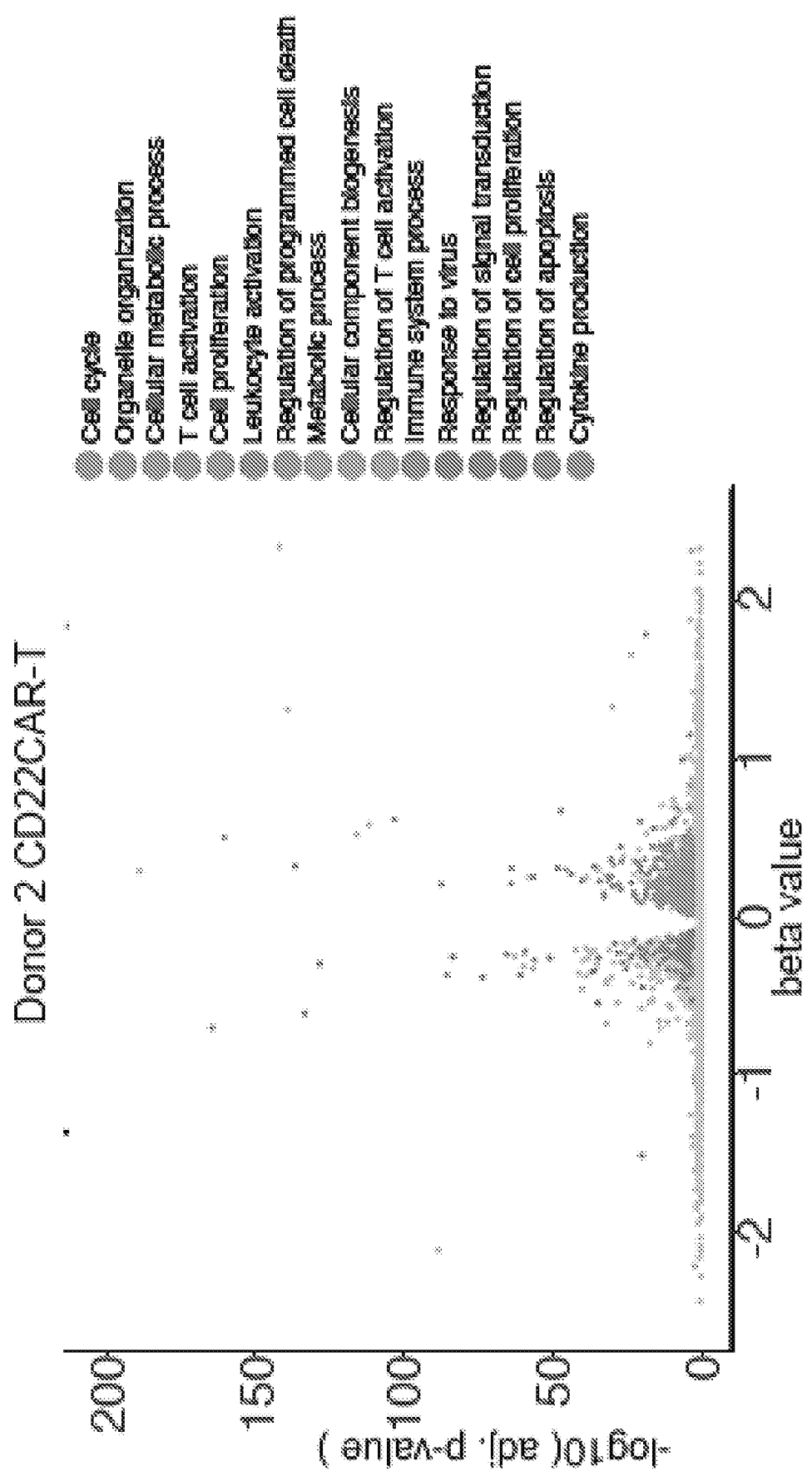
Figure 19:
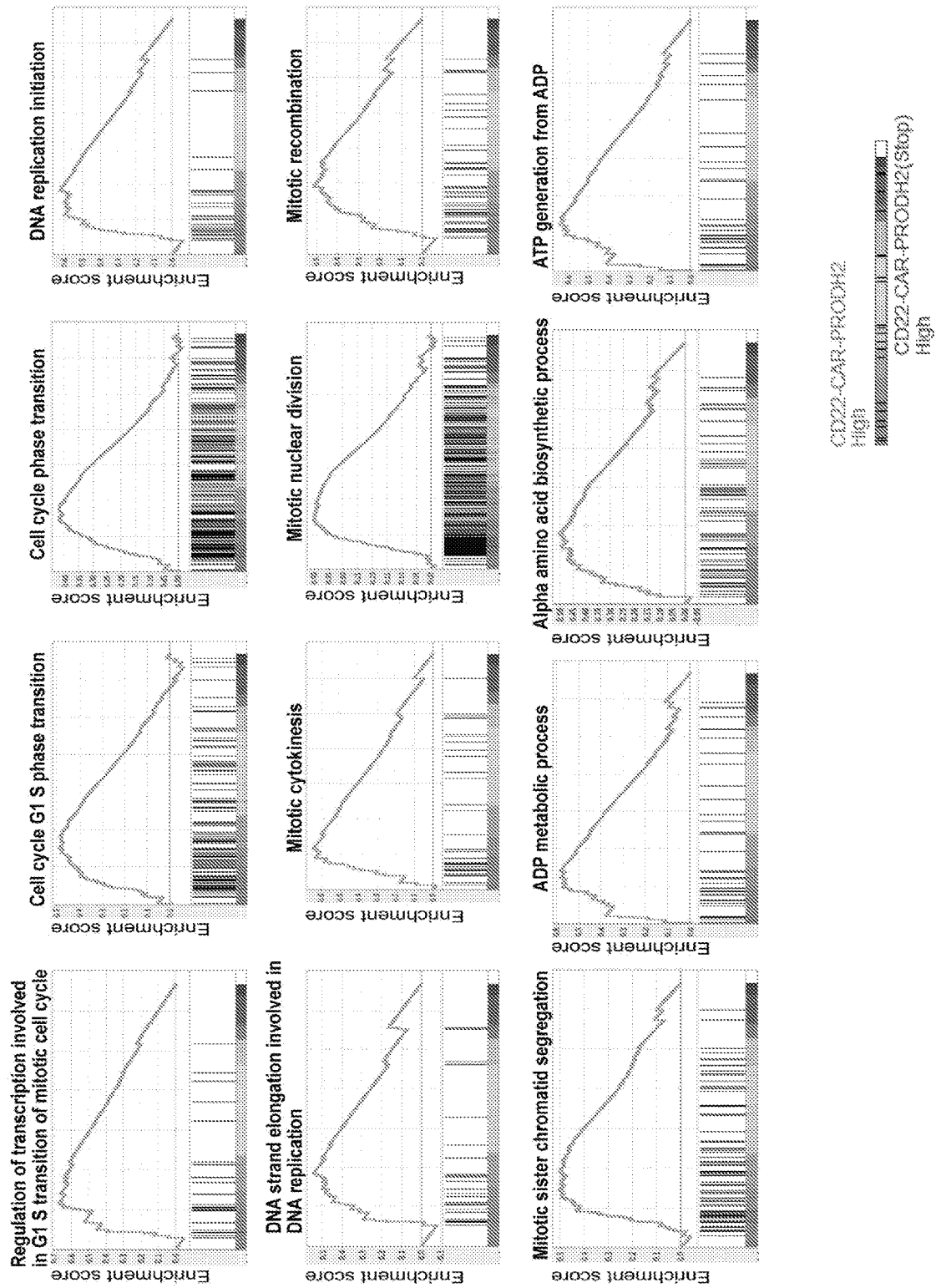
FIG. 19 illustrates GSEA individual pathways for mRNAseq of PRODH2 knockin CD22-CAR-T cells. The figure shows Gene Set Enrichment Analysis (GSEA) plots of individual pathways from the representative upregulated and downregulated gene sets between CD22-CAR-PRODH2 and CD22-CAR-PRODH2 (Stop) T cell groups.

Example 9: PRODH2 Knockin Restructured CAR-T Cell Gene Expression and Metabolic Programs To provide a molecular basis for how PRODH2 programs the engineered human CAR-T cell genetic circuits and metabolic states, multi-omics were performed by transcriptome profiling, untargeted metabolomics, targeted metabolomics and integrated analyses (Methods) (FIG. 10A). The mRNA-seq experiment profiled the transcriptomes of CD22-CAR;PRODH2 as well as CD22-CAR;PRODH2 (Stop) knockin CAR-T cells, both with source $CD8^+$ T cells from two human donors. DE analysis again uncovered broad transcriptomic changes as a result of PRODH2 knockin, with 4,420 upregulated and 2,454 downregulated genes in donor 1, and 1,627 upregulated and 1,348 downregulated genes in donor 2 (FDR adjusted p-value, q<0.05) (FIG. 10B). The DE genes in human CAR-T, both upregulated and downregulated, significantly overlap between donors and with those DE orthologs driven by lentiviral overexpression in mouse $CD8^+$ T cells (FIGS. 10C, 10E), suggesting a set of conserved function, regardless that these two technical systems do not have strict parity (human vs. mouse, AAV-knockin vs. lenti-overexpression, comparing to stop mutant vs. comparing to vector). Similar to the effect of Prodh2-OE in mouse $CD8^+$ T cells, knocking in PRODH2 co-cistronically with the CAR-T construct again showed strong changes in the transcriptomic programs of cell cycle, metabolism, apoptosis and immune response, in both donors (FIGS. 5D-5F, FIGS. 18A-18B). Representative significantly upregulated genes include CDCA7, CDCA3, CDCA2, CDC42BPA, KIFC1, ADCY3, E2F1, E2F8 (cell cycle); as well as CA9, CA4, ENO1, ATP 12A, ATP10D, PDE6G, LDHA (metabolism), with the note that cell cycle processes are often closely linked to metabolism especially those involved in biomacromolecule synthesis. In addition, PRODH2 knockin boosted a transcriptomic program of T cell activation, signal transduction and cytokine production, again in both donors (FIGS. 18A-18B). Representative significantly upregulated genes in these lines include those well-documented in T cell activation (e.g. CCR3, CCR5, CCR9, CXCR3, CXCR4, EOMES, ADA, SIRPG), T cell signaling (e.g. PLCG2, ZAP70, FYN, LCK, JAG2, PRKDC, PRKG2, PIK3CG, PIK3R6), and/or effector function (e.g. IFNG, TGFBR2, GZMB, GZMH, GZMK), while the terms are not mutually exclusive because these genes often play important roles in multiple T cell pathways. Breakdown of biological processes into more refined pathways revealed that the cell cycle signature is evident in multiple aspects of cell division, including M phase, mitosis, macromolecular complex assembly, biosynthetic process, organelle fission, and cell division (FIG. 10D). This is further corroborated by GSEA analysis, recapitulating a series of strong gene signatures in phase transition, G1/S transition, DNA replication, DNA strand elongation, mitotic cytokinesis, mitotic nuclear division, mitotic recombination and mitotic sister chromatid segregation (FIG. 19). The broad metabolic program also contains DE genes enriched in multiple metabolic pathways, including ATP/ADP metabolism, amino acid biosynthesis, protein metabolism, glucose metabolism, glutamine metabolism, glutathione metabolism, NADH metabolism, carbon metabolism, nucleotide metabolism, DNA/RNA metabolism and pyruvate metabolism (FIG. 10D, FIG. 19). These data suggest that PRODH2 knockin broadly and strongly altered the gene expression programs of CD22-CAR-T cells centered on cell cycle, T cell activation and metabolic processes.

Figure 11A:
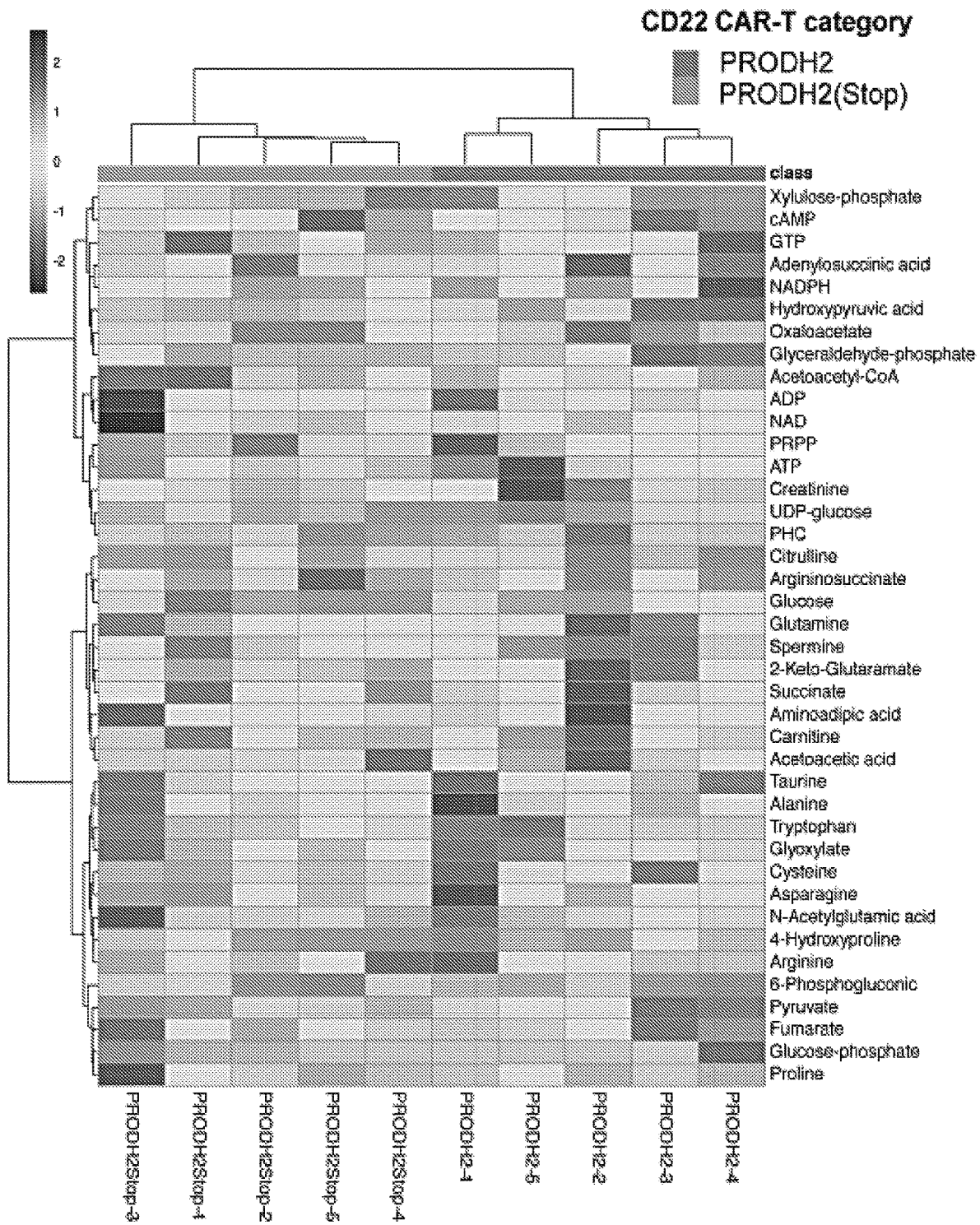
FIGS. 11A-11E illustrate Human CD22-CAR-PRODH2 CD8 T cell metabolomics and mRNA-seq analysis.
Figure 11B:
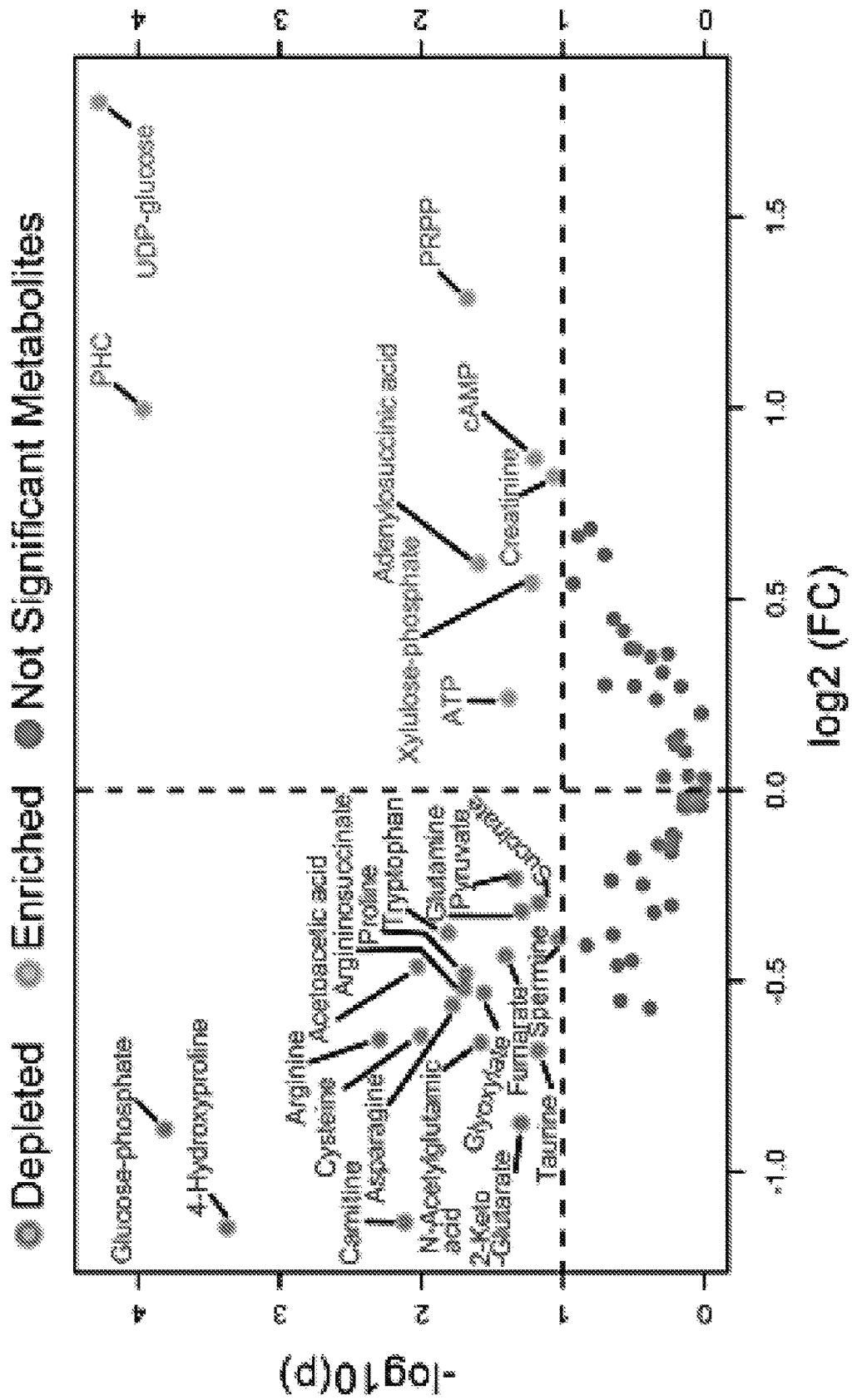
Figure 11C:
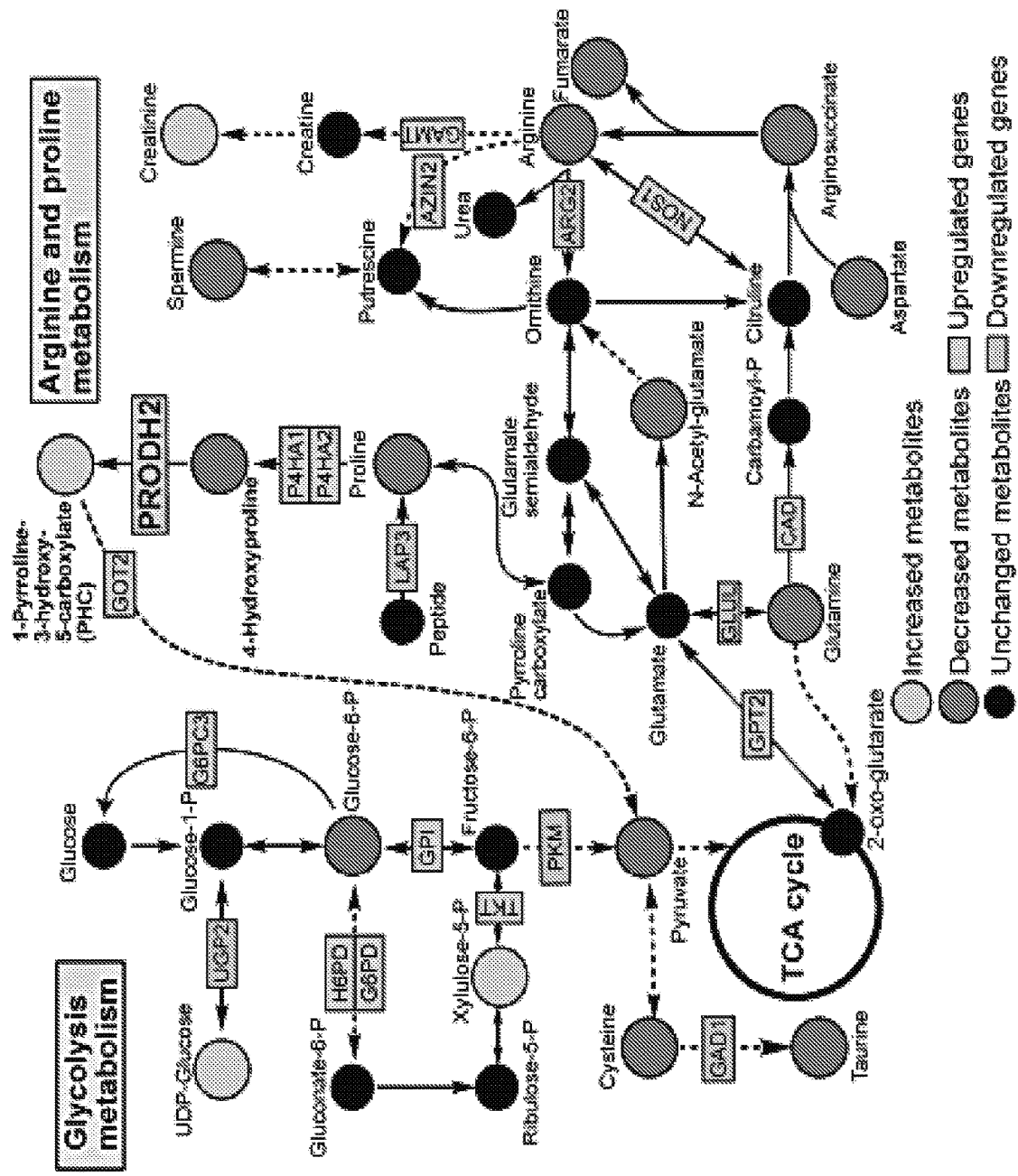
Figure 11D:
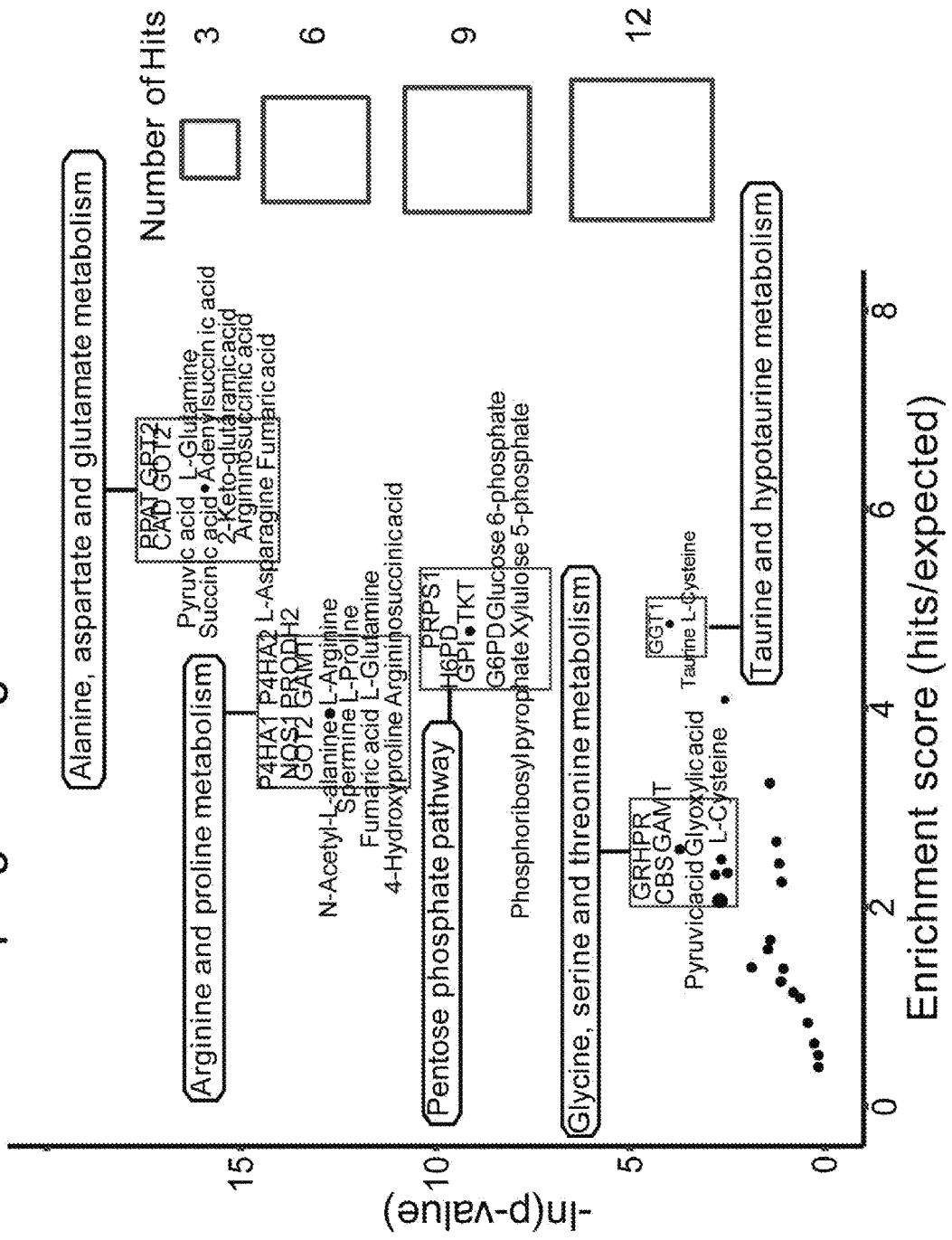
Figure 11E:
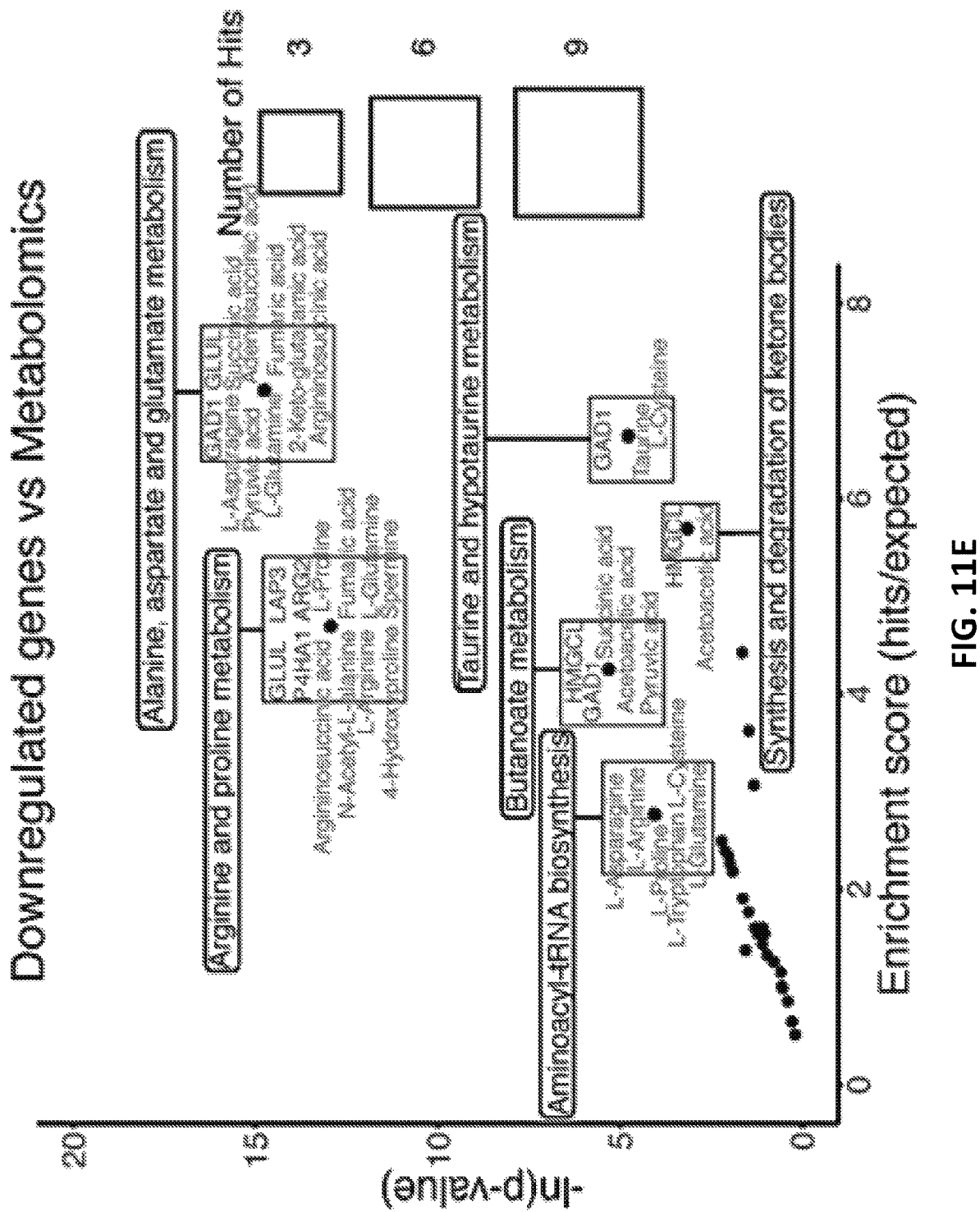
Figure 20:
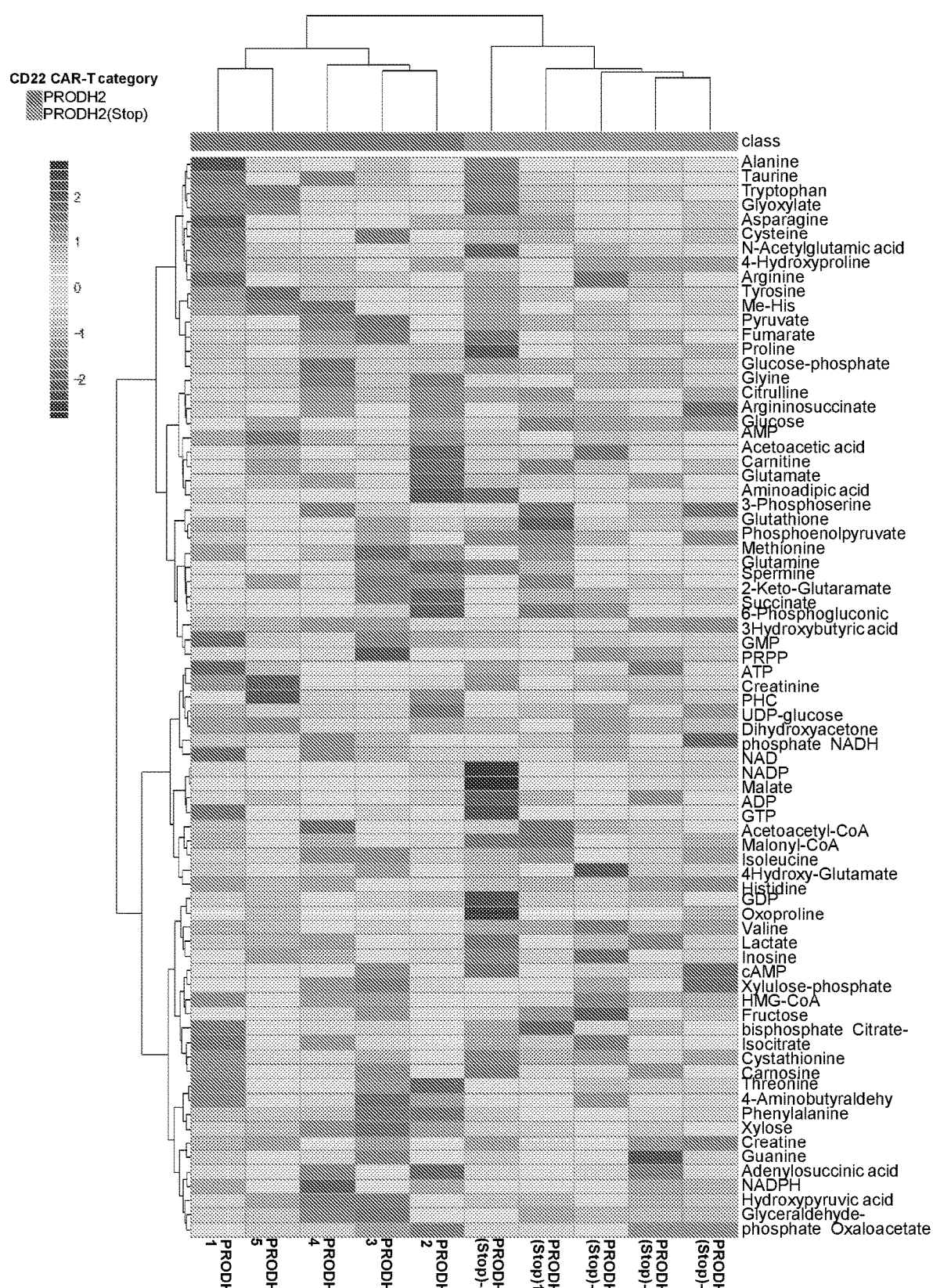
FIG. 20 illustrates a metabolomics analysis of human CD22-CAR-PRODH2 T cells. The figure shows a heatmap of the relative abundance of all QTOF/QQQ detected metabolites of PRODH2 vs. PRODH2 (Stop) CD22-CAR-T cells (n=5 biological replicates).
Figure 21:
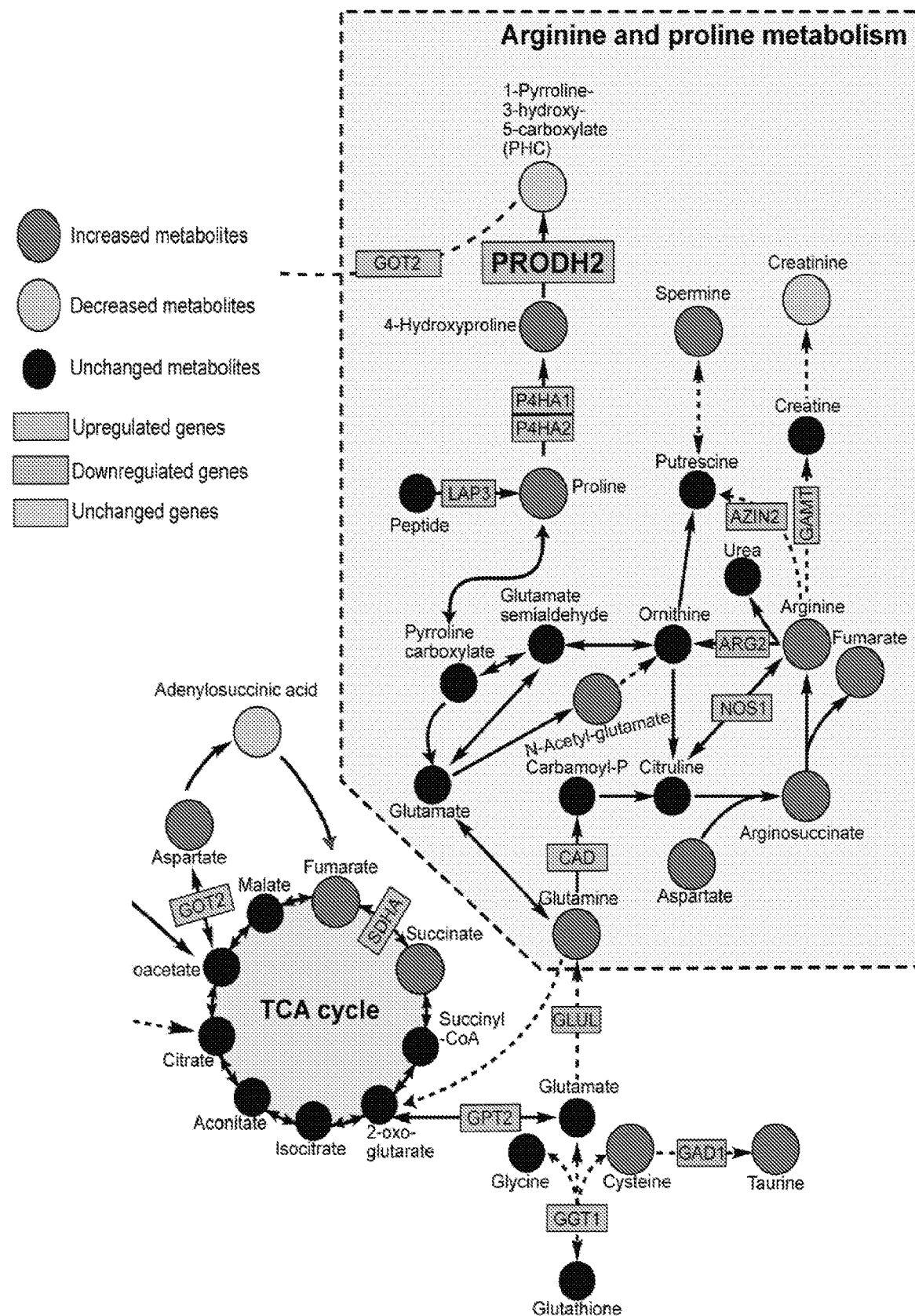
FIG. 21 illustrates KEGG-guided multi-omics analysis of human CD22-CAR-PRODH2 T cells. The figure shows a summary illustration highlighting representative enzymes encoded by DE genes, as well as DR metabolites on a metabolic map adapted from KEGG metabolic pathways. As in legend, blue circles indicate decreased metabolites; pink circles indicate increased metabolites; green squares indicate enzymes of downregulated genes; orange squares indicate enzymes of upregulated genes. Solid arrows indicate direct biochemical reactions; dashed arrows indicate indirect or multi-step biochemical reactions; bi-direction arrows indicate reversible reactions. All arrows were drawn according to the known reactions in KEGG. Only reactions related to DE genes or DR metabolites were shown. A simplified version is shown in a main figure panel.

Untargeted metabolomics jointly with targeted metabolomics identified a total of 75 metabolites in both CD22-CAR; PRODH2 and CD22-CAR;PRODH2(Stop) knockin CAR-T cells (FIG. 20). Among those, 8 metabolites are more abundant in CD22-CAR;PRODH2 knockin CAR-T cells, whereas 19 metabolites are less abundant (FIGS. 11A-11B). As established in the biochemical literature and KEGG database, these metabolites have clearly defined metabolic pathways with enzymes that catalyze their production and catabolismy intersecting the genes encoding those enzymes that produce or breakdown these metabolites, multiple DE genes whose upregulation or downregulation are consistent with the predicted metabolic activity, i.e. the directions of metabolite alterations were observed (FIG. 11C, FIG. 21). For example, besides the upregulation of PRODH2 that is consistent with decreased 4-Hydroxyproline and increased PHC levels, upregulation of GAMT that encodes a guanidinoacetate N-methyltransferase is consistent with the reduction of its substrate arginine and downstream product creatinine; upregulation of glucose-6-phosphatase 3 encoded by the G6PC3 gene is consistent with reduced glucose-6-phosphatase level; and reduced glutamine level is consistent with downregulation of GLUL that produces it from glutamate and upregulation of CAD that converts it into carbamoyl-phosphatase (FIG. 11C, FIG. 21). Furthermore, multi-omics analysis with MetaboAnalyst that integrates mRNA-seq DE analysis and metabolomics data identified enriched metabolic pathways in an unbiased manner, with the note that the significant changes of these metabolic pathways can be in both directions (for example, a pathway with both metabolites increased and decreased) (Methods). The second-most enriched metabolic pathway with the DE gene set in CD22-CAR;PRODH2 knockin CAR-T cells is arginine and proline metabolism, with significantly enriched intersecting DE genes involved in these pathways as well as differentially represented (DR) metabolites (FIG. 11D-11E), again highlighting the on-target activity of augmenting PRODH2. The most significantly enriched metabolic pathway is alanine, aspartate and glutamate metabolism, where the enzyme-encoding genes PPAT, GPT2, CAD, GOT2 are upregulated and GAD1, GLUL are downregulated, 8 relevant metabolites increased abundance, and 8 metabolites decreased abundance (FIGS. 11D-11E). In addition, other significantly altered metabolic pathways, potentially indirectly related to PRODH2's biochemical function, include pentose phosphate pathway, glycine, serine and threonine metabolism and taurine and hypotaurine metabolism in the upregulated gene vs. DR metabolite intersection; as well as butanoate metabolism, aminoacyl-tRNA biosynthesis, synthesis and degradation of ketone bodies and again taurine and hypotaurine metabolism in the downregulated gene vs. DR metabolite intersection (FIGS. 11D-11E). These data together showed that PRODH2 knockin broadly reprograms T cell's genetic circuit and metabolic states, further confirming it as a valid target for T cell engineering.

Example 10: Discussion

Activation screen in primary T cell. Catalytically dead guide RNAs (dgRNAs), which are 14-nt or 15-nt in length, can be utilized to modulate gene expression without introducing DSBs with catalytically active Cas9 at the target site. These innovations have expanded the potential applications of CRISPR technologies for genetic perturbations at the level of gene expression. High-throughput adaptations of these technologies can facilitate systematic interrogation of large numbers of genes or non-coding genetic elements for loss-of-function (LOF) and gain-of-function (GOF) screens. Recently, human $CD8^+$ T cell and mouse T helper cell LOF screens were performed to identify regulators which can boost T cell function and affect T helper cell activation and differentiation. While several studies demonstrated genome-scale GOF screen systems for protein-coding genes and long noncoding RNAs (lncRNAs) that confer resistance to the BRAF inhibitors in human melanoma cells, it is still challenging to introduce both dCas9-activator and a large-scale guide RNA library simultaneously into primary murine $CD8^+$ T cells, given their intrinsic resistance to various forms of genetic manipulation. The present study developed an orthogonal system for $CD8^+$ T cell GOF screen and identified endogenous factors for boosting T cell function. By designing a catalytically dead guide RNA library, we enabled high-throughput GOF screening using catalytically active Cas9. This allows leveraging Cas9 transgenic mice where $Cas9^+$ immune cells are readily available to be isolated and cultured in large scale. With the development of orthogonal screening technologies, the dgRNA library system may be used in conjunction with knockout systems to perform complex intersectional screens in individual $Cas9''$ cells. GOF identification of T cell functional boosters. Overexpression of STAT5 can improve anti-tumor effects by enhancing the cytotoxic ability of T cells against tumors and granting resistance to TGFβ and IL-6 signaling. Using a systems approach, a large number of ranked GOF candidates enriched in T cells with superior effector function was unveiled herein. Four genes, Prodh2, Ccnblip1, Sreklip1, and Wdr37 were validated, where augmenting their expression consistently enhanced $CD8^+$ T cell degranulation. Prodh2 encodes an enzyme in proline metabolism by catalyzing the first step in the catabolism of trans-4-hydroxy-L-proline. L-arginine metabolism in T cells enhances anti-tumor activity and is linked to proline metabolism, although the latter is less well-characterized. Wdr37 encodes a member of the WD repeat proteins that are involved in a diverse set of cellular processes. Ccnblip1 encodes an E3 ubiquitin ligase that regulates the progression of the cell cycle. Sreklip1 encodes a protein that interacts with Srek1, a serine/arginine-rich (SR) splicing protein that interacts with other SR proteins to modulate splice site selection. These previously undocumented genes highlight the ability of the dgTKS system for discovery of new GOF targets in primary T cells with relevance for cancer immunology.

T cell metabolism, activation and proliferation. T cell survival, activation, development, proliferation, differentiation and anti-tumor effector function are virtually all driven by metabolism. Naïve T cells are supported by ATP which are predominantly generated from oxidative phosphorylation before activation. The naïve T cell metabolic state will be rapidly changed after a sufficiently strong TCR signal is provided. A recent study established landscapes of T cell proteome and phosphoproteome and dynamic T cell activation signaling networks during T cell activation, which revealed various metabolic pathway changes during the T cell activation process. Activated T cells shifted metabolic state from oxidative metabolism to glycolysis for cell proliferation and effector functions, such as secretion of cytokines and cytolytic molecules important for tumor and pathogen clearance. Glycolysis is a relatively inefficiency pathway for generation ATP with only two ATPs per unit of glucose, however, this pathway can provide abundant biosynthetic intermediates for synthesis of nucleotides, amino acids, and fatty acids, which is important to support rapid T cell growth and proliferation. The total biomass is dramatically increased after T cell activation for proliferation, which requires substantial nucleotide, lipid, and amino acid synthesis. Program T cell metabolism using bioengineering approaches therefore may provide effective strategies for enhancement of T cell function relevant to the treatment of cancer, infection or immunological diseases. PRODH2 function in T cell. The dgTKS system and genome-scale GOF screen described herein identified Prodh2 as a top hit in cancer cell killing ability. Mouse whole transcriptome analysis, in vivo mouse models, human CAR T cell kill assays, and CAR-T cell multi-omics integrated analyses confirmed that engineered PRODH2/Prodh2 can reprogram T cell metabolism, promoted cell proliferation, activation, and enhanced anti-tumor effect. PRODH2/Prodh2 is a 4-Hydroxyproline dehydrogenase, which is a highly tissue-specific enzyme mainly expressed in livers and kidneys and only lowly expressed in most other cell types. In the present study, PRODH2/Prodh2 overexpression or genomic knockin was found to reprogram the T cell metabolic state, including distinct genetic and metabolic signatures, which demonstrated that hyperactivation of PRODH2 can boost T cell metabolism and immune function. The strong phenotypic strength and molecular effects of PRODH2 makes it an attractive target for T cell metabolic programming.

Engineering PRODH2 as a future approach for T cell programming in cell therapy. Cell therapies with engineered T cells including TCR-modified T cells and CAR-T cells have been proven as powerful cancer therapeutics. Successful clinical trials of anti-CD19 CAR for the CD19+ B lymphocyte molecule have recently been approved by the U.S. Food and Drug Administration (FDA) for treatment of refractory pre-B cell acute lymphoblastic leukemia and diffuse large B cell lymphoma. There remain many hurdles for CAR-T therapy because the adverse tumor microenvironment especially for solid tumors, such as T cell trafficking, tumor recognition and killing, and T cell proliferation and persistence. In the tumor microenvironment, tumors can metabolically restrict T cell anti-tumor functions by nutrient depletion. Thus, approaches to enhance T cell metabolic circuit in order to boost or at least maintain T cell anti-tumor immunity by reprogramming T cell metabolism is an emerged key goal for future immunotherapies. The second and third generation CARs designed with extra co-stimulatory domains (CD28 and/or 4-1BB) in addition to CD3ζ (CD3 zeta), exhibited better anti-tumor efficacy compared with first generation CARs. Interestingly, CD28 signaling domain has been proven with an extra function of enhancing aerobic glycolysis, and 4-1BB enhanced mitochondria biogenesis and fatty acid oxidation in the CAR-T cells. Recently, intracellular L-arginine (involved in arginine and proline metabolism) concentration impacted the metabolic fitness and survival capacity of T cells, and increased L-arginine level enhanced T cell survival and anti-tumor activity. Programming T cell metabolism is an emerging approach for immunotherapy. The present data showed that CD22-CAR;PRODH2 CAR-T cells are more robust than CD22-CAR;PRODH2 (Stop) cells in NALM-6 cancer cell killing, while the engineering and testing of PRODH2 in solid tumor CARs can be done in future studies. Integrated RNA-seq and metabolomics analyses demonstrated CAR-T cell's whole transcriptome and metabolic pathways were remodeled with PRODH2 knockin. Therefore, engineered PRODH2 mediates metabolism reprogramming, promotes nucleotide metabolism, amino acid biosynthesis, glucose metabolism, and ATP/ADP metabolism among the broad spectra of reshaped pathways, ultimately promoting T cell proliferation and boosting effector functions. Thus, PRODH2 is a promising T cell booster, which via engineering approaches can be applied for various T cell-mediated immunotherapies in the future, including modification of isolated tumor-infiltrating lymphocytes (TILs), autologous T cells, TCR-T cells, CAR-T cells and potentially other forms of T cells.

TABLE 1

Primer Sequences

| SEQ ID NO: | Primer/ Barcode Name | seq (5>3) |
|---|---|---|
| 84,615 | SAM_BC_F01 | AATGATACGGCGACCACCGAGATCTACACTCTTTCCCTACACGACGCTCT TCCGATCTaAACCGGTTGCTTTATATATCTTGTGGAAAGGACGAAACACC |
|  | Barcode | AACCGGTT |
| 84,616 | SAM_BC_F02 | AATGATACGGCGACCACCGAGATCTACACTCTTTCCCTACACGACGCTCT TCCGATCTcaGGCCAATTGCTTTATATATCTTGTGGAAAGGACGAAACAC C |
|  | Barcode | GGCCAATT |
| 84,617 | SAM_BC_F03 | AATGATACGGCGACCACCGAGATCTACACTCTTTCCCTACACGACGCTCT TCCGATCTgcaTTGGAACCGCTTTATATATCTTGTGGAAAGGACGAAACAC C |
|  | Barcode | TTGGAACC |
| 84,618 | SAM_BC_F04 | AATGATACGGCGACCACCGAGATCTACACTCTTTCCCTACACGACGCTCT TCCGATCTtgcaCCTTGGAAGCTTTATATATCTTGTGGAAAGGACGAAACA CC |
|  | Barcode | CCTTGGAA |
| 84,619 | SAM_BC_F05 | AATGATACGGCGACCACCGAGATCTACACTCTTTCCCTACACGACGCTCT TCCGATCTatgcaACACGTGTGCTTTATATATCTTGTG-GAAAGGACGAAACA CC |
|  | Barcode | ACACGTGT |
| 84,620 | SAM_BC_F06 | AATGATACGGCGACCACCGAGATCTACACTCTTTCCCTACACGACGCTCT TCCGATCTcatgcaGCGCATATGCTTTATATATCTTGTG-GAAAGGACGAAAC ACC |
|  | Barcode | GCGCATAT |

TABLE 1-continued

Primer Sequences

| SEQ ID NO: | Primer/ Barcode Name | seq (5>3) |
|---|---|---|
| 84,621 | SAM_BC_F07 | AATGATACGGCGACCACCGAGATCTACACTCTTTCCCTACACGACGCTCTTCCGATCTgcatgcaTGTGACACGCTTTATATATCTTGTGGAAAGGACGAAACACC |
|  | Barcode | TGTGACAC |
| 84,622 | SAM_BC_F08 | AATGATACGGCGACCACCGAGATCTACACTCTTTCCCTACACGACGCTCTTCCGATCTagctgcaCTCTGAGAGCTTTATATATCTTGTGGAAAGGACGAAACACC |
|  | Barcode | CTCTGAGA |
| 84,623 | SAM_BC_F09 | AATGATACGGCGACCACCGAGATCTACACTCTTTCCCTACACGACGCTCTTCCGATCTaAGGTTCCAGCTTTATATATCTTGTGGAAAGGACGAAACACC |
|  | Barcode | AGGTTCCA |
| 84,624 | SAM_BC_F10 | AATGATACGGCGACCACCGAGATCTACACTCTTTCCCTACACGACGCTCTTCCGATCTcaGAATTCCGGCTTTATATATCTTGTGGAAAGGACGAAACACC |
|  | Barcode | GAATTCCG |
| 84,625 | SAM_BC_F11 | AATGATACGGCGACCACCGAGATCTACACTCTTTCCCTACACGACGCTCTTCCGATCTgcaTAACCGGTGCTTTATATATCTTGTGGAAAGGACGAAACACC |
|  | Barcode | TAACCGGT |
| 84,626 | SAM_BC_F12 | AATGATACGGCGACCACCGAGATCTACACTCTTTCCCTACACGACGCTCTTCCGATCTtgcaCGGAATTCGCTTTATATATCTTGTGGAAAGGACGAAACACC |
|  | Barcode | CGGAATTC |
| 84,627 | SAM_BC_NR01 | CAAGCAGAAGACGGCATACGAGATATATCGCGGTGACTGGAGTTCAGACGTGTGCTCTTCCGATCTctcggtgccacttggccCTG |
|  | Barcode | ATATCGCG |
| 84,628 | SAM_BC_NR02 | CAAGCAGAAGACGGCATACGAGATGAGATCTCGTGACTGGAGTTCAGACGTGTGCTCTTCCGATCTctcggtgccacttggccCTG |
|  | Barcode | GAGATCTC |
| 84,629 | SAM_BC_NR03 | CAAGCAGAAGACGGCATACGAGATTGTGACACGTGACTGGAGTTCAGACGTGTGCTCTTCCGATCTctcggtgccacttggccCTG |
|  | Barcode | TGTGACAC |
| 84,630 | SAM_BC_NR04 | CAAGCAGAAGACGGCATACGAGATCTCTAGAGGTGACTGGAGTTCAGACGTGTGCTCTTCCGATCTctcggtgccacttggccCTG |
|  | Barcode | CTCTAGAG |

Other Embodiments

The recitation of a listing of elements in any definition of a variable herein includes definitions of that variable as any single element or combination (or subcombination) of listed elements. The recitation of an embodiment herein includes that embodiment as any single embodiment or in combination with any other embodiments or portions thereof.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

SEQUENCE LISTING

The patent contains a lengthy sequence listing. A copy of the sequence listing is available in electronic form from the USPTO web site (https://seqdata.uspto.gov/docdetail?docId=US12497611B2). An electronic copy of the sequence listing will also be available from the USPTO upon request and payment of the fee set forth in 37 CFR 1.19(b)(3).

What is claimed is:

1. A vector comprising
   (i) a first expression cassette comprising a nucleic acid sequence encoding a dead-guide RNA (dgRNA), and a MS2-loop-containing chimeric backbone sequence, under control of a first promoter, and
   (ii) a second expression cassette comprising a nucleic acid sequence encoding a fusion protein of Thy1.1 and one or more transcription activators under control of a second promoter,
   wherein the dgRNA consists of a nucleotide sequence selected from the group consisting of any one of SEQ ID NOs: 1-83600 and 83601.

2. The vector of claim 1, wherein the one or more transcription activators are selected from the group consisting of MS2 bacteriophage coat protein (MCP), transcription factor p65 (P65), and heat shock factor I (HSFI).

3. The vector of claim 1, wherein the dgRNA expression cassette and the MS2-loop-containing chimeric backbone are driven by a U6 promoter.

4. An engineered immune cell comprising the vector of claim 1.

5. The cell of claim 4, wherein the cell is selected from the group consisting of a T cell, a primary cell, a CD8+ cell, a CD4+ cell, a T regulatory (Treg) cell, and a CAR-T cell.

6. The vector of claim 1, further comprising one or more additional components selected from the group consisting of a long terminal repeat (LTR) sequence, a T2A sequence, a linker sequence, a nuclear localization sequence (NLS), and a short PA sequence.

7. The vector of claim 1, wherein the first promoter is a U6 promoter and/or the second promoter is an EFS promoter.

8. The vector of claim 1, wherein the cassette expressing a fusion protein of Thy 1.1 and one or more transcription activators is driven by an EFS promoter.

9. The vector of claim 1, wherein the vector is a lentiviral vector.

10. The vector of claim 1, wherein the dgRNA consists of a nucleotide sequence selected from the group consisting of SEQ ID NOs: 55168, 55169, 55170, and 55171.

11. An engineered immune cell comprising the vector of claim 10.

12. The cell of claim 11, wherein the cell is selected from the group consisting of a T cell, a primary cell, a CD8+ cell, a CD4+ cell, a T regulatory (Treg) cell, and a CAR-T cell.

13. The vector of claim 1, wherein the dgRNA expression cassette comprises a dgRNA that targets one or more genes that, when upregulated, enhance degranulation of T cells,
   wherein the one or more genes is selected from the group consisting of Prodh2, Ccnblip1, Sreklip1, and Wdr37.

14. The vector of claim 13, wherein the dgRNA expression cassette comprises a nucleotide sequence selected from the group consisting of SEQ ID NOs: 55168, 55169, 55170, 55171, 79364, 79365, 79366, 79367, 55044, 55045, 55046, 55047, 55671, 55672, 55673, 55674, 25546, 25547, 25548, 25549, 34631, 34632, 34633, and 34634.

15. An engineered immune cell comprising the vector of claim 14.

16. The cell of claim 15, wherein the cell is selected from the group consisting of a T cell, a primary cell, a CD8+ cell, a CD4+ cell, a T regulatory (Treg) cell, and a CAR-T cell.

17. A composition comprising a plurality of the vectors of claim 1, wherein the plurality of vectors comprises at least 100 different vectors each encoding a different dgRNA according SEQ ID NOs: 1-83601.

18. The composition of claim 17, wherein the plurality of vectors comprises at least 83601 different vectors each separately encoding one of the dgRNAs according SEQ ID NOs: 1-83601.

19. A vector comprising
   (i) a first expression cassette under control of a first promoter, comprising a dead-guide RNA (dgRNA) and a MS2-loop-containing chimeric backbone sequence, and
   (ii) a second expression cassette under control of a second promoter, comprising a fusion protein of Thy1.1 and one or more transcription activators, wherein the vector comprises a nucleic acid sequence of SEQ ID NO: 84602.

* * * * *